United States Patent
Anderson et al.

(10) Patent No.: US 9,213,363 B2
(45) Date of Patent: Dec. 15, 2015

(54) COMMUNICATIONS BLADED PANEL SYSTEMS

(71) Applicant: ADC Telecommunications, Inc., Berwyn, PA (US)

(72) Inventors: Chad Anderson, New Prague, MN (US); Joseph C. Coffey, Burnsville, MN (US); Ryan Kostecka, Waconia, MN (US); David Stone, Irvine, CA (US); Michael Wentworth, Belle Plaine, MN (US)

(73) Assignee: TYCO ELECTRONICS SERVICES GMBH (CH)

( * ) Notice: Subject to any disclaimer, the term of this patent is extended or adjusted under 35 U.S.C. 154(b) by 0 days.

(21) Appl. No.: 14/574,663

(22) Filed: Dec. 18, 2014

(65) Prior Publication Data

US 2015/0177780 A1 Jun. 25, 2015

Related U.S. Application Data

(63) Continuation of application No. 13/025,737, filed on Feb. 11, 2011, now Pat. No. 8,934,253.

(60) Provisional application No. 61/303,948, filed on Feb. 12, 2010, provisional application No. 61/413,844, filed on Nov. 15, 2010, provisional application No. 61/439,693, filed on Feb. 4, 2011.

(51) Int. Cl.
*H05K 5/00* (2006.01)
*H05K 7/00* (2006.01)
(Continued)

(52) U.S. Cl.
CPC ............... *G06F 1/16* (2013.01); *G02B 6/4452* (2013.01); *H04Q 1/023* (2013.01); *H04Q 1/03* (2013.01);
(Continued)

(58) Field of Classification Search
CPC .......................... H05K 7/1421; G02B 6/4452
USPC ..................................... 361/679.01–679.03
See application file for complete search history.

(56) References Cited

U.S. PATENT DOCUMENTS

| | | | |
|---|---|---|---|
| 4,953,194 | A | 8/1990 | Hansen et al. |
| 4,968,929 | A | 11/1990 | Hauck et al. |

(Continued)

FOREIGN PATENT DOCUMENTS

| | | |
|---|---|---|
| GB | 2 236 398 A | 4/1991 |
| JP | 2009-104801 A | 5/2009 |
| WO | WO 2006/092553 A1 | 9/2006 |
| WO | WO 2010/001400 A1 | 1/2010 |
| WO | WO 2010/121639 A1 | 10/2010 |

OTHER PUBLICATIONS

*Avaya's Enhanced SYSTIMAX® iPatch System Enables IT Managers to Optimise Network Efficiency and Cut Downtime*, Press Release, May 9, 2003, obtained from http://www.avaya.com/usa/about-avaya/newsroom/news-releases/2003/pr-030509 on Jan. 7, 2009.

(Continued)

*Primary Examiner* — Jerry Wu
(74) *Attorney, Agent, or Firm* — Merchant & Gould P.C.

(57) ABSTRACT

A fiber panel system includes a chassis including a backplane; and at least a first blade configured to mount to the chassis. The first blade is moveable relative to the chassis between a refracted (closed) position and at least one extended position. The first blade includes a coupler arrangement for connecting together media segments. Each blade includes a blade processor and a plurality of smart couplers. A chassis processor is electrically coupled to a processor port of the chassis backplane.

19 Claims, 117 Drawing Sheets

(51) Int. Cl.
*G06F 1/16* (2006.01)
*G02B 6/44* (2006.01)
*H04Q 1/08* (2006.01)
*H04Q 1/02* (2006.01)
*H04Q 1/06* (2006.01)
*H05K 5/02* (2006.01)

(52) U.S. Cl.
CPC . *H04Q 1/06* (2013.01); *H04Q 1/08* (2013.01); *H04Q 1/155* (2013.01); *H05K 5/0026* (2013.01); *H05K 5/0204* (2013.01); *H05K 5/0217* (2013.01); *Y10T 29/49002* (2015.01); *Y10T 29/49826* (2015.01)

(56) References Cited

U.S. PATENT DOCUMENTS

| | | | |
|---|---|---|---|
| 5,107,532 A | 4/1992 | Hansen et al. | |
| 5,161,988 A | 11/1992 | Krupka | |
| 5,166,970 A | 11/1992 | Ward | |
| 5,265,187 A | 11/1993 | Morin et al. | |
| 5,305,405 A | 4/1994 | Emmons et al. | |
| 5,353,367 A | 10/1994 | Czosnowski et al. | |
| 5,393,249 A | 2/1995 | Morgenstern et al. | |
| 5,394,503 A | 2/1995 | Dietz, Jr. et al. | |
| 5,413,494 A | 5/1995 | Dewey et al. | |
| 5,418,334 A | 5/1995 | Williams | |
| 5,419,717 A | 5/1995 | Abendschein et al. | |
| 5,448,675 A | 9/1995 | Leone et al. | |
| 5,467,062 A | 11/1995 | Burroughs et al. | |
| 5,483,467 A | 1/1996 | Krupka et al. | |
| 5,497,444 A | 3/1996 | Wheeler | |
| 5,579,425 A | 11/1996 | Lampert et al. | |
| 5,685,741 A | 11/1997 | Dewey et al. | |
| 5,712,942 A | 1/1998 | Jennings et al. | |
| 5,717,810 A | 2/1998 | Wheeler | |
| 5,754,404 A | 5/1998 | Biermann et al. | |
| 5,758,003 A | 5/1998 | Wheeler et al. | |
| 5,854,824 A | 12/1998 | Bengal et al. | |
| 6,002,331 A | 12/1999 | Laor | |
| 6,116,961 A | 9/2000 | Henneberger et al. | |
| 6,166,917 A | 12/2000 | Anderson | |
| 6,195,493 B1 | 2/2001 | Bridges | |
| 6,219,252 B1 | 4/2001 | Tsai | |
| 6,222,908 B1 | 4/2001 | Bartolutti et al. | |
| 6,222,975 B1 | 4/2001 | Gilbert et al. | |
| 6,234,830 B1 | 5/2001 | Ensz et al. | |
| 6,285,293 B1 | 9/2001 | German et al. | |
| 6,300,877 B1 | 10/2001 | Schannach et al. | |
| 6,330,307 B1 | 12/2001 | Bloch et al. | |
| RE37,489 E | 1/2002 | Anton et al. | |
| 6,350,148 B1 | 2/2002 | Bartolutti et al. | |
| 6,388,891 B1 | 5/2002 | Falkenberg et al. | |
| 6,409,392 B1 | 6/2002 | Lampert et al. | |
| 6,421,322 B1 | 7/2002 | Koziy et al. | |
| 6,424,710 B1 | 7/2002 | Bartolutti et al. | |
| 6,437,894 B1 | 8/2002 | Gilbert et al. | |
| 6,456,768 B1 | 9/2002 | Boncek et al. | |
| 6,499,861 B1 | 12/2002 | German et al. | |
| 6,522,737 B1 | 2/2003 | Bartolutti et al. | |
| 6,560,114 B2 | 5/2003 | Berry et al. | |
| 6,574,586 B1 | 6/2003 | David et al. | |
| 6,591,051 B2 | 7/2003 | Solheid et al. | |
| 6,621,692 B1* | 9/2003 | Johnson et al. | 361/679.55 |
| 6,626,697 B1 | 9/2003 | Martin et al. | |
| 6,636,152 B2 | 10/2003 | Schannach et al. | |
| RE38,311 E | 11/2003 | Wheeler | |
| 6,725,177 B2 | 4/2004 | David et al. | |
| 6,743,044 B2 | 6/2004 | Musolf et al. | |
| 6,808,116 B2 | 10/2004 | Eslambolchi et al. | |
| 6,850,685 B2 | 2/2005 | Tinucci et al. | |
| 6,870,734 B2 | 3/2005 | Mertesdorf et al. | |
| 6,898,368 B2 | 5/2005 | Colombo et al. | |
| 6,905,363 B2 | 6/2005 | Musolf et al. | |
| 6,910,267 B1 | 6/2005 | Erwin | |
| 6,971,895 B2 | 12/2005 | Sago et al. | |
| 6,976,867 B2 | 12/2005 | Navarro et al. | |
| 6,980,725 B1 | 12/2005 | Swieconek | |
| 7,081,808 B2 | 7/2006 | Colombo et al. | |
| 7,123,810 B2 | 10/2006 | Parrish | |
| 7,153,142 B2 | 12/2006 | Shifris et al. | |
| 7,165,728 B2 | 1/2007 | Durrant et al. | |
| 7,193,422 B2 | 3/2007 | Velleca et al. | |
| 7,226,217 B1 | 6/2007 | Benton et al. | |
| 7,234,944 B2 | 6/2007 | Nordin et al. | |
| 7,297,018 B2 | 11/2007 | Caveney et al. | |
| 7,312,715 B2 | 12/2007 | Shalts et al. | |
| 7,352,289 B1 | 4/2008 | Harris | |
| 7,370,106 B2 | 5/2008 | Caveney | |
| 7,418,182 B2 | 8/2008 | Krampotich | |
| 7,454,113 B2 | 11/2008 | Barnes | |
| 7,488,206 B2 | 2/2009 | Caveney et al. | |
| 7,519,000 B2 | 4/2009 | Caveney et al. | |
| 7,570,860 B2 | 8/2009 | Smrha et al. | |
| 7,570,861 B2 | 8/2009 | Smrha et al. | |
| 7,627,221 B2 | 12/2009 | Morris | |
| RE41,460 E | 7/2010 | Wheeler | |
| 7,855,896 B2 | 12/2010 | Lee | |
| 7,869,426 B2 | 1/2011 | Hough et al. | |
| 7,872,738 B2 | 1/2011 | Abbott | |
| 7,873,252 B2 | 1/2011 | Smrha et al. | |
| 7,873,253 B2 | 1/2011 | Smrha et al. | |
| 7,876,580 B2 | 1/2011 | Mayer | |
| 7,934,022 B2 | 4/2011 | Velleca et al. | |
| 8,179,684 B2 | 5/2012 | Smrha et al. | |
| 8,326,107 B2 | 12/2012 | Cooke et al. | |
| 8,363,996 B2 | 1/2013 | Morris | |
| 8,452,148 B2 | 5/2013 | Cooke et al. | |
| 8,475,214 B2 | 7/2013 | Shtargot et al. | |
| 8,934,253 B2 | 1/2015 | Anderson et al. | |
| 2002/0181896 A1 | 12/2002 | McClellan et al. | |
| 2002/0197045 A1 | 12/2002 | Schmidt et al. | |
| 2003/0185536 A1 | 10/2003 | Steinman et al. | |
| 2003/0210515 A1 | 11/2003 | Rahmouni | |
| 2004/0042448 A1 | 3/2004 | Lebizay et al. | |
| 2004/0052471 A1 | 3/2004 | Colombo et al. | |
| 2004/0117515 A1 | 6/2004 | Sago et al. | |
| 2006/0018622 A1 | 1/2006 | Caveney et al. | |
| 2006/0160395 A1 | 7/2006 | MacAuley et al. | |
| 2006/0193591 A1 | 8/2006 | Rapp et al. | |
| 2006/0210229 A1 | 9/2006 | Scadden | |
| 2006/0228086 A1 | 10/2006 | Holmberg et al. | |
| 2006/0234782 A1 | 10/2006 | Dorenkamp et al. | |
| 2007/0116411 A1 | 5/2007 | Benton et al. | |
| 2007/0230452 A1 | 10/2007 | Hough et al. | |
| 2008/0100456 A1 | 5/2008 | Downie et al. | |
| 2008/0130244 A1 | 6/2008 | Morris | |
| 2008/0175550 A1 | 7/2008 | Coburn et al. | |
| 2008/0175552 A1* | 7/2008 | Smrha et al. | 385/135 |
| 2008/0285240 A1 | 11/2008 | Klein et al. | |
| 2009/0097846 A1 | 4/2009 | Kozischek et al. | |
| 2009/0166404 A1 | 7/2009 | German et al. | |
| 2009/0232455 A1 | 9/2009 | Nhep | |
| 2010/0000758 A1 | 1/2010 | Bravo et al. | |
| 2010/0005211 A1 | 1/2010 | Wen et al. | |
| 2010/0086275 A1 | 4/2010 | Krampotich et al. | |
| 2010/0172087 A1 | 7/2010 | Jeffery et al. | |
| 2010/0211664 A1 | 8/2010 | Raza et al. | |
| 2010/0211665 A1 | 8/2010 | Raza et al. | |
| 2010/0211697 A1 | 8/2010 | Raza et al. | |
| 2010/0215049 A1 | 8/2010 | Raza et al. | |
| 2010/0310225 A1 | 12/2010 | Anderson et al. | |
| 2011/0228473 A1 | 9/2011 | Anderson et al. | |
| 2011/0267794 A1 | 11/2011 | Anderson et al. | |
| 2012/0113613 A1 | 5/2012 | Anderson et al. | |

OTHER PUBLICATIONS

*Avaya's Enhanced SYSTIMAX® iPatch System Enables IT Managers to Optimise Network Efficiency and Cut Downtime*, Press Release, May 20, 2003, obtained from http://www.avaya.com/usa/about-avaya/newsroom/news-releases/2003/pr-030520 on Jan. 7, 2009.
*Fiber Breakout Bay Cable Routing Guide*, ADC Telecommunications, Inc., ADCP-90-329, Issue 1, May 2002 (8 pages).

(56) References Cited

OTHER PUBLICATIONS

FOCIS 10—Fiber Optic Connector Intermateability Standard—Type LC, TIA/EIA-604-10A, 38 pages (Mar. 2002).
*IntellaPatch™ 100/1000 Ethernet Fiber Optic Blade*, Apcon, Inc., © 2006 (2 pages).
*Intelligent patching systems carving out a 'large' niche*, Cabling Installation & Maintenance, vol. 12, Issue 7, Jul. 2004 (5 pages).
*intelliMAC: The intelligent way to make Moves, Adds or Changes!* NORDX/CDT © 2003 (6 pages).
International Search Report and Written Opinion mailed Jun. 6, 2011 in related Application No. PCT/US2011/024626 (8 pages).
International Search Report and Written Opinion mailed Oct. 7, 2011 in related Application No. PCT/US2011/024623 (15 pages).
International Search Report and Written Opinion mailed Oct. 18, 2011 in related Application No. PCT/US2011/024630 (21 pages).
International Search Report and Written Opinion mailed Nov. 21, 2011 in related Application No. PCT/US2011/024635 (15 pages).
Meredith, L., "Managers missing point of intelligent patching," *Daa Center News*, Jun. 21, 2005, obtained Dec. 2, 2008 from http://searchdatacenter.techtarget.com/news/article/0,289142,sid80_gci1099991,00.html.
Notice of Allowance from U.S. Appl. No. 13/025,750, mailed May 15, 2014.
Notice of Allowance from U.S. Appl. No. 13/025,730, mailed Jun. 18, 2014.
Office Action from U.S. Appl. No. 13/025,730 mailed Feb. 6, 2014.
Office Action from U.S. Appl. No. 13/025,743 mailed Feb. 7, 2013.
Office Action from U.S. Appl. No. 13/025,743 mailed Aug. 2, 2013.
Office Action from U.S. Appl. No. 13/025,743 mailed Oct. 11, 2013.
Office Action from U.S. Appl. No. 13/025,743 mailed Feb. 12, 2014.
Office Action from U.S. Appl. No. 13/025,743 mailed Jun. 13, 2014.
Office Action from U.S. Appl. No. 13/025,750 mailed Jan. 13, 2014.
Partial International Search and Invitation to Pay Additional Fees mailed Jun. 6, 2011 in related Application No. PCT/US2011/024623 (7 pages).
Partial International Search and Invitation to Pay Additional Fees mailed Jun. 30, 2011 in related Application No. PCT/US2011/024630 (7 pages).
Partial International Search and Invitation to Pay Additional Fees mailed Aug. 8, 2011 in related Application No. PCT/US2011/024635 (6 pages).
Restriction Requirement from U.S. Appl. No. 13/025,730 mailed Apr. 11, 2013.
Restriction Requirement from U.S. Appl. No. 13/025,730 mailed Sep. 16, 2013.
Restriction Requirement from U.S. Appl. No. 13/025,750 mailed Sep. 23, 2013.
*SYSTIMAX® iPatch System Wins Platinum Network of the Year Award*, Press Release, Jan. 30, 2003, obtained from http://www.avaya.com/usa/about-avaya/newsroom/news-releases/2003/pr-030130a on Jan. 7, 2009.
TrueNet; TFP Series Rack Mount Fiber Panels, Spec Sheet; May 2008; 8 pages.

\* cited by examiner

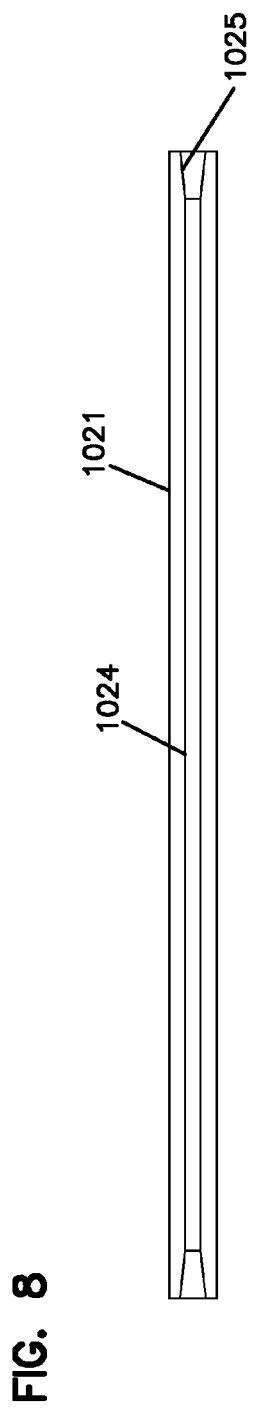
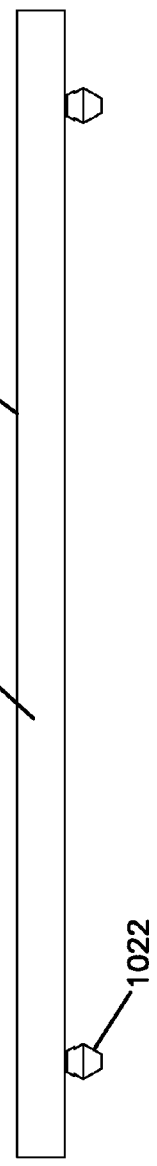
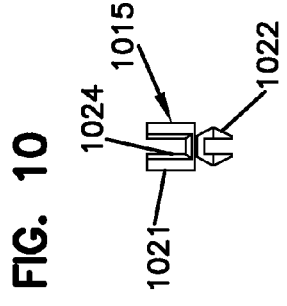
FIG. 8
FIG. 9
FIG. 10

COMMUNICATIONS BLADED PANEL SYSTEMS

CROSS REFERENCE TO RELATED APPLICATIONS

This application is a continuation of application Ser. No. 13/025,737, filed Feb. 11, 2011, now issued as U.S. Pat. No. 8,934,253, application claims the benefit of provisional application Ser. No. 61/303,948, filed Feb. 12, 2010, titled "Bladed Communications System;" U.S. Provisional Application No. 61/413,844, filed Nov. 15, 2010, titled "Communications Bladed Panel Systems;" and U.S. Provisional Application No. 61/439,693, filed Feb. 4, 2011, titled "Communications Bladed Panel Systems," which applications are incorporated herein by reference in their entirety.

BACKGROUND

In communications infrastructure installations, a variety of communications devices can be used for switching and connecting communications signal transmission paths in a communications network. Some such communications devices are installed in one or more equipment racks to permit organized, high-density installations to be achieved in limited space available for equipment.

Installing a large number of connections in an equipment rack is efficient with respect to floor space, but places a premium on the ability to manage and maintain the communications cables leading to and away from these equipment racks. Further, due to the increasing demand for communications system capacity, it is desirable to increase the density of connections within a given space that can be achieved.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to communications panels which provide a higher density of connections within a given floor space, provide improved cable management structures, and provide physical layer management capabilities. One or more communications devices for providing such connections can be bundled into compact operational units, known as blades.

One aspect of the present disclosure relates to a communications panel system including one or more blades mounted to a chassis.

In some implementations, the blades are configured to move separately relative to the chassis.

In some implementations, the blades are each configured to provide physical layer information (PLI) functionality and physical layer management (PLM) functionality.

BRIEF DESCRIPTION OF THE DRAWINGS

The accompanying drawings, which are incorporated in and constitute a part of the description, illustrate several aspects of the present disclosure. A brief description of the drawings is as follows:

FIGS. 4-24 provide an example connector assembly implemented as a bladed panel system configured to support PLI functionality as well as PLM functionality in accordance with aspects of the present disclosure.

DETAILED DESCRIPTION

Figure 1:
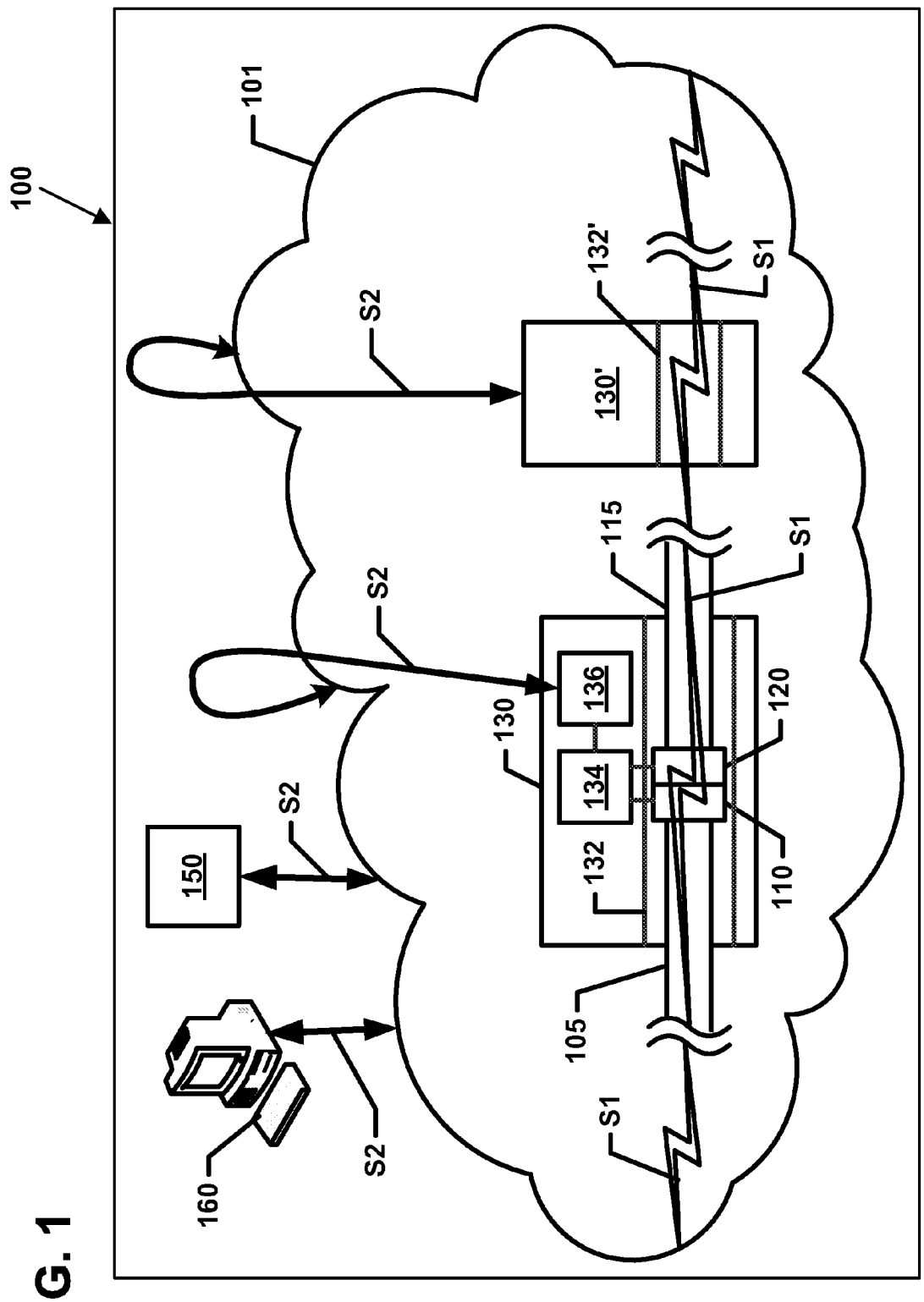
FIG. 1 is a diagram of a portion of an example communications and data management system in accordance with aspects of the present disclosure.

The present disclosure is directed to bladed distribution panel systems for use in communications networks. The bladed distribution panel systems include one or more bladed distribution modules that are configured to connect together two or more cables. Certain types of bladed distribution modules include one or more first cable ports at which terminated ends of first cables (e.g., patch cables) can be plugged and one or more second cable ports at which terminated ends of second cables (e.g., distribution cables) can be plugged. Opposite ends of the first cables can connect together ports of two or more bladed distribution modules. Opposite ends of the second cables can connect the bladed distribution modules to a larger communications network as will be described in more detail herein. Communications signals pass through the bladed distribution modules between the first cables and the second cables.

In addition, PLI (physical layer information) cables also may be routed to the bladed distribution modules. In accordance with some aspects, the PLI cables may provide power (e.g., electrical power) to the bladed distribution modules. In accordance with other aspects, the PLI cables may carry additional data signals between the bladed distribution modules and a data network as will be described in more detail herein. In certain implementations, the data network is different from the communications network to which the second cables connect.

As the term is used herein, a "cable" refers to a physical medium that is capable of carrying one or more data signals along its length. Non-limiting examples of suitable cables include fiber cables, electrical cables, and hybrid cables. For example, a fiber optic cable includes one or more optical fibers that are configured to carry optical signals along their length. The fibers in a fiber optic cable may be buffered and/or jacketed (e.g., individually or as a group). Certain types of fiber optic cables may be terminated with one or more connectors (e.g., SC, LC, FC, LX.5, or MPO connectors).

An electrical cable includes one or more conductors (e.g., wires) that are configured to carry electrical signals along their length. The conductors in an electrical cable may be insulated (e.g., individually or as a group). Non-limiting examples of electrical cables include CAT-5, 6, and 7 twisted-pair cables, DS1 line, and DS3 line. Certain types of electrical cables may be terminated with one or more connectors or connector assemblies (e.g., RJ jacks and plugs, DSX jacks and plugs, BNC connectors, F connectors, punch-down terminations, or bantam jacks and plugs). A hybrid cable includes a combination of one or more wires and one or more optical fibers that may be insulated/jacketed.

Reference will now be made in detail to exemplary aspects of the present disclosure that are illustrated in the accompanying drawings. Wherever possible, the same reference numbers will be used throughout the drawings to refer to the same or like parts.

FIG. 1 is a diagram of a portion of an example communications and data management system 100. The example system 100 shown in FIG. 1 includes a part of a communications network 101 along which communications signals S1 pass. In one example implementation, the network 101 can include an Internet Protocol network. In other implementations, however, the communications network 101 may include other types of networks.

The communications network 101 includes connected network components (e.g., connector assemblies, inter-networking devices, internet working devices, servers, outlets, and end user equipment (e.g., computers)). In one example implementation, communications signals S1 pass from a computer, to a wall outlet, to a port of communication panel, to a first port of an inter-networking device, out another port of the inter-networking device, to a port of the same or another communications panel, to a rack mounted server. In other implementations, the communications signals S1 may follow other paths within the communications network 101.

The portion of the communications network 101 shown in FIG. 1 includes first and second connector assemblies 130, 130' at which communications signals S1 pass from one portion of the communications network 101 to another portion of the communications network 101. Non-limiting examples of connector assemblies 130, 130' include, for example, rack-mounted connector assemblies (e.g., patch panels, distribution units, and media converters for fiber and copper physical communication media), wall-mounted connector assemblies (e.g., boxes, jacks, outlets, and media converters for fiber and copper physical communication media), and inter-networking devices (e.g., switches, routers, hubs, repeaters, gateways, and access points).

In the example shown, the first connector assembly 130 defines at least one port 132 configured to communicatively couple at least a first media segment (e.g., cable) 105 to at least a second media segment (e.g., cable) 115 to enable the communication signals S1 to pass between the media segments 105, 115. The at least one port 132 of the first connector assembly 130 may be directly connected to a port 132' of the second connector assembly 130'. As the term is used herein, the port 132 is directly connected to the port 132' when the communications signals S1 pass between the two ports 132, 132' without passing through an intermediate port. For example, plugging a first terminated end of a patch cable into the port 132 and a second terminated end of the patch cable into the port 132' directly connects the ports 132, 132'.

The port 132 of the first connector assembly 130 also may be indirectly connected to the port 132' of the second connector assembly 130'. As the term is used herein, the port 132 is indirectly connected to the port 132' when the communications signals S1 pass through an intermediate port when traveling between the ports 132, 132'. For example, in one implementation, the communications signals S1 may be routed over one media segment from the port 132 at the first connector assembly 130, to a port of a third connector assembly at which the media segment is coupled, to another media segment that is routed from the port of the third connector assembly to the port 132' of the second connector assembly 130'.

Non-limiting examples of media segments include optical cables, electrical cables, and hybrid cables. The media segments may be terminated with electrical plugs, electrical jacks, fiber optic connectors, fiber optic adapters, media converters, or other termination components. In the example shown, each media segment 105, 115 is terminated at a plug or connector 110, 120, respectively, which is configured to communicatively connect the media segments 105, 115. For example, in one implementation, the port 132 of the connector assembly 130 can be configured to align ferrules of two fiber optic connectors 110, 120. In another implementation, the port 132 of the connector assembly 130 can be configured to electrically connect an electrical plug with an electrical socket (e.g., a jack). In yet another implementation, the port 132 can include a media converter configured to connect an optical fiber to an electrical conductor.

In accordance with some aspects, the connector assembly 130 does not actively manage (e.g., is passive with respect to) the communications signals S1 passing through port 132. For example, in some implementations, the connector assembly 130 does not modify the communications signal S1 carried over the media segments 105, 115. Further, in some implementations, the connector assembly 130 does not read, store, or analyze the communications signal S1 carried over the media segments 105, 115.

In accordance with aspects of the disclosure, the communications and data management system 100 also provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system 100. In accordance with some aspects, physical layer information of the communications system 100 can include media information, device information, and location information.

As the term is used herein, "media information" refers to physical layer information pertaining to cables, plugs, connectors, and other such physical media. In accordance with some aspects, the media information is stored on or in the physical media, themselves. In accordance with other aspects, the media information can be stored at one or more data repositories for the communications system, either alternatively or in addition to the media, themselves.

Non-limiting examples of media information include a part number, a serial number, a plug or other connector type, a conductor or fiber type, a cable or fiber length, cable polarity, a cable or fiber pass-through capacity, a date of manufacture, a manufacturing lot number, information about one or more visual attributes of physical communication media (e.g., information about the color or shape of the physical communication media or an image of the physical communication media), and an insertion count (i.e., a record of the number of times the media segment has been connected to another media segment or network component). Media information also can include testing or media quality or performance information. The testing or media quality or performance information, for example, can be the results of testing that is performed when a particular segment of media is manufactured.

As the term is used herein, "device information" refers to physical layer information pertaining to the communications panels, inter-networking devices, media converters, computers, servers, wall outlets, and other physical communications devices to which the media segments attach. In accordance with some aspects, the device information is stored on or in the devices, themselves. In accordance with other aspects, the device information can be stored at one or more data repositories for the communications system, either alternatively or in addition to the devices, themselves. In accordance with still other aspects, the device information can be stored in the media segments attached thereto. Non-limiting examples of device information include a device identifier, a device type, port priority data (that associates a priority level with each port), and port updates (described in more detail herein).

As the term is used herein, "location information" refers to physical layer information pertaining to a physical layout of a building or buildings in which the network 101 is deployed. Location information also can include information indicating where each communications device, media segment, network component, or other component is physically located within the building. In accordance with some aspects, the location information of each system component is stored on or in the respective component. In accordance with other aspects, the location information can be stored at one or more data repositories for the communications system, either alternatively or in addition to the system components, themselves.

In accordance with some aspects, one or more of the components of the communications network 101 are configured to store physical layer information pertaining to the component as will be disclosed in more detail herein. In FIG. 1, the connectors 110, 120, the media segments 105, 115, and/or the connector assemblies 130, 130' may store physical layer information. For example, in FIG. 1, each connector 110, 120 may store information pertaining to itself (e.g., type of connector, data of manufacture, etc.) and/or to the respective media segment 105, 115 (e.g., type of media, test results, etc.).

In another example implementation, the media segments 105, 115 or connectors 110, 120 may store media information that includes a count of the number of times that the media segment (or connector) has been inserted into port 132. In such an example, the count stored in or on the media segment is updated each time the segment (or plug or connector) is inserted into port 132. This insertion count value can be used, for example, for warranty purposes (e.g., to determine if the connector has been inserted more than the number of times specified in the warranty) or for security purposes (e.g., to detect unauthorized insertions of the physical communication media).

One or more of the components of the communications network 101 can read the physical layer information from one or more media segments retained thereat. In certain implementations, one or more network components includes a media reading interface that is configured to read physical layer information stored on or in the media segments or connectors attached thereto. For example, in one implementation, the connector assembly 130 includes a media reading interface 134 that can read media information stored on the media cables 105, 115 retained within the port 132. In another implementation, the media reading interface 134 can read media information stored on the connectors or plugs 110, 120 terminating the cables 105, 115, respectively.

In accordance with some aspects of the disclosure, the physical layer information read by a network component may be processed or stored at the component. For example, in certain implementations, the first connector assembly 130 shown in FIG. 1 is configured to read physical layer information stored on the connectors 110, 120 and/or on the media segments 105, 115 using media reading interface 134. Accordingly, in FIG. 1, the first connector assembly 130 may store not only physical layer information about itself (e.g., the total number of available ports at that assembly 130, the number of ports currently in use, etc.), but also physical layer information about the connectors 110, 120 inserted at the ports and/or about the media segments 105, 115 attached to the connectors 110, 120.

The physical layer information obtained by the media reading interface may be communicated (see PLI signals S2) over the network 101 for processing and/or storage. In accordance with some aspects, the communications network 101 includes a data network (e.g., see network 218 of FIG. 2) along which the physical layer information is communicated. At least some of the media segments and other components of the data network may be separate from those of the communications network 101 to which such physical layer information pertains. For example, in some implementations, the first connector assembly 130 may include a plurality of "normal" ports (e.g., fiber optic adapter ports) at which connectorized media segments (e.g., optical fibers) are coupled together to create a path for communications signals S1. The first connector assembly 130 also may include one or more PLI ports 136 at which the physical layer information (see PLI signals S2) are passed to components of the data network (e.g., to one or more aggregation points 150 and/or to one or more computer systems 160).

In other implementations, however, the physical layer information may be communicated over the communications network 101 just like any other signal, while at the same time not affecting the communication signals S1 that pass through the connector assembly 130 on the normal ports 132. Indeed, in some implementations, the physical layer information may be communicated as one or more of the communication signals S1 that pass through the normal ports 132 of the connector assemblies 130, 130'. For example, in one implementation, a media segment may be routed between the PLI port 136 and one of the "normal" ports 132. In another implementation, the media segment may be routed between the PLI port 136 and a "normal" port of another connector assembly. In such implementations, the physical layer information may be passed along the communications network 101 to other components of the communications network 101 (e.g., to another connector assembly, to one or more aggregation points 150 and/or to one or more computer systems 160). By using the network 101 to communicate physical layer information pertaining to it, an entirely separate data network need not be provided and maintained in order to communicate such physical layer information.

For example, in the implementation shown in FIG. 1, each connector assembly 130 includes at least one PLI port 136 that is separate from the "normal" ports 132 of the connector assembly 130. Physical layer information is communicated between the connector assembly 130 and the communications network 101 through the PLI port 136. Components of the communications network 101 may be connected to one or more aggregation devices 150 and/or to one or more computing systems 160. In the example shown in FIG. 1, the connector assembly 130 is connected to a representative aggregation device 150, a representative computing system 160, and to other components of the network 101 (see looped arrows) via the PLI port 136.

In some implementations, some types of physical layer information pertaining to media segments can be obtained by the connector assembly 130 from a user at the connector assembly 130 via a user interface (e.g., a keypad, a scanner, a touch screen, buttons, etc.). For example, physical layer information pertaining to media that is not configured to store such information can be entered manually into the connector assembly 130 by the user. In certain implementations, the connector assembly 130 can provide the physical layer information obtained from the user to other devices or systems that are coupled to the communications network 101 and/or a separate data network.

In other implementations, some or all physical layer information can be obtained by the connector assembly 130 from other devices or systems that are coupled to the communications network 101 and/or a separate data network. For example, physical layer information pertaining to media that is not configured to store such information can be entered manually into another device or system (e.g., at the connector assembly 130, at the computer 160, or at the aggregation point 150) that is coupled to the network 101 and/or a separate data network.

In some implementations, some types of non-physical layer information (e.g., network information) also can be obtained by one network component (e.g., a connector assembly 130, an aggregation point 150, or a computer 160) from other devices or systems that are coupled to the communications network 101 and/or a separate data network. For example, the connector assembly 130 may pull non-physical layer information from one or more components of the network 101. In other implementations, the non-physical layer information can be obtained by the connector assembly 130 from a user at the connector assembly 130.

In some implementations, the connector assembly 130 is configured to modify (e.g., add, delete, and/or change) the physical layer information stored in or on the segment of physical communication media 105, 115 (i.e., or the associated connectors 110, 120). For example, in some implementations, the media information stored in or on the segment of physical communication media 105, 115 can be updated to include the results of testing that is performed when a segment of physical media is installed or otherwise checked. In other implementations, such testing information is supplied to the aggregation point 150 for storage and/or processing. The modification of the physical layer information does not affect the communications signals S1 passing through the connector assembly 130.

Figure 2:
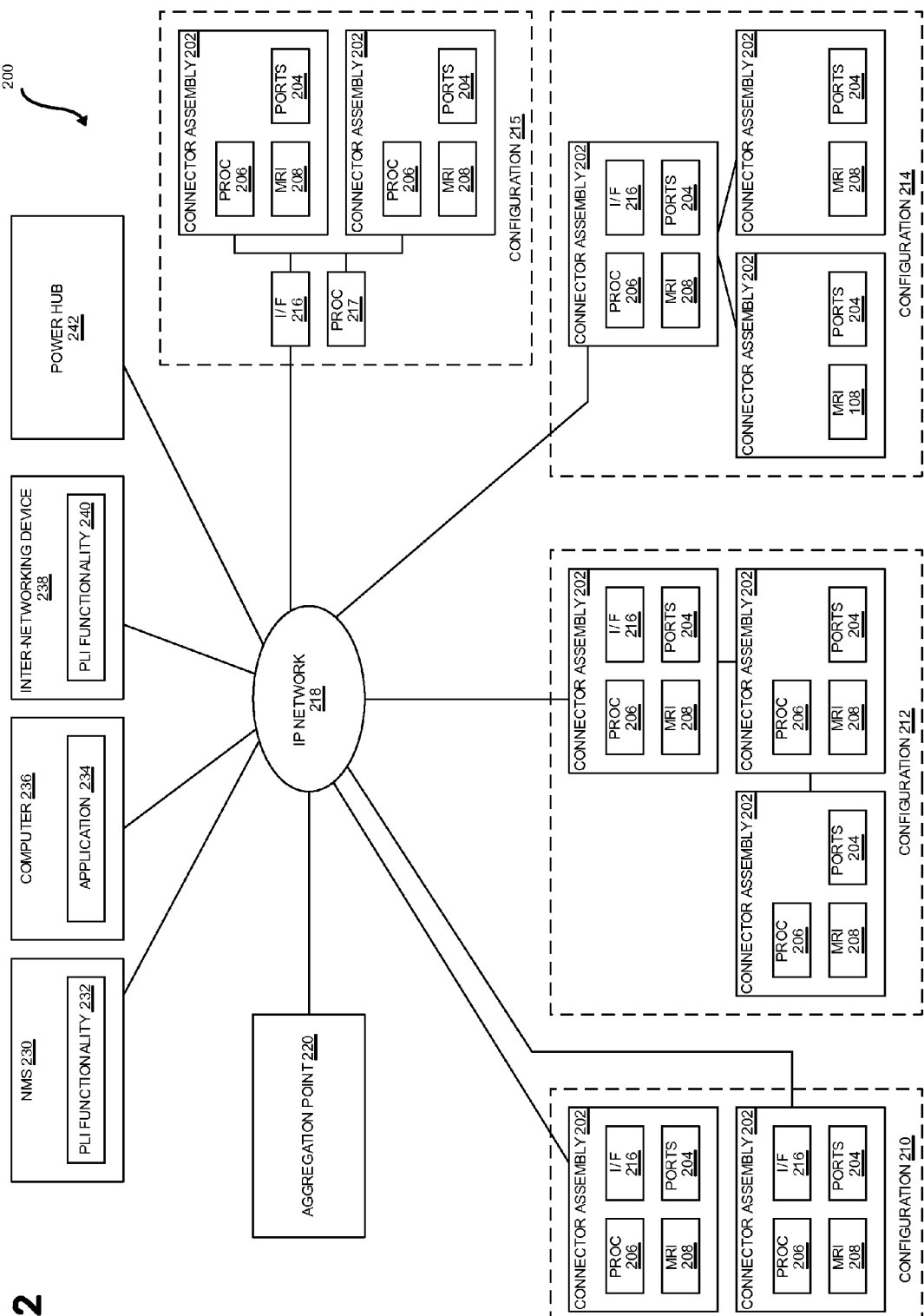
FIG. 2 is a block diagram of one implementation of a communications management system that includes PLI functionality as well as PLM functionality in accordance with aspects of the present disclosure.

FIG. 2 is a block diagram of one example implementation of a communications management system 200 that includes PLI functionality as well as PLM functionality. The management system 200 comprises a plurality of connector assemblies 202. The management system 200 includes one or more connector assemblies 202 connected to an IP network 218. The connector assemblies 202 shown in FIG. 2 illustrate various example implementations of the connector assemblies 130, 30' of FIG. 1.

Each connector assembly 202 includes one or more ports 204, each of which is used to connect two or more segments of physical communication media to one another (e.g., to implement a portion of a logical communication link for communication signals S1 of FIG. 1). At least some of the connector assemblies 202 are designed for use with segments of physical communication media that have physical layer information stored in or on them. The physical layer information is stored in or on the segment of physical communication media in a manner that enables the stored information, when the segment is attached to a port 204, to be read by a programmable processor 206 associated with the connector assembly 202.

Each programmable processor 206 is configured to execute software or firmware that causes the programmable processor 206 to carry out various functions described below. Each programmable processor 206 also includes suitable memory (not shown) that is coupled to the programmable processor 206 for storing program instructions and data. In general, the programmable processor 206 determines if a physical communication media segment is attached to a port 204 with which that processor 206 is associated and, if one is, to read the identifier and attribute information stored in or on the attached physical communication media segment (if the segment includes such information stored therein or thereon) using the associated media reading interface 208. In some implementations, the programmable processor 206 does not modify, monitor, or otherwise interact with communications signals propagating over the media segments. In certain implementations, the programmable processor 206 is isolated from the signals carried over the media segments.

In some implementations, each of the ports 204 of the connector assemblies 202 comprises a respective media reading interface 208 via which the respective programmable processor 206 is able to determine if a physical communication media segment is attached to that port 204 and, if one is, to read the physical layer information stored in or on the attached segment (if such media information is stored therein or thereon). In other implementations, a single media reading interface 208 may correspond to two or more ports 204. The programmable processor 206 associated with each connector assembly 202 is communicatively coupled to each of the media reading interfaces 208 using a suitable bus or other interconnect (not shown).

In FIG. 2, four example types of connector assembly configurations 210, 212, 214, and 215 are shown. In the first connector assembly configuration 210 shown in FIG. 2, each connector assembly 202 includes its own respective programmable processor 206 and its own respective network interface 216 that is used to communicatively couple that connector assembly 202 to an Internet Protocol (IP) network 218. In some implementations, the ports 204 of the connector assemblies 202 also connect to the IP network 218. In other implementations, however, only the network interfaces 216 couple to the IP network 218.

In the second type of connector assembly configuration 212, a group of connector assemblies 202 are physically located near each other (e.g., in a rack, rack system, or equipment closet). Each of the connector assemblies 202 in the group includes its own respective programmable processor 206. However, in the second connector assembly configuration 212, some of the connector assemblies 202 (referred to here as "interfaced connector assemblies") include their own respective network interfaces 216 while some of the connector assemblies 202 (referred to here as "non-interfaced connector assemblies") do not. The non-interfaced connector assemblies 202 are communicatively coupled to one or more of the interfaced connector assemblies 202 in the group via local connections. In this way, the non-interfaced connector assemblies 202 are communicatively coupled to the IP network 218 via the network interface 216 included in one or more of the interfaced connector assemblies 202 in the group. In the second type of connector assembly configuration 212, the total number of network interfaces 216 used to couple the connector assemblies 202 to the IP network 218 can be reduced. Moreover, in the particular implementation shown in FIG. 2, the non-interfaced connector assemblies 202 are connected to the interfaced connector assembly 202 using a daisy chain topology (though other topologies can be used in other implementations and embodiments).

In the third type of connector assembly configuration 214, a group of connector assemblies 202 are physically located near each other (e.g., within a rack, rack system, or equipment closet). Some of the connector assemblies 202 in the group (also referred to here as "master" connector assemblies 202) include both their own programmable processors 206 and network interfaces 216, while some of the connector assemblies 202 (also referred to here as "slave" connector assemblies 202) do not include their own programmable processors 206 or network interfaces 216. Each of the slave connector assemblies 202 is communicatively coupled to one or more of the master connector assemblies 202 in the group via one or more local connections. The programmable processor 206 in each of the master connector assemblies 202 is able to carry out the PLM functions for both the master connector assembly 202 of which it is a part and any slave connector assemblies 202 to which the master connector assembly 202 is connected via the local connections. As a result, the cost associated with the slave connector assemblies 202 can be reduced. In the particular implementation shown in FIG. 2, the slave connector assemblies 202 are connected to a master connector assembly 202 in a star topology (though other topologies can be used in other implementations and embodiments).

In the fourth type of connector assembly configuration 215, a group of connector assemblies (e.g., distribution modules) 202 are housed within a common chassis or other enclosure. Each of the connector assemblies 202 in the configuration 215 includes their own programmable processors 206. In the context of this configuration 215, the programmable processors 206 in the connector assemblies 202 are "slave" processors 206. Each of the slave programmable processors 206 in the group is communicatively coupled to a common "master" programmable processor 217 (e.g., over a backplane included in the chassis or enclosure). The master programmable processor 217 is coupled to a network interface 216 that is used to communicatively couple the master programmable processor 217 to the IP network 218.

In the fourth configuration 215, each slave programmable processor 206 is configured to manage the media reading interfaces 208 to determine if physical communication media segments are attached to the port 204 and to read the physical layer information stored in or on the attached physical communication media segments (if the attached segments have such information stored therein or thereon). The physical layer information is communicated from the slave programmable processor 206 in each of the connector assemblies 202 in the chassis to the master processor 217. The master processor 217 is configured to handle the processing associated with communicating the physical layer information read from by the slave processors 206 to devices that are coupled to the IP network 218.

In accordance with some aspects, the communications management system 200 includes functionality that enables the physical layer information captured by the connector assemblies 202 to be used by application-layer functionality outside of the traditional physical-layer management application domain. That is, the physical layer information is not retained in a PLM "island" used only for PLM purposes but is instead made available to other applications. For example, in the particular implementation shown in FIG. 2, the management system 200 includes an aggregation point 220 that is communicatively coupled to the connector assemblies 202 via the IP network 218.

The aggregation point 220 includes functionality that obtains physical layer information from the connector assemblies 202 (and other devices) and stores the physical layer information in a data store. The aggregation point 220 can be used to receive physical layer information from various types of connector assemblies 202 that have functionality for automatically reading information stored in or on the segment of physical communication media. Also, the aggregation point 220 and aggregation functionality 224 can be used to receive physical layer information from other types of devices that have functionality for automatically reading information stored in or on the segment of physical communication media. Examples of such devices include end-user devices—such as computers, peripherals (e.g., printers, copiers, storage devices, and scanners), and IP telephones—that include functionality for automatically reading information stored in or on the segment of physical communication media.

The aggregation point 220 also can be used to obtain other types of physical layer information. For example, in this implementation, the aggregation point 220 also obtains information about physical communication media segments that is not otherwise automatically communicated to an aggregation point 220. This information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The aggregation point 220 also includes functionality that provides an interface for external devices or entities to access the physical layer information maintained by the aggregation point 220. This access can include retrieving information from the aggregation point 220 as well as supplying information to the aggregation point 220. In this implementation, the aggregation point 220 is implemented as "middleware" that is able to provide such external devices and entities with transparent and convenient access to the PLI maintained by the access point 220. Because the aggregation point 220 aggregates PLI from the relevant devices on the IP network 218 and provides external devices and entities with access to such PLI, the external devices and entities do not need to individually interact with all of the devices in the IP network 218 that provide PLI, nor do such devices need to have the capacity to respond to requests from such external devices and entities.

For example, as shown in FIG. 2, a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. In certain implementations, the NMS 230 communicates with the aggregation point 220 over the IP network 218. In other implementations, the NMS 230 may be directly connected to the aggregation point 220.

As shown in FIG. 2, an application 234 executing on a computer 236 also can use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

In the example shown in FIG. 2, one or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

The aggregation point 220 can be implemented on a standalone network node (e.g., a standalone computer running appropriate software) or can be integrated along with other network functionality (e.g., integrated with an element management system or network management system or other network server or network element). Moreover, the functionality of the aggregation point 220 can be distribute across many nodes and devices in the network and/or implemented, for example, in a hierarchical manner (e.g., with many levels of aggregation points). The IP network 218 can include one or more local area networks and/or wide area networks (e.g., the Internet). As a result, the aggregation point 220, NMS 230, and computer 236 need not be located at the same site as each other or at the same site as the connector assemblies 202 or the inter-networking devices 238.

Also, power can be supplied to the connector assemblies 202 using conventional "Power over Ethernet" techniques specified in the IEEE 802.3af standard, which is hereby incorporated herein by reference. In such an implementation, a power hub 242 or other power supplying device (located near or incorporated into an inter-networking device that is coupled to each connector assembly 202) injects DC power onto one or more power cables (e.g., a power wire included in a copper twisted-pair cable) used to connect each connector assembly 202 to the IP network 218.

Figure 3:
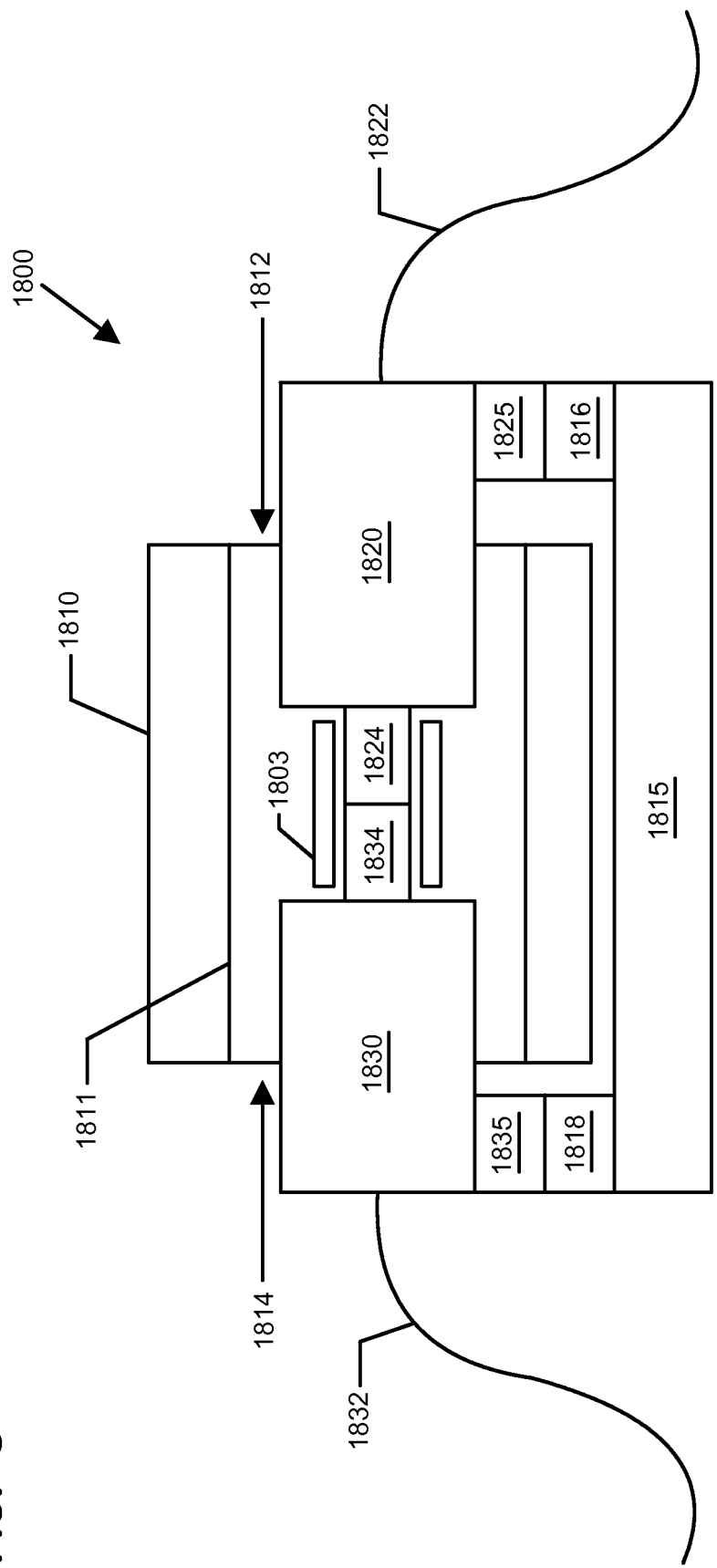
FIG. 3 is a block diagram of one high-level example of a port and media reading interface that are suitable for use in the management system of FIG. 2 in accordance with aspects of the present disclosure.

FIG. 3 is a schematic diagram of one example connection system 1800 including a connector assembly 1810 configured to collect physical layer information from at least one segment of physical communications media. The example connector assembly 1810 of FIG. 3 is configured to connect segments of optical physical communications media in a physical layer management system. The connector assembly 1810 includes a fiber optic adapter defining at least one connection opening 1811 having a first port end 1812 and a second port end 1814. A sleeve (e.g., a split sleeve) 1803 is arranged within the connection opening 1811 of the adapter 1810 between the first and second port ends 1812, 1814. Each port end 1812, 1814 is configured to receive a connector arrangement as will be described in more detail herein.

A first example segment of optical physical communication media includes a first optical fiber 1822 terminated by a first connector arrangement 1820. A second example segment of optical physical communication media includes a second optical fiber 1832 terminated by a second connector arrangement 1830. The first connector arrangement 1820 is plugged into the first port end 1812 and the second connector arrangement 1830 is plugged into the second port end 1814. Each fiber connector arrangement 1820, 1830 includes a ferrule 1824, 1834 through which optical signals from the optical fiber 1822, 1832, respectively, pass.

The ferrules 1824, 1834 of the connector arrangements 1820, 1830 are aligned by the sleeve 1803 when the connector arrangements 1820, 1830 are inserted into the connection opening 1811 of the adapter 1810. Aligning the ferrules 1824, 1834 provides optical coupling between the optical fibers 1822, 1832. In some implementations, each segment of optical physical communication media (e.g., each optical fiber 1822, 1832) carries communication signals (e.g., communications signals S1 of FIG. 1). The aligned ferrules 1824, 1834 of the connector arrangements 1820, 1830 create an optical path along which the communication signals (e.g., signals S1 of FIG. 1) may be carried.

In some implementations, the first connector arrangement 1820 may include a storage device 1825 that is configured to store physical layer information (e.g., an identifier and/or attribute information) pertaining to the segment of physical communications media (e.g., the first connector arrangement 1820 and/or the fiber optic cable 1822 terminated thereby). In some implementations, the connector arrangement 1830 also includes a storage device 1835 that is configured to store information (e.g., an identifier and/or attribute information) pertaining to the second connector arrangement 1830 and/or the second optic cable 1832 terminated thereby.

In one implementation, each of the storage devices 1825, 1835 is implemented using an EEPROM (e.g., a PCB surface-mount EEPROM). In other implementations, the storage devices 1825, 1835 are implemented using other non-volatile memory device. Each storage device 1825, 1835 is arranged and configured so that it does not interfere or interact with the communications signals communicated over the media segments 1822, 1832.

In accordance with some aspects, the adapter 1810 is coupled to at least a first media reading interface 1816. In certain implementations, the adapter 1810 also is coupled to at least a second media interface 1818. In some implementations, the adapter 1810 is coupled to multiple media reading interfaces. In certain implementations, the adapter 1810 includes a media reading interface for each port end defined by the adapter 1810. In other implementations, the adapter 1810 includes a media reading interface for each connection opening 1811 defined by the adapter 1810. In still other implementations, the adapter 1810 includes a media reading interface for each connector arrangement that the adapter 1810 is configured to receive. In still other implementations, the adapter 1810 includes a media reading interface for only a portion of the connector arrangement that the adapter 1810 is configured to receive.

In some implementations, at least the first media reading interface 1816 is mounted to a printed circuit board 1815. In the example shown, the first media reading interface 1816 of the printed circuit board 1815 is associated with the first port end 1812 of the adapter 1810. In some implementations, the printed circuit board 1815 also can include the second media reading interface 1818. In one such implementation, the second media reading interface 1818 is associated with the second port end 1814 of the adapter 1810.

The printed circuit board 1815 of the connector assembly 1810 can be communicatively connected to one or more programmable processors (e.g., processors 216 of FIG. 2) and/or to one or more network interfaces (e.g., network interfaces 216 of FIG. 2). In some implementations, the programmable processor does not modify, monitor, or otherwise interact with communications signals propagating over the media segments. The network interface may be configured to send the physical layer information (e.g., see signals S2 of FIG. 1) to a physical layer management network (e.g., see communications network 101 of FIG. 1 or IP network 218 of FIG. 2). In one implementation, one or more such processors and interfaces can be arranged as components on the printed circuit board 1815. In another implementation, one or more such processor and interfaces can be arranged on separate circuit boards that are coupled together. For example, the printed circuit board 1815 can couple to other circuit boards via a card edge type connection, a connector-to-connector type connection, a cable connection, etc.

When the first connector arrangement 1820 is received in the first port end 1812 of the adapter 1810, the first media reading interface 1816 is configured to enable reading (e.g., by the processor) of the information stored in the storage device 1825. The information read from the first connector arrangement 1820 can be transferred through the printed circuit board 1815 to a physical layer management network, e.g., network 101 of FIG. 1, network 218 of FIG. 2, etc. When the second connector arrangement 1830 is received in the second port end 1814 of the adapter 1810, the second media reading interface 1818 is configured to enable reading (e.g., by the processor) of the information stored in the storage device 1835. The information read from the second connector arrangement 1830 can be transferred through the printed circuit board 1815 or another circuit board to the physical layer management network.

In some such implementations, the storage devices 1825, 1835 and the media reading interfaces 1816, 1818 each comprise three (3) leads—a power lead, a ground lead, and a data lead. The three leads of the storage devices 1825, 1835 come into electrical contact with three (3) corresponding leads of the media reading interfaces 1816, 1818 when the corresponding media segment is inserted in the corresponding port. In certain example implementations, a two-line interface is used with a simple charge pump. In still other implementations, additional leads can be provided (e.g., for potential future applications). Accordingly, the storage devices 1825, 1835 and the media reading interfaces 1816, 1818 may each include four (4) leads, five (5) leads, six (6) leads, etc.

FIGS. 4-24 provide an example connector assembly implemented as a first bladed panel system 1000 suitable for mounting to a communications equipment rack. The bladed panel system 1000 includes a chassis 1010 configured to receive one or more communications blades 1100. The bladed panel system 1000 is configured to connect segments of communications media 1200 carrying communications signals (e.g., signals S1 of FIG. 1). For the sake of convenience, media segments 1200 routed to the rear of the chassis 1010 will be referred to herein as "incoming" media segments 1211 (FIG. 17) and the media segments 1200 routed to the front of the chassis 1010 will be referred to herein as "outgoing" media segments 1212 (FIG. 21). However, each media segment 1211, 1212 may carry incoming signals, outgoing signals, or both.

Each blade 1100 includes one or more communications couplers 1150, each coupler defining one or more ports for connecting segments 1211, 1212 of physical communications media, which carry communications signals. In some implementations, each coupler 1150 includes front and rear ports. In accordance with some aspects, the couplers 1150 on an example blade 1100 can include fiber optic adapters for connecting optical fibers. In accordance with other aspects, the couplers 1150 on another example blade 1100 can include communications sockets (e.g., electrical jacks) for connecting electrical plugs (e.g., terminating coaxial cables, twisted pair cables, etc.) to other electrical plugs (e.g., via corresponding sockets), terminated wires (e.g., via insulation displacement contacts), or printed circuit boards (e.g., via contact pins). In accordance with other aspects, the couplers 1150 on an example blade 1100 can include transceivers for managing wireless communications signals. In accordance with still other aspects, however, the couplers 1150 on an example blade 1100 can include some combination of the above couplers or other types of communications couplers.

The example bladed panel system 1000 includes PLI functionality as well as PLM functionality. In accordance with some aspects, the couplers 1150 on each blade 1100 include one or more media reading interfaces that are configured to read physical layer information stored on or in physical media segments 1200. For example, each coupler 1150 can include a media reading interface 1305 that communicatively connects to a storage device 1230 positioned on or in a physical media segment 1200.

Figure 4:
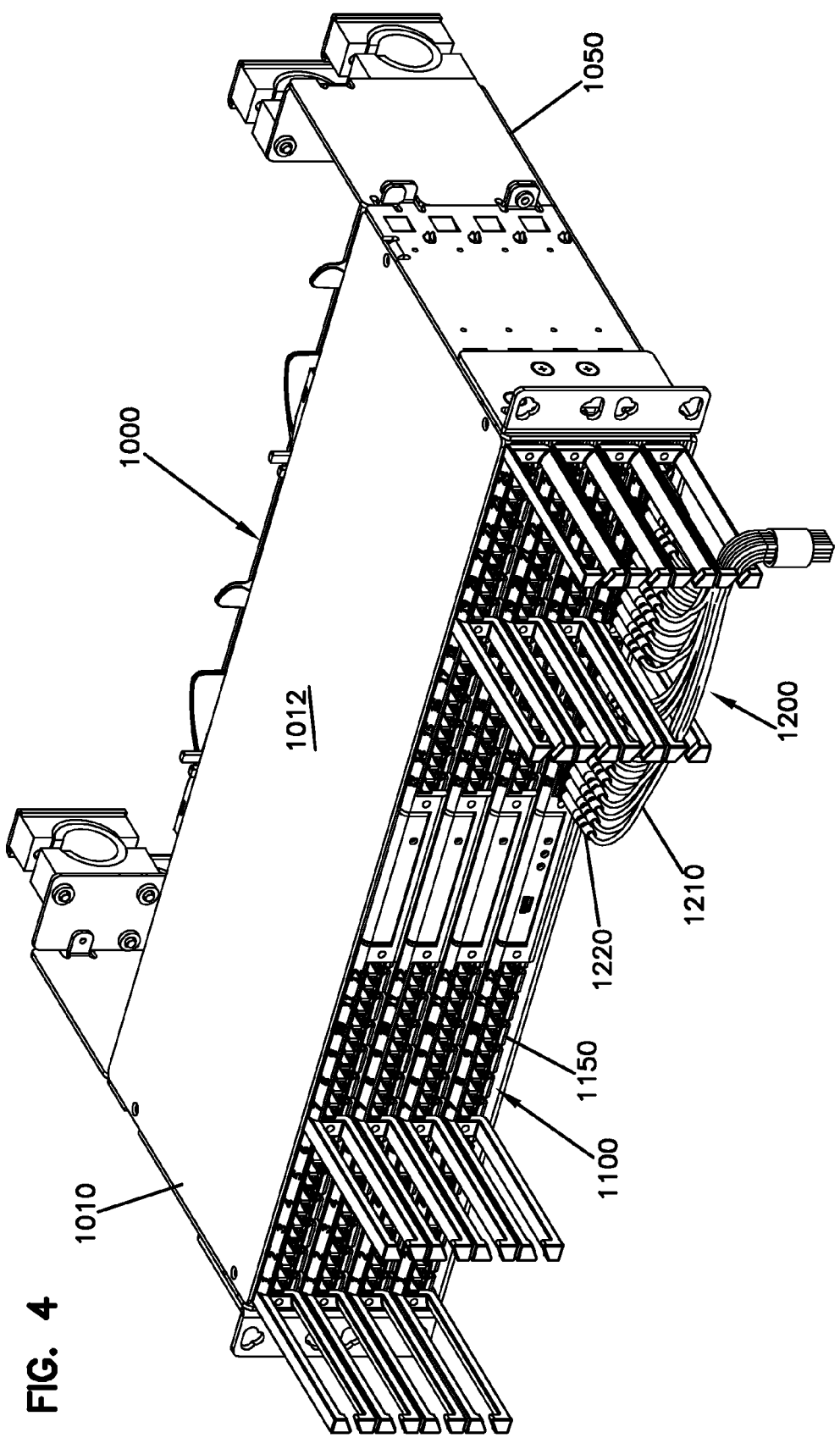
Figure 5:
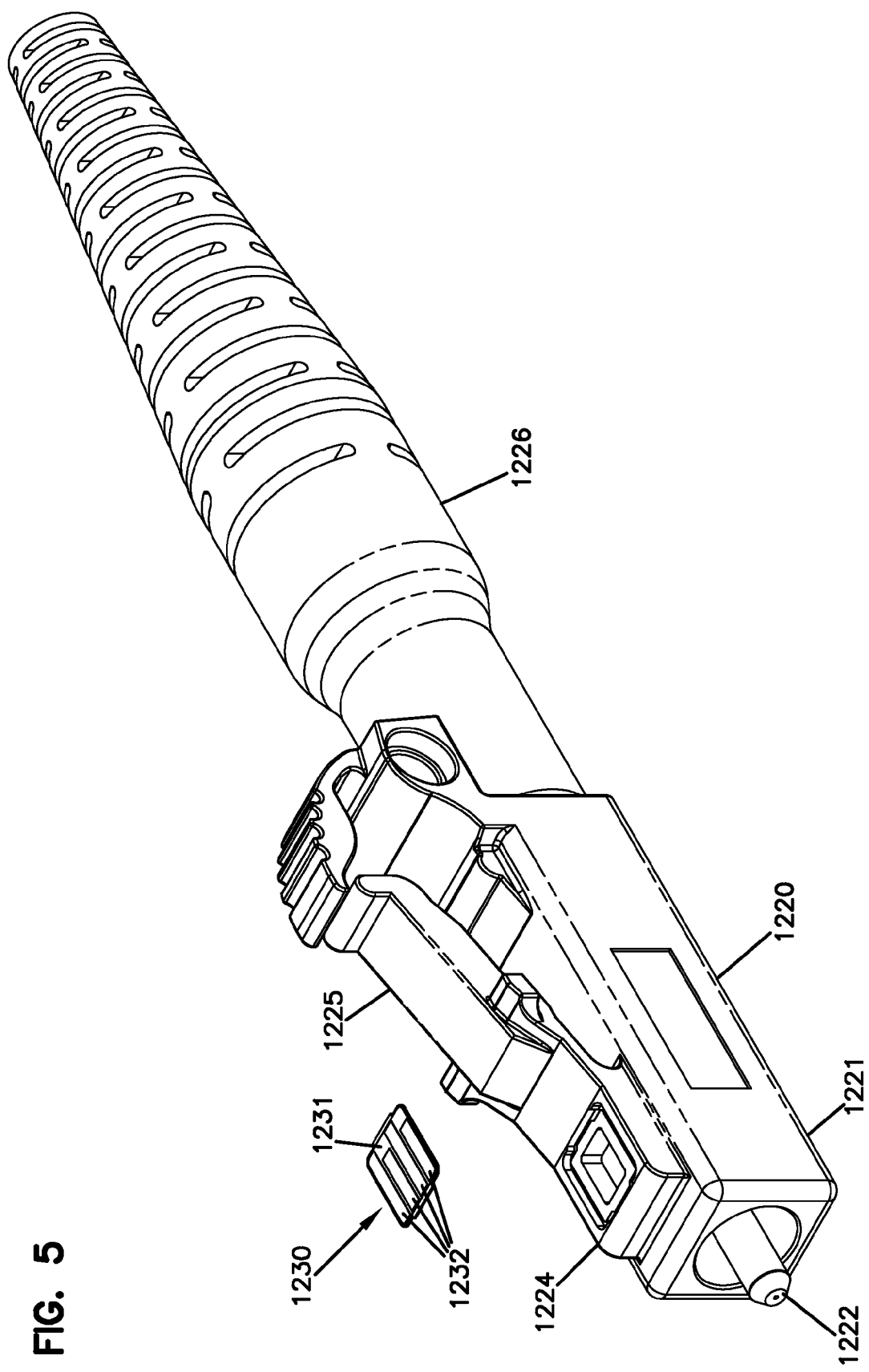
Figure 6:
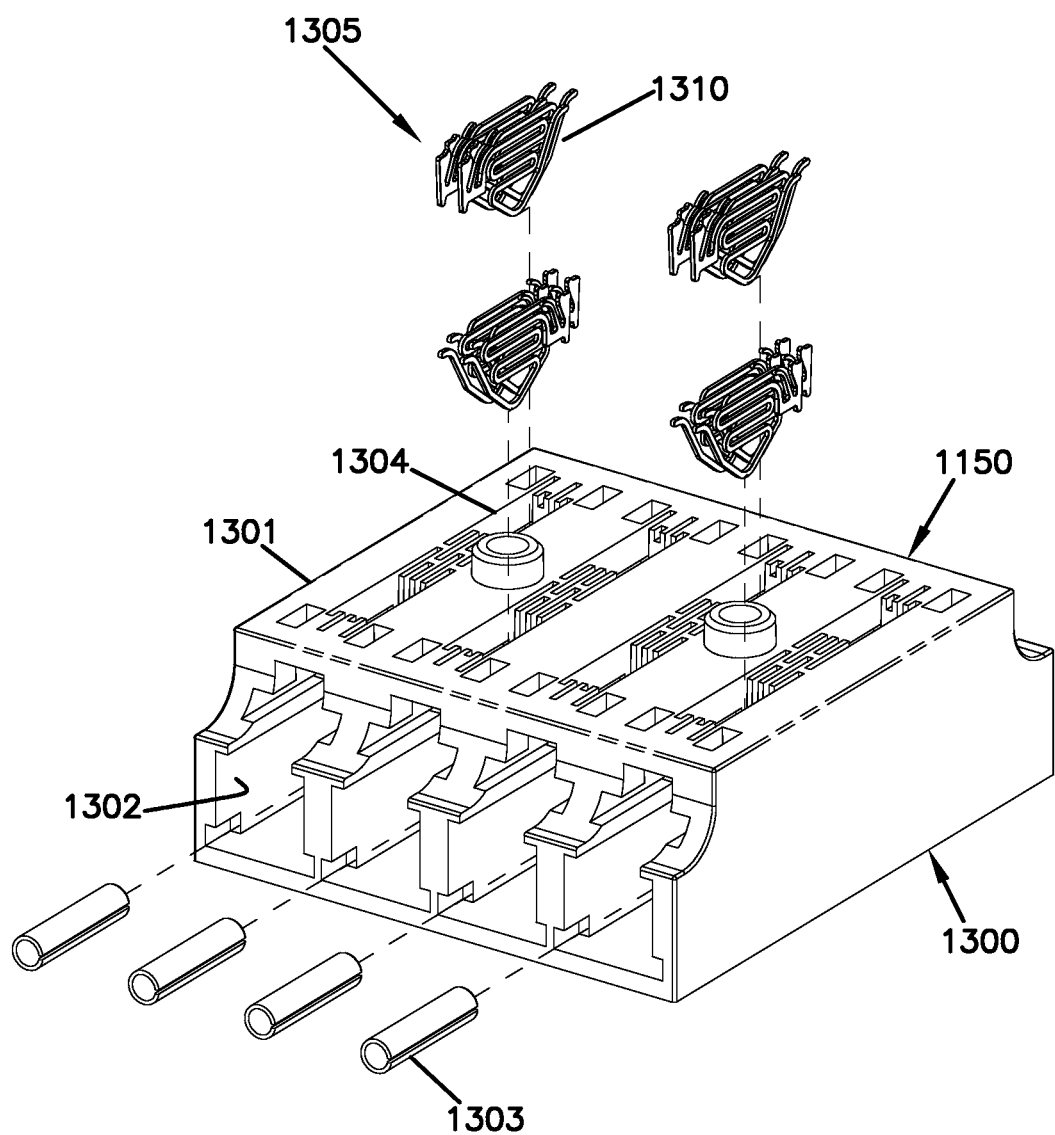

For ease in understanding, one example media segment 1200 including a storage device 1230 storing physical layer information and an example coupler 1150 including a media reading interface 1305 configured to read the physical layer information from the media segment 1200 are discussed are shown in FIGS. 5 and 6, respectively. FIG. 5 shows an example physical media segment 1200 implemented as a fiber optic connector (e.g., an LC-type fiber optic connector) 1220 configured to terminate at least one optical fiber 1210 (FIG. 4). FIG. 6 shows an example coupler 1150 implemented as a fiber optic adapter 1300 that is suitable for receiving media segments, such as the fiber optic connector 1220 of FIG. 5. In other implementations, other types of connectors, plugs, adapters, and sockets can be utilized.

The fiber optic connector 1220 includes a body 1221 enclosing an optical ferrule 1222 through which an optical fiber 1210 extends. The body 1221 also defines a depression or cavity 1224 in which a storage device 1230 can be positioned. In accordance with some implementations, the storage device 1230 includes memory circuitry arranged on a printed circuit board 1231. Electrical contacts 1232 also are arranged on the printed circuit board for interaction with the media reading interface 1305 of the coupler 1150. In one example embodiment, the storage device 1230 includes an EEPROM circuit arranged on the printed circuit board 1231. In other embodiments, however, the storage device 1230 can include any suitable type of non-volatile memory. In the example shown in FIG. 5, the memory circuitry is arranged on the non-visible side of the printed circuit board 1231.

The fiber optic adapter 1300 includes a body 1301 defining at least one port 1302 in which a sleeve 1303 is configured to receive and align the ferrules 1222 of two fiber optic connectors 1220. Accordingly, communications data signals (e.g., signals S1 of FIG. 1) carried by an optical fiber terminated by a first of the fiber optic connectors 1220 can be transmitted to an optical fiber terminated by a second of the fiber optic connectors 1220.

In some example implementations, the fiber optic adapter 1300 can define a single port 1302 that is configured to optically couple together two fiber optic connectors 1220. In other example implementations, the fiber optic adapter 1300 can define multiple (e.g., two, three, four, eight, twelve, etc.) ports 1302 that are each configured to optically couple together two fiber optic connectors 1220. In other example implementations, each port 1302 is configured to communicatively couple together a fiber optic connector 1220 with a media converter (not shown) to convert the optical data signals into electrical data signals, wireless data signals, or other such data signals. In still other implementations, the coupler 1150 includes an electrical termination block that is configured to receive punch-down wires, electrical plugs (e.g., for electrical jacks), or other types of electrical connectors.

Each fiber optic adapter 1300 also includes at least one media reading interface 1305 to enable physical layer information to be read from the storage devices 1230 of the connectors 1220 mounted at the adapter 1300. In certain implementations, the media reading interface 1305 also can write physical layer information to the storage device 1230 (e.g., add new information, delete information, or change/update information). For example, in one implementation, the adapter 1300 can include a media reading interface 1305 associated with each port 1302. In another implementation, the adapter 1300 can include a media reading interface 1305 associated with each connection end of a port 1302.

In general, each media reading interface 1305 is formed from one or more contact members 1310. In some implementations, the adapter body 1301 defines slots 1304 configured to receive the one or more contact members 1310 (see FIG. 6). In accordance with some aspects, portions of the contact members 1310 extend into the port 1302 to engage the electrical contacts 1232 of the storage member 1230 mounted to the fiber optic connector 1220. Other portions of the contact members 1310 are configured to engage contacts on a printed circuit board associated with (e.g., positioned on top of) the fiber optic adapter 1300. As discussed below, a processor or other such equipment also can be electrically coupled to the printed circuit board. Accordingly, such a processor can communicate with the memory circuitry on the storage device 1230 via the contact members 1310 and the printed circuit board.

Additional information pertaining to some example fiber optic connectors 1220, storage devices 1230, fiber optic adapters 1300, and contact members 1310 can be found in copending U.S. Provisional Application No. 61/303,961, filed Feb. 12, 2010, titled "Fiber Plugs and Adapters for Managed Connectivity;" U.S. Application Provisional No. 61/413,828, filed Nov. 15, 2010, titled "Fiber Plugs and Adapters for Managed Connectivity;" U.S. Provisional Application No. 61/437,504, filed Jan. 28, 2011, titled "Fiber Plugs and Adapters for Managed Connectivity," and U.S. application Ser. No. 13/025,841, filed Feb. 11, 2011, titled "Managed Fiber Connectivity Systems," the disclosures of which are hereby incorporated by reference herein in their entirety.

Figure 7:
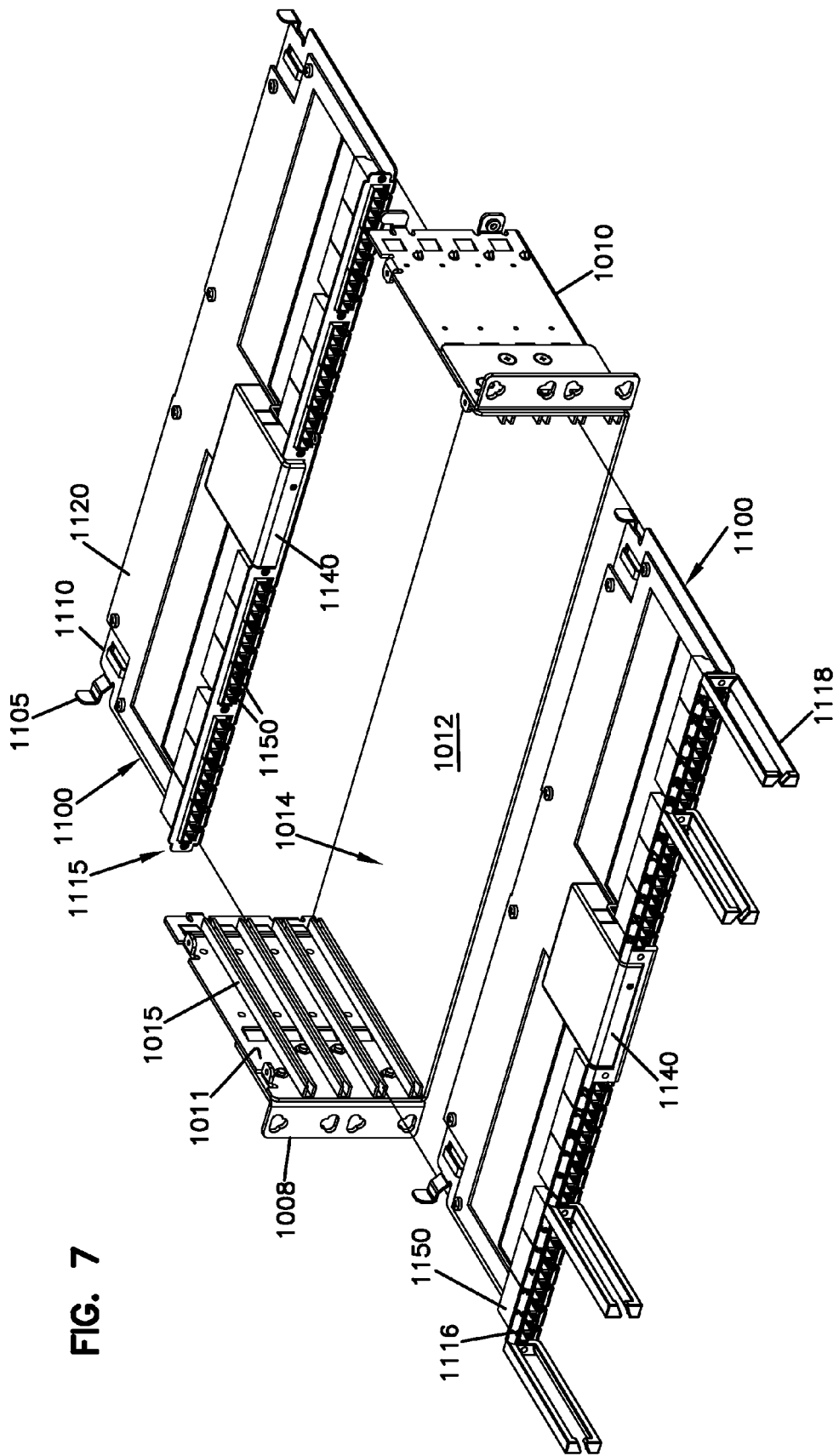
Figure 11:
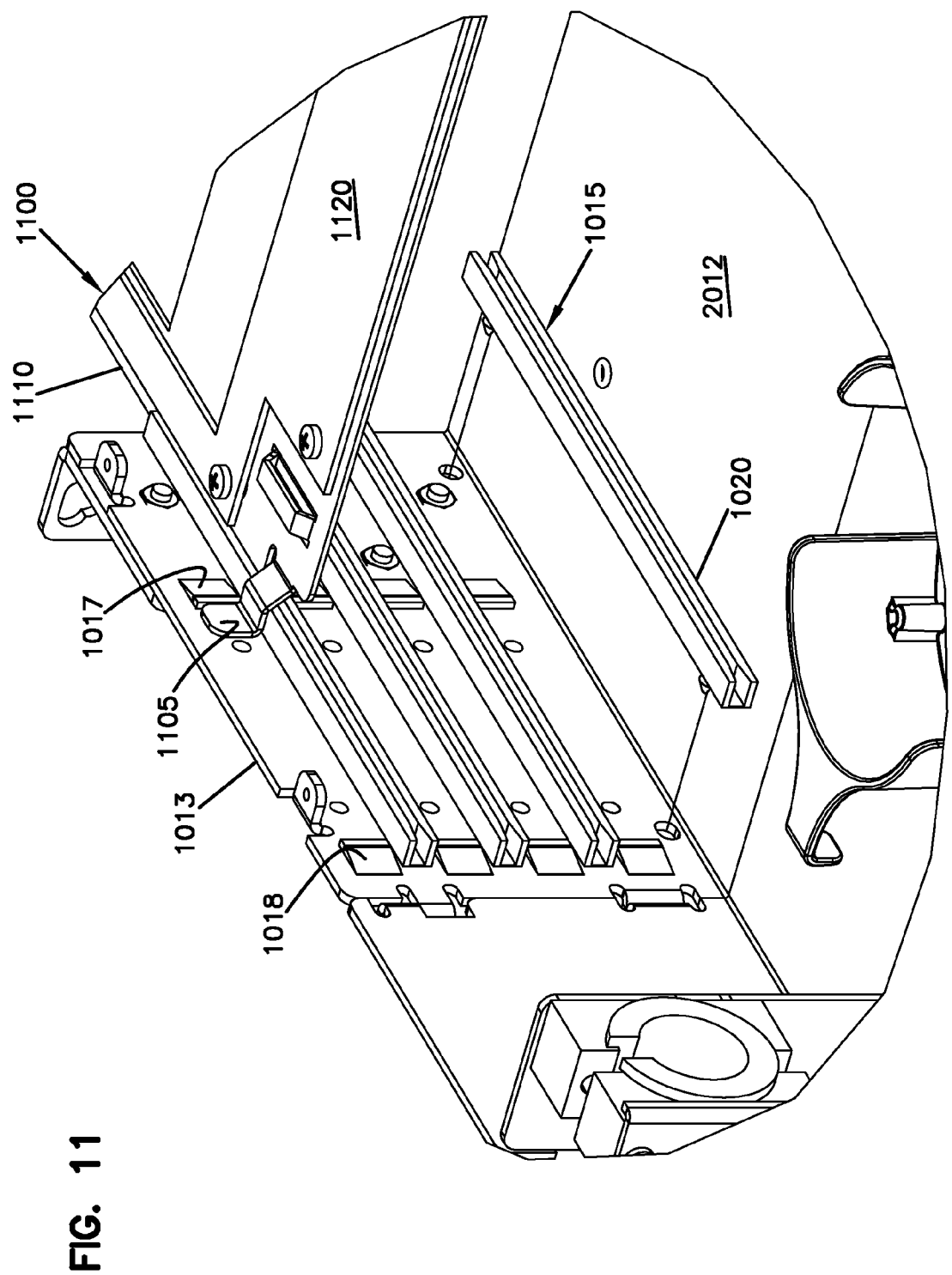

For example, the example blades 1100 shown in FIG. 7 each include a processor 1140 coupled to a printed circuit board (PCB) 1120. Couplers 1150 also are mounted (or electrically connected) to the PCB 1120. Accordingly, the processor 1140 on each blade 1100 can communicate with the media reading interfaces 1305 on the couplers 1150 to manage (e.g., read, store, update, process, etc.) any physical layer information associated with media segments inserted at the couplers 1150. In some implementations, the blade processor 1140 does not modify, monitor, or otherwise interact with communications signals propagating over media segments received at the couplers 1150. In certain implementations, the blade processor 1140 is isolated from the signals carried over the media segments. In other implementations, however, each blade 1100 can include an application-specific integrated circuit (ASIC) that can be controlled via a remote host in place of a processor 1140.

Figure 12:
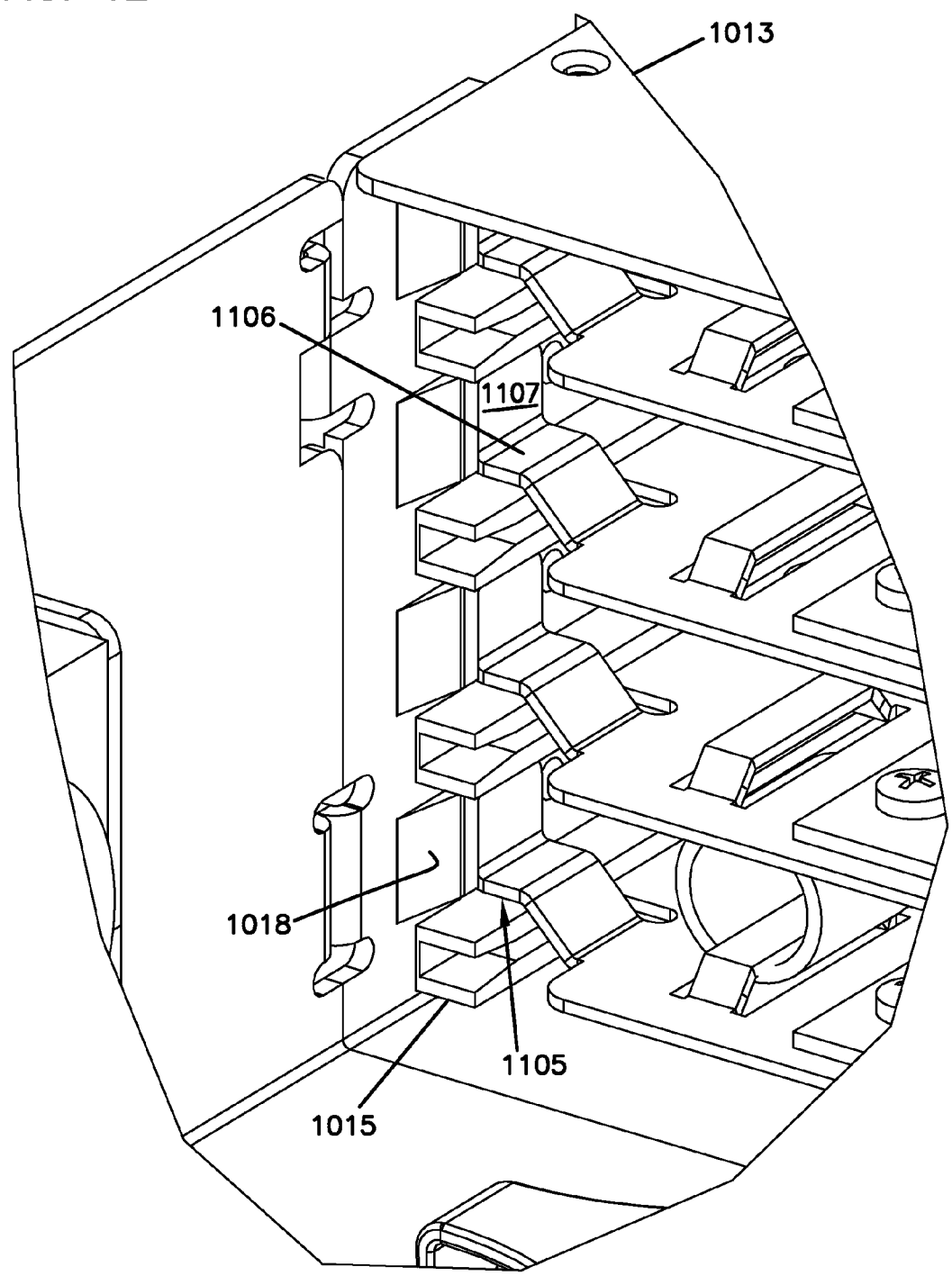

FIG. 7 shows two example communications blades 1100 exploded out from an example chassis 1010. Each blade 1100 includes a base 1110 and a support member 1115. In the example shown in FIG. 7, the base 1110 defines a generally planar surface and the support member 1115 extends upwardly from a front end of the planar base 1110. The base 1110 includes tabs 1105 defining a riding section 1106 and an engagement section 1107 (FIG. 12). The communications couplers (e.g., fiber optic adapters, electrical plugs, etc.) 1150 mount to the support member 1115 of the blade 1100 (see FIG. 7).

The PCB 1120 mounts to the base 1110. In the implementation shown, the PCB 1120 mounts substantially parallel to the base 1110. In accordance with some aspects, a central processing unit (e.g., a processor) 1140 also can be mounted to the base 1110 and electrically coupled to the PCB 1120. In the example implementation shown in FIG. 7, the central processing unit 1140 mounts directly to the PCB 1120 as will be discussed in more detail herein.

The chassis 1010 includes opposing side walls 1011 interconnected by opposing major surfaces 1012 (see FIGS. 4 and 7) to form a housing 1013 defining an interior 1014. In the example shown, the chassis housing 1013 defines an open front and an open rear (see FIG. 7). In other implementations, one or both of the front and rear can be at least partially closed. A management module 1050 also can be mounted to the chassis 1010 to organize one or more of the media segments.

Mounting members 1008 are mounted to the opposing side walls 1011 to facilitate mounting the chassis housing 1013 to a communications rack. In accordance with one implementation shown in FIG. 7, the mounting members 1008 are L-shaped flanges having first sections that attach to the side walls 1011 and second sections that extend generally parallel with an open end face of the chassis housing 1013. In other embodiments, however, other types of mounting members 1008 can be used to mount the chassis housing 1013 to a rack. In still other embodiments, other types of mounting equipment can be used (e.g., to mount the chassis housing 1013 to shelves).

Guides 1015 can be provided within the interior 1014 of the chassis housing 1013. The guides 1015 enable the blades 1100 to move relative to the chassis housing 1013. In certain embodiments, each blade 1100 is configured to move separately from the other blades 1100. In certain implementations, the blades 1100 are configured to travel along the connector insertion direction. For example, the blades 1100 may be configured to travel in a forward-rearward direction.

In some embodiments, the guides 1015 enable each blade 1100 to move between at least a first position, in which the blade 1100 is positioned within the interior 1014 of the chassis housing 1013, and a second position, in which at least a portion of the blade 1100 protrudes outwardly from the interior 1014 of the chassis housing 1013. For example, moving a blade 1100 to the second position can facilitate access to the communications couplers 1150 mounted to the blade 1100.

In some embodiments, the guides 1015 are implemented as slides 1020 configured to facilitate sliding movement of the blades 1100. FIGS. 8-10 illustrate one example slide member 1020 suitable for use as a guide 1015. The slide member 1020 includes a body 1021 from which mounting pegs 1022 extend. The mounting pegs 1022 are configured to be received within openings defined in the sides 1011 of the chassis housing 1013 (see FIG. 11). The slide body 1021 defines a longitudinally extending slot or channel 1024 along a length of the slide body 1021. The channel 1024 is sized and configured to receive at least a side edge of the planar base 1110 of the blade 1100. In certain implementations, the sides of the body 1021 defining the channel 1024 have ramped end portions 1025 to facilitate insertion of the base 1110 into the channel 1024.

The slides 1020 can be configured to facilitate lateral sliding of the blades 1100. In some implementations, the slides 1020 are mounted to the opposing side walls 1011 of the chassis 1010 to enable the blades 1100 to slide forwardly and rearwardly relative to the chassis 1010. In the example shown, the slides 1015 are mounted to the chassis housing 1013 in a generally parallel, vertically spaced configuration. In other implementations, however, the slides 1015 can be configured to enable the blades 1100 to slide side-to-side or diagonally. In still other implementations, other types of guides 1015 are used to facilitate other types of blade movement.

In accordance with some aspects, the chassis housing 1013 and the blades 1100 are configured to inhibit removal of the blades 1100 from the chassis housing 1013. For example, the chassis housing 1013 can define one or more stops configured to interact with tabs 1105 on the blade 1100 to inhibit movement of the blade 1100 in one or more directions. The stops can be positioned on the side walls 1011 of the chassis 1010 adjacent the guides 1015. In some embodiments, at least one stop can be provided for each guide 1015.

When a blade 1100 is inserted into one of the guides 1015, an edge of the blade base 1110 slides into the channel 1024 of the slide 1015. The riding section 1106 of each tab 1105 seats on top of the slide body 1021 and the engagement section 1107 extends upwardly from the riding section 1106 to interact with the stops positioned along the side wall 1011 of the chassis housing 1013. In the example implementation shown, each blade 1100 includes two tabs 1105, each extending outwardly from the base 1110 at a rear of the blade 1100. In other example implementations, the tabs 1105 can extend outwardly from a front of the base 1110 or from somewhere between the front and rear of the base 1110. In other example implementations, the tabs 1105 can seat on the bottom of the slide body 1021.

In accordance with some aspects of the disclosure, an example chassis housing 1010 can include a forward stop 1017 and a rearward stop 1018 associated with each guide 1015. The forward stop 1017 is configured to inhibit forward movement of a blade 1100 beyond a set pull-out distance to maintain the blade 1100 at least partially within the chassis housing 1010 (e.g., see FIG. 11). Accordingly, the blade 1100 can be partially pulled out of the chassis housing 1013 through the open front to provide access to components mounted on the blade 1100.

In some example implementations, the forward stop 1017 is positioned to enable the blade 1100 to be pulled out of the chassis housing interior 1014 at least sufficient to provide access to the outgoing physical media segments 1212 received at a front of the communications couplers 1150. Indeed, in some example implementations, the forward stop 1017 is positioned to enable the blade 1100 to be pulled out of the chassis housing interior 1014 at least sufficient to provide access to the incoming physical media segments 1211 received at a rear of the communications couplers 1150 (see FIG. 17). In some example implementations, the forward stop 1017 is positioned to enable the blade 1100 to be pulled out of the chassis housing interior 1014 at least sufficient to provide access to the processor 1140 mounted to the blade 1100. In one example implementation, the blade 1100 can be pulled out about three (3) inches.

Likewise, the rearward stop 1018 is configured to inhibit rearward movement of the blade 1100 to inhibit the blade 1100 from exiting the chassis housing 1010 through the open rear of the chassis housing 1010 (e.g., see FIG. 12). Accordingly, the rear stop 1018 prevents the blade 1100 from being unintentionally pushed too far rearward and into the cable manager module 1050. In some example implementations, the rearward stop 1018 is positioned to inhibit even a rear portion of the blade 1100 from exiting the interior 1014 of the chassis housing 1013 through the rear end of the chassis housing 1013.

In some embodiments, the chassis housing 1013 is configured to enable insertion of the blades 1100 optionally through either the open front or through the open rear of the chassis housing 1013. In other words, the chassis housing 1013 is configured to enable the user to choose whether to insert each blade 1100 from the front or from the rear. In one embodiment, each stop 1017, 1018 defines a ramp on one side and a shoulder on the other. To facilitate insertion, the ramp of the rearward stops 1018 faces the rear end of the chassis housing 1013 and the ramp of the forward stop 1017 faces the open front of the chassis housing 1013.

In accordance with some aspects, the blades 1100 can be secured in one or more positions. For example, in some implementations, the chassis housing 1013 includes retention features to secure each blade 1100 in an extended position and/or a retracted position. In one implementation, the retention feature includes a dimple extending inwardly from the side walls 1011. In another implementation, the retention feature includes a spring-mounted ball extending into the chassis 1010. In other implementations, other types of retention features can be utilized.

Figure 13:
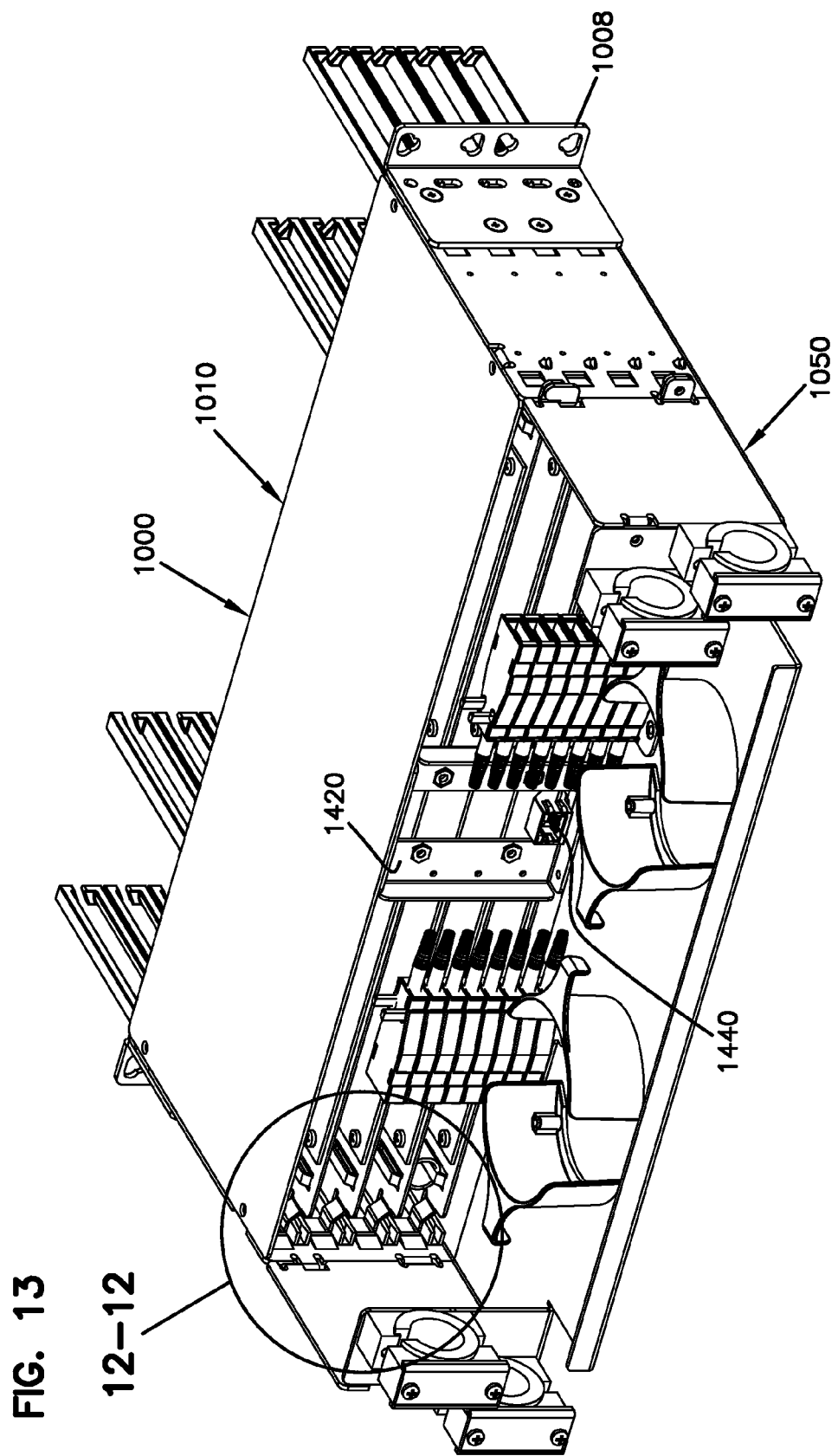

When a blade 1100 is mounted to the chassis housing 1013, the blade 1100 is communicatively connected to a network (e.g., see network 218 of FIG. 2) for management of any physical layer information associated with the physical media segments 1200 attached to the blade 1100. In accordance with some aspects, a backplane 1400 (FIG. 14) is mounted to the chassis housing 1013 to facilitate connecting the blade 1100 to the management network. In general, the printed circuit boards 1120 on each blade 1100 communicatively couple (e.g., electrically couple) to a printed circuit board 1410 on the backplane 1400 via connector ports 1430. The backplane 1400 also includes a network port 1440 via which the backplane 1400 connects to the network (FIG. 13).

In some example implementations, the backplane 1400 is mounted at the open rear of the chassis housing 1013. For example, FIG. 13 shows a rear view of the chassis housing 1013 in which multiple blades 1100 have been mounted. A rear portion of a backplane 1400 to which the blades 1100 are connected is visible. The backplane 1400 includes a bracket 1420 that attaches the printed circuit board 1410 to the chassis housing 1013. The network port 1440 is mounted to a rear side of the printed circuit board 1410 of the backplane 1400. In the example shown, the network port 1440 includes a Power Over Ethernet electrical socket configured to receive DC power source input from the network. In other implementations, however, other types of ports 1440 can be utilized.

Figure 14:
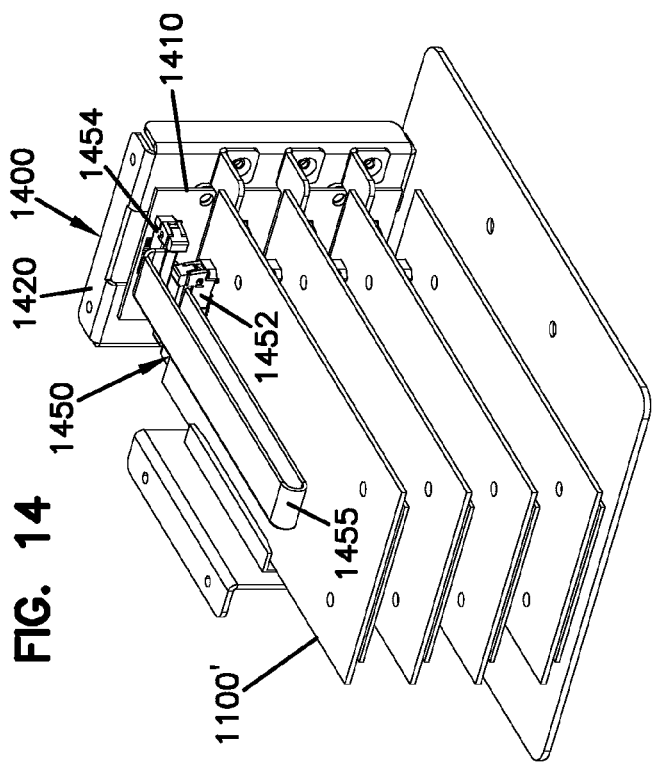
Figure 16:
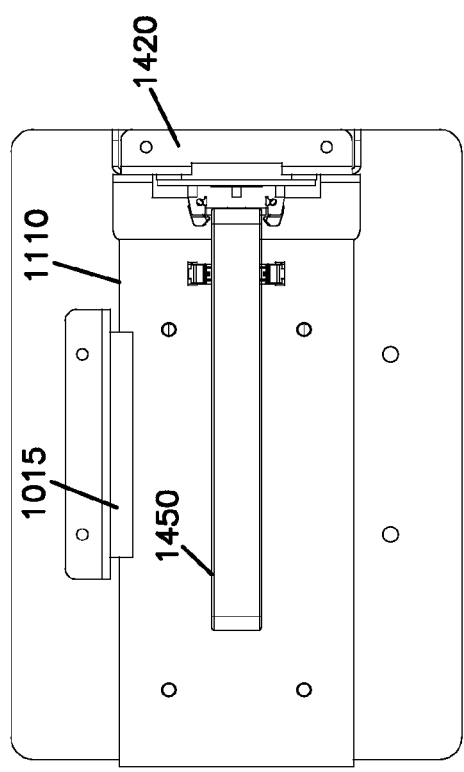
Figure 15:
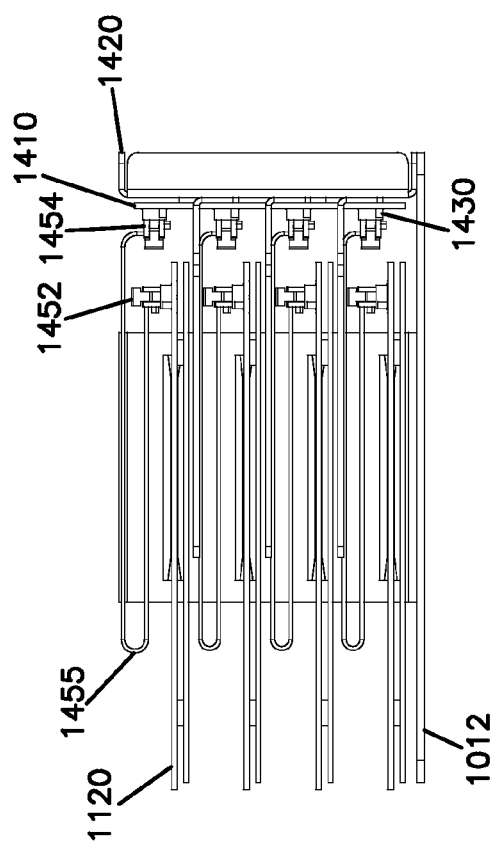
Figure 17:
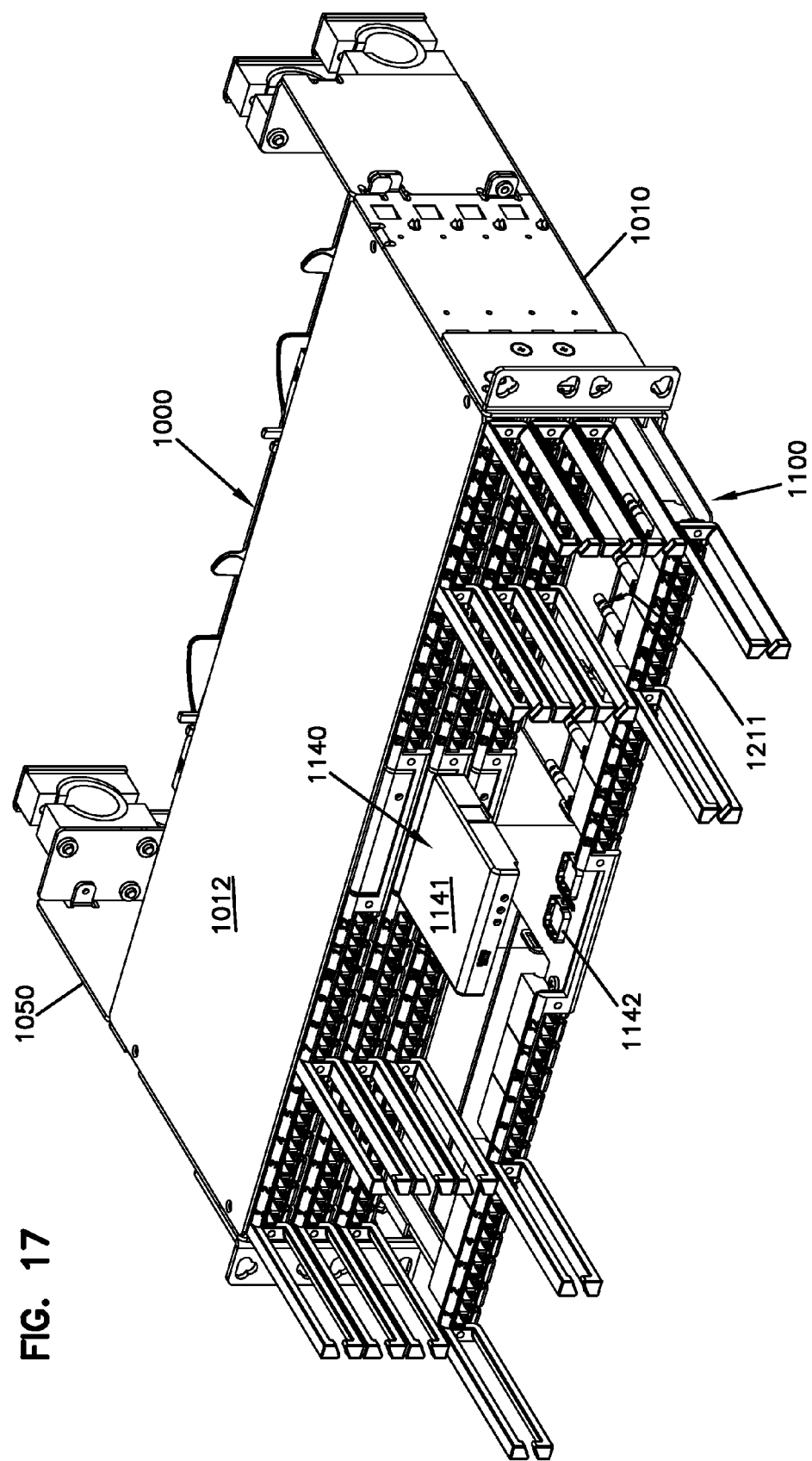

FIGS. 14-16 illustrate one example implementation of connecting blades 1100 to a backplane 1400. For ease in understanding, select details pertaining to the chassis housing 1013 and to the blades 1100 have been removed from the figures. For example, in FIGS. 14-16, the blades are represented by panels 1100' without differentiating the PCB 1120 from the base 1110. Further, the guides 1015 are shows mounted to a generic side wall. Accordingly, details pertaining to the connection between the blades and the backplane 1400 are visible.

In accordance with some implementations, a blade can be connected to the backplane 1400 using an electrical cable 1450 extending from a first end to a second end. A first electrical connector 1452 is attached to and terminates the first end of the cable 1450 and a second electrical connector 1454 is attached to and terminates the second end of the cable 1450. Each of the connectors 1452, 1454 is configured to plug into a mating socket on a printed circuit board. For example, the first connector 1452 is configured to plug into (and electrically communicate with) the printed circuit board 1120 on the blade 1100. The second connector 1454 is configured to plug into (and electrically communicate with) the printed circuit board 1410 on the backplane 1400.

The cable 1450 is sufficiently long to form an at least partial loop (e.g., half loop) 1455 at a location between the first and second connectors 1452, 1454. When one of the blades 1100 is pulled forwardly relative to the chassis housing 1013, the first connector 1452 of the corresponding cable 1450 moves with the blade 1100. The second connector 1454, however, remains attached to the backplane 1400. Accordingly, the PCBs 1120 mounted to the blades 1100 (and components mounted thereto, e.g., the processor 1140) can remain coupled to the data management network even when the blades 1100 are moved relative to the chassis housing 1013.

For example, if a user wants to add, remove, or replace a physical media segment 1200 on a blade 1100, then the user can slide the blade 1100 to a forward (i.e., or rearward) extended position to access the desired segment 1200, coupler port, or other component (e.g., processor 1140) without disconnecting the remaining components on the blade 1100 from the data management network. For example, moving the blade 1100 to the extended position and removing a media segment attached to one of the couplers 1150 does not disconnect the storage devices 1230 of the other physical media segments 1200 mounted to the blade 1100 from the network.

In accordance with some aspects of the disclosure, the processors 1140 mounted to the blades 1100 can be added, removed, or replaced without completely removing the blade 1100 from the chassis 1010 or disconnecting the PCB 1120 from the network. For example, in some implementations, a blade processor 1140 and the PCB section to which it attaches can be accessed by sliding the blade 1100 from the first blade position within the chassis interior 1014 to the second blade position in which a front of the blade 1100 extends through the open front of the chassis 1010 (e.g., see FIG. 17).

In certain implementations, the blade processor 1140 includes a connector or socket that is configured to mate with a complementary socket or connector on the blade PCB 1120. For example, the blade processor 1140 can be secured to the blade PCB 1120 using one or more mezzanine connectors 1142. In the example shown in FIG. 17, the blade processor 1140 is secured to the blade PCB 1120 using two mezzanine connectors 1142. In other implementations, the blade processor 1140 can be secured to the PCB 1120 using other types of connectors (e.g., contact pins).

In some implementations, each blade processor 1140 includes a display arrangement 1145. For example, in the implementation shown in FIG. 18, each blade processor 1140 includes at least one light emitting diode (LED) 1146. A blade processor 1140 can actuate an LED 1146 to identify the processor 1140. For example, a user can be directed to a particular blade 1100 by actuating the LED 1146 on the processor 1140. A blade processor 1140 can actuate any additional LEDs 1146 on the blade 1100 to indicate a status (e.g., an error) of the blade 1100, of the processor 1140, or of any of the physical segments 1200 attached to the blade 1100.

In some implementations, each chassis 1010 is configured to receive a first blade 1100 having a master processor 1140 and one or more additional blades 1100 having a slave processor 1140. Each slave processor is configured to read any physical layer data through the corresponding media reading interfaces at the direction of the master processor. The master processor coordinates the slave processors and provides the network connection for the chassis 1010.

Figure 18:
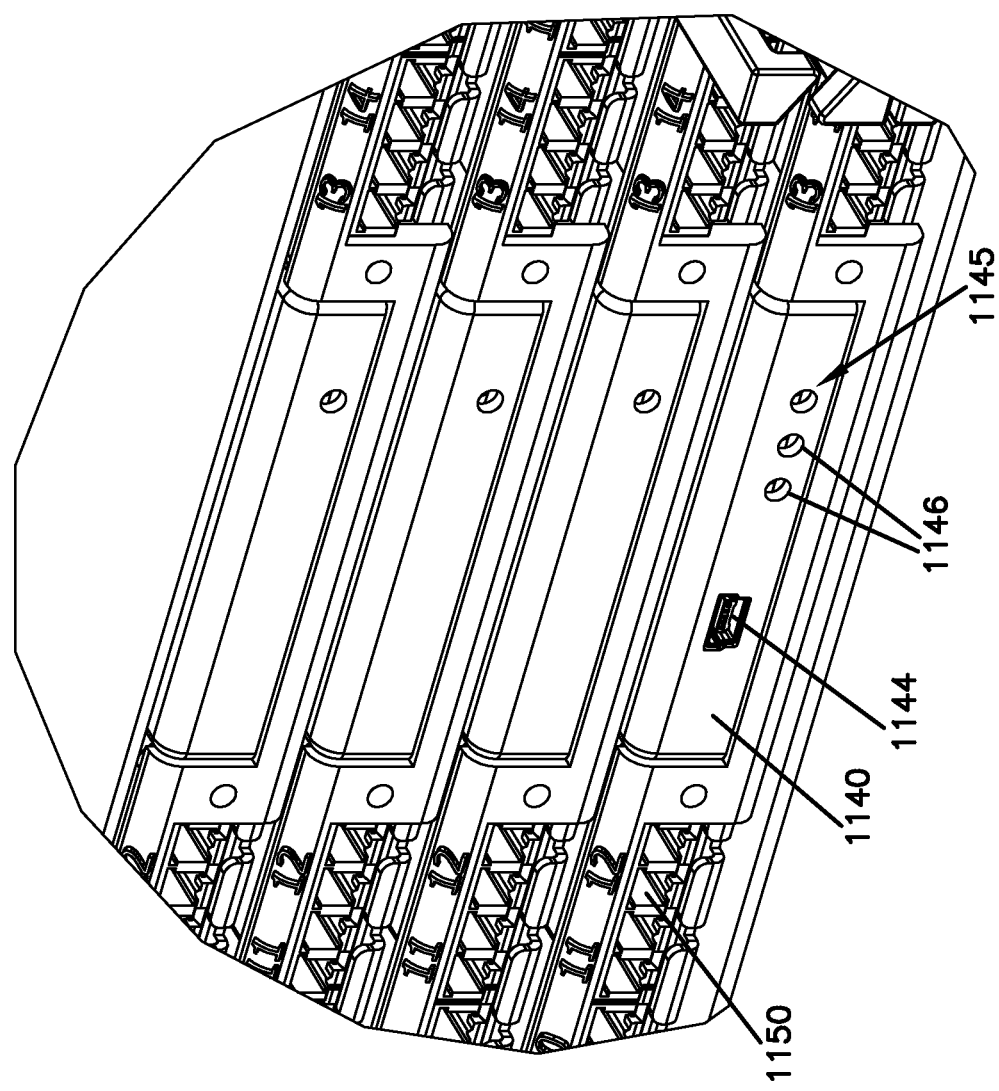

In one example implementation, the master processor also includes a user port 1144 through which a user can obtain physical layer information from the master processor and/or can write physical layer data to the master processor for distribution to one or more physical media storage devices. One example user port 1144 is shown in FIG. 18. In the example shown, the user port 1144 is a USB connector port. In other implementations, however, other types of ports (e.g., ports suitable for connecting to a cell phone, Smartphone, PDA, laptop, or other mobile computing device) can be used. In some implementations, only the blade 1100 having the master processor includes multiple LEDs 1146, which provide status indicia for the entire chassis.

Figure 19:
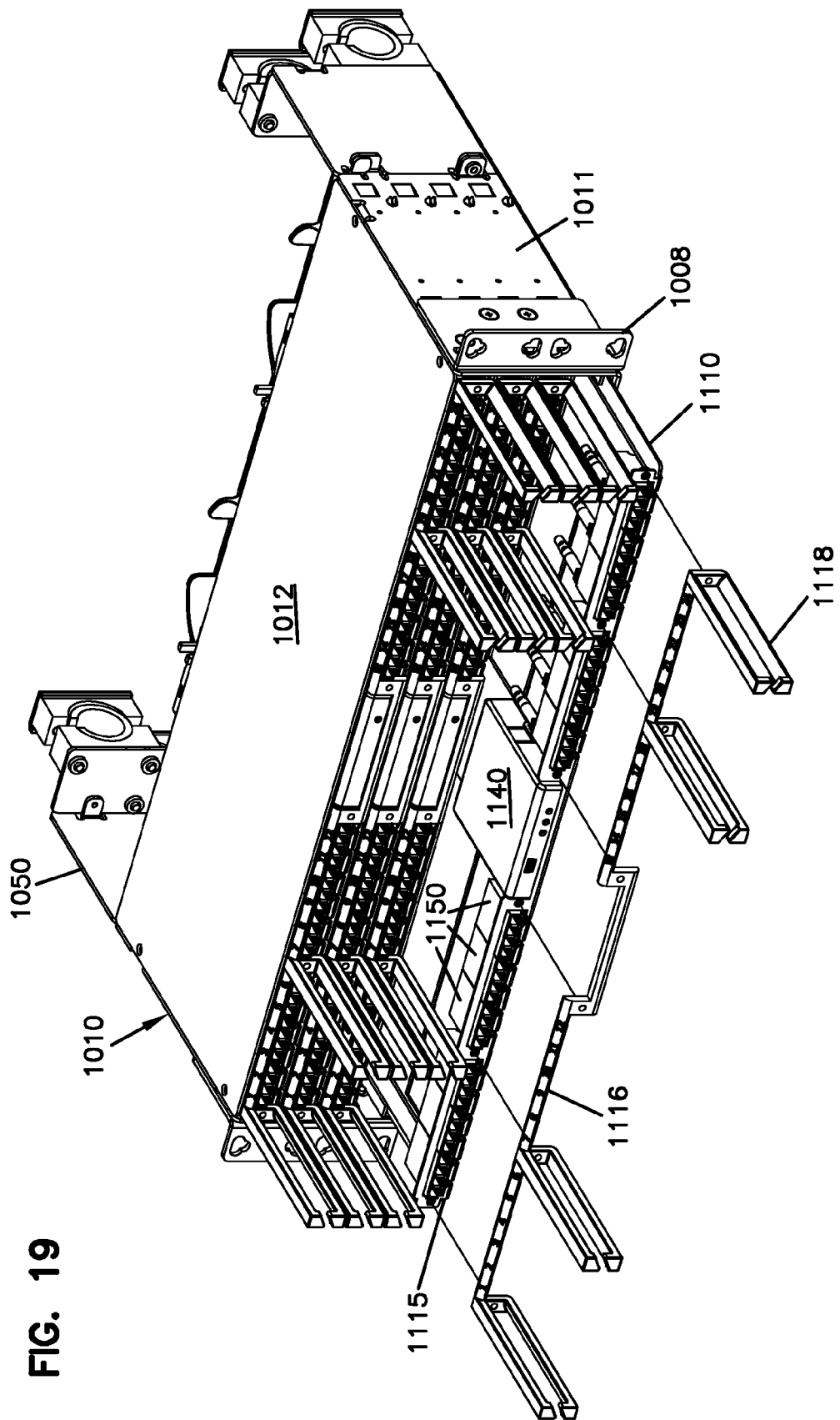
Figure 20:
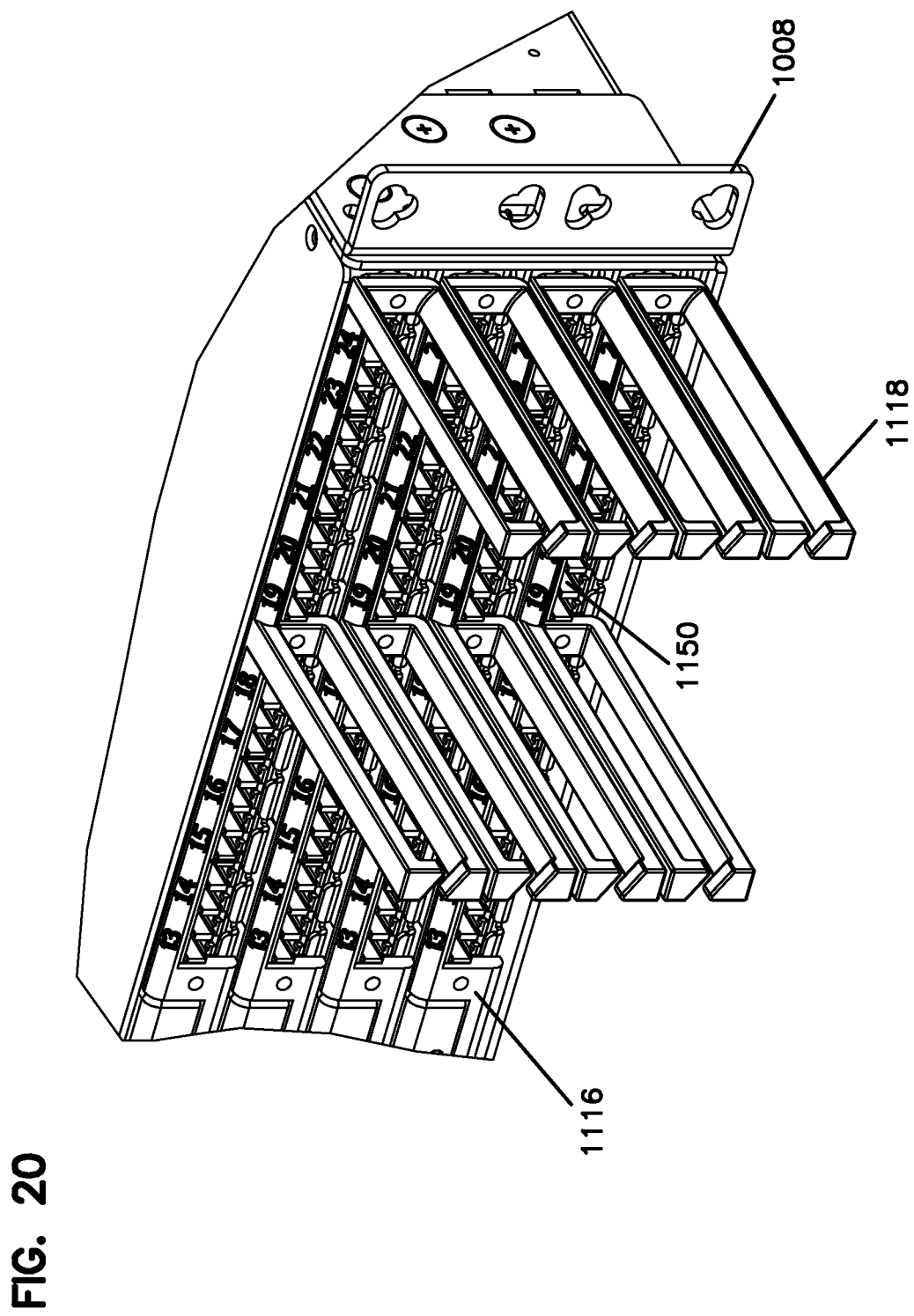
Figure 21:
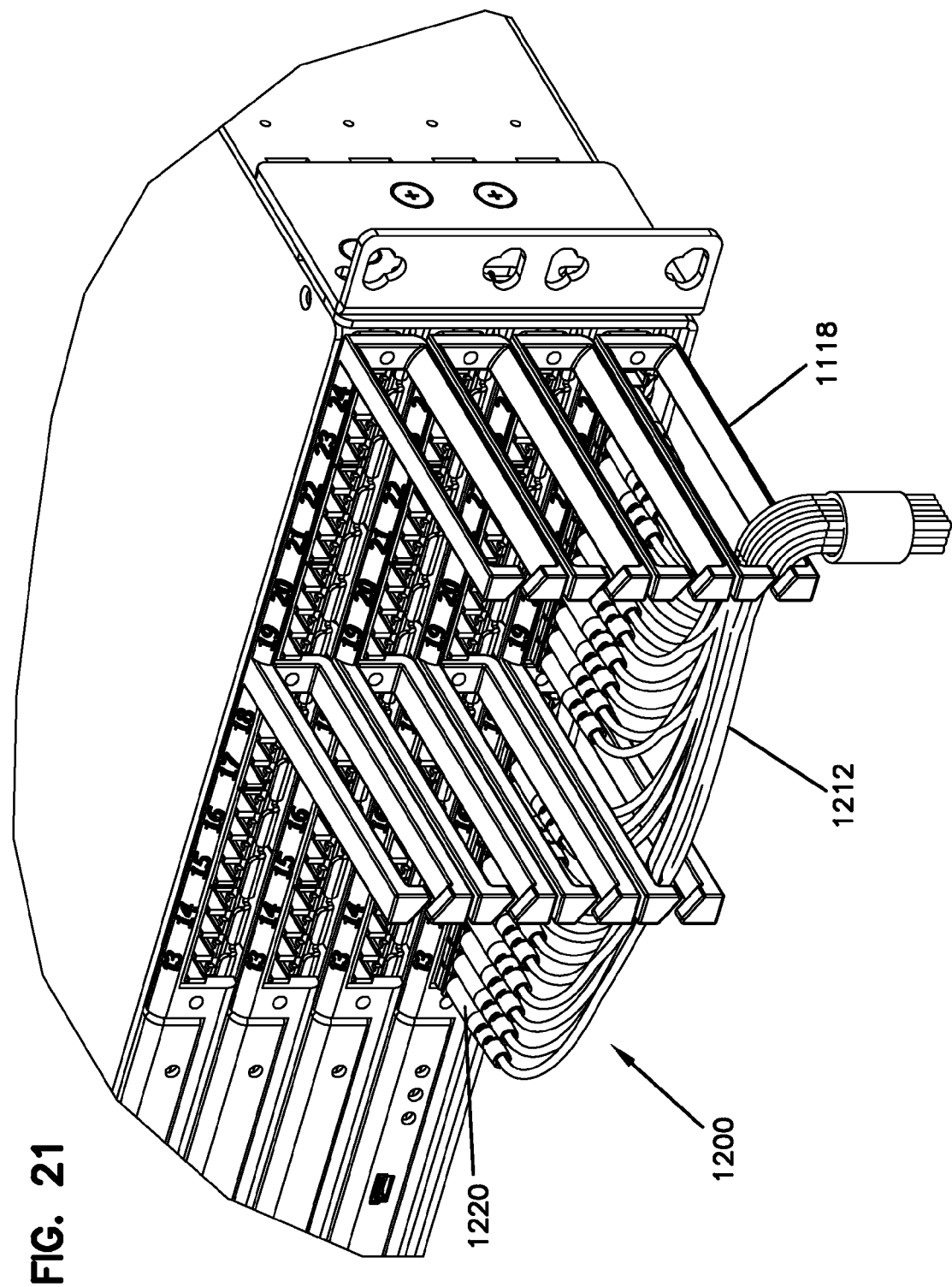

Referring now to FIGS. 19-21, each blade 1100 is configured to facilitate media segment management and tracking. For example, as shown in FIG. 19, some example implementations of a blade 1100 include a fascia 1116 fastened (e.g., screwed, welded, riveted, etc.) to the support member 1115 of the blade 1100. The fascia 1116 includes indicia for identifying particular ones of the couplers 1150 or sets of the couplers 1150 (e.g., duplex couplers). In the example shown, each fascia 1116 includes a number printed above each coupler port. In other implementations, other types of indicia (letters, colors, etc. also can be used).

Some example fascia 1116 can include segment management structures. For example, in some implementations, a fascia 1116 can include retention tabs or fingers 1118 extending forwardly of the fascia 1116. In the example shown, the fingers 1118 are configured to route communications cables (e.g., optical fibers, optical fiber cables, electrical conductors, electrical cables, etc.) away from the couplers 1150 along a cable routing path (e.g., see FIG. 21).

Figure 22:
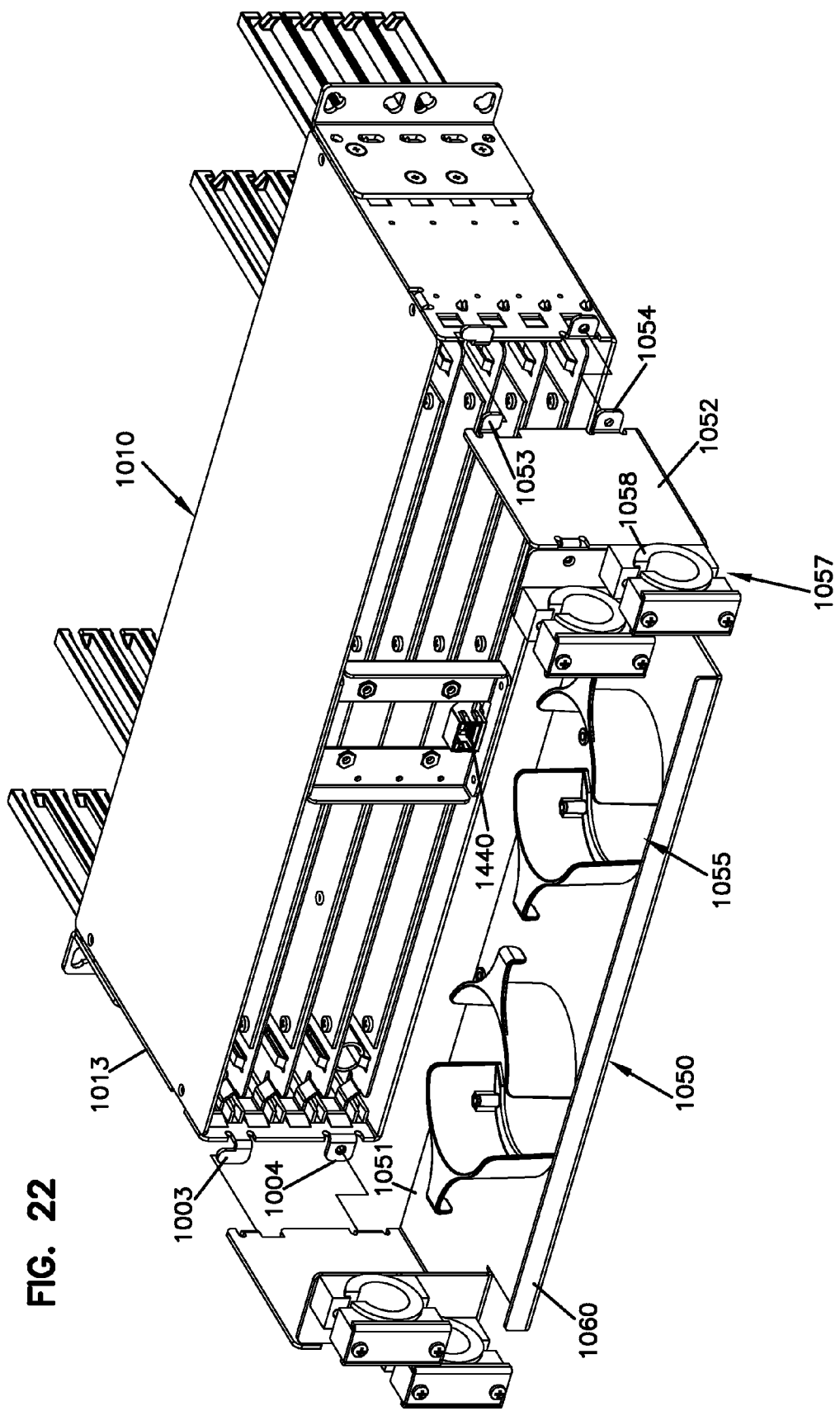
Figure 23:
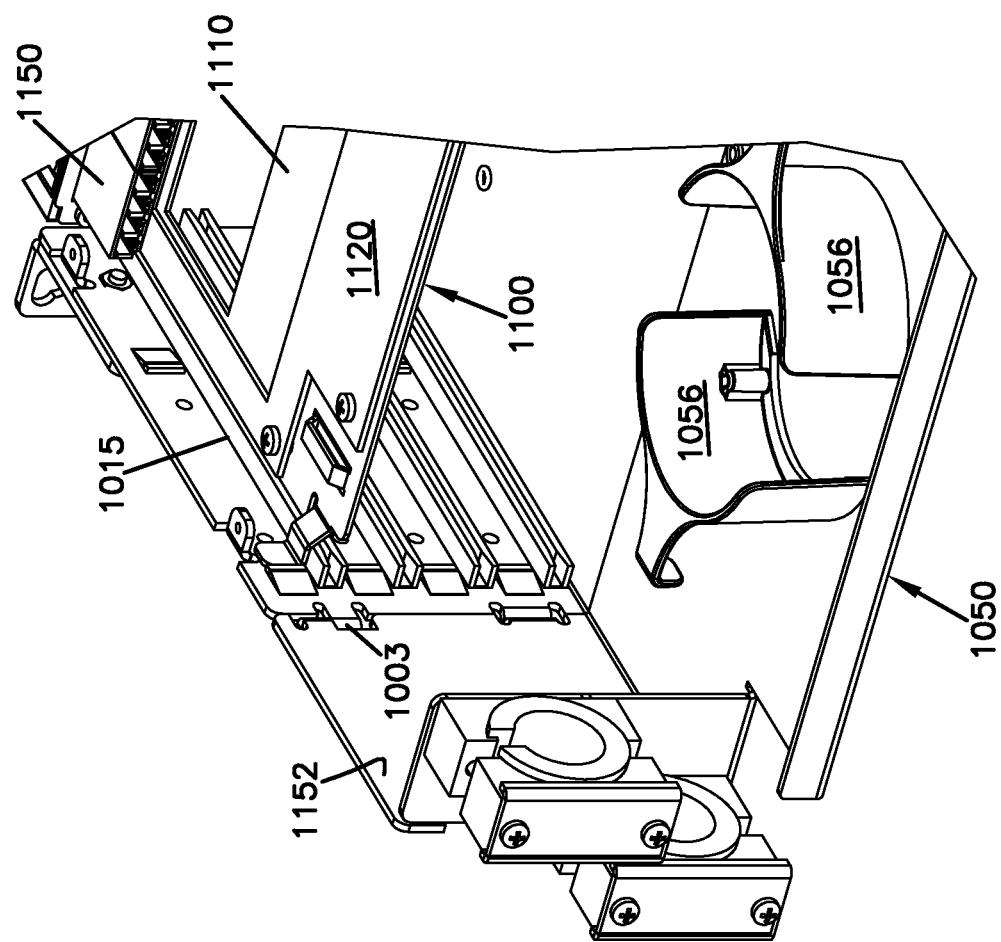
Figure 24:
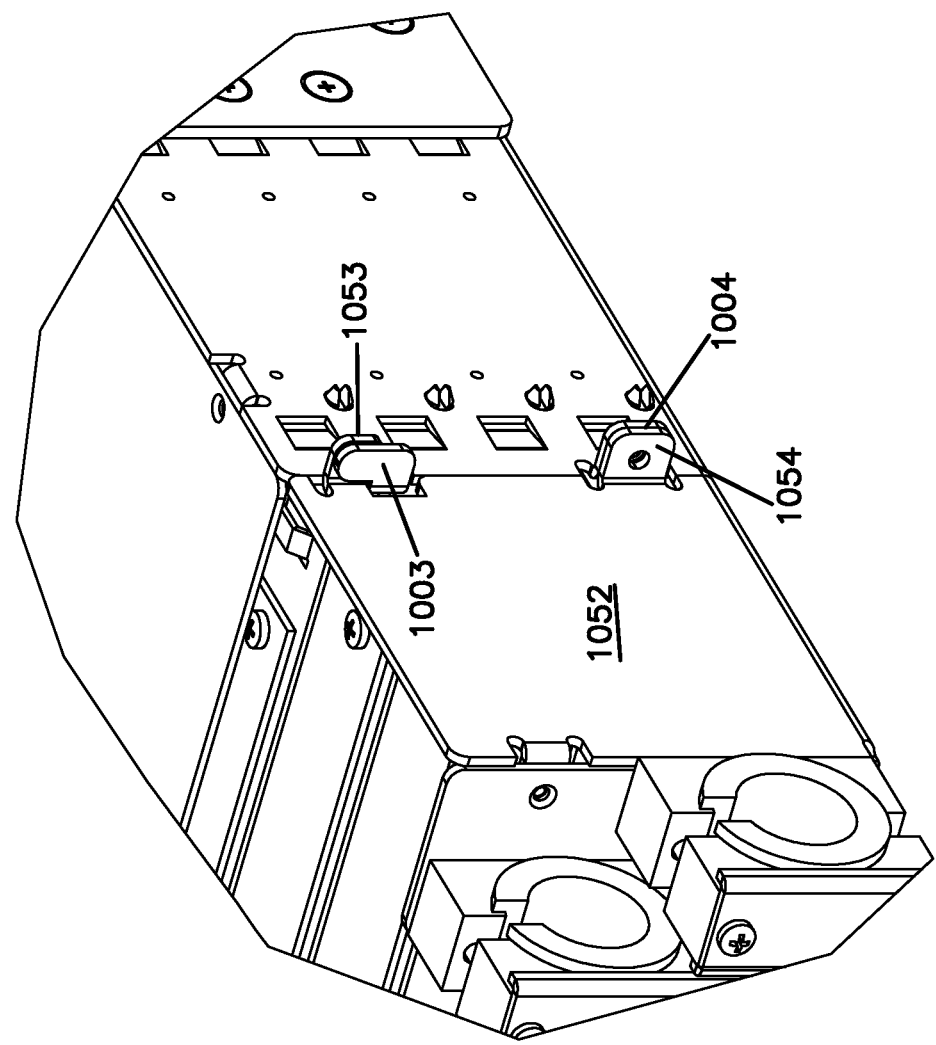

Referring to FIGS. 22-24, a management module (e.g., cable management module) 1050 can be mounted to the chassis 1010 to organize one or more of the media segments. Example management modules 1050 have a storage area 1055 and segment ports 1057. In general, the storage area 1055 is configured to store any excess length of one or more physical media segments. In particular, the storage area 1055 enables the blades 1100 to be moved relative to the chassis 1010 without unplugging incoming cables 1211 from the blades 1100. For example, slack cable length may tighten or loosen around cable spools 1056 positioned at the storage area 1055 as the blade 1100 is moved forward and rearward relative to the chassis 1010.

The segment ports 1057 are configured to route physical media segments onto and off the management module 1050. In the example shown in FIG. 22, the management module 1050 is attached to a rear side of the chassis 1010. Accordingly, the management module 1050 is configured to receive and direct media segments plugged into the rear sides of the couplers 1150. For example, each physical media segment plugged into the rear side of the couplers 1150 can be routed rearwardly from the couplers 1150, through the storage area 1055, and out the segment ports 1057.

In the example shown, the management module 1050 includes a base 1051 having opposing side walls 1052. The base 1051 can include a rearward lip 1060 to aid in retaining the physical media segments on the module 1050. Spools 1056 are mounted at the storage area 1055, which is located on the base 1051. Grommets 1058 and seals 1059 are arranged at the segment ports 1057, which are located on the side walls 1052.

The management module 1050 is configured to removably attach to the chassis housing 1013. In some example implementations, the side walls 1052 of the module 1050 include support flanges 1053 and fastening brackets 1054. In the example shown, the support flanges 1053 define L-shaped members, which are oriented in an outwardly (sideways) facing direction. In other example embodiments, the module support flange 1053 also could be oriented in a downwardly pointing direction. The fastening brackets 1054 define through-holes.

The chassis housing 1013 includes complementary features including a support flange 1003 and a fastening bracket 1004 (FIG. 22). The support flange 1003 of the chassis housing 1013 is oriented in an upwardly pointing direction. In other example embodiments, the chassis support flange 1003 also could be oriented in an outwardly (sideways) facing direction. The fastening brackets 1004 define through-holes.

To attach the management module 1050 shown in FIG. 22 to the chassis housing 1013, the support flanges 1053 of the management module 1050 is seated on the support flange 1003 of the chassis housing 1013. Engaging the support flanges 1053, 1003 with each other positions the brackets 1054, 1004 to align the through-holes. A fastener (e.g., a screw, a bolt, a rivet, etc.) can be inserted through the holes in the brackets 1054, 1004 to secure the management module 1050 to the chassis 1010. In other implementations, the management module 1050 can be welded, glued, or otherwise secured to the chassis 1010.

To enhance clarity of the application, the following disclosure provides an example walk-through of routing the incoming and outgoing media segments 1211, 1212 for an example blade 1100. One or more chasses 1010 are provided, for example, on an equipment rack. One or more blades 1100 are installed in each chassis 1010. Circuit boards on each blade 1100 may be connected to a backplane 1400 of the chassis 1010 (e.g., by sliding the blade into the chassis 1010 towards the backplane 2014). A processor 1140 on each blade 1100 is connected to the backplane 1400 via the circuit boards.

Incoming cables 1211 are connected to each blade 1100 after the blade 1100 has been inserted into the chassis 1010. For example, a technician may secure the incoming cables 1211 at the management region 1050 at the rear of the chassis 1010. In some implementations, the incoming cables 1211 include optical fibers separately terminated by a fiber optic connector (e.g., an LC-type connector). In other implementations, the incoming cables 1211 include one or more multi-fiber cables, each of which is terminated by a multi-fiber connector (e.g., an MPO-type connector).

The technician plugs connectorized ends of the incoming cables 1211 into the rear ports of the blade 1100. For example, the technician may feed connectorized ends of the incoming cables 1211 from the rear of the chassis 1010, over the base 1110 of the blade 1100, toward the adapters 1151. The technician may subsequently access the adapters 1151 through an open top of the blade 1100 at the front of the chassis 1010 (see FIG. 17). For example, the technician may access the adapters 1151 with the blade 1100 in the first or second extended position. In particular, the technician can unplug a dust plug from one of the rear ports of the adapters 1151 and insert one of the connectorized ends into the rear port from the front of the chassis 1010.

Subsequently, outgoing cables 1212 can be installed at the front ports of the blade 1100 without disconnecting the blade 1100 from the backplane 1400. In some implementations, the outgoing cables 1212 include optical fibers separately terminated by a fiber optic connector (e.g., an LC-type connector). In other implementations, the outgoing cables 1212 include one or more multi-fiber cables, each of which is terminated by a multi-fiber connector (e.g., an MPO-type connector). In certain implementations, the technician may plug the connectors 1220 of the outgoing cables 1212 into the front ports of the adapters 1151 when the blade 1100 is in the closed or first extended position. In other implementations, however, the connectors 1220 of the outgoing fibers 1212 may be plugged into the front adapter ports while the blade 1100 is in any desired position. The technician also routes the fibers 1220 through the retention fingers 1118 at the front of the blade 1100.

FIGS. 25-44 provide another example connector assembly implemented as a bladed panel system 2000 suitable for mounting to a communications equipment rack. The bladed panel system 2000 includes a chassis 2010 configured to receive one or more communications blades 2100. The bladed panel system 2000 is configured to connect segments of communications media 2200 carrying communications signals (e.g., signals S1 of FIG. 1). For the sake of convenience, media segments 2200 routed to the rear of the chassis 2010 will be referred to herein as "incoming" media segments 2210 (FIG. 40) and the media segments 2200 routed to the front of the chassis 2010 will be referred to herein as "outgoing" media segments 2220 (FIG. 41). However, each media segment 2210, 2220 may carry incoming signals, outgoing signals, or both.

Figure 25:
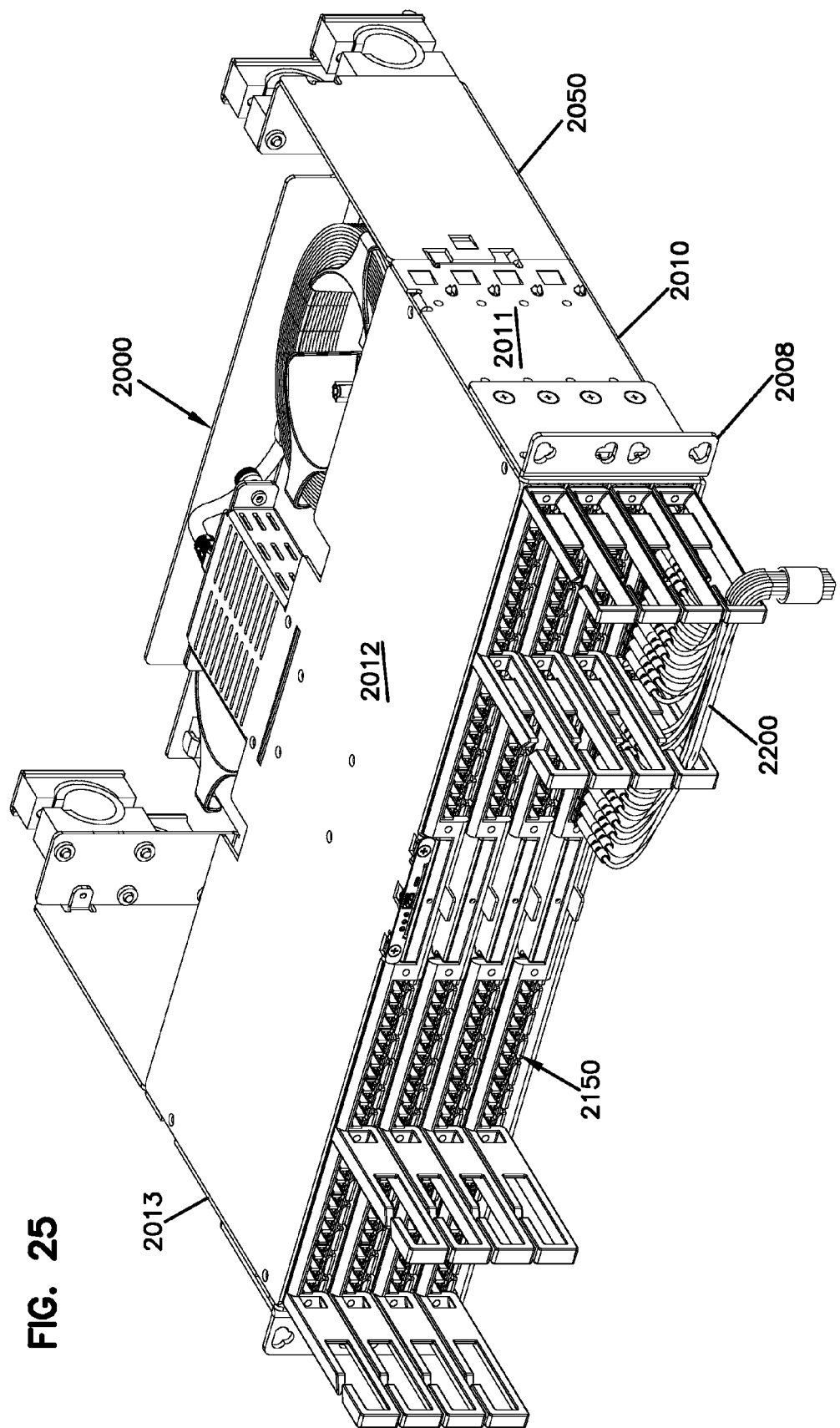
FIGS. 25-44 provide another example connector assembly implemented as a bladed panel system configured to support PLI functionality as well as PLM functionality in accordance with aspects of the present disclosure.
Figure 26:
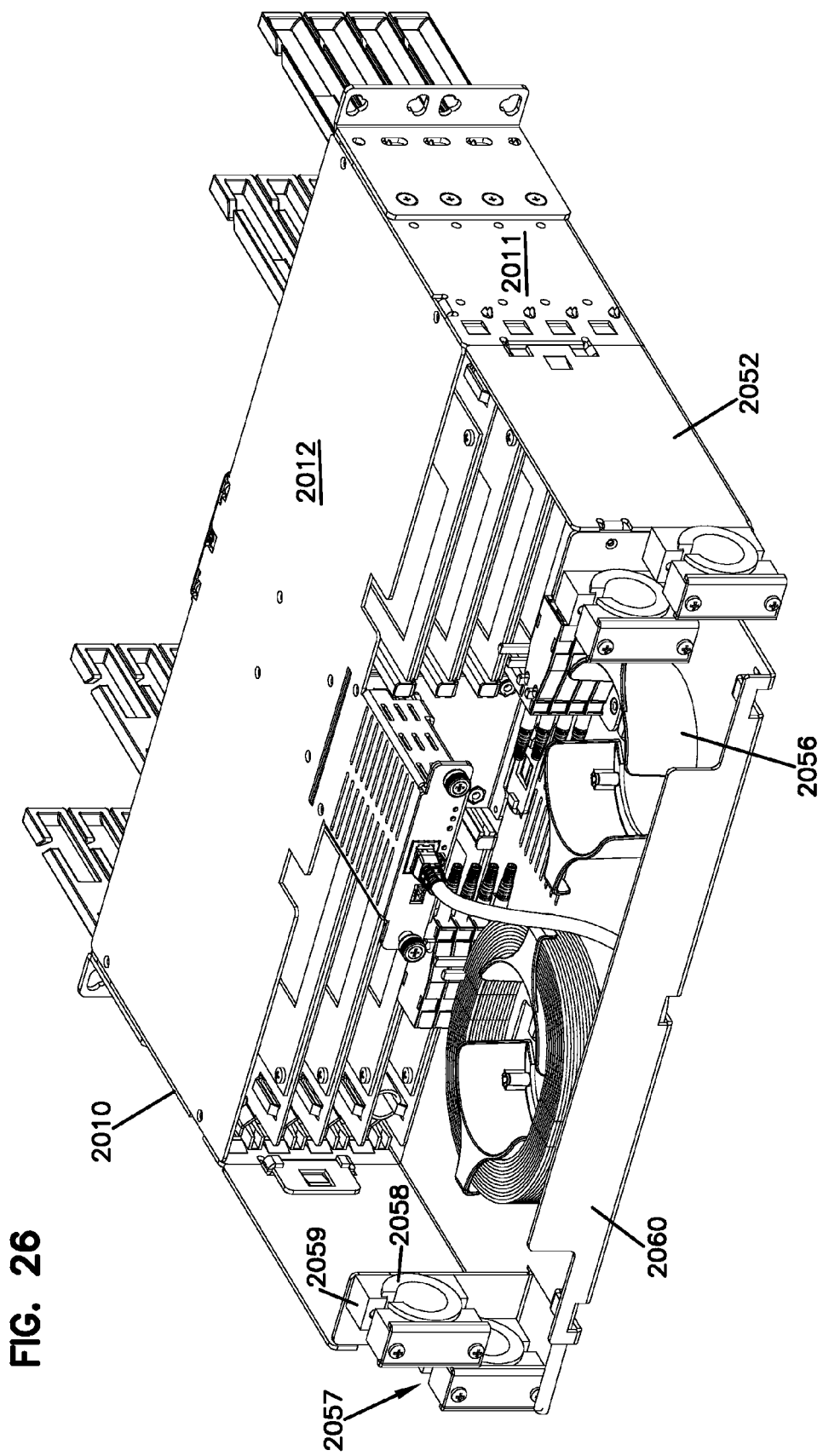

In the example shown in FIG. 25, the chassis housing 2010 is substantially similar to the chassis housing 1010 shown in FIGS. 4 and 7, including opposing side walls 2011 interconnected by opposing major surfaces 2012 to form a housing 2013 defining an interior 2014. The chassis housing 2013 defines an open front and an open rear (see FIG. 27). In other implementations, one or both of the front and rear can be at least partially closed. The chassis housing 2013 includes mounting members 2008 and guides 2015 that enable the blades 2100 to move relative to the chassis housing 2013. For example, the blades 2100 may be configured to move along a connector insertion direction (e.g., forwardly and rearwardly). The chassis housing 2013 also includes forward stops 2017 and rearward stops 2018 to inhibit removal of the blades 2100 from the chassis housing 2013.

A management module 2050 (FIG. 26) also can be mounted to the chassis 2010 to organize one or more of the media segments. In certain implementations, the management module 2050 also is configured to enable the blades 2100 to be moved relative to the chassis 2010 without unplugging incoming cables 2210 from the blades 2100. For example, slack cable length may tighten or loosen around cable spools 2056 positioned at a storage area 2055 of the management module 2050 as the blade 2100 is moved forward and rearward relative to the chassis 2010.

In certain implementations, the management module 2050 may be substantially similar to the management module 1050 shown in FIGS. 22-24, including a base 2051 having opposing side walls 2052. The base 2051 can include a rearward lip 2060 to aid in retaining the physical media segments on the module 2050. Spools 2056 are mounted at the storage area 2055, which is located on the base 2051. Grommets 2058 and seals 2059 are arranged at the segment ports 2057, which are located at the rear of the management module 2050.

Figure 27:
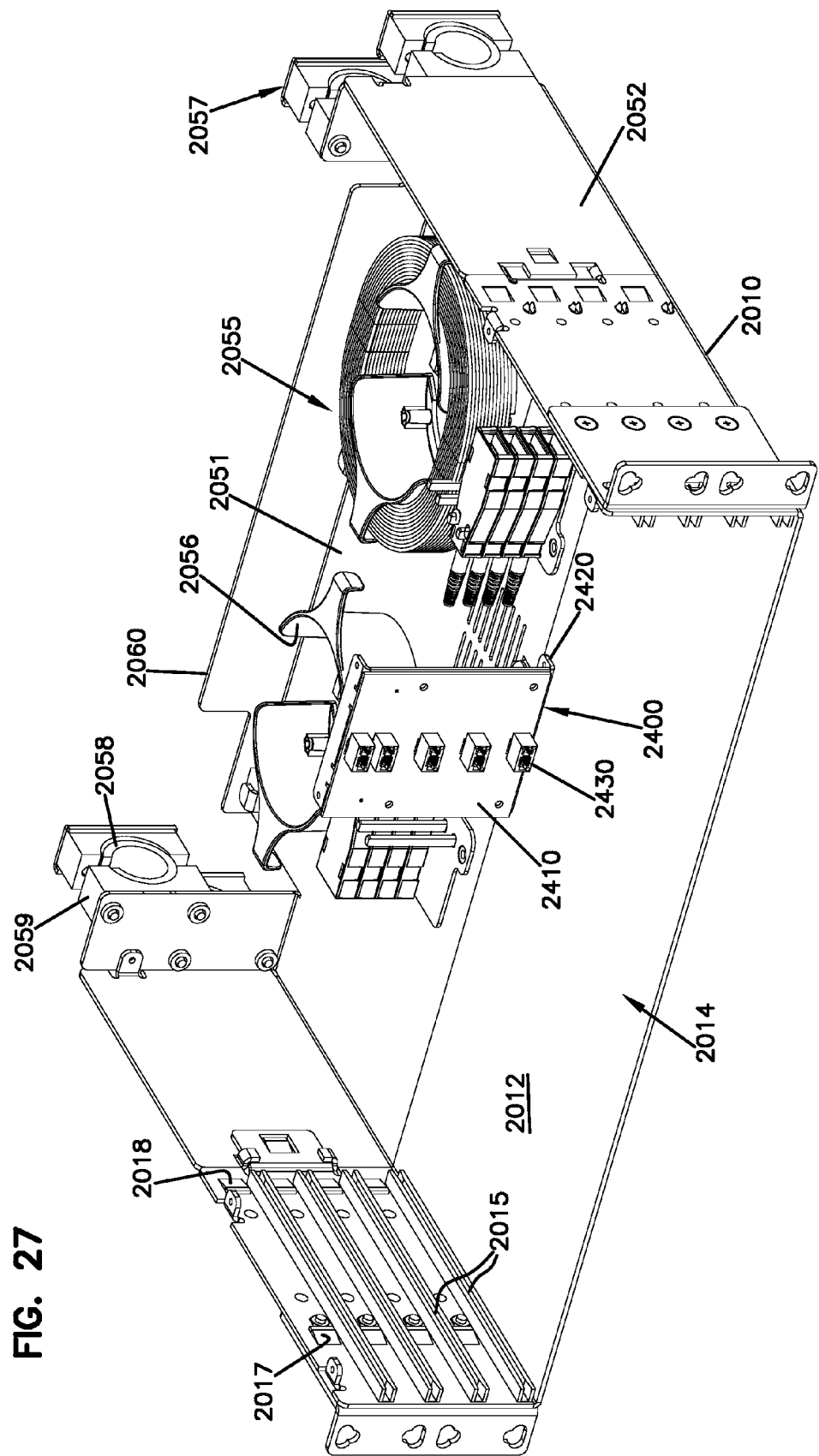

The example bladed panel system 2000 includes PLI functionality as well as PLM functionality. As shown in FIG. 27, the chassis 2010 includes a backplane 2400 to facilitate connecting the blades 2100 to a data management network (e.g., an Internet Protocol network). The backplane 2400 includes a printed circuit board 2410 including connector ports 2430, via which blades 2100 connect to the backplane 2400, and a network port (not shown) via which the backplane 2400 connects to the network. The printed circuit board 2410 is supported by bracket 2420, which couples to the chassis housing 2010.

28-30 illustrate one example implementation of a blade module 2100. Each blade 2100 includes one or more communications couplers 2150, each coupler 2150 defining one or more ports for connecting segments of physical communications media, which carry communications signals. In certain implementations, the couplers 2150 include media reading interfaces that are configured to read physical layer information from storage devices on or in a connectorized media segments plugged into the couplers 2150. Adapter 1300 of FIG. 6 is one example implementation of a coupler 2150. Connector 1220 of FIG. 5 is one example implementation of a connectorized end 1220 of a media segment. Additional examples of couplers and connectorized media segments are disclosed in U.S. Provisional Application Nos. 61/303,961; 61/413,828; 61/437,504; and U.S. application Ser. No. 13/025,841 incorporated by reference above.

The blade 2100 includes a base 2110 configured to ride within the guides 2015 of the chassis housing 2010. A support member 2115 extends upwardly from a front end of the base 2110. Communications couplers (e.g., fiber optic adapters, electrical plugs, etc.) 2150 mount to the support member 2115. A printed circuit board (PCB) arrangement 2120, which is discussed in greater detail herein, and a processor (e.g., a microprocessor) 2140 also are mounted to the blade 2100. In some implementations, the blade processor 2140 does not modify, monitor, or otherwise interact with communications signals propagating over media segments received at the couplers 2150. In certain implementations, the blade processor 2140 is isolated from the signals carried over the media segments. Rather, the blade processor 2140 is configured to manage data signals stored in memory devices of the media segments.

The base 2110 of each blade 2100 includes outwardly extending tabs 2105 that are configured to ride within the chassis guides 2015 and to interact with the stops 2017, 2018. For example, the tabs 2105 can define a riding section 2106 and an engagement section 2107 that function the same as the riding and engagement sections 1106, 1107 of tabs 1105 discussed above. The base 2110 also can include an outwardly extending tab 2108 to facilitate moving the blade 2100 along the guides 2015. For example, the tab 2108 can define a forwardly extending handle with which a user can manipulate movement of the blade 2100.

In certain embodiments, each blade 2100 is configured to move separately from the other blades 2100. In some embodiments, the guides 2015 enable each blade 2100 to move between at least a first position, in which the blade 2100 is positioned within the interior 2014 of the chassis housing 2013 (e.g., FIG. 31), and a second position, in which at least a portion of the blade 2100 protrudes outwardly from the interior 2014 of the chassis housing 2013 (e.g., FIG. 32). In some embodiments, the guides 2015 are implemented as slides configured to facilitate sliding movement of the blades 2100. In the example shown, the slides 2015 are mounted to the opposing side walls 2011 of the chassis 2010 to enable the blades 2100 to slide forwardly and rearwardly relative to the chassis 2010.

In accordance with some aspects, the blades 2100 can be secured in one or more positions. Securing a blade 2100 in a particular position can facilitate access to the communications couplers 2150 and/or a processor 2140 mounted to the blade 2100. For example, securing the blade 2100 in position inhibits the removal of the blade 2100 when adding, removing, or replacing blade couplers 2150 and/or the blade processor 2140. In some implementations, the chassis housing 2013 includes retention features (e.g., as described above with respect to chassis housing 1013) to secure each blade 2100 in an extended position and/or a retracted position.

In accordance with some aspects, the communications couplers 2150 of each blade can remain coupled to the data management network (e.g., via the backplane 2400) even when the blade 2100 is moved relative to the chassis housing 2013 (e.g., to a position in which at least part of the blade 2100 extends outwardly from the chassis interior 2014). The communications couplers 2150 are connected to the backplane 2400 via the PCB arrangement 2120 of the blade and the PCB 2020 of the chassis.

Figure 29:
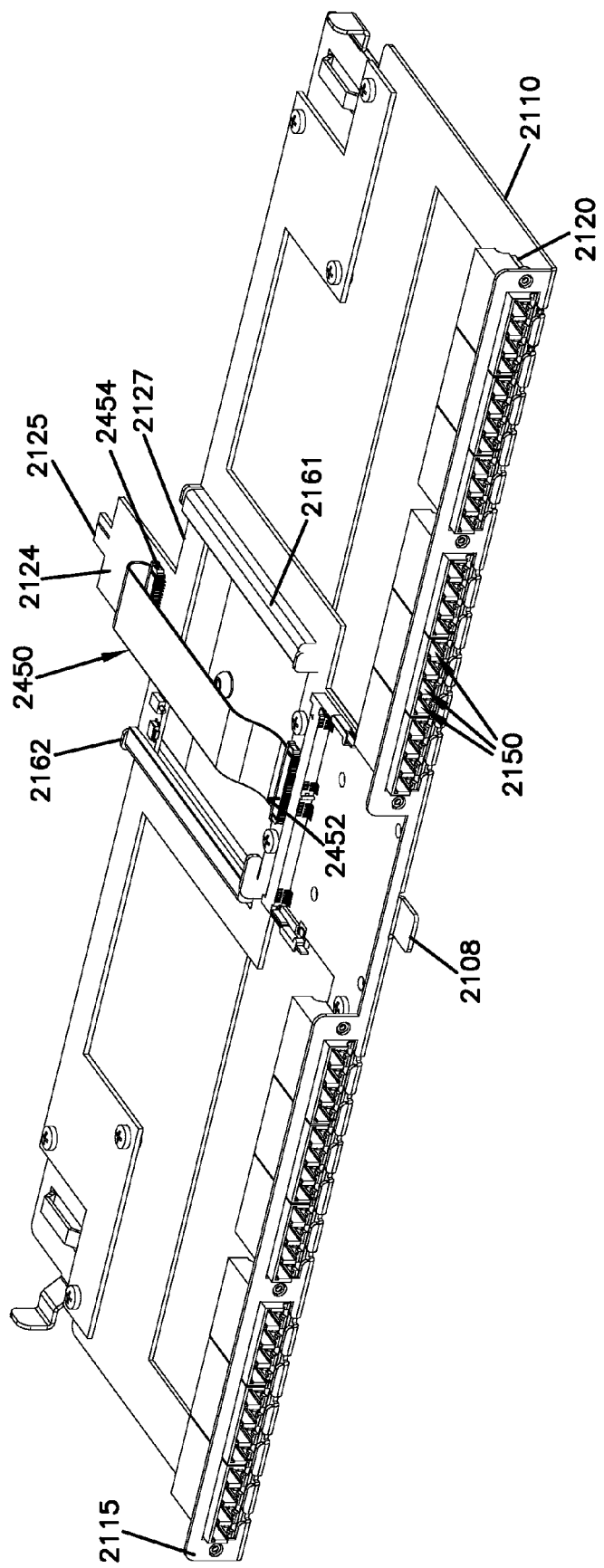
Figure 30:
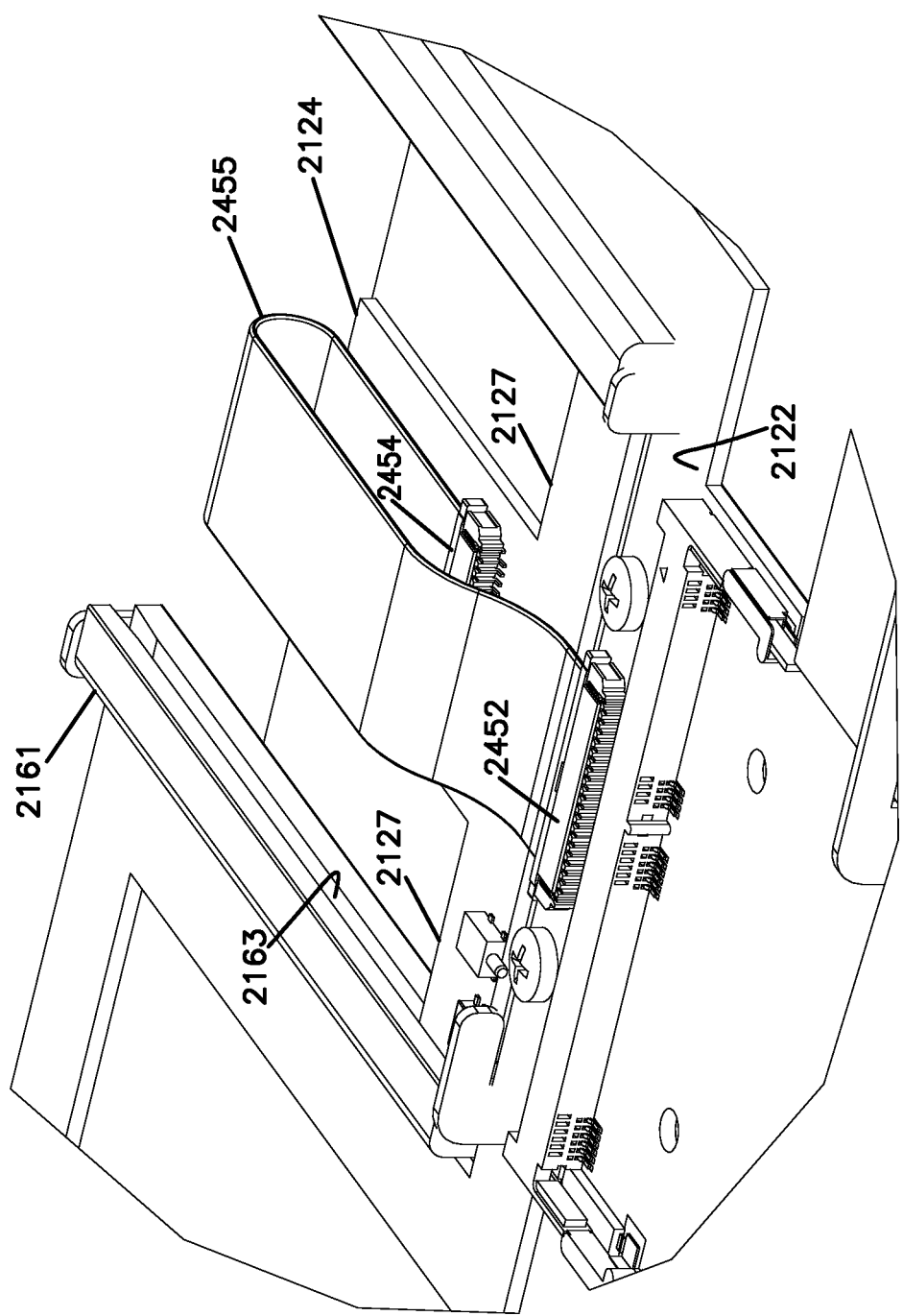
Figure 31:
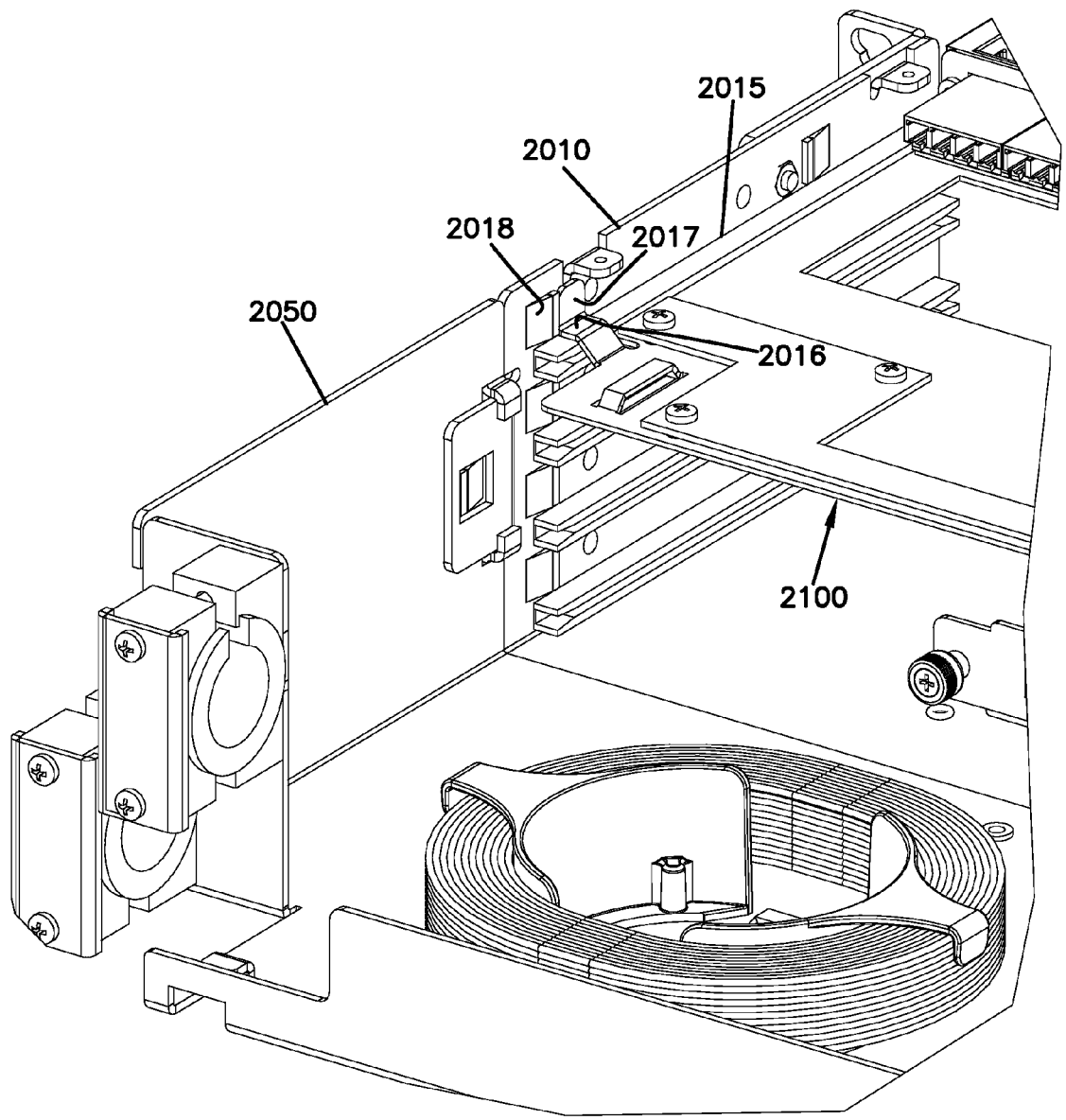
Figure 32:
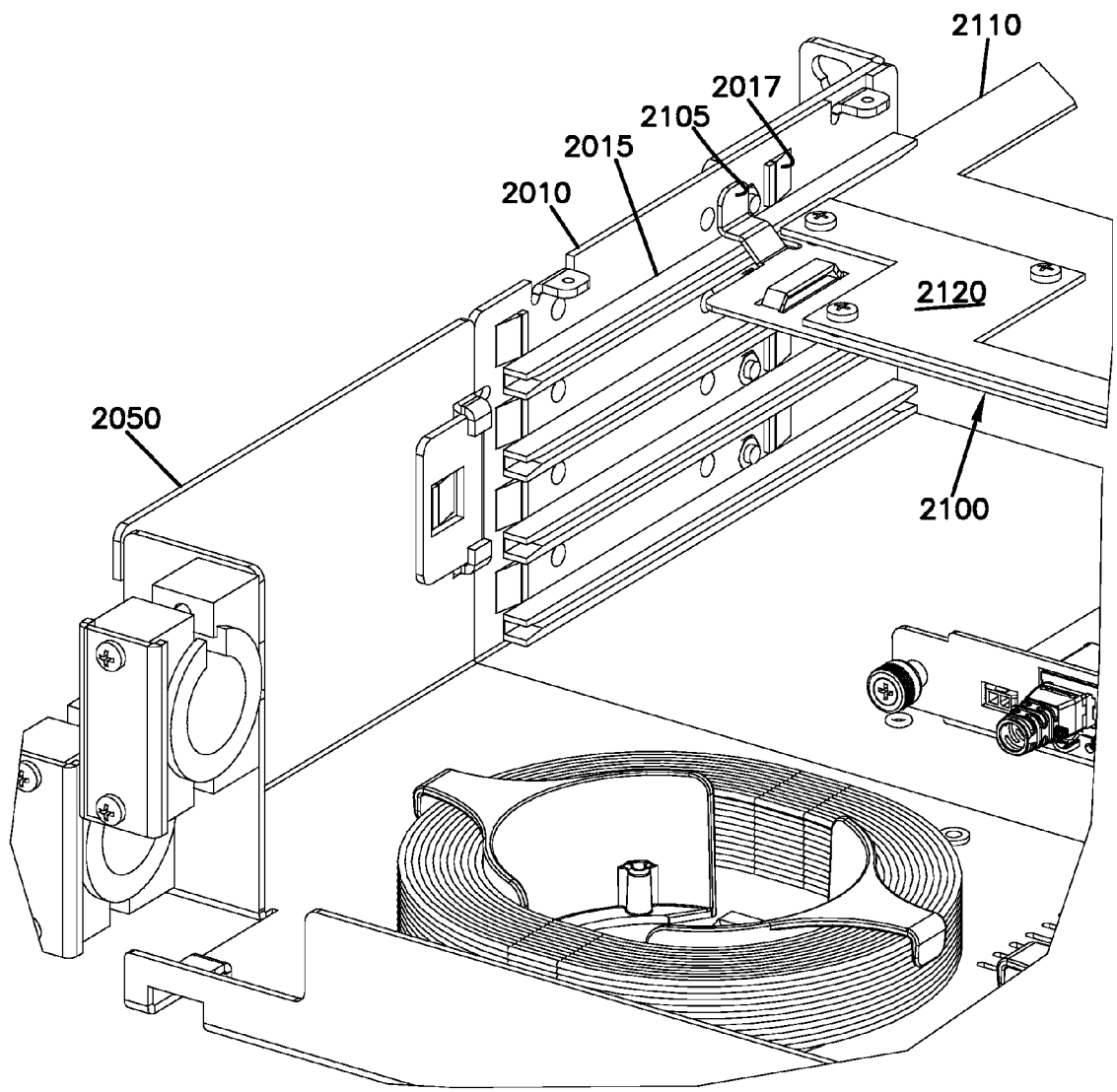
Figure 33:
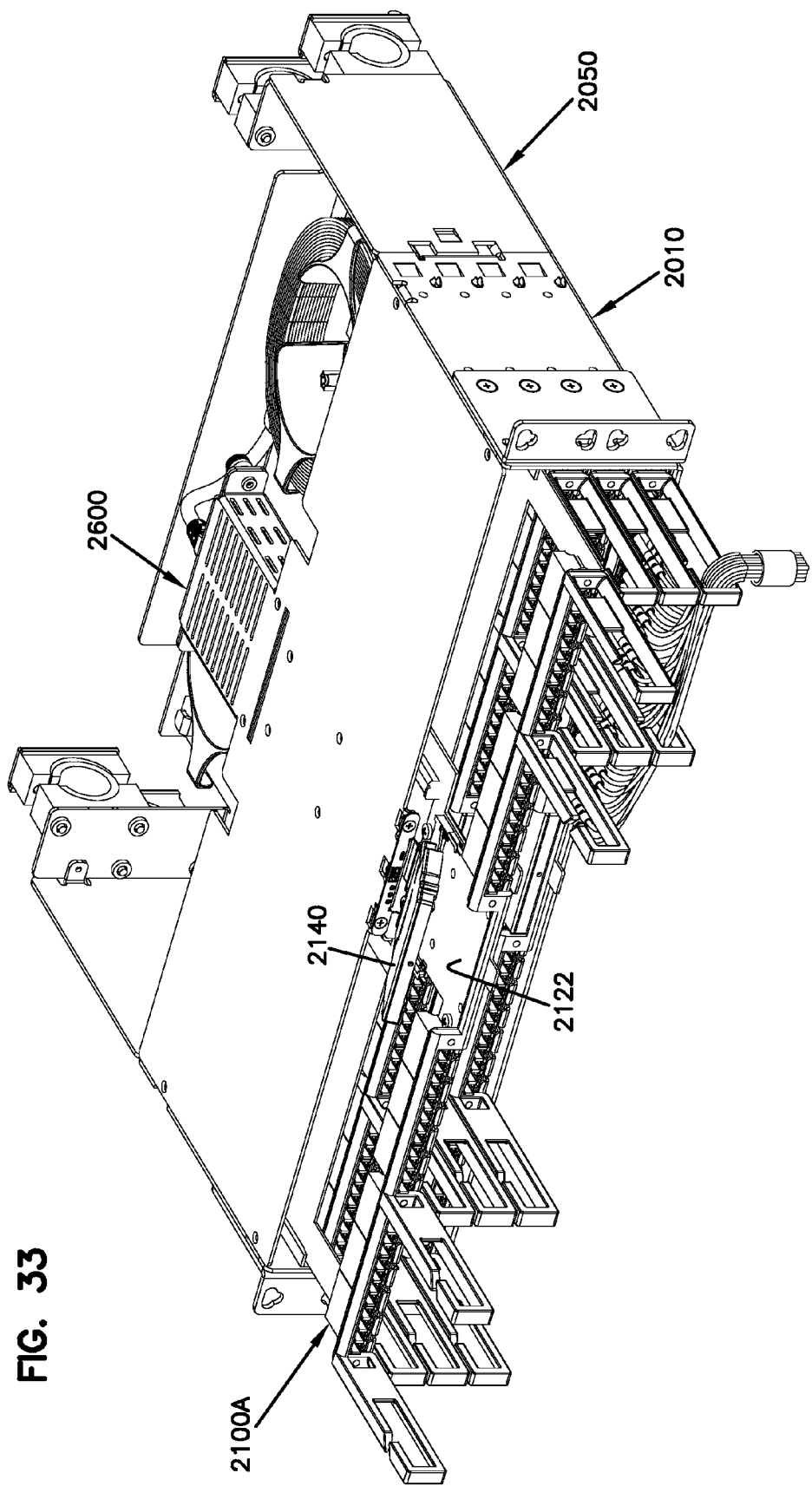
Figure 34:
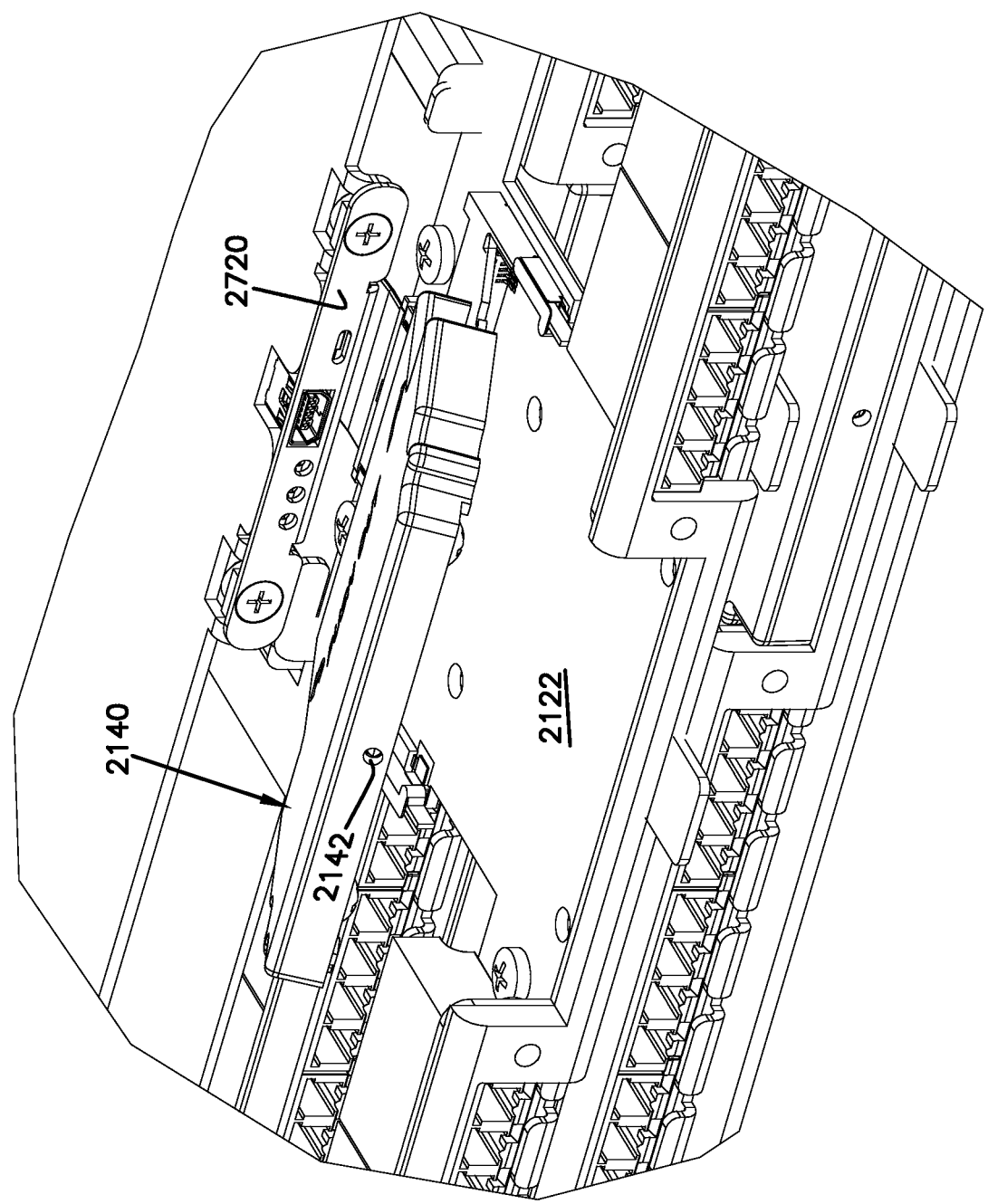

In accordance with some implementations, the PCB arrangement 2120 of each blade 2100 can include at least a first printed circuit board 2122 and a second printed circuit board 2124. The communications couplers 2150 are coupled to first printed circuit board 2122 and the backplane 2400 is coupled to the second printed circuit board 2124. In the example shown, the second printed circuit board 2124 is connected to the backplane 2400 via a card edge connection 2125 (FIG. 29). In other implementations, the second printed circuit board 2124 can be connected to the backplane 2400 via other types of connections (e.g., a plug/socket connection, a cable connection, a wireless connection, etc.).

The printed circuit boards 2122, 2124 are configured to move relative to each other. For example, in some implementations, the second printed circuit board 2124 is configured to slide within a guide arrangement 2160 mounted to the blade base 2110. The guide arrangement 2160 includes opposing guides 2161 bordered by stops 2162 at opposite ends. In the example shown, the second printed circuit board 2124 includes arms 2127 that are configured to slide within channels 2163 defined by the guides 2161. The stops 2162 at the ends of the guides 2161 inhibit removal of the second printed circuit board 2124 from the guides 2161.

The first printed circuit board 2122 is connected to the second printed circuit board 2124 using an electrical cable 2450, which extends from a first end to a second end. A first electrical connector 2452 is attached to and terminates the first end of the cable 2450 and a second electrical connector 2454 is attached to and terminates the second end of the cable 2450. The first connector 2452 is electrically coupled (e.g., via contact pins) to the first printed circuit board 2122 and the second connector 2452 is electrically coupled (e.g., via contact pins) to the second printed circuit board 2124.

Figure 28:
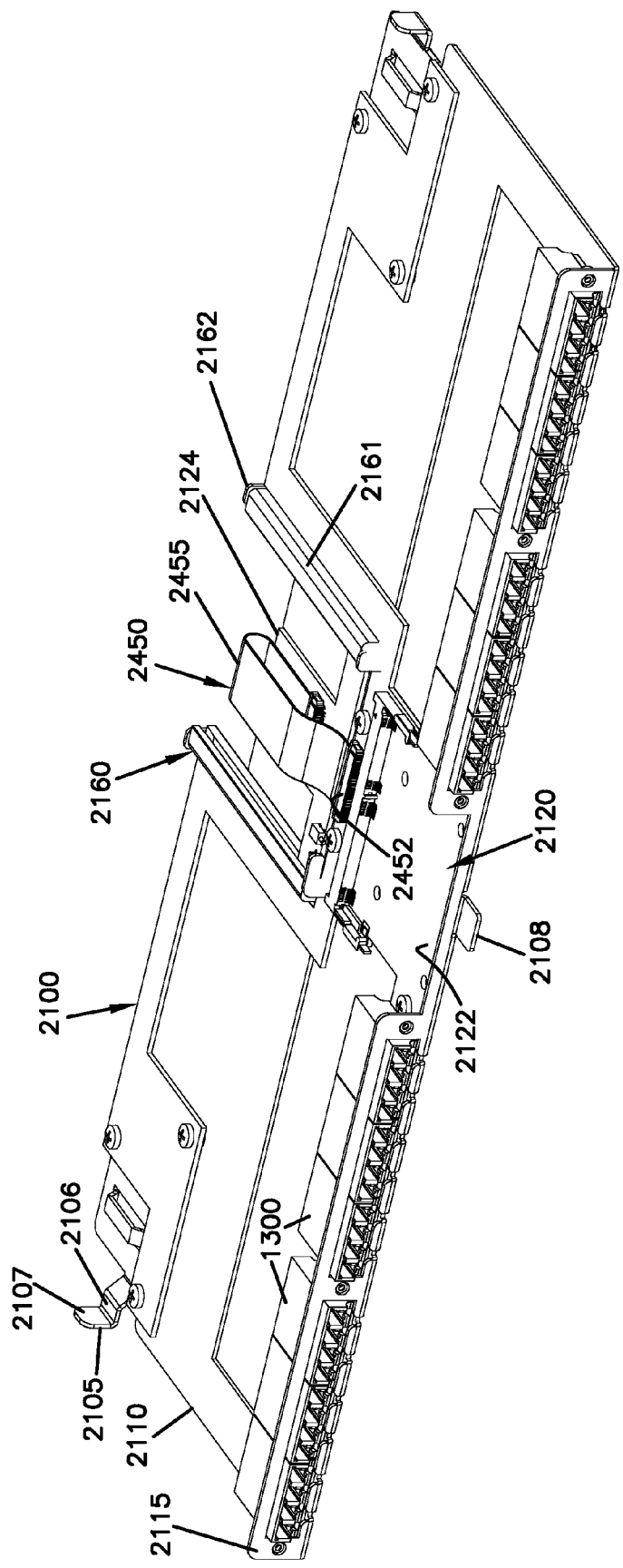

The cable 2450 is sufficiently long to enable the second printed circuit board 2124 to move along the guide channels 2163 relative to the first printed circuit board 2122 without disconnecting from the first printed circuit board 2122. For example, when the second printed circuit board 2124 is positioned at a first end of the channels 2161 (e.g., as shown in FIG. 28), the cable 2450 can form a half loop 2455 at a location between the first and second connectors 2452, 2454. When the second printed circuit board 2124 is positioned at a second end of the channels 2161 (e.g., as shown in FIG. 29), the cable 2450 straightens out to extend over the distance between the printed circuit boards 2122, 2124.

In use, the guide arrangement 2160 can be configured so that the second printed circuit board 2124 is located at the first end of the guides 2161 when the blade 2100 is located in the first position within the interior 2014 of the chassis 2010. The guide arrangement 2160 also can be configured so that the second printed circuit board 2124 is located at the second end of the guides 2161 when the blade 2100 is located in the second position protruding outwardly from the interior 2014 of the chassis 2010.

Accordingly, when a user chooses to pull one of the blades 2100 forwardly relative to the chassis housing 2013 (e.g., to access a communications coupler or to access the processor 2140), the first connector 2452 of the corresponding cable 2450 moves with the blade 2100. The second connector 2454, however, remains attached to the backplane 2400. For example, if a user wants to add, remove, or replace a physical media segment 1200 on a blade 2100, then the user can slide the blade 2100 to a forwardly extended position to access the desired segment 1200 or coupler port without disconnecting the storage devices 1230 of the remaining physical media segments 1200 mounted to the blade 2100 from the data management network.

In one implementation, the amount of force necessary to overcome the retention feature 2016, which inhibits removal of the blade 2100 from the chassis 2010, is sufficient to overcome the connection between the second printed circuit board 2124 and the backplane 2400. For example, the force necessary to overcome the retention feature 2016 is sufficient to disconnect a card edge connection between the second printed circuit board 2124 and the backplane 2400.

As noted above, moving a blade 2100 to a position at least partially outside the chassis 2010 facilitates access to components on the blade 2100. For example, moving the blade to such an extended position can facilitate access to a processor 2140 mounted to the blade. In accordance with certain aspects of the disclosure, the processors 2140 mounted to the blades 2100 can be added, removed, or replaced without completely removing the blade 2100 from the chassis 2010.

In certain implementations, the blade processor 2140 includes a connector or socket that is configured to mate with a complementary socket or connector on the first printed circuit board 2122 of the blade 2100. For example, the blade processor 2140 can be secured to the first printed circuit board 2124 using a snap-fit connection (see FIGS. 33 and 36). In other implementations, the blade processor 2140 can be secured to the first printed circuit board 2122 using other types of connectors (e.g., cable, mezzanine, etc.).

In accordance with some aspects of the disclosure, the backplane 2400 of the chassis 2010 connects to the data network via a chassis processor 2600. The chassis processor 2600 functions as the interface between the panel system 2000 and the data management network. In some implementations, the chassis processor 2600 manages the blade processors 2140. For example, the chassis processor 2600 can instruct each of the blade processors 2140 to determine which communications couplers 2150 have media segments inserted therein, to obtain physical layer information from the media segments, and to forward the physical layer information to the chassis processor 2600 for storage and/or transmission to the data network. In one implementation, the chassis processor 2600 has a master/slave relationship with the blade processors 2140.

The chassis processor 2600 is configured to mount to the chassis housing 2013. For example, in some implementations, the chassis processor 2600 can mount to a support structure 2070 extending outwardly from a top, rear of the chassis housing 2013 (e.g., see FIG. 35). The support structure 2070 includes a top 2071 and side walls 2072 defining an interior that is sized and configured to receive the chassis processor 2600. Support flanges 2073, which extend outwardly from the side walls 2072, define through openings 2074. The chassis processor 2600 includes a base 2610 and a fascia 2612 extending generally perpendicular to the base 2610. The fascia 2612 defines openings through which fasteners 2615 (e.g., set screws) can extend. The fasteners 2615 also extend through the openings defined in the support flanges 2073 of the support structure 2070 to secure the chassis processor 2600 to the support structure 2070.

The chassis processor 2600 includes a printed circuit board 2620 mounted to the base 2610 (e.g., using fasteners 2614). The printed circuit board 2620 of the chassis processor 2600 is configured to connect to the printed circuit board 2410 of the backplane 2400 (e.g., via a card edge connection, via a plug/socket connection, via a cable connection, etc.). Memory (e.g., an EEPROM chip) and other electronic circuitry can be mounted to the printed circuit board 2620. Physical layer information obtained by the communications couplers 2150 can be stored in the memory of the chassis processor 2600.

Figure 35:
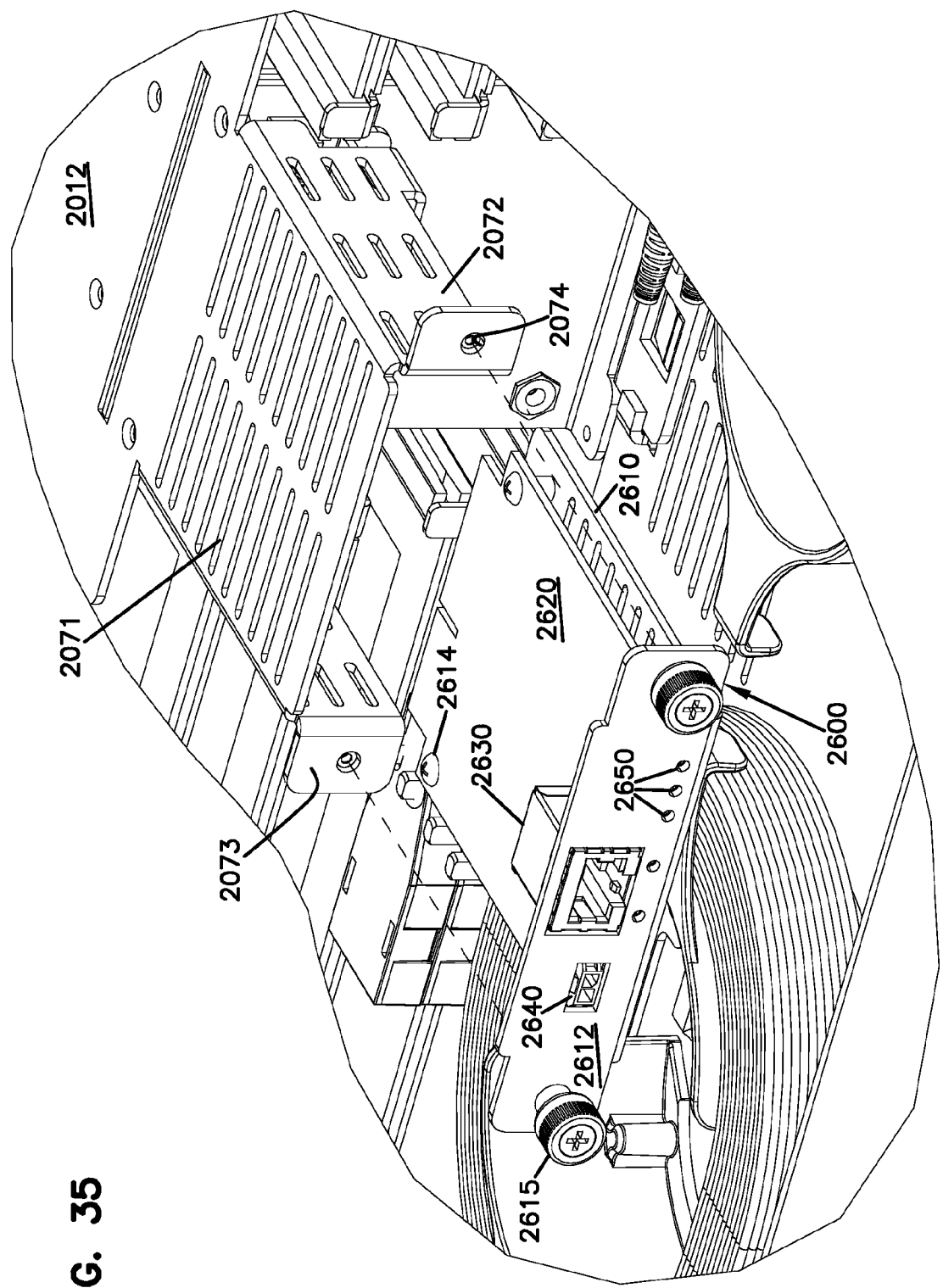
Figure 36:
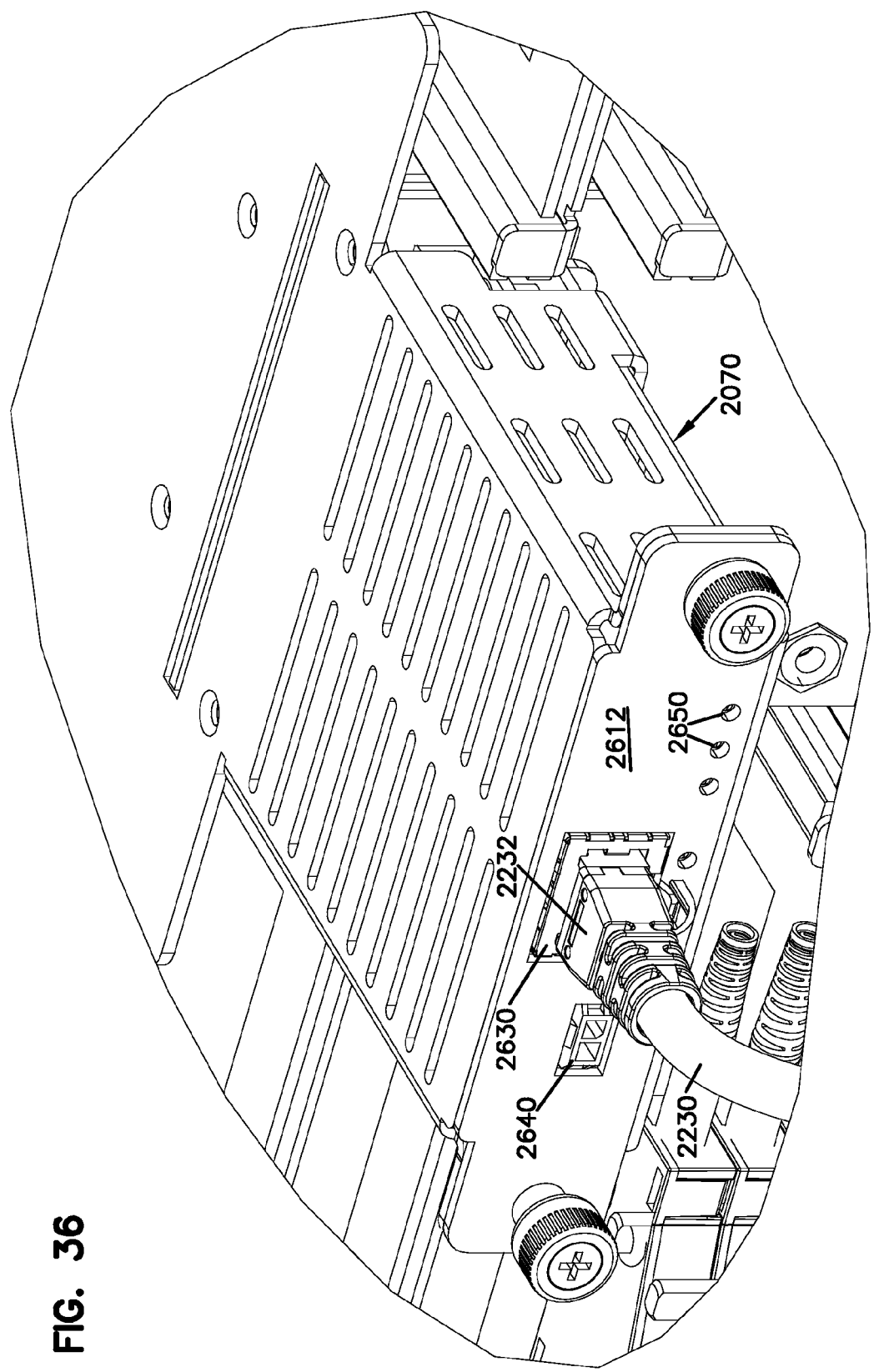
Figure 37:
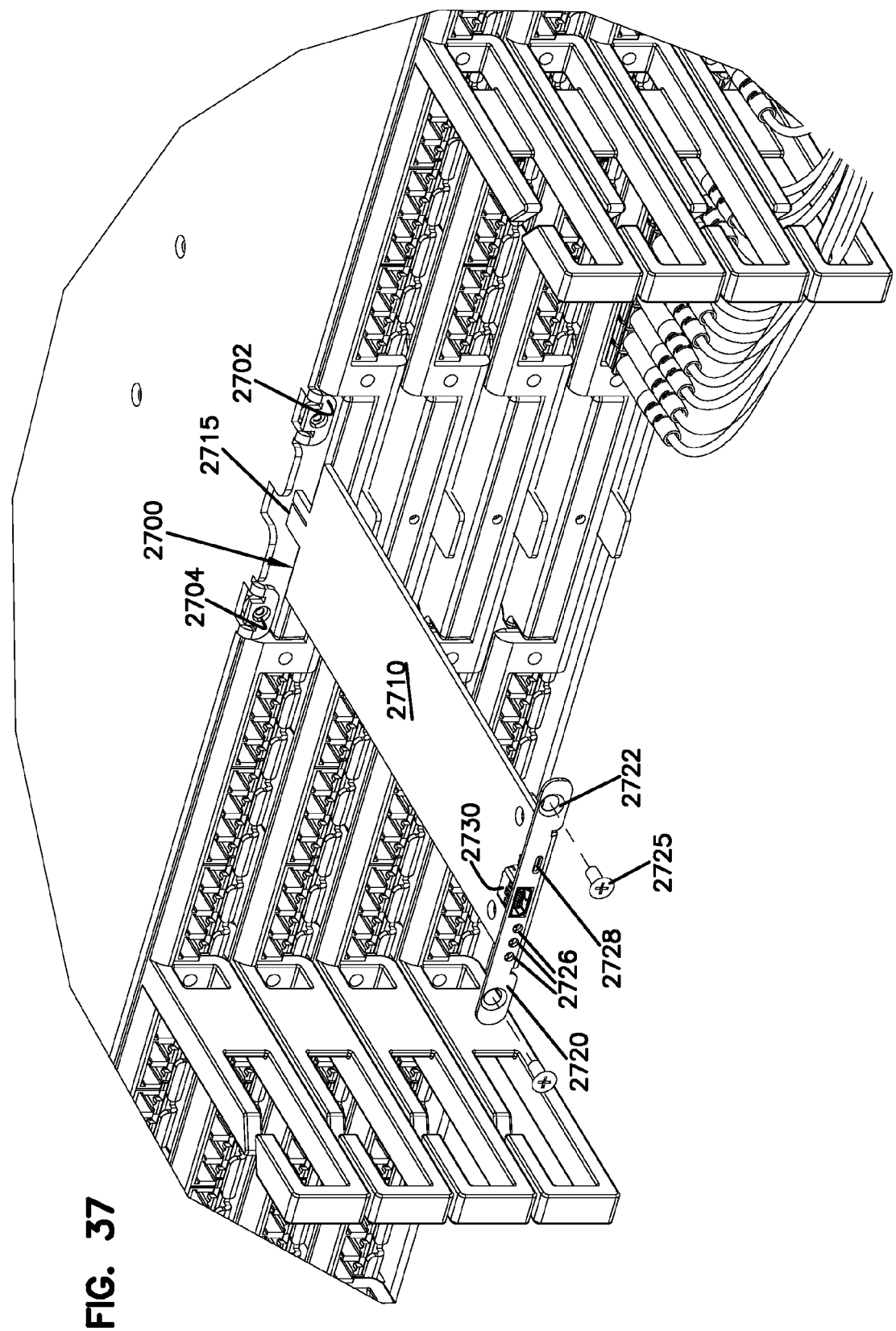
Figure 38:
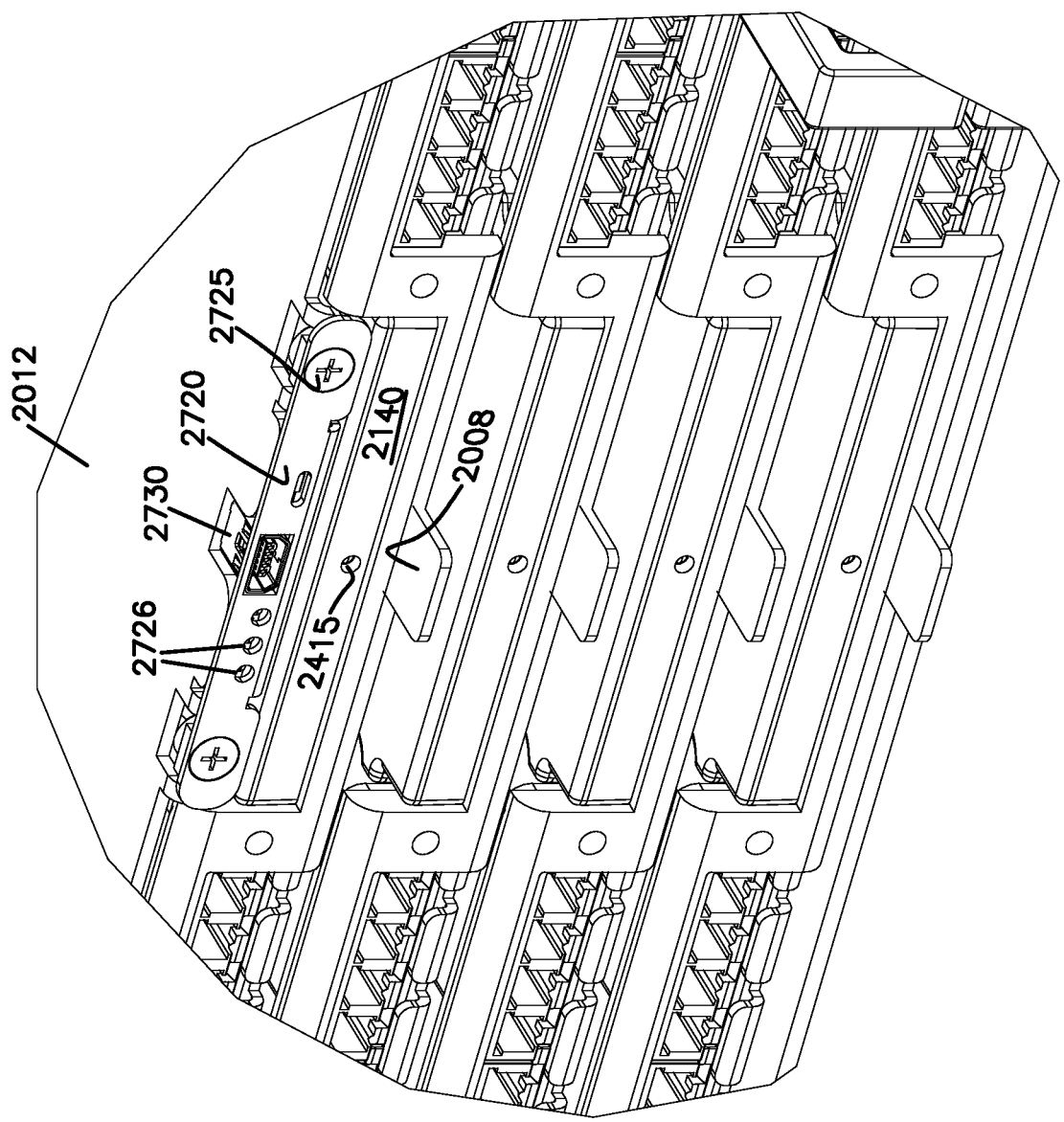

In accordance with some implementations, the fascia 2612 of the chassis processor 2600 includes one or more indicators (e.g., light emitting diodes) 2650 (e.g., see FIG. 35). The indicators 2650 can display status information (e.g., error information, power information, network connection information, etc.).

A first network port 2630 is electrically connected to the printed circuit board 2620 of the chassis processor 2600. In the example shown, the first network port 2630 defines an RJ jack configured to receive an electrical plug 2232 terminating a PLI cable 2230 (FIG. 36) connecting the panel system 2000 to the data network (e.g., network 218 of FIG. 2, network 101 of FIG. 1, etc.). In other implementations, however, the first network port 2630 can define a USB socket or other type of cable port.

In accordance with certain aspects, a second port 2640 also can be connected to the printed circuit board 2620. In the example shown, the second port 2640 defines a DC power socket. In other implementations, however, the second port 2640 can define any suitable type of power cable port. In some implementations, the second port 2640 provides an alternative port by which the panel system 2000 can receive power from an auxiliary power source (e.g., when Power Over Ethernet is not available).

In accordance with some aspects of the disclosure, the chassis 2010 can include one or more data ports 2730 (e.g., see FIG. 37) configured to enable connecting a mobile device to the storage devices on any media segments plugged into the communications couplers 2150. The data port 2730 enables a user to connect (e.g., using a communications cable) a mobile device (e.g., a handheld scanner, a cell phone, a Smartphone, a PDA, a laptop, etc.) to the panel system 2000. For example, a user can download physical layer information about the media segments connected to the communications couplers 2150 of the panel system 2000 from the chassis processor 2600 to memory on the mobile device.

The user also can use the mobile device to manipulate (e.g., add, delete, and/or change) the physical layer information stored on the chassis processor 2600. For example, the user can upload new and/or updated physical layer information (e.g., test results) from the mobile device to the chassis processor 2600. In accordance with certain aspects, the user can upload physical layer information pertaining to media segments that are connected to the communications couplers 2150 but are not associated with storage devices (i.e., do not otherwise have PLI and PLM functionality).

In some implementations, each blade processor 2140 defines such a data port 2730. In other implementations, the chassis 2010 is configured to receive a status board 2700 defining such a data port (see FIG. 37). For example, the status board 2700 can slide into the chassis housing 2013 from a front of the chassis 2010. The status board 2700 includes a fascia 2720 mounted to one end of a printed circuit board 2710. In the example shown, the fascia 2720 defines openings 2722 through which fasteners 2725 can extend to be received in openings 2704 defined by mounting tabs 2702 of the chassis housing 2013 (see FIGS. 37 and 38). In certain implementations, the printed circuit board 2710 slides along guides mounted within the chassis housing 2013. In other implementations, the status board 2700 can be otherwise secured to the chassis 2010.

The data port 2730 mounts to the fascia 2720 and electrically connects to the printed circuit board 2710. The other end of the printed circuit board 2710 is configured to connect to the printed circuit board 2410 of the backplane 2400. In the example shown, the printed circuit board 2710 includes a card edge connector 2715 that plugs into the printed circuit board 2410 of the backplane 2400. In other implementations, the printed circuit board 2710 can connect to the backplane 2400 using a different type of electrical connector. Accordingly, a mobile device (i.e., as discussed above) can be plugged into the panel system 2000 and/or data network from the front of the chassis 2010.

Additional components also can be mounted to the status board 2700. For example, indicators (e.g., LEDs) 2726 can be positioned on the fascia 2720. The LEDs 2726 can display status information (e.g., error information, power information, network connection information, etc.) for the chassis 2010. An indicator 2415 on a front of each blade processor 2140 can identify or display a status for the individual blade 2100.

In some implementations, a switch (i.e., or other input mechanism) 2728 is positioned on the fascia 2720. In accordance with some aspects, the input mechanism 2728 can include a momentary pushbutton signal to the chassis processor 2600. In other implementations, the input mechanism 2728 can include a fixed position slide or a pushbutton switch for particular signal configuration indications to the chassis processor 2600.

Figure 39:
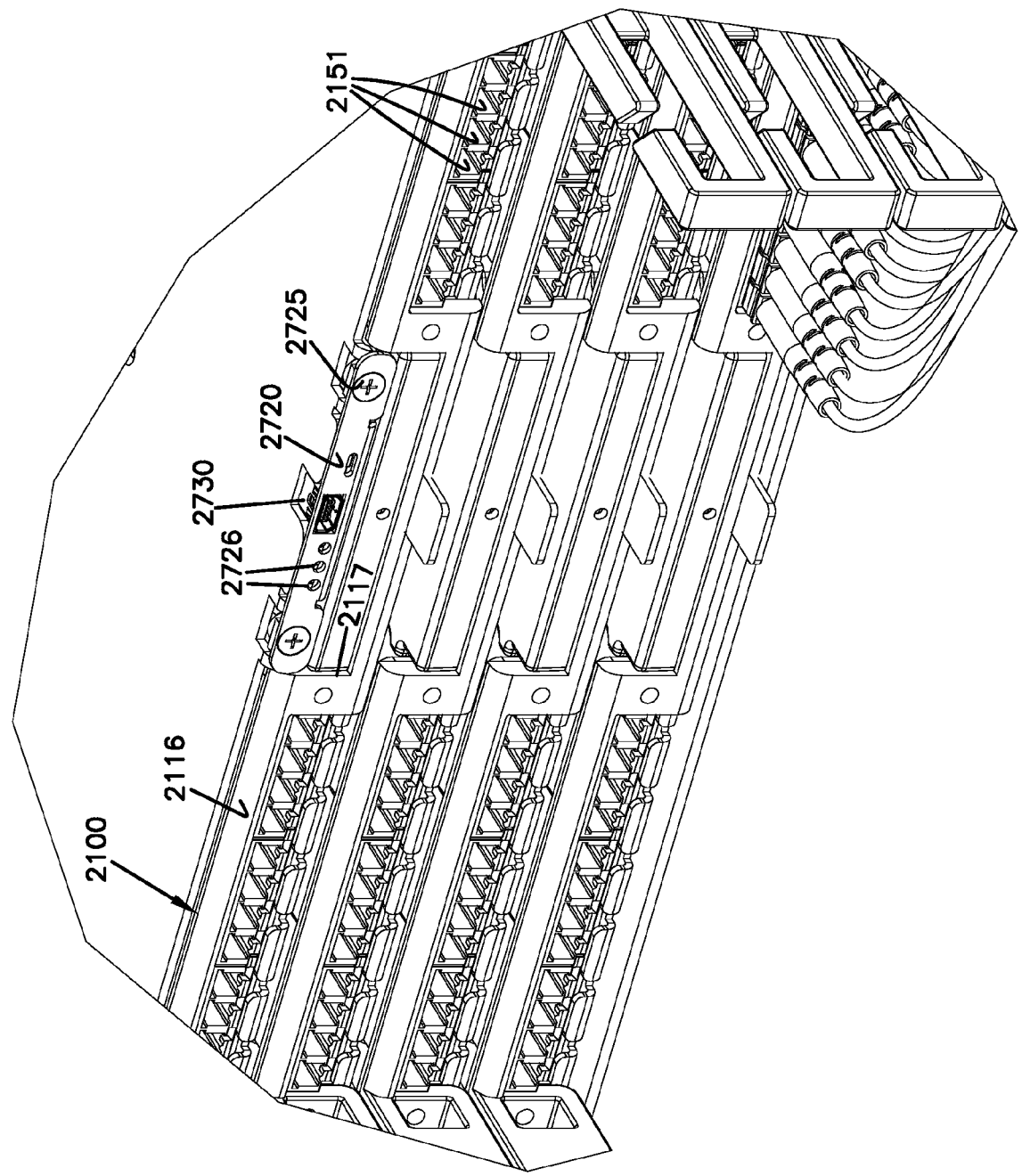
Figure 40:
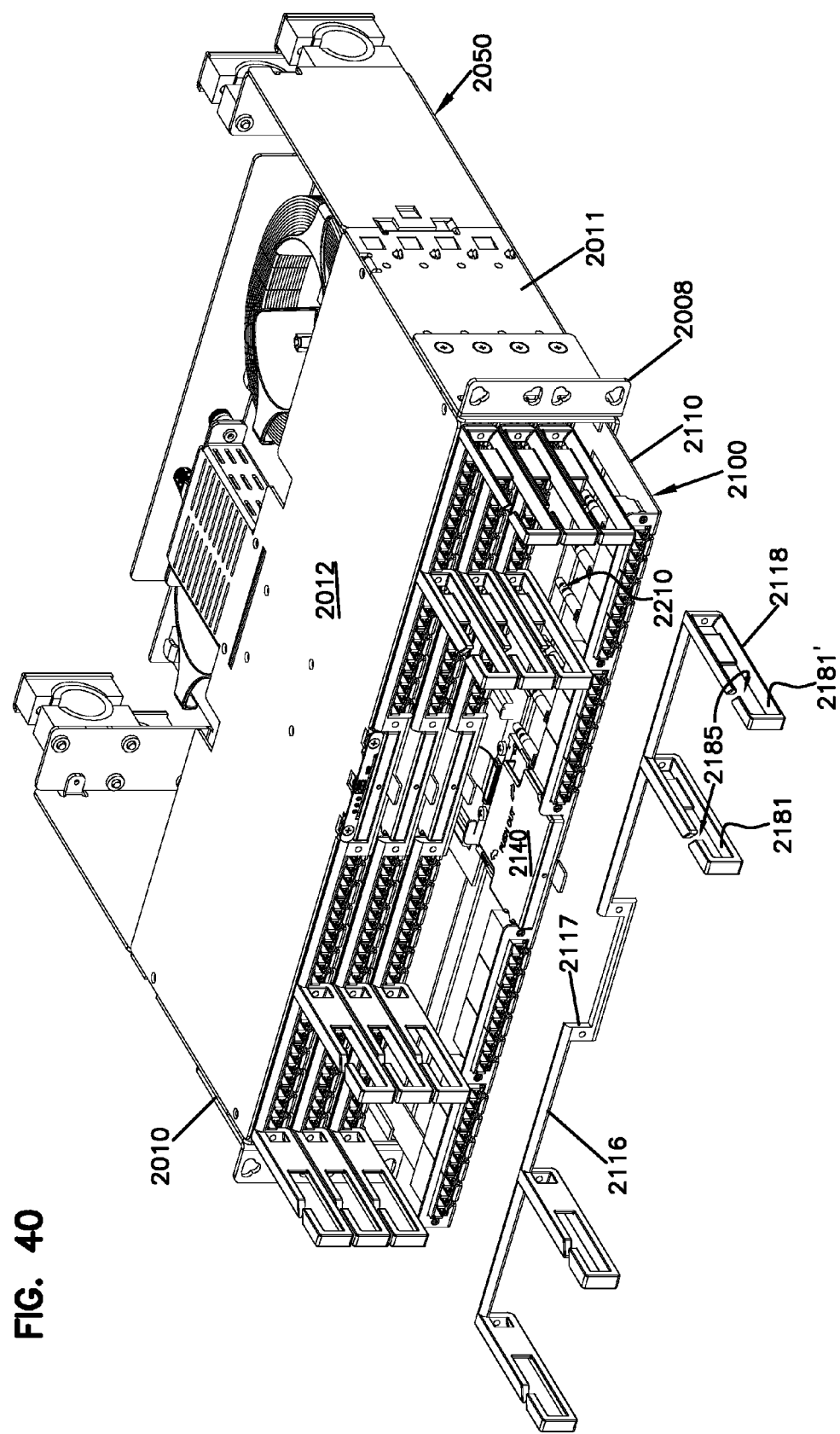
Figure 41:
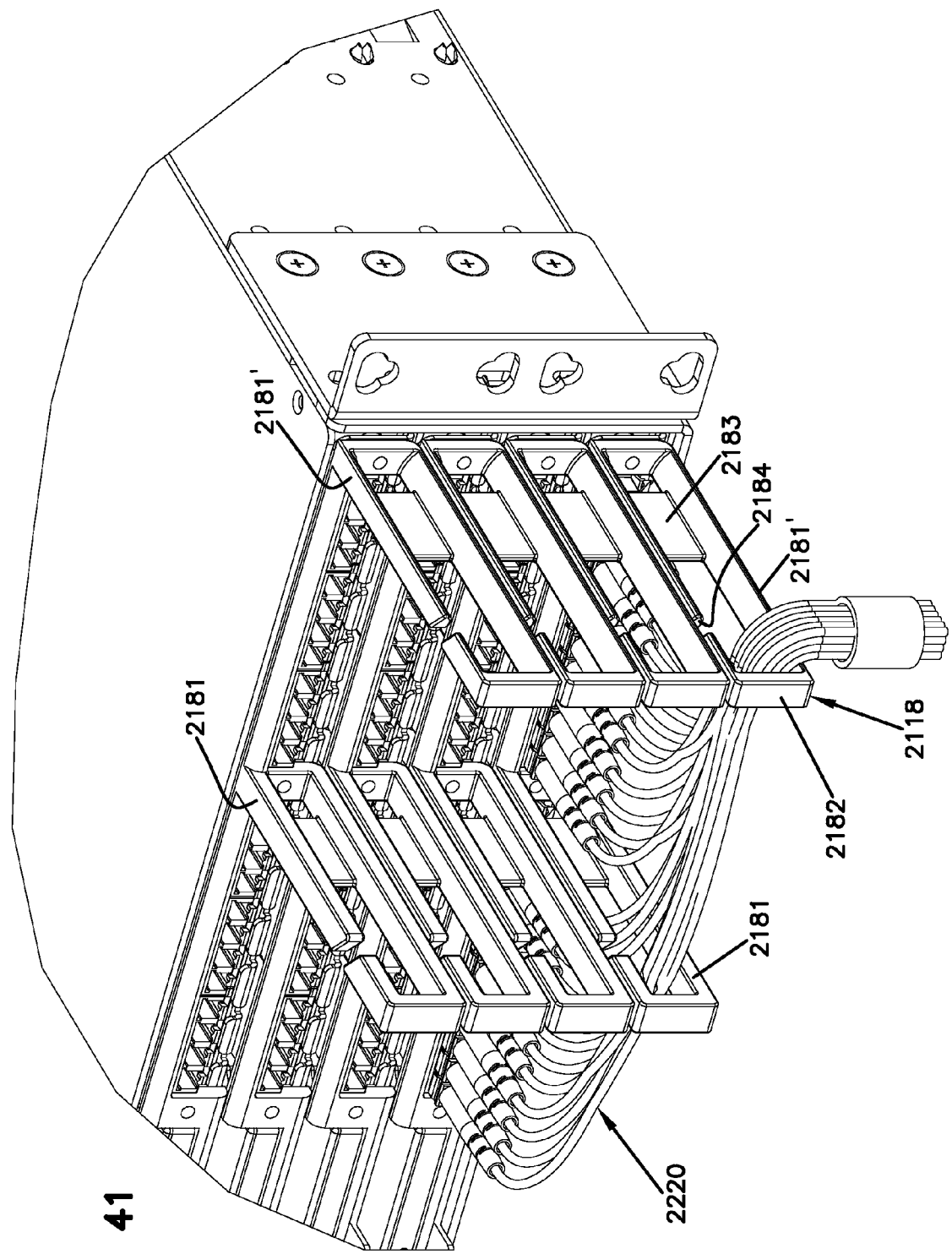

As shown in FIGS. 39-41, a fascia 2116 can be mounted to the support structure 2115 of each blade 2100. In some implementations, the fascia 2116 includes indicia for identifying particular ones of the communications couplers 2150 or sets of the couplers 2150 (e.g., duplex couplers, quad couplers, etc.). In one implementation, each fascia 2116 includes a number printed above each coupler port. In another implementation, each fascia 2116 includes a number printed above each predefined set of coupler ports. In other implementations, however, other types of indicia (letters, colors, etc.) can be used.

The fascia 2116 defines a stepped portion 2117 that is sized and configured to accommodate the blade processor 2140 so that the indicator 2145 on the blade processor 2140 is visible from the front. The stepped portion 2117 of each blade fascia 2116 also is sized and configured to accommodate the status board 2700 so that the fascia 2720 of the status board 2700 is visible from the front of the chassis 2010. Accordingly, the data port 2730 and indicators 2726 are accessible to a user (see FIG. 39).

Some example fascia 2116 can include segment management structures. For example, in some implementations, a fascia 2116 can include retention members or fingers 2118 extending forwardly of the fascia 2116 (see FIG. 40). In the example shown, the fingers 2118 are configured to route communications cables (e.g., optical fibers, optical fiber cables, electrical conductors, electrical cables, etc.) away from the communications couplers 2150 along a cable routing path (e.g., see FIG. 41).

In the example shown, each retention member 2118 includes opposing retaining members 2181 interconnected by side members 2182 to define a through passage. A rib 2183 extends between the retaining members 2181 within the through passage to define a cable routing passage 2185 (FIG. 40). One of the retaining members 2181 defines a slot 2184 leading to the cable routing passage 2185. In the example shown, the slot 2184 is defined in a top retaining member 2181 of each retention member 2118. In other implementations, the slot 2184 can be defined in one of the side members 2182. In still other implementations, the slot 2184 can be closed by a flexible or removable bridge.

One or more segments of physical communications media can be routed from the communications couplers 2150, through the cable routing passages 2185 defined by the retaining members 2181, to the sides of the chassis 2010. In some implementations, the outermost retention members 2118 have retaining members 2181' that define ramped or curved inner surfaces to facilitate routing the media segments. For example, the curved inner surfaces of the retaining members 2181' can inhibit excessive bending of optical media segments.

Figure 42:
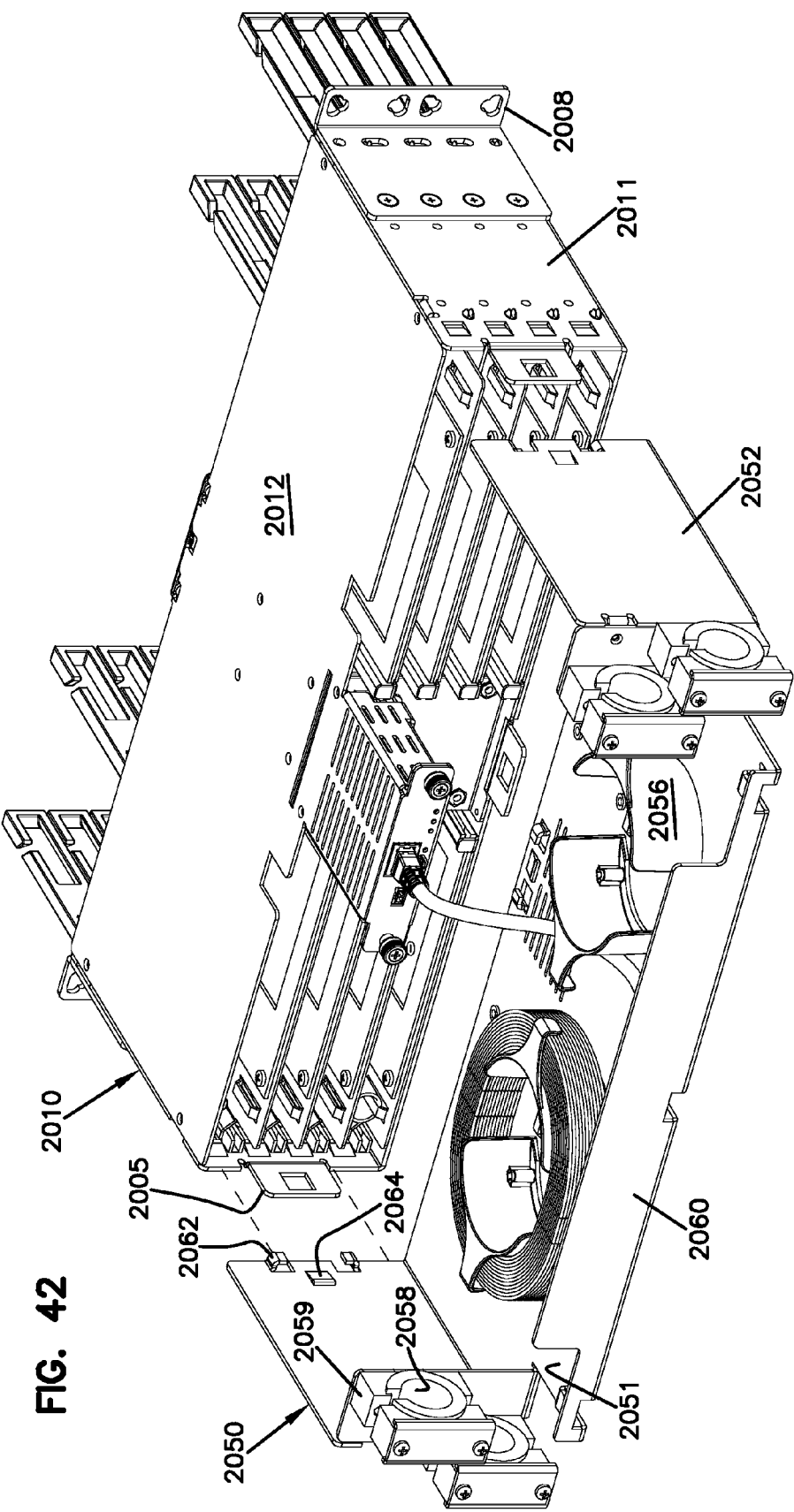
Figure 43:
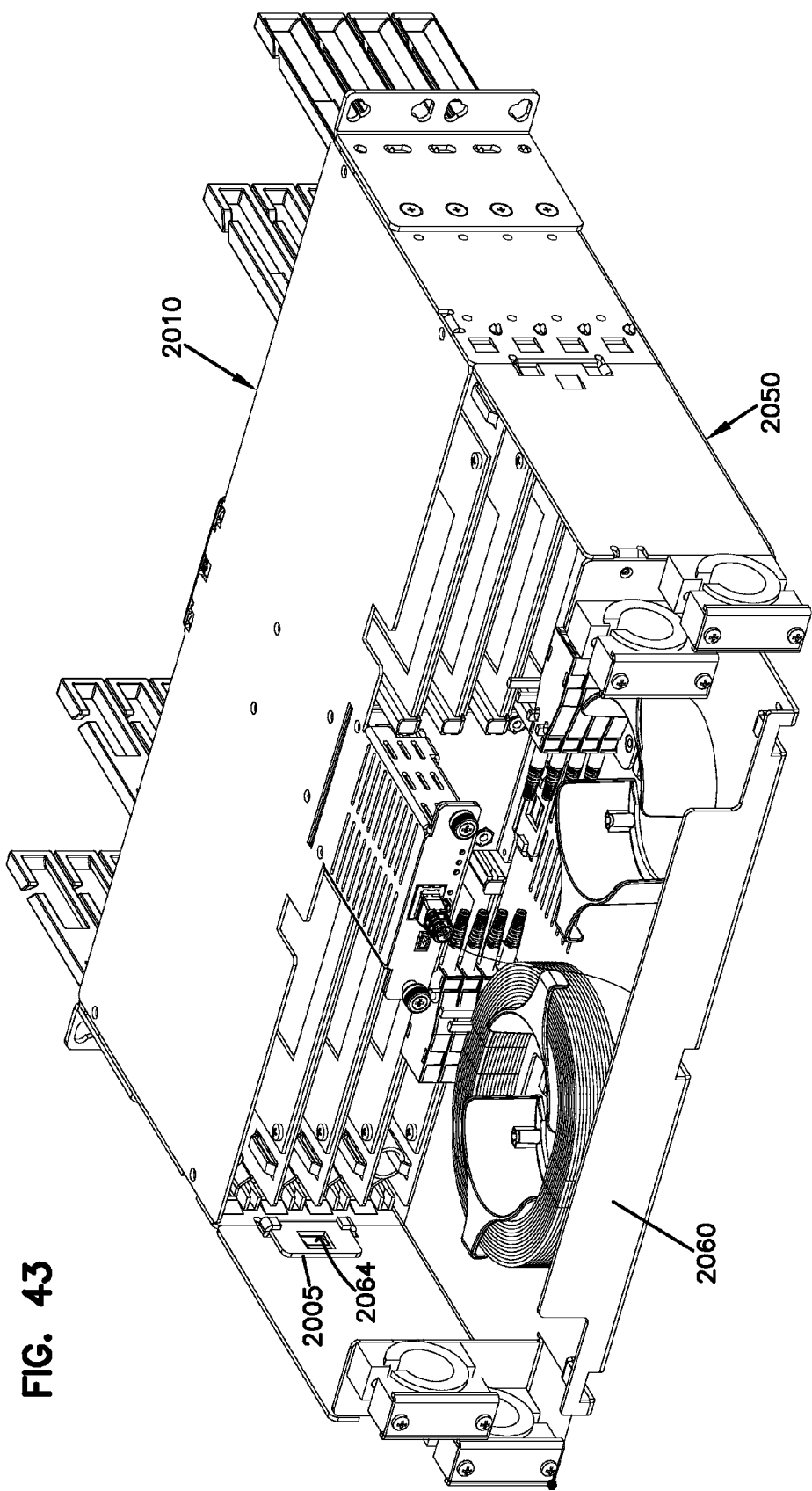
Figure 44:
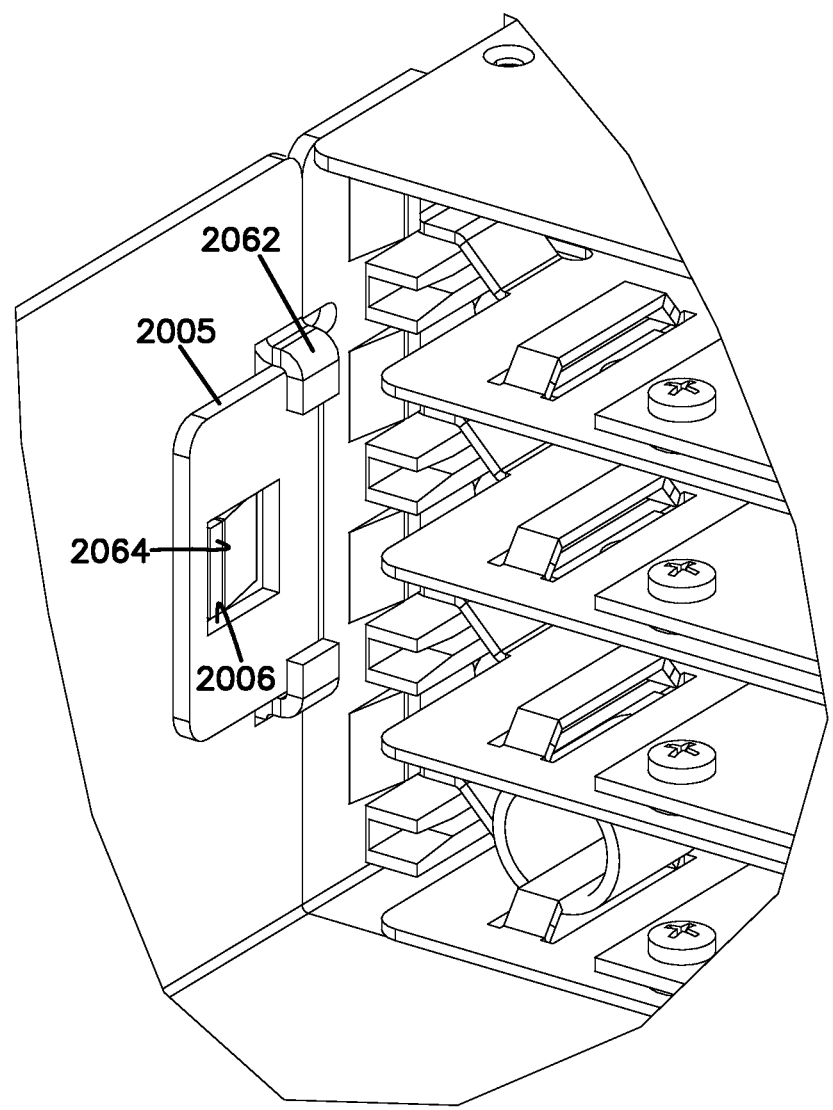

Referring to FIGS. 42-44, the management module 2050 can be secured to a rear side of the chassis housing 2010 without components protruding outwardly from the management module 2050. Having a substantially planar interface between the chassis housing 2010 and the management module 2050 on each side can facilitate insertion of the panel system 2000 into an equipment rack or other suitable support structure.

In the example shown, the management module 2050 includes retaining members 2062 that are configured to slide over a tab 2005 of the chassis housing 2010. The tab 2005 defines an opening 2006 into which a lug 2064 of the management module 2050 can snap to secure the components together (see FIG. 44). In the implementation shown in FIG. 42, the tabs 2062 and lug 2064 are punched out from the side walls 2052 of the management module 2050.

To enhance clarity of the application, the following disclosure provides an example walk-through of routing the incoming and outgoing media segments 2200 for an example blade 2100. One or more chasses 2010 are provided, for example, on an equipment rack. One or more blades 2100 are installed in each chassis 2010. A circuit board arrangement 2120 on each blade 2100 may be connected to a backplane 2410 of the chassis 2010 (e.g., by sliding the blade 2100 rearwardly into the chassis 2010). For example, a second circuit board 2124 on each blade 2100 may be connected to the backplane 2410 (e.g., via a card-edge connection, via a connector, etc.). The processor 2140 on each blade 2100 is connected to the backplane 2410 via the circuit board arrangement 2120.

Incoming cables 2210 are connected to each blade 2100 after the blade 2100 has been inserted into the chassis 2010. For example, a technician may secure (e.g., using a cable tie) the incoming cables 2210 to the management structures (cable spools, cable clamp, fanout arrangement, or other securement structure) of the management region 2050. The technician plugs connectorized ends of the incoming cables 2210 into the rear ports of the blade 2100. In some implementations, the incoming cables 2210 include optical fibers separately terminated by a fiber optic connector (e.g., an LC-type connector). In other implementations, the incoming cables 2210 include one or more multi-fiber cables, each of which is terminated by a multi-fiber connector (e.g., an MPO-type connector).

The technician routes the connectorized ends of the incoming cables 2210 to the rear ports of the blade 2100. In certain implementations, the technician feeds connectorized ends of the incoming cables 2210 from the rear of the chassis 2010, over the base 2110 of the blade 2100, toward the front adapters 2151. In some implementations, the technician plugs the connectorized ends of the incoming cables 2210 into the rear ports from the rear of the chassis 2010. In other implementations, the technician may subsequently access the adapters 2151 through an open top of the blade 2100 at the front of the chassis 2010. For example, the technician may access the adapters 2151 with the blade 2100 in the first or second extended position. In particular, the technician can unplug a dust plug from one of the rear ports of the front adapters 2151 and insert one of the connectorized ends into the rear port from the front of the chassis 2010 (see FIG. 40).

Subsequently, outgoing cables 2220 can be installed at the front ports of the blade 2100 without disconnecting the blade 2100 from the backplane 2410. For example, the technician may plug the connectorized ends of the outgoing cables 2220 into the front ports of the adapters 2151 when the blade 2100 is in the closed or first extended position. In other implementations, however, the connectorized ends of the outgoing fibers 2220 may be plugged into the front adapter ports while the blade 2100 is in any desired position. The technician also routes the outgoing cables 2220 through the retention fingers 2118 at the front of the blade 2100.

Figure 45:
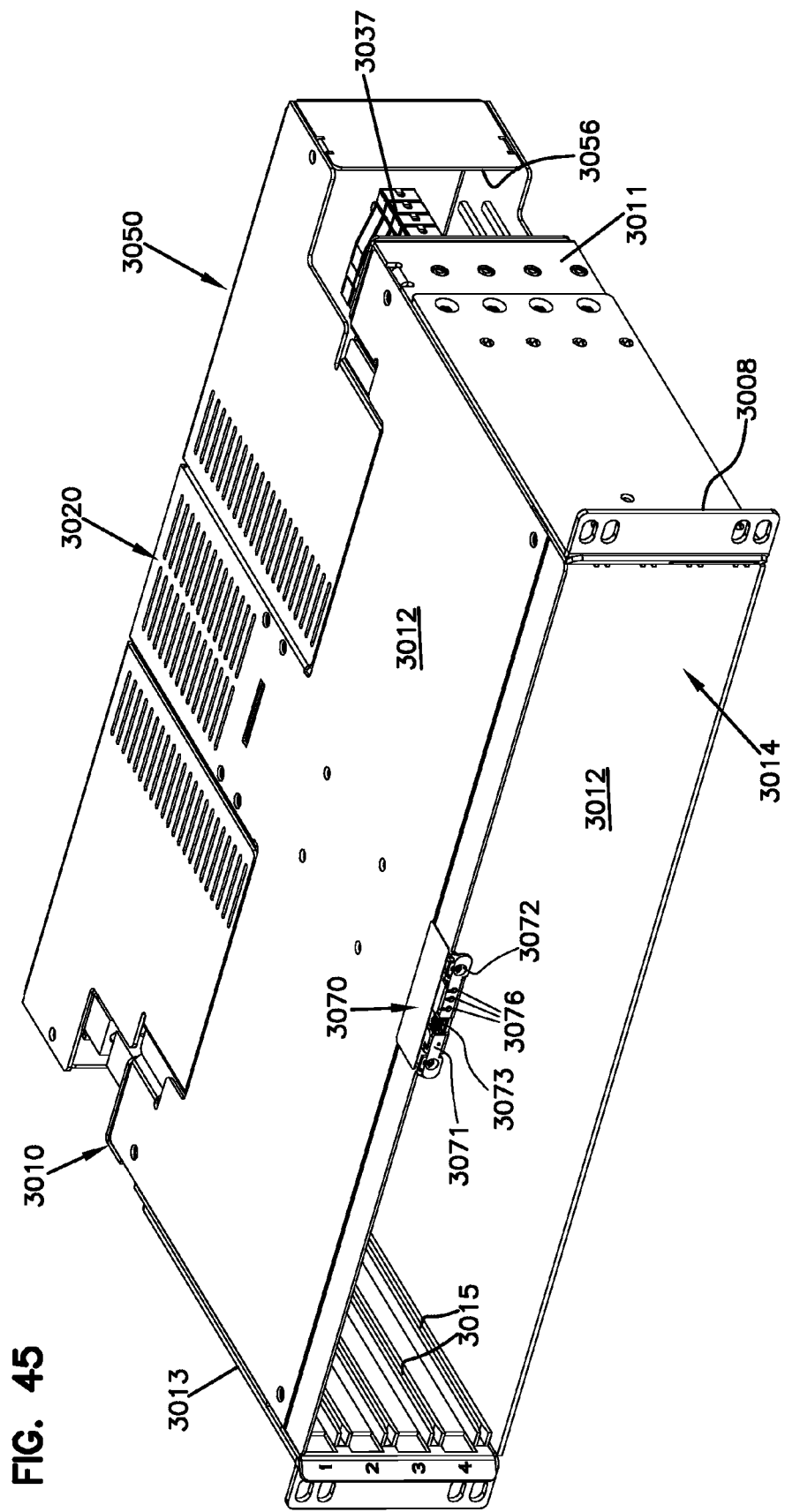
FIGS. 45-49 illustrate one example chassis of a bladed panel system suitable for receiving one or more blades in accordance with aspects of the present disclosure.

FIGS. 45-150 provide other example connector assemblies implemented as bladed panel systems 3000 suitable for mounting to communications equipment racks, cabinets, or other structures. The bladed panel system 3000 includes a chassis 3010 configured to receive one or more communications blades 3100. The bladed panel system 3000 is configured to connect segments of communications media 3200 carrying communications signals (e.g., signals S1 of FIG. 1). In accordance with some aspects, the example bladed panel system 3000 includes PLI functionality as well as PLM functionality. For example, the bladed panel system 3000 is configured to read physical layer information (e.g., signals S2 of FIG. 1) from one or more of the media segments 3200.

In some implementations, each blade 3100 includes one or more media couplers 3150 that are configured to connect together media segments 3200 and to read physical layer information from the media segments 3200. For example, the media couplers 3150 may connect segments 3200 received at a rear of the chassis 3010 with segments 3200 received at a front of the chassis 3010. For the sake of convenience, media segments 3200 routed to the rear of the chassis 3010 will be referred to herein as "incoming" media segments 3210 and the media segments 3200 routed to the front of the chassis 3010 will be referred to herein as "outgoing" media segments 3220. However, each set of media segments 3200 may carry incoming signals, outgoing signals, or both.

One example chassis 3010 is shown in FIGS. 45-49. The chassis 3010 is similar to the chassis housings 1010, 2010 shown in FIGS. 7 and 27, including opposing side walls 3011 interconnected by opposing major surfaces 3012 to form a housing 3013 defining an interior 3014. The chassis housing 3013 defines an open front and an open rear. In other implementations, one or both of the front and rear can be at least partially closed. The chassis housing 3013 includes a grounding port 3007 at which a grounding wire or cable may enter the chassis housing 3013.

The chassis housing 3013 includes mounting brackets 3008 to secure the chassis housing 3013 to the rack, poles, or other structures. In some implementations, the mounting brackets 3008 extend along only a portion of the side walls 3011 of the chassis 3010 (e.g., see FIG. 77). In other implementations, the mounting brackets 3008 extend along a majority of the side walls 3011 of the chassis 3010 (see FIGS. 45-47). In the examples shown, the brackets 3008 are L-shaped. In other implementations, however, other types of mounting brackets may be used.

The interior 3014 of the chassis housing 3013 includes guides 3015 that enable the blades 3100 to move (e.g., slide forwardly and rearwardly) relative to the chassis housing 3013. For example, the guides 3015 may enable the blades to each move from a closed (refracted) position to one or more extended positions relative to the chassis 3010. In certain implementations, the guides 3015 are substantially the same as guiding slots 1020 of FIGS. 8-10. In other implementations, however, other types of guides can be used.

In some implementations, the chassis 3010 is configured to receive a status board 3070 (FIG. 45). The status board 3070 includes a fascia 3071 mounted to one end of a printed circuit board (e.g., see status board 2700 of FIG. 37). The status board 3070 also may include a base to protect the printed circuit board. In certain implementations, the printed circuit board slides along guides mounted within the chassis housing 3013. For example, the status board 3070 can slide into the guides from a front of the chassis 3010. In other implementations, the status board 3070 can be otherwise secured to the chassis 3010.

In some implementations, the fascia 3171 of the status board 3070 defines openings 3172 through which fasteners can extend to secure the status board 3070 to the chassis housing 3013 (see FIG. 45). Indicators (e.g., LEDs) 3076 also can be positioned on the fascia 3071 of the status board 3070. The LEDs 3076 can display status information (e.g., error information, power information, network connection information, etc.) for the chassis 3010. In some implementations, a switch (i.e., or other input mechanism) also may positioned on the fascia 3071.

Figure 47:
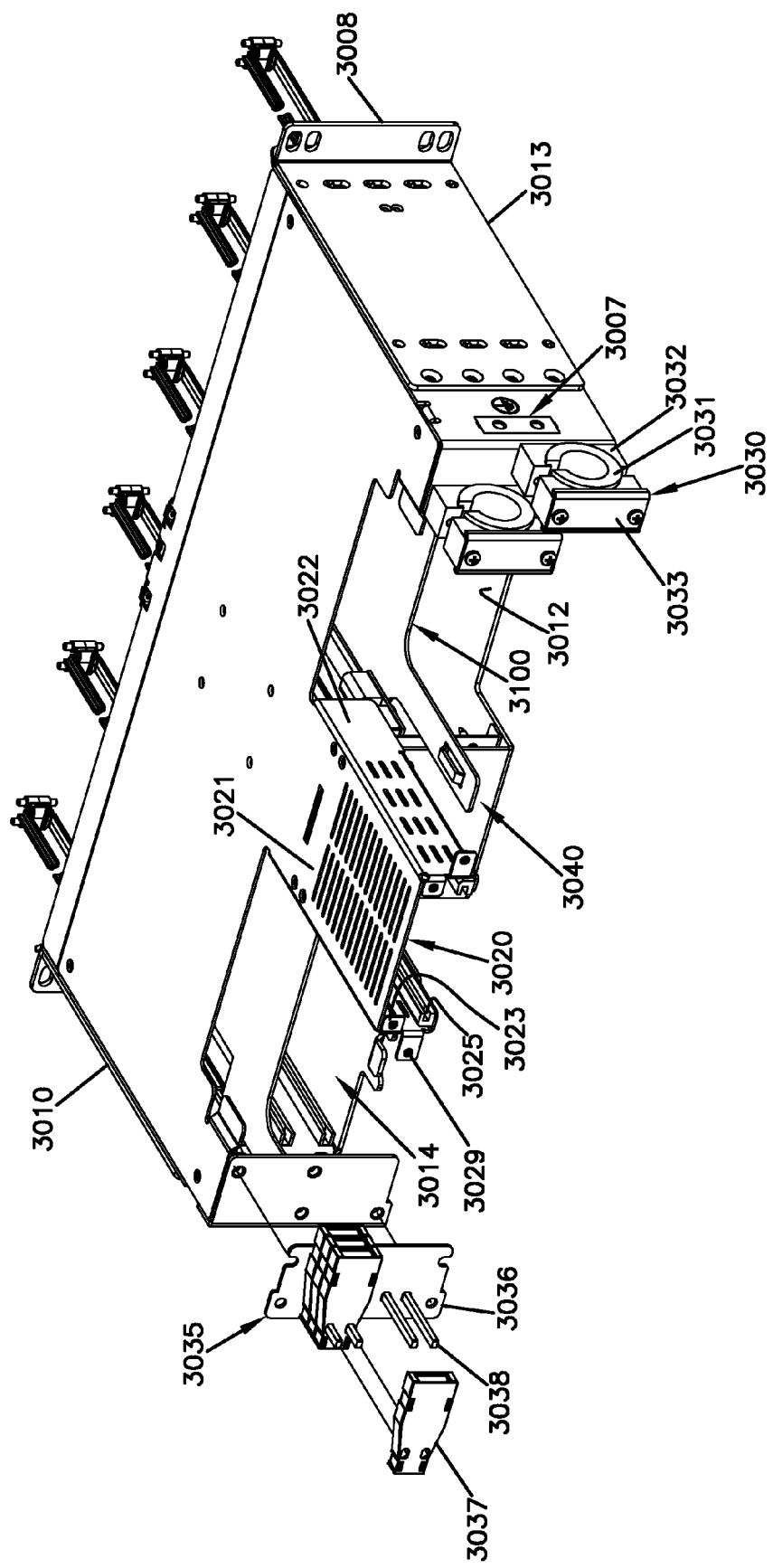
Figure 77:
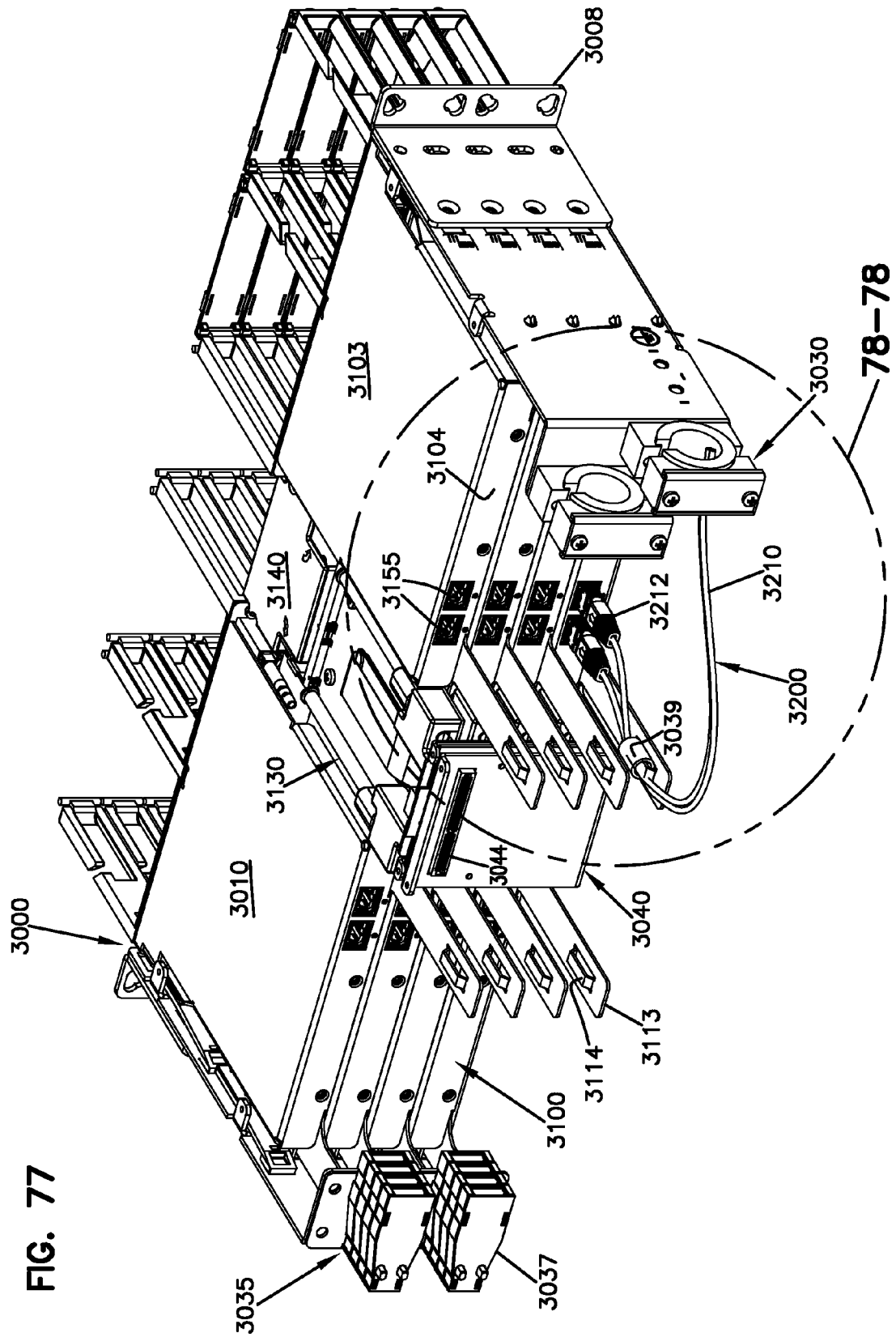
FIGS. 77-79 show rear perspective views of a bladed panel system including management structures at the rear of the chassis and the rear of the blades.
Figure 78:
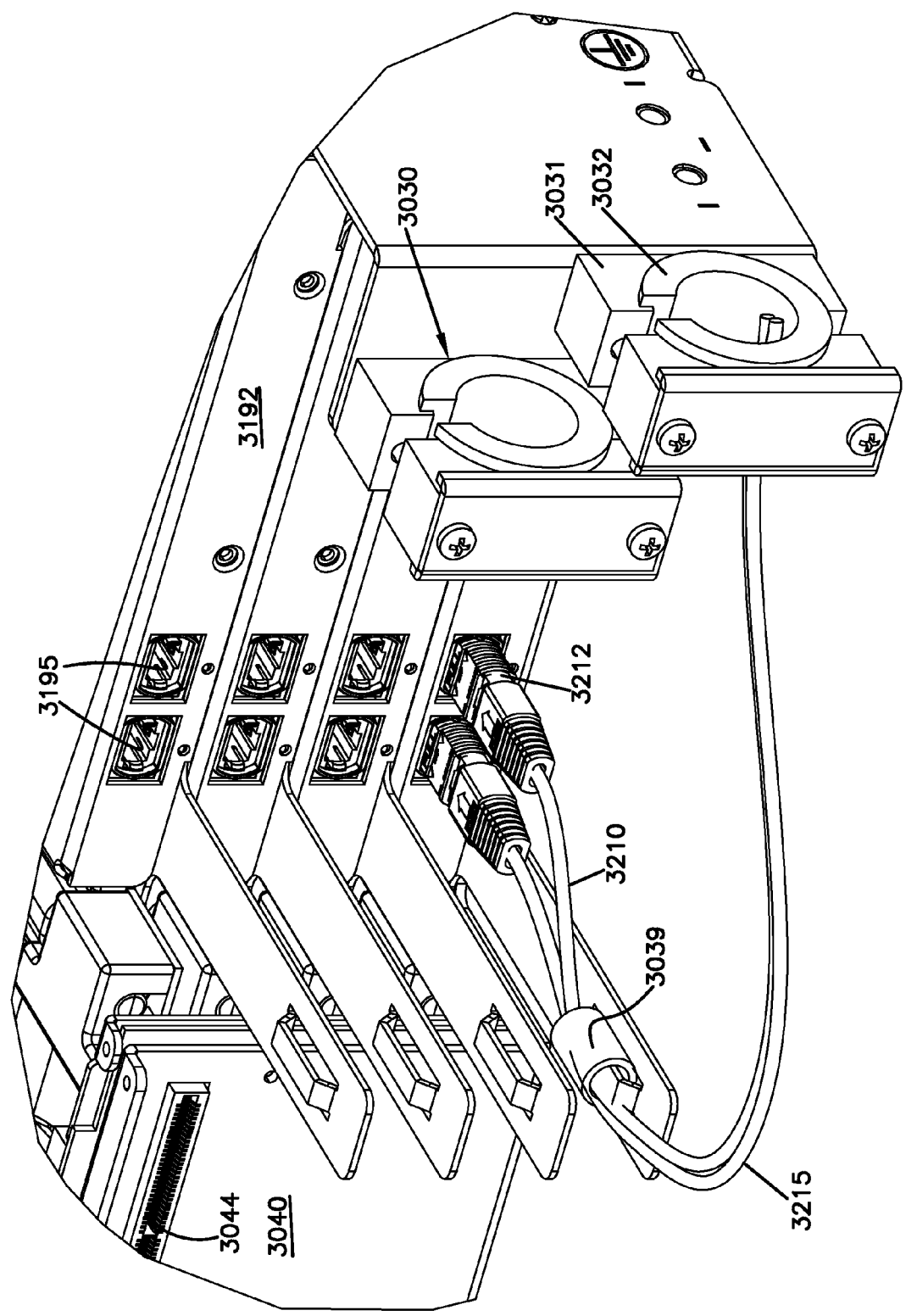
Figure 79:
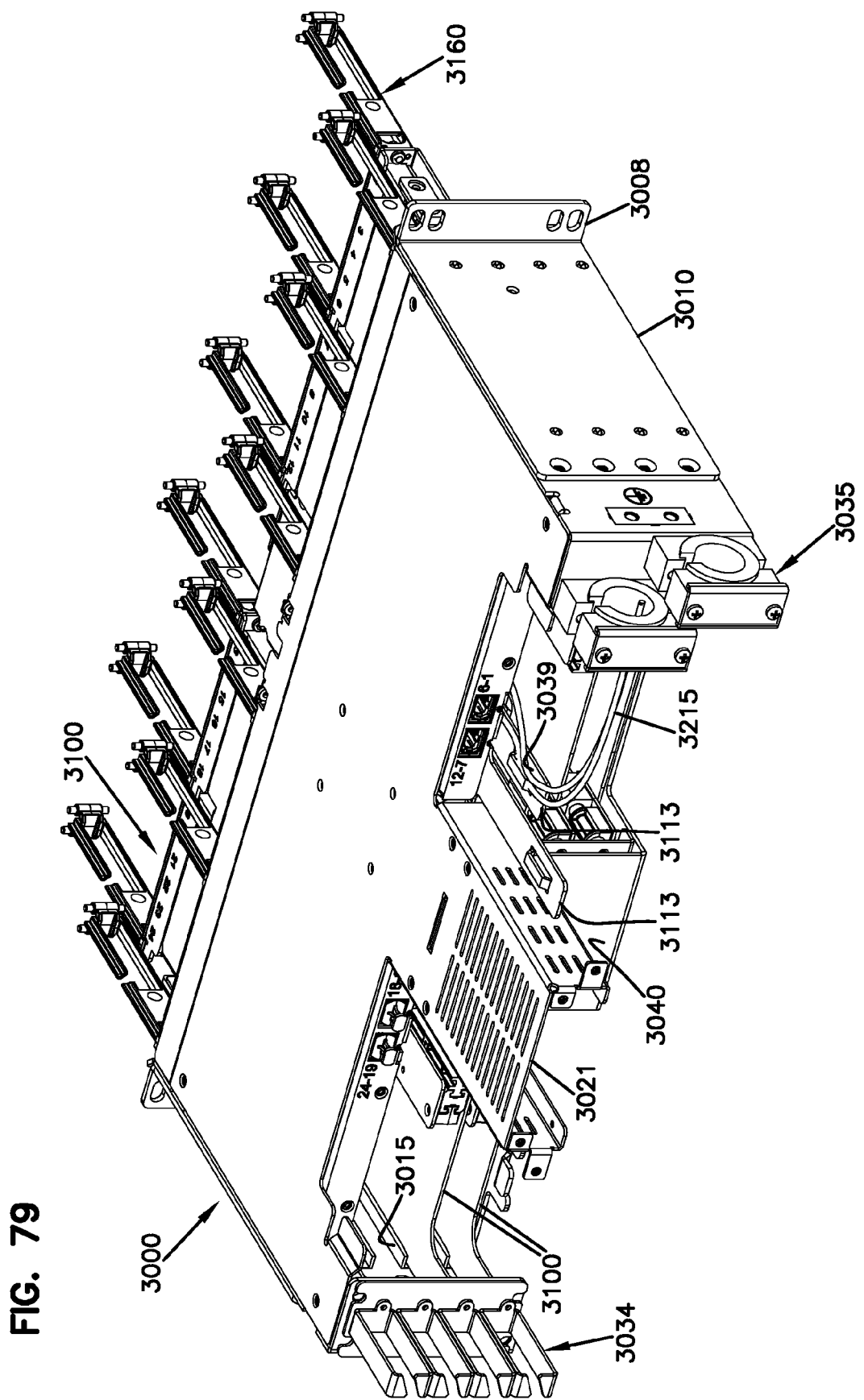

The rear of the chassis 3010 is configured to facilitate routing and securement of the incoming media segments 3210. FIG. 47 is a rear perspective view of the chassis housing 3013 showing various example management structures. FIGS. 77-79 also show rear perspective views of chassis 3010 with various management structures. Non-limiting examples of management structures include cable retention clamps 3030, cable retention fingers 3034 (FIG. 79), and cable fanouts 3035 (FIG. 77). In other implementations, other types of management structures (e.g., spools, radius limiters, cable ties, etc.) may be utilized at the rear of the chassis 3010.

In FIG. 47, cable retention clamps 3030 are shown attached to the chassis housing 3013 on the right side of the drawing. The example cable retention clamps 3030 include compression inserts 3031 through which media segments 3200 can be routed. The insert 3031 may include a slot to facilitate routing of the media segments 3200 through the insert 3031. The cable retention clamps 3030 also include compression members 3032 that mount to either side of the insert 3031 to clamp down on the insert 3031. The cable clamps 3030 may be attached to the chassis housing 3013 with brackets 3033.

An example fanout arrangement 3035 is shown in FIG. 47 attached to the chassis housing 3013 on the left side of the drawing. The fanout arrangement 3035 includes a mounting panel 3036 on which one or more fanouts 3037 can be installed. For example, one or more fanouts 3037 can include openings through which pins 3038 may extend to mount the fanouts 3037 to the panel 3036. Multiple fanouts 3037 can be stacked onto one set of pins 3038. Each fanout 3037 is configured to separate a media segment 3200 into multiple segments. For example, each fanout 3037 may separate a multiple fiber cable into individual fibers. In certain implementations, each of the individual fibers is terminated at a fiber optic connector.

In some implementations, one or more retention clamps 3030 can be positioned on each side of the chassis 3010 at the rear. In other implementations, one or more fanout arrangements 3035 can be positioned on each side of the chassis 3010 at the rear. In certain implementations, each side of the chassis 3010 holds at least one retention clamp 3030 and at least one fanout arrangement 3035. In accordance with some aspects, the management structures are configured to be releasably attached to the chassis housing 3013 so that an appropriate management structure may be attached to the chassis housing 3013 in the field. In other implementations, other types of fanout configurations may be utilized.

Which management structure 3030, 3035 is appropriate may depend on the types of incoming media segments 3210 and the configuration of the coupler arrangement installed on each blade 3100 to be held within the chassis 3010. In some implementations, the clamps 3030 may be appropriate if the incoming media segments 3210 are terminated by connectors 3212 that is configured to be received within couplers 3151, 3153, 3155 of the coupler arrangement 3150. For example, a cable clamp 3030 may be appropriate when a multi-fiber cable 3210 terminated by an MPO connector 3212 is to be plugged into an MPO coupler 3153, 3155 (see FIGS. 65 and 77). In other implementations, the fanout arrangements 3035 may be appropriate if the incoming media segments 3210 are multi-fiber connectors that are to be plugged into LC-adapters. In such implementations, the fanout arrangements 3035 may separate the multi-fiber cables into individual fibers terminated by LC connectors that may be plugged into the LC adapters.

The chassis 3010 also includes a chassis processor 3060 that functions as the interface between the panel system 3000 and the data management network. The chassis processor 3060 may be connected to a backplane 3040 to manage the media reading interfaces, either directly or via processors on the individual blades 3100. The chassis processor 3060 also may connect the backplane 3040 to the data management network. In certain implementations, the chassis processor 3060 also may include memory (e.g., an EEPROM chip) and other electronic circuitry so that physical layer information obtained at the blades 3100 can be stored in the memory of the chassis processor 3060.

In some implementations, the chassis processor 3060 includes a printed circuit board 3061 (FIG. 48) that is configured to connect to the port 3044 (FIG. 77) of the backplane 3040. For example, the circuit board 3061 may include a connection edge 3062 that is configured to connect to port 3044 via a card edge connection. In other implementations, the circuit board 3061 may otherwise connects to the port 3044 (e.g., via a plug/socket connection, via a cable connection, etc.).

Figure 48:
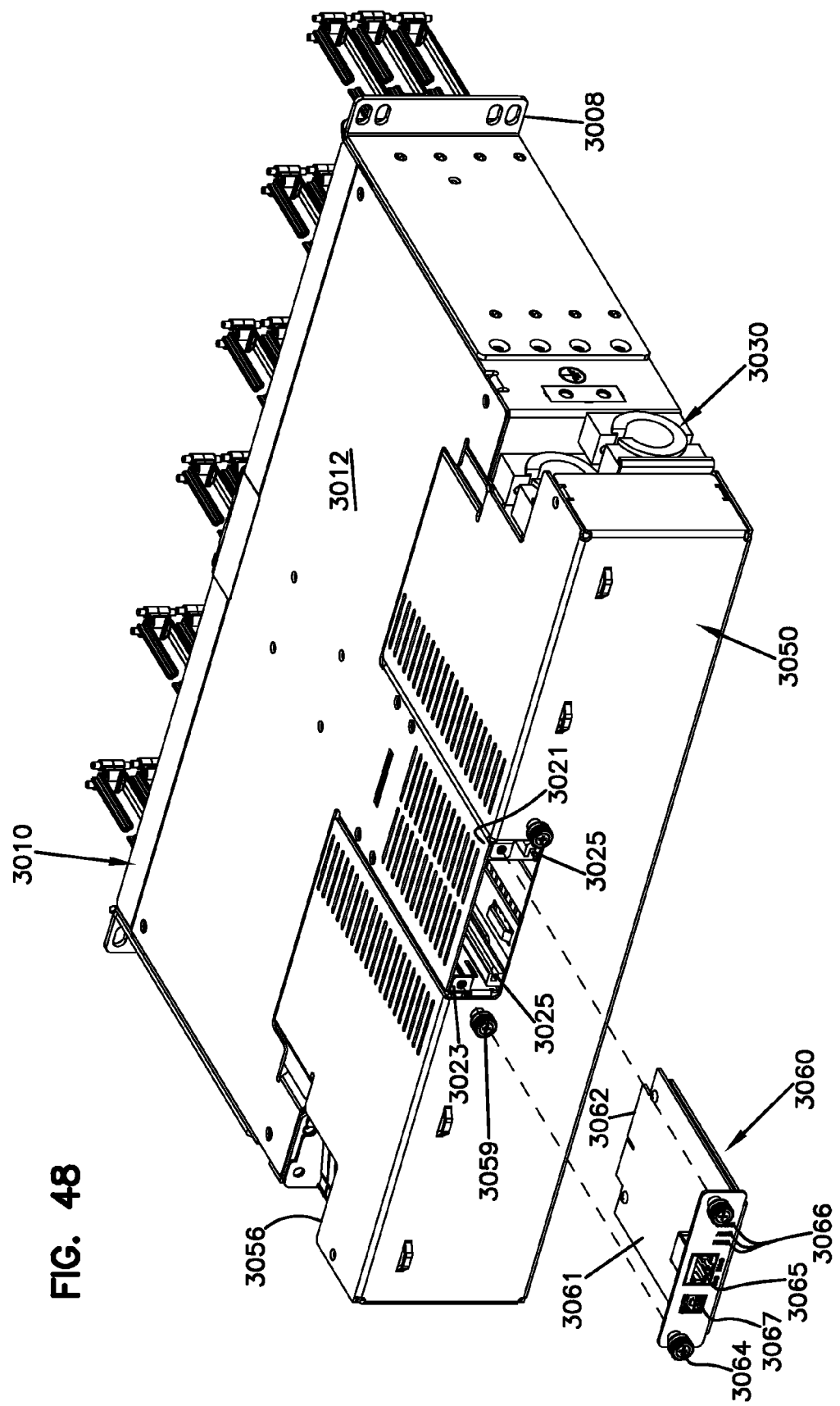
Figure 49:
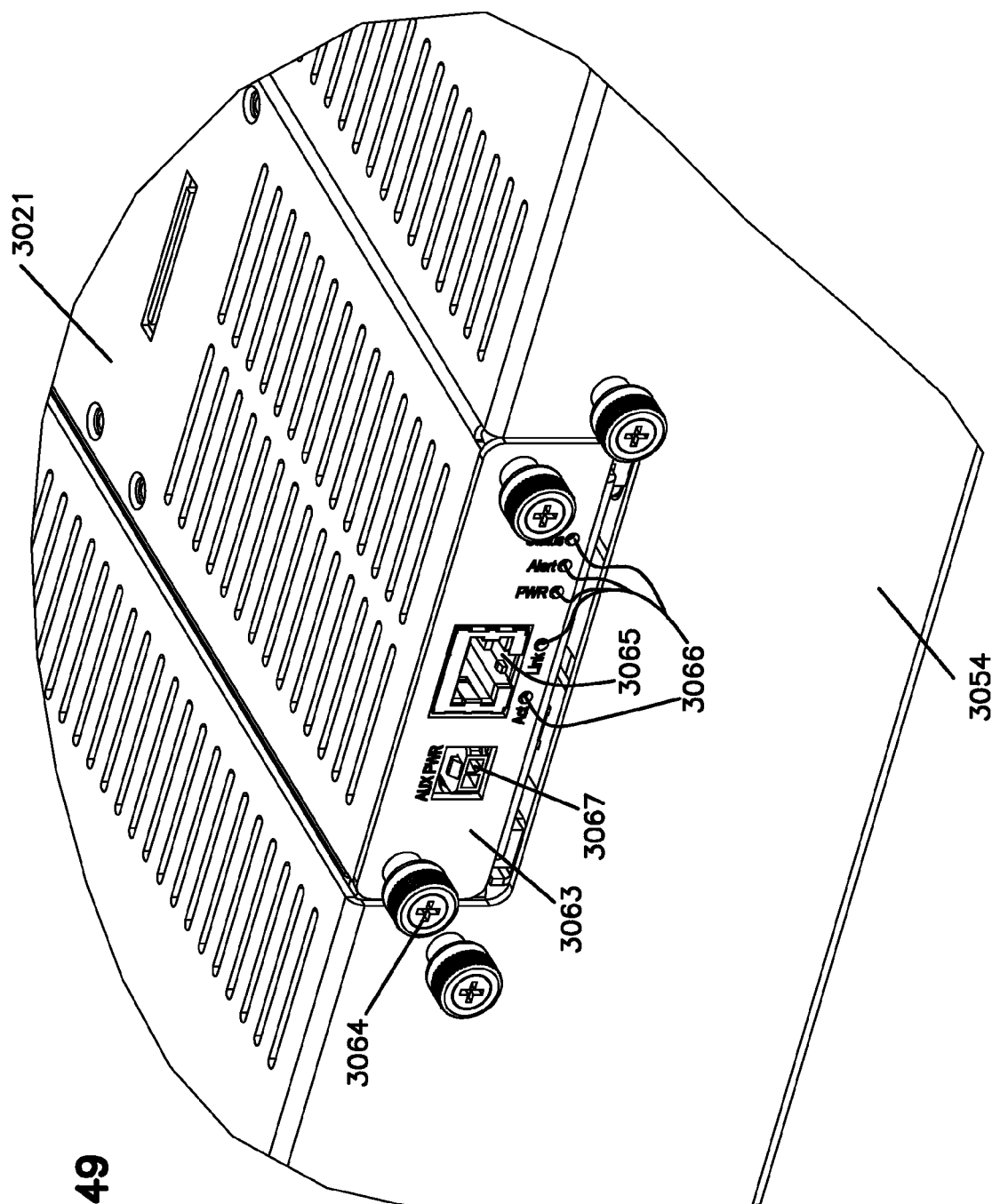

The chassis processor 3060 is configured to mount to the chassis housing 3013. For example, in some implementations, the chassis processor 3060 can mount to a support structure 3020 extending outwardly from a top, rear of the chassis housing 3013 (e.g., see FIG. 47). The support structure 3020 includes a top 3021 and side walls 3022 defining an interior that is sized and configured to receive the chassis processor 3060. In certain implementations, the interior of the support structure 3020 includes guides 3025 along which the printed circuit board 3062 may slide (FIG. 48).

In certain implementations, the chassis processor 3060 includes a fascia 3063 coupled to the circuit board 3061. In some implementations, the fascia 3063 is configured to connect to mounting flanges 3023 (FIG. 47) extending inwardly from the side walls 3022 of the support structure 3020. For example, the fascia 3063 may mount to the flanges 3023 via fasteners 3064 (FIG. 49), via a snap-fit connection, or via other types of attachment members. In other implementations, the chassis processor 3060 may be otherwise secured to the chassis 3010.

In some implementations, a first network port 3065 is electrically connected to the circuit board 3061 of the chassis processor 3060. For example, the first network port 3065 may define an RJ jack configured to receive an electrical plug terminating a network data cable connecting the panel system 3000 to the data network. In other implementations, however, the first network port 3065 can define a USB socket or other type of cable port.

In certain implementations, the chassis processor 3060 also may include a second port 3067. For example, the second port 3067 may defines a DC power socket or any suitable type of power cable port. In some implementations, the second port 3067 provides an alternative port by which the panel system 3000 can receive power from an auxiliary power source (e.g., when Power Over Ethernet is not available).

The chassis processor 3060 also may control one or more indicators (e.g., light emitting diodes) 3066 mounted to the fascia 3063. The indicators 3066 can display status information (e.g., error information, power information, network, connection information, etc.). In the example shown in FIG. 49, five indicators 3066 are provided on the fascia 3061. In other implementations, however, greater or fewer indicators 3066 may be provided.

Figure 50:
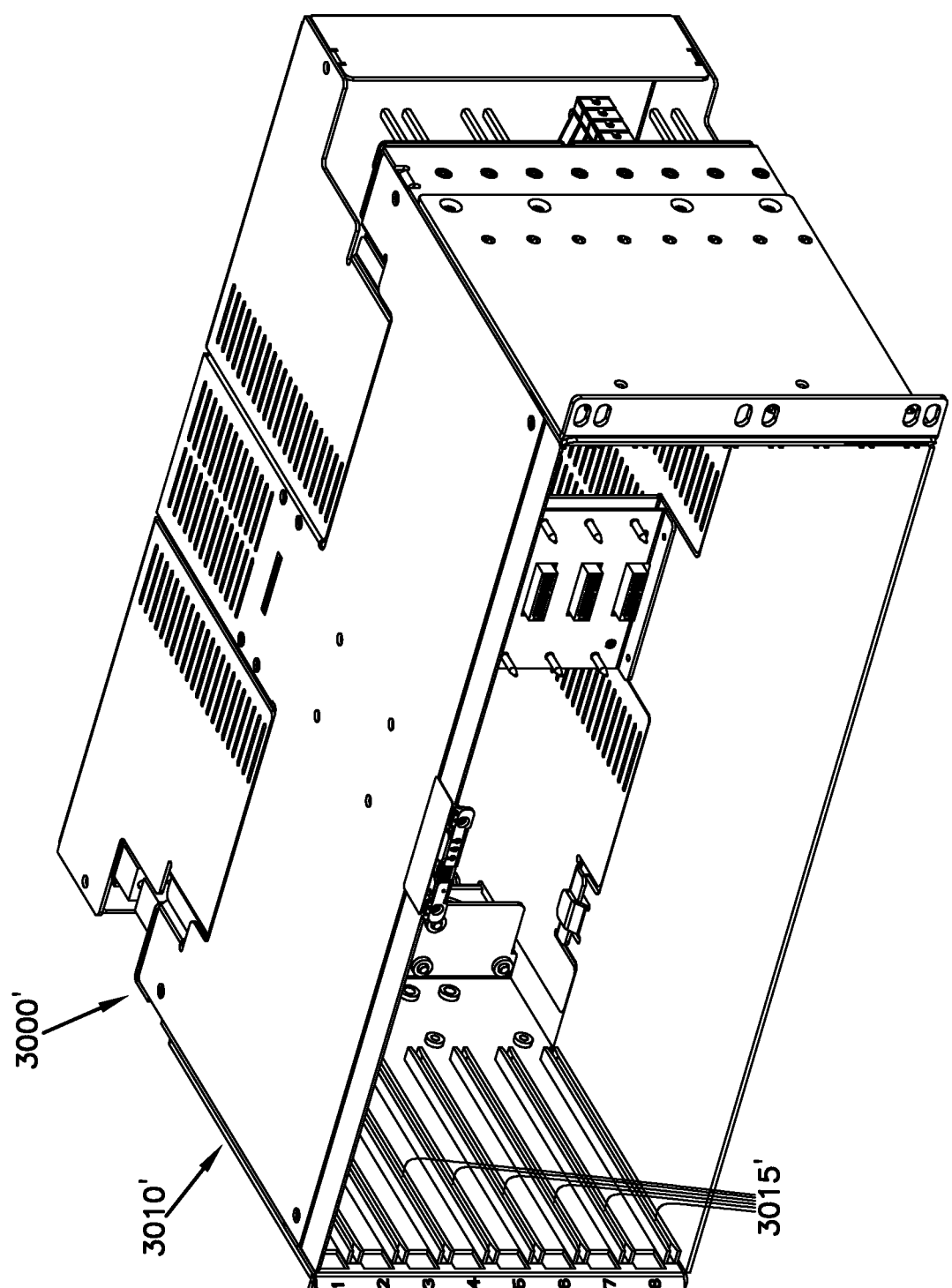
FIGS. 50-51 illustrate another example chassis of a bladed panel system suitable for receiving one or more blades in accordance with aspects of the present disclosure.
Figure 91:
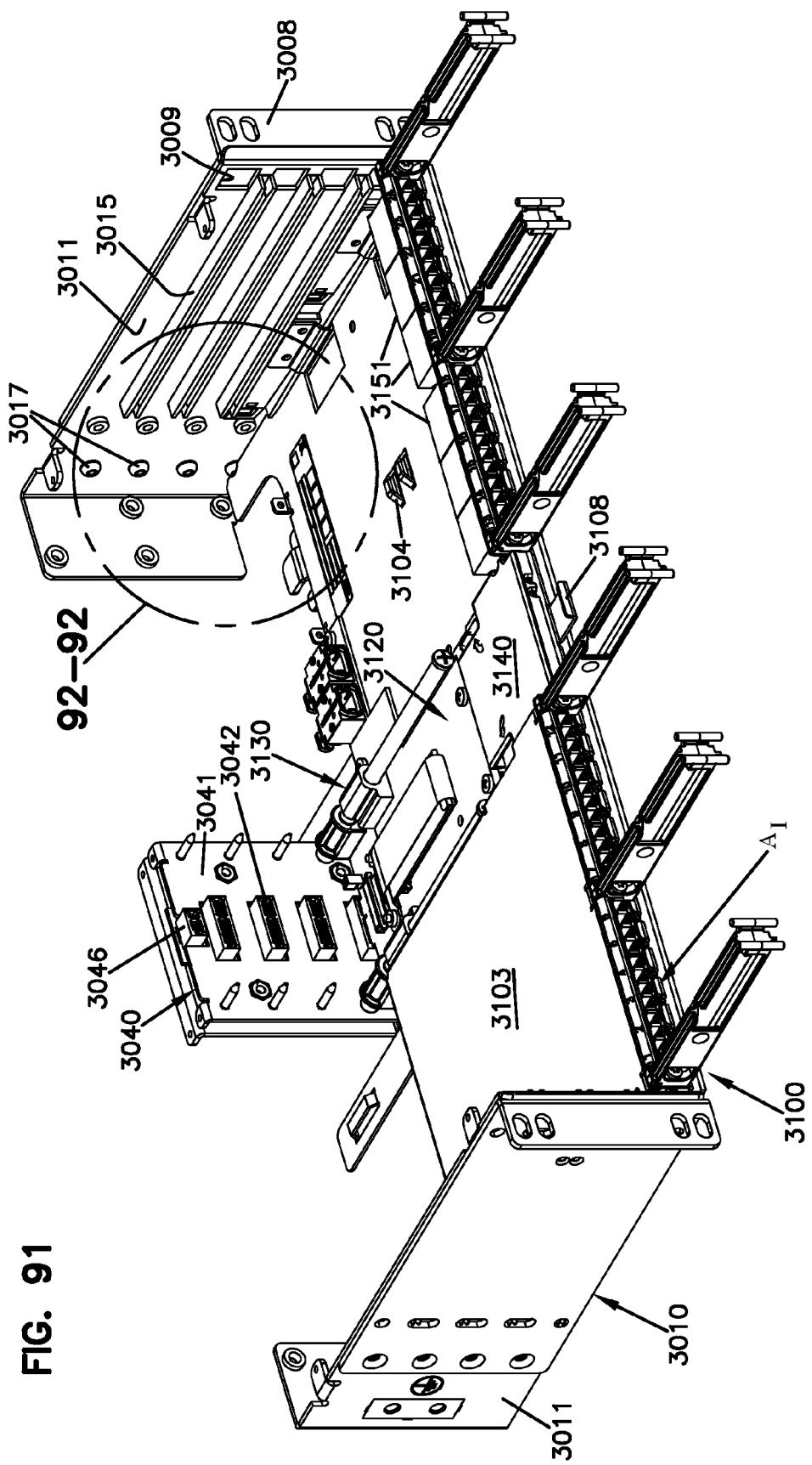
FIG. 91 is a front perspective view of an example chassis and backplane with a top of the chassis removed so that the interior of the chassis and a blade positioned in the chassis are visible.

In accordance with some aspects, the chassis 3010 includes a backplane 3040 (e.g., see FIGS. 50, 77, and 91). The circuit board arrangement 3120 of each blade 3100 positioned in the chassis 3010 connect to the backplane 3040 of the chassis 3010. In some implementations, the blades 3100 are connected to the backplane 3040 only when the blades 3100 are in the closed position relative to the chassis 3010. In other implementations, however, the blades 3100 are connected to the backplane 3040 when the blade 3100 is in both the closed position and at least one extended position as will be disclosed in more detail herein.

Figure 64:
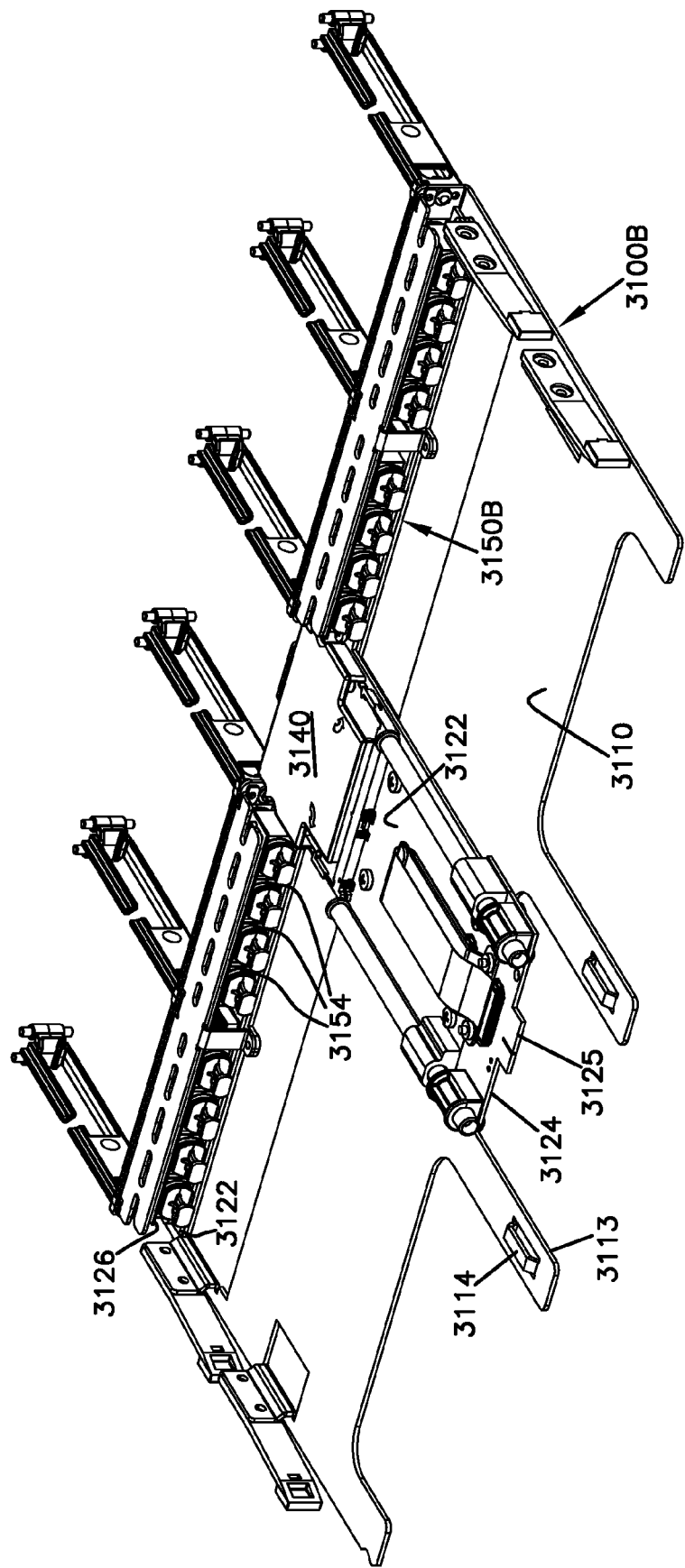

An example chassis backplane 3040 are shown in FIGS. 50, 77, and 91. The chassis backplane 3040 includes one or more connector ports 3042 mounted to a circuit board 3041. For example, the backplane 3040 may include one or more blade ports 3042, each of which is configured to receive a connection end of the circuit board arrangement of a blade (e.g., connection end 3125 of circuit board arrangement 3120 of blade 3100 of FIGS. 55, 64, and 68). The backplane 3040 also may include a status board port 3046 configured to receive a connector or connection edge of a status board (e.g., status board 3070 of FIG. 45). In some implementations, the circuit board arrangements and/or the status boards have card-edge connectors. In other implementations, the circuit board arrangements and/or status boards can connect to the backplane 3040 using a different type of electrical connector.

In some implementations, the status board 3070 includes a data port 3073 (FIG. 45) at the front of the chassis 3010 that electrically connects a media segment (e.g., a USB cable) inserted therein to the chassis backplane 3040 via the printed circuit board of the status board 3070. Accordingly, a mobile device can access the chassis processor 3060 and/or any of the blade processors 3140 from the front of the chassis 3010. In certain implementations, sliding the status board 3070 at least partially out of the chassis 3010 disconnects the status board 3070 from the backplane 3040.

Figure 46:
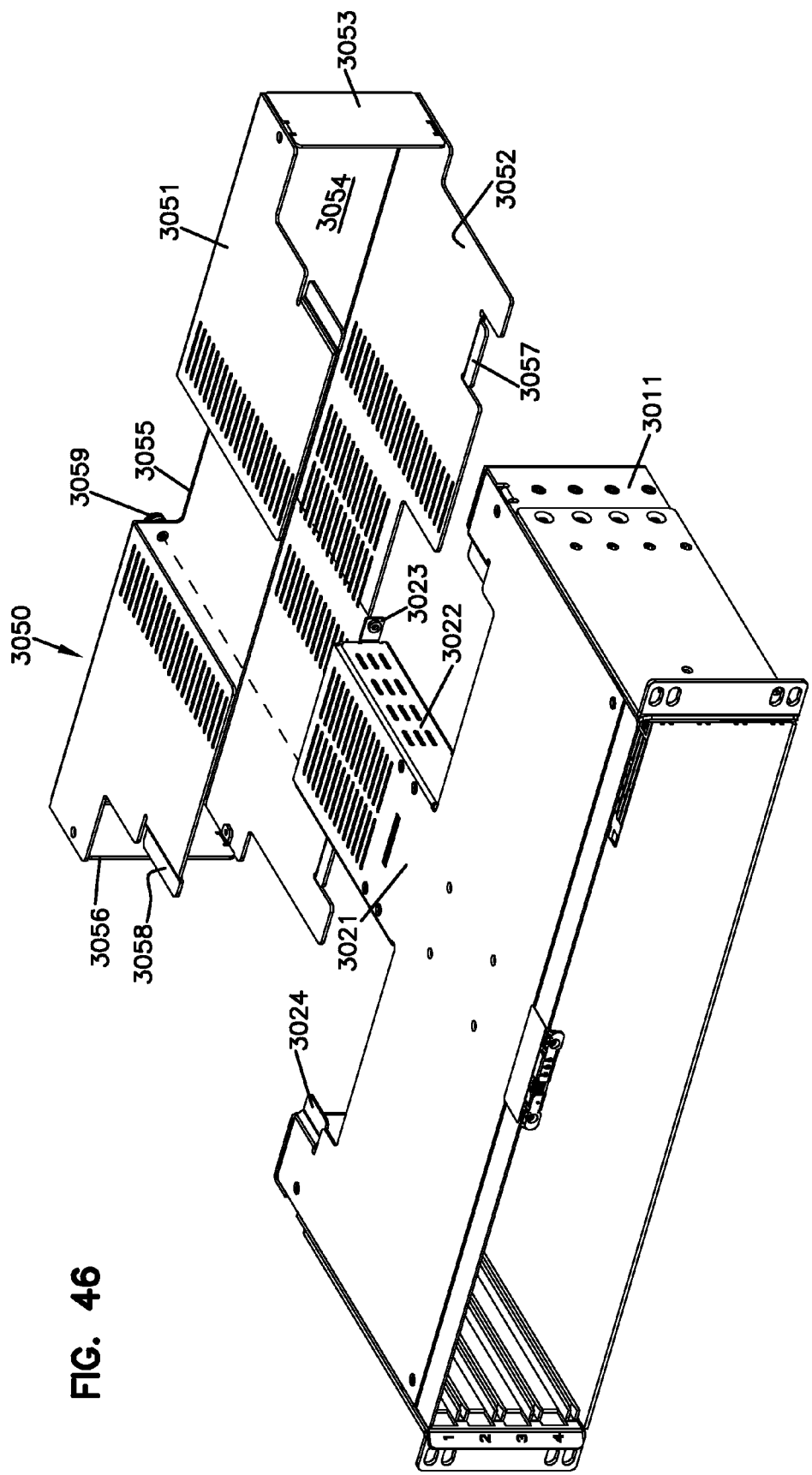

In some implementations, a cover 3050 may be positioned at the rear of the chassis 3010 to provide protection for media segments 3200 routed to the rear of the chassis 3010. As shown in FIG. 46, the cover 3050 includes sidewalls 3053 extending between a top 3051 and a bottom 3052. In certain implementations, vents may be provided in the top 3051 and/or the bottom 3052 to inhibit overheating of the chassis processor 3060. A rear wall 3054 extends between the sidewalls 3053 and between the top 3051 and bottom 3052. Cable tie locations may be provided on the exterior of the rear wall 3054 (see FIG. 48).

In certain implementations, the top 3051 and rear walls 3054 define a cutout 3055 that accommodates the support structure 3020 of the chassis 3010. The fascia 3063 of the chassis processor 3060 may be accessible through the cutout 3055. The cover 3050 defines open portions 3056 at the sides to facilitate routing of media segments 3200 to the rear of the chassis 3010. For example, the cable management structure 3030, 3035 may be accessible through the open portions 3056 of the cover 3050. In the example shown, the open portion 3056 extends over only a portion of each side, top, and bottom of the cover 3050. In other implementations, one or both sides of the cover 3050 may be open in their entirety.

In some implementations, the cover 3050 includes tabs, slots, or other attachment features that interact with tabs, slots, or other attachment features of the chassis 3010 to secure the cover 3050 to the chassis 3010. In the example shown, the cover 3050 includes two forward tabs 3057 and two sideways tabs 3058 that interact with tabs 3024 of the chassis 3010 to align the cover 3050 on the chassis 3010. In certain implementations, the cover 3050 is secured to the chassis 3010 by fasteners 3059. For example, one or more fasteners 3059 may extend through the rear wall 3054 of the cover and through tabs 3029 (FIG. 47) extending outwardly from the support structure 3020 of the chassis 3010.

Figure 51:
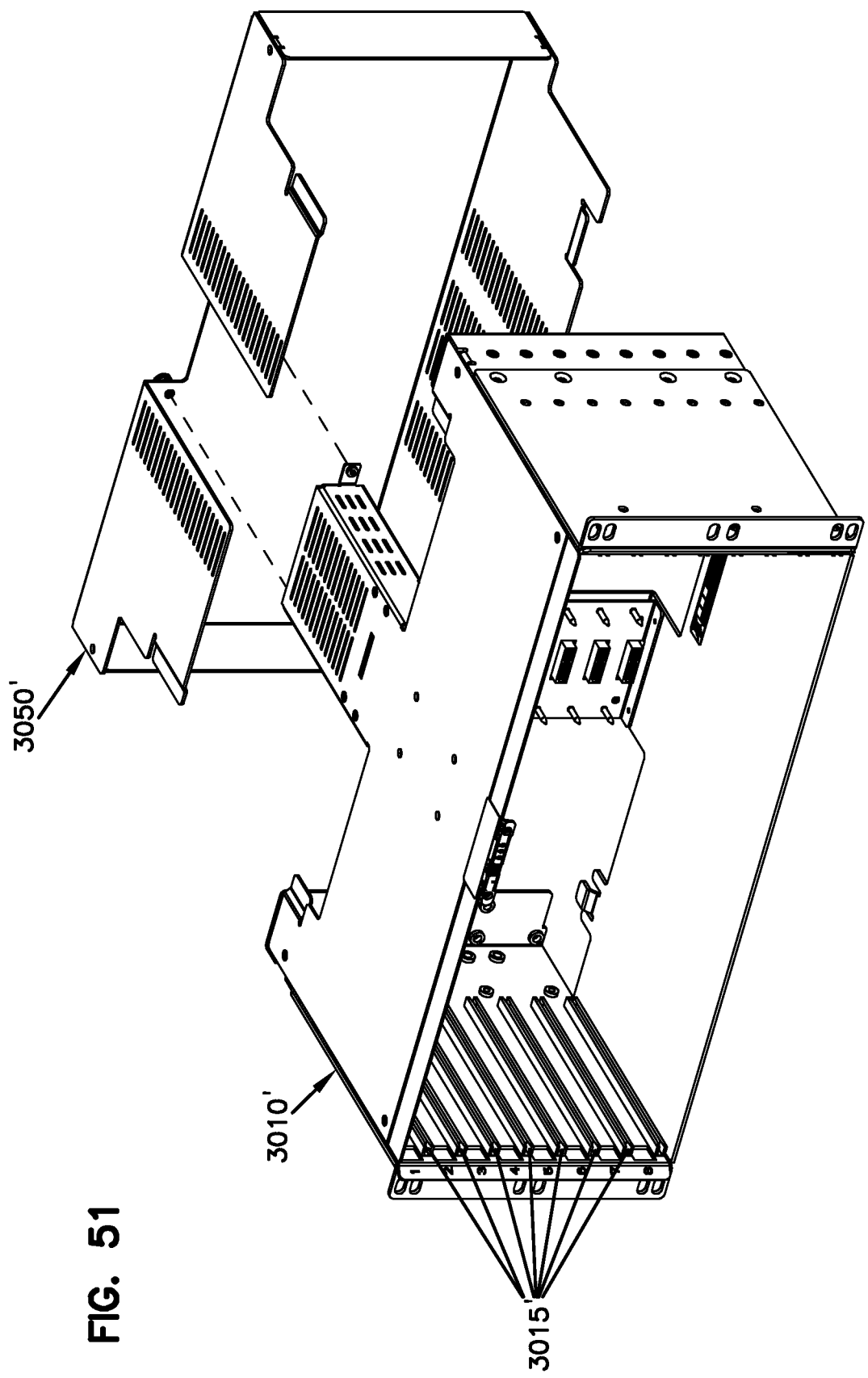
Figure 52:
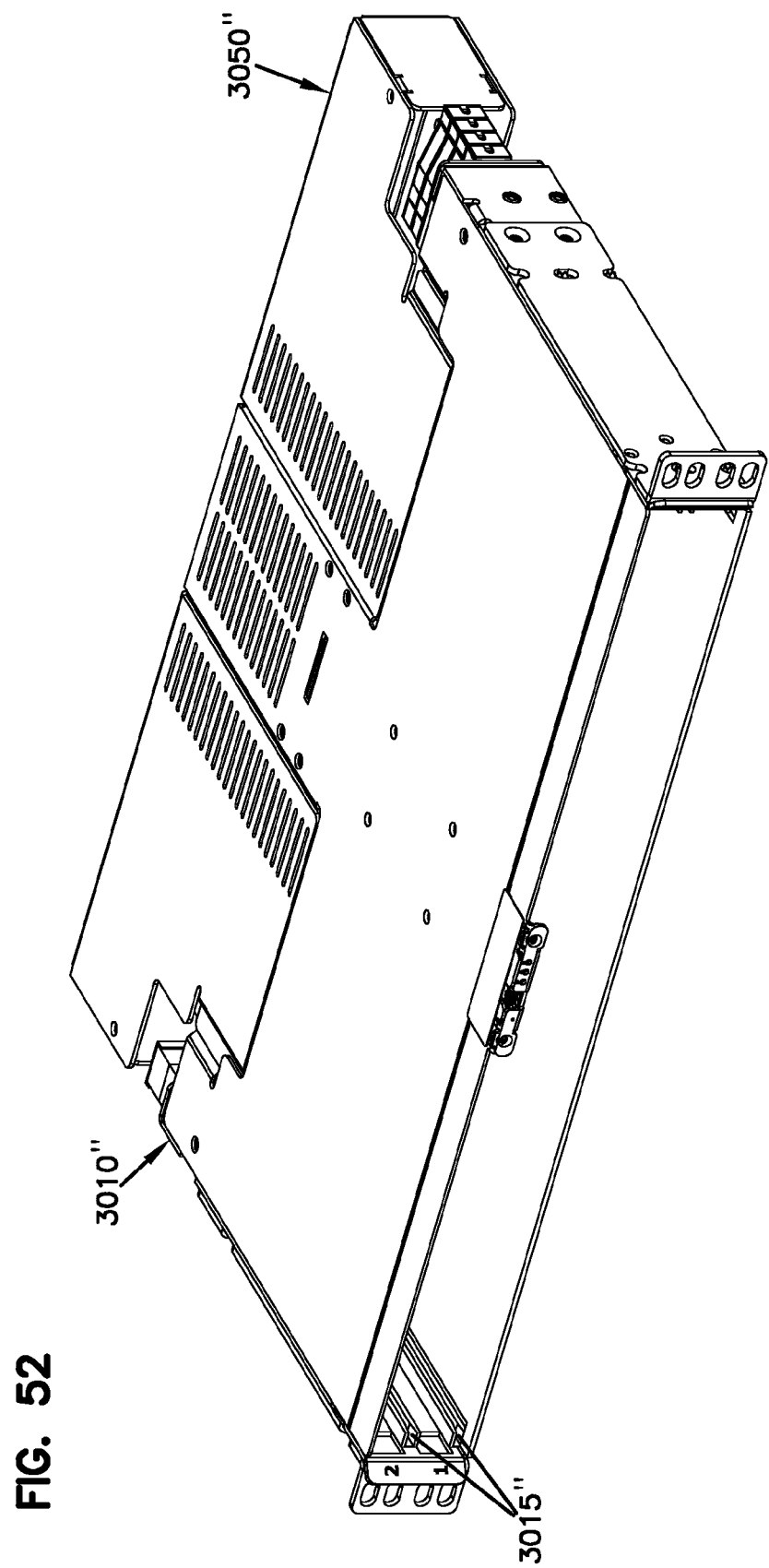
FIGS. 52-53 illustrate another example chassis of a bladed panel system suitable for receiving one or more blades in accordance with aspects of the present disclosure.
Figure 53:
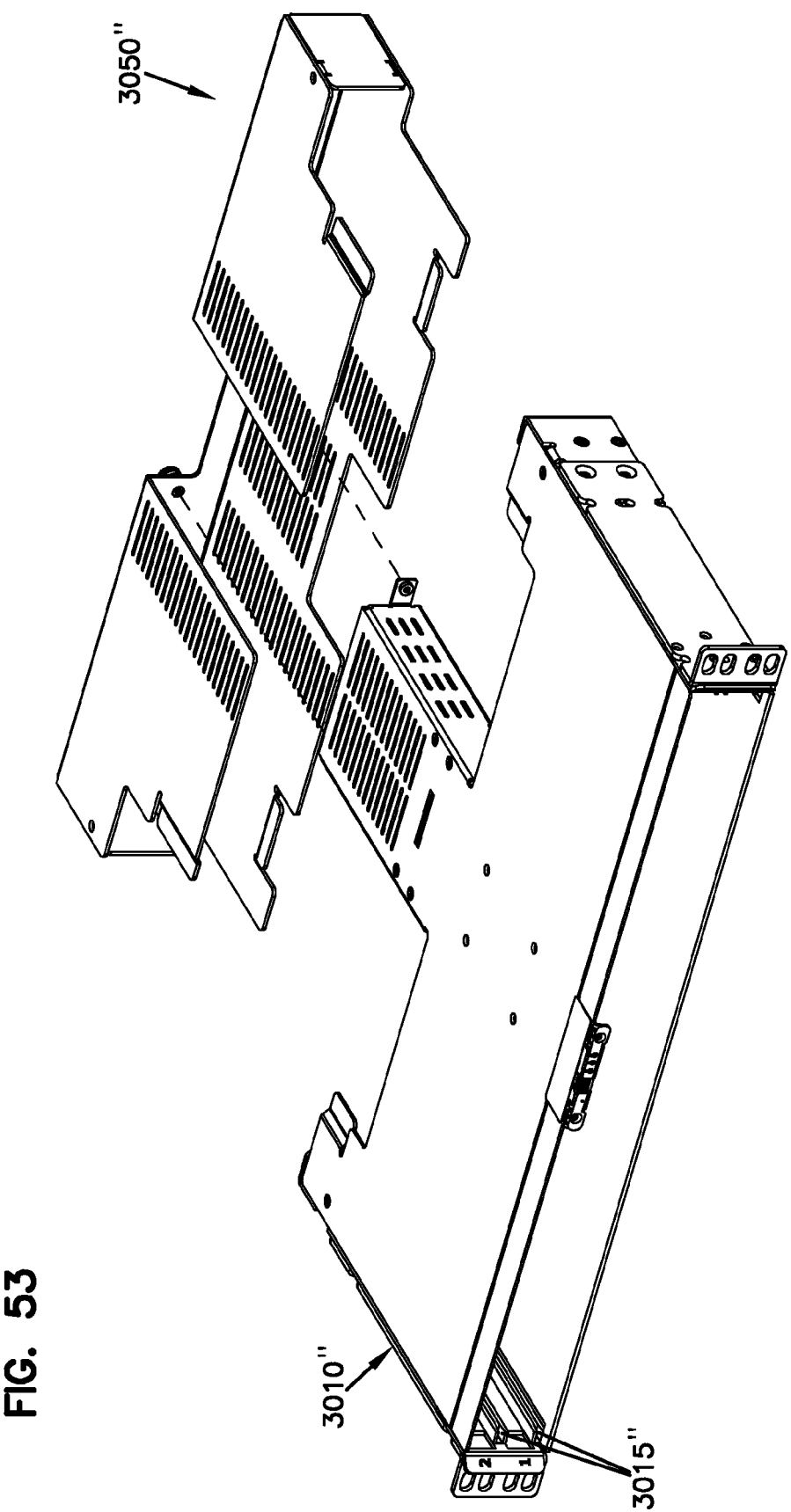

In the example shown in FIGS. 45-49, the chassis 3010 of panel system 3000 is configured to receive about four blades 3100. For example, the chassis 3010 includes four guides 3015, each guide 3015 being configured to receive one blade 3100. In other implementations, however, a chassis may be configured to receive greater or fewer blades 3100. For example, FIGS. 50-51 show one example panel system 3000' that is configured to receive eight blades 3100. The chassis 3010' includes eight guides 3015 on either side of the chassis 3010'. FIGS. 52-53 show another example panel system 3000" that is configured to receive two blades 3100. The chassis 3010" includes two guides 3015" on each side of the chassis 3010".

FIGS. 54-74 show various example blades 3100 configured to be mounted within any of the chasses 3010, 3010', 3010". For ease in understanding, however, this disclosure will show the blades interacting with chassis 3010. In accordance with some aspects, different types of blades 3100 may be mounted within the same chassis 3010 (see FIGS. 75 and 143). In other implementations, however, blades 3100 of the same type may be mounted within the chassis 3010. The type of management structure (e.g., management arrangements 3030, 3035) provided at the rear of the chassis 3010 may depend on the type or types of blades 3100 mounted within the chassis 3010.

Figure 54:
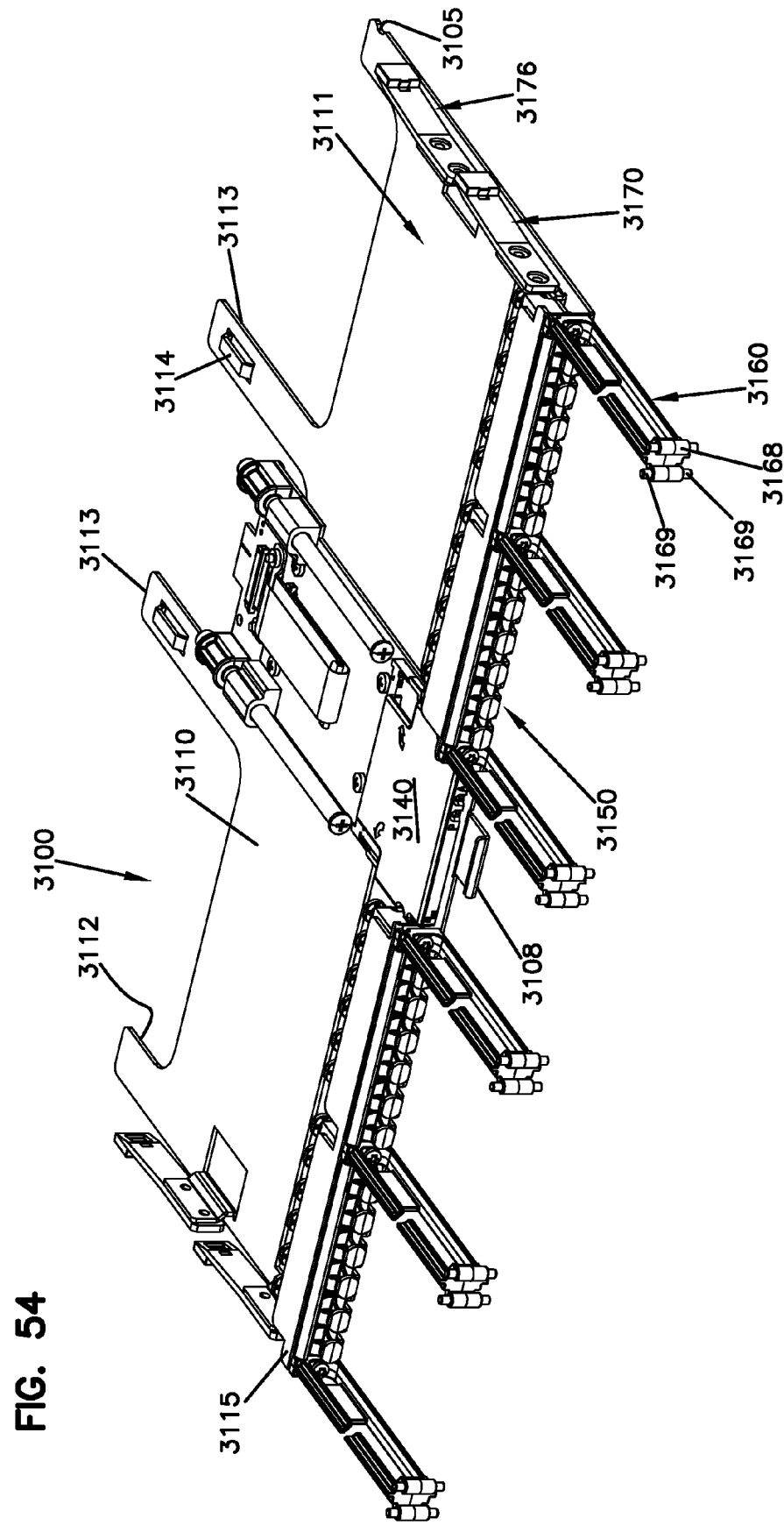
FIGS. 54-56 illustrate an example blade suitable for receipt in any of the chasses shown in FIGS. 25-51 in accordance with aspects of the present disclosure.
Figure 55:
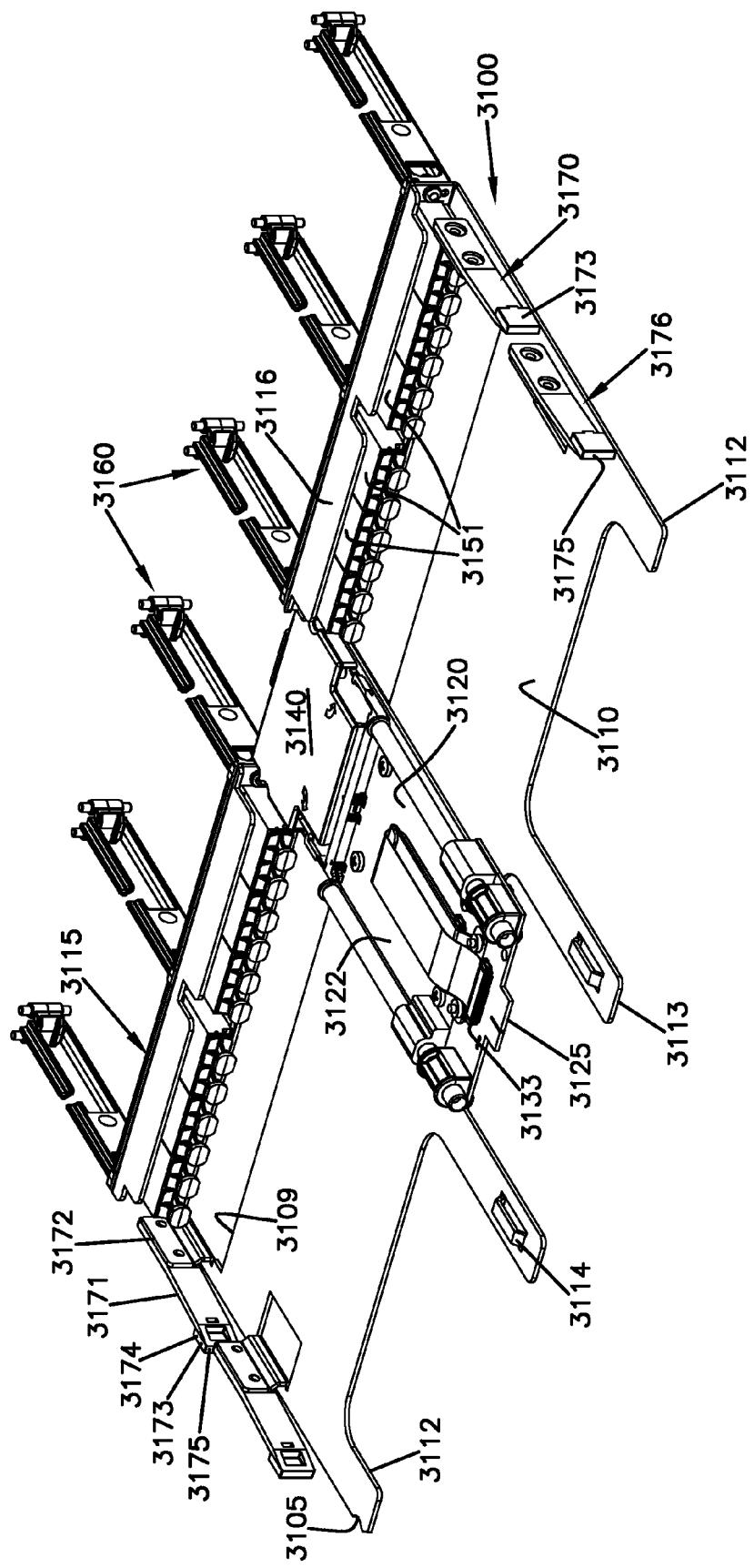
Figure 56:
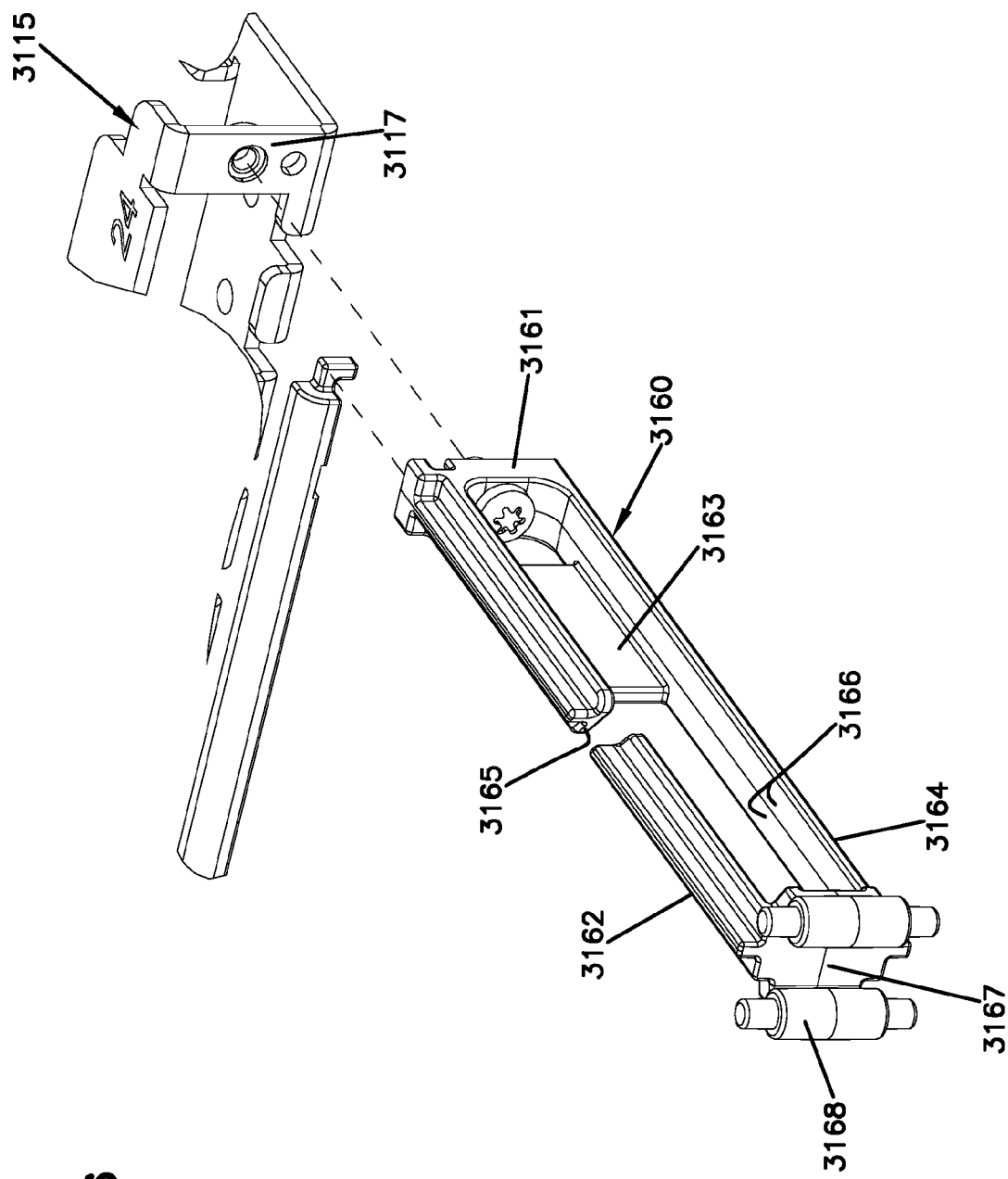

FIGS. 54-56 illustrate an example blades 3100 configured to mount in any of the chassis 3010, 3010', 3010" disclosed above. In general, each blade 3100 includes a generally planar base 3110 having a front, a rear, and opposing sides. A handle 3108 extends from the front of the base 3110 to facilitate positioning of the blade 3100 relative to the chassis 3010 as will be described in more detail herein. Outer extensions 3112 extend from the rear of the base 3110. At least one of the outer extensions 3112 defines a notch 3105 in an external side (FIG. 54). Inner extensions 3113 also extend from the rear of the base 3110. In the example shown, the base 3110 includes two spaced apart inner flanges 3113. Each inner flange 3113 defines a tab (e.g., cable tie location) 3114 at which media segments can be secured as will be described in more detail herein.

Each blade 3100 also includes a coupler arrangement 3150. A frame 3115 holds at least a portion of the coupler arrangement 3150 to the blade 3100. In some implementations, the coupler arrangement defines one or more rear ports at which incoming media segments are received and one or more front ports at which outgoing media segments are received. As noted above, the terms "incoming" and "outgoing" are used for convenience only and do not imply that communication signals flow in only one direction. In some implementations, the front and rear ports are defined by couplers 3151 3153 located at the front of the blade 3100. In other implementations, the rear ports are defined by couplers 3155 located at the rear of the blade 3100.

In some implementations, each coupler 3151, 3153, 3155 of the coupler arrangement 3150 is an adapter configured to receive and optically couple optical fiber cables. As the term is used herein, optical fiber cables refer to one or more strands of optical fibers. In certain implementations, the optical fibers are jacketed or buffered. In some implementations, the optical fibers of a cable are individually connectorized (e.g., with LC connectors, SC connectors, ST connectors, FC connectors, LX.5 connectors, etc.). In other implementations, multiple optical fibers may be terminated at the same connector (e.g., an MPO connector).

In other implementations, one or more couplers 3151, 3153, 3155 of the coupler arrangement 3150 is configured to electrically connect two or more electrical media segments. For example, the coupler arrangement may include a socket for receiving an electrical connector terminating a conductor cable. The socket may connect to one or more IDCs at which other conductors are terminated. In other implementations, the coupler arrangement may include other types of terminations of electrical conductors. In still other implementations, the coupler arrangement may include media converters that are configured to receive one or more optical fiber and one or more electrical conductors to create a communications pathway therebetween.

In some implementations, the blade 3100 is a smart blade as described in more detail herein with reference to FIGS. 128-130. The coupler arrangement 3150 of the smart blade 3100 also includes one or more media reading interfaces that are configured to read physical layer information stored on or in the media segments 3200 received at the coupler arrangement 3150. In certain implementations, each coupler arrangement includes at least one media reading interface. Indeed, in some implementations, each front port of the coupler arrangement includes a media reading interface. In other implementations, adjacent pairs of front ports each include a media reading interface. In still other implementations, one or more rear ports also may include media reading interfaces. Example media reading interfaces are disclosed in U.S. Provisional Application Nos. 61/303,961; 61/413,828; 61/437,504; and U.S. application Ser. No. 13/025,841 incorporated by reference above.

In some implementations, an example smart blade 3100 includes a circuit board arrangement 3120 and a blade processor 3140. The circuit board arrangement 3120 connects the blade processor 3140 to the media reading interfaces of the coupler arrangement 3150. In some implementations, the blade processor 3140 does not modify or otherwise interfere with communications signals (e.g., signals S1 of FIG. 1) propagating over media segments plugged into ports of the coupler arrangement 3150. In certain implementations, the blade processor 3140 does not monitor such communications signals. In certain implementations, the blade processor 3140 is isolated from such communications signals.

A first portion of the circuit board arrangement 3120 extends across the front of the blade 3100. The front couplers 3151, 3153 (FIGS. 57, 65, and 70) are coupled to the first portion of the circuit board arrangement 3120. The second portion of the circuit board arrangement 3120 extends rearwardly from the first portion. In some implementations, the second portion of the circuit board arrangement 3120 is sufficiently narrow to fit between the intermediate flanges 3113 of the blade base 3110. In some implementations, the circuit board arrangement 3120 includes a single printed circuit board.

In other implementations, however, the circuit board arrangement 3120 includes multiple circuit boards that are electrically connected together. In certain implementations, the circuit board arrangement 3120 includes a first circuit board 3122 and a second circuit board 3124. In one implementation, the first circuit board 3122 defines at least the first portion of the circuit board arrangement 3120 and the second circuit board 3124 defines at least part of the second portion of the circuit board arrangement 3120. In certain implementations, the first and second boards 3122, 3124 are configured to move relative to each other as will be described in more detail herein.

In certain implementations, the mounting frame 3115 is interrupted (e.g., defines a reduced height) at an intermediate section of the frame 3115, thereby defining a gap between two adjacent groups of couplers 3151. The blade processor 3140 is mounted to the first portion of the circuit board arrangement 3120 at the interrupted section of the frame 3115 (see FIG. 57). In one implementation, the processor 3140 is mounted to the circuit board arrangement 3120 via s SIM-card type connector. In other implementations, however, the processor 3140 may be otherwise connected to the circuit board arrangement 3120 (e.g., mezzanine connectors).

In some implementations, the blade 3100 may have an open top. In such implementations, the rear ports of the couplers 3151 may be accessible through the open top of the blade 3100. Accordingly, the connectorized ends of the incoming media segments 3210 may be accessible through the open top of the blade 3100. The processor 3140 also may be accessible through the open top of the blade 3100. The interrupted top portion 3116 of the frame 3115 enhances access to the blade processor 3140 through the open top.

In certain implementations, the blade base 3110 defines one or more openings 3109 (FIGS. 57 and 62) at the rear of the front couplers 3151. In some implementations, the first portion of the circuit board arrangement 3120 does not extend rearwardly of the front couplers 3151. Accordingly, the openings 3109 provide finger access to the rear ports of the couplers 3151 from a bottom of the blade 3100. In the example shown, the base 3110 defines one opening 3109 on either side of the processor 3140.

In some implementations, one or more retention fingers 3160 are mounted to the front of the blade 3100 to manage and/or organize the outgoing media segments 3220. FIG. 56 illustrates one example retention finger 3160 configured to facilitate fiber cable management. In certain implementations, the cable retention fingers 3160 may be installed on the mounting frame 3115. For example, each cable retention finger 3160 includes a base 3161 that may be fastened or otherwise attached to a portion (e.g., bracket 3117) of the frame 3115. In other implementations, the base 3161 of each retention finger 3160 may attach to the base 3110 or cover 3103 of a blade 3100.

Bottom and top arms 3162, 3164, respectively, of each finger 3160 extend outwardly from the base 3161 to an end 3167. The arms 3162, 3164, base 3161, and end 3167 define an opening 3166 through which one or more media segments (e.g., optical fiber cables) can be routed. In the example shown, the top arm 3164 defines a break 3165 through which media segments can pass into the opening 3166 without routing an end (e.g., an end terminated by a connector) of the media segment between the arms 3162, 3164. In other implementations, the break 3165 may be provided in the end 3167 or bottom 3164. A support flange 3163 extends between the bottom and top arms 3162, 3164 adjacent the base 3161. The support flange 3163 inhibits the media segments retained within the opening 3166 from being bent too far.

FIGS. 57-62 show a first example blade 3100A including a mounting frame 3115A at which the front ports of a first example coupler arrangement 3150A are positioned. The first example coupler arrangement 3150A (FIG. 57) defines the front and rear ports of the blade 3100A. In some implementations, the mounting frame 3115A holds at least part of the coupler arrangement 3150A to the blade base 3110. For example, in some implementations, the coupler arrangement 3150A includes a first plurality of couplers 3151 held within the front openings of the mounting frame 3115A.

The mounting frame 3115A generally includes a top 3116 connected to the base 3110 by two or more brackets 3117 to define a generally open front. Additional brackets 3117 may extend between the top 3116 and base 3110 to separate the front opening into multiple openings. In certain implementations, the mounting frame 3115A includes tabs 3118 and flanges 3119 that extend partially into the frame openings. The tabs 3118 and flanges 3119 aid in holding the couplers 3151. In the example shown, the mounting frame 3115A defines four openings. In other implementations, however, the mounting frame 3115A may form greater or fewer openings. In some implementations, the mounting frame 3115A is integral with the base 3110. For example, the frame 3115A may be formed by bending a front portion of the base 3110. In other implementations, however, the frame 3115A can be a separate piece that is assembled to the base 3110.

In some implementations, multiple couplers 3151 are mounted within each frame opening. In other implementations, however, a single coupler 3151 may be mounted within each frame opening. In the example shown, three couplers 3151 are mounted within each opening in the frame 3115A. The couplers 3151 have front ports that define the front ports of the blade 3100A that are configured to receive the outgoing media segments 3210 (e.g., see FIGS. 61-62). In some implementations, the couplers 3151 of the first coupler arrangement 3150A also define the rear ports of the blade 3100A that are configured to receive the incoming media segments 3210 (e.g., see FIGS. 61-62). For example, in certain implementations, each coupler 3151 defines one or more through-openings 3159 (FIG. 60) extending between the front and rear ports. In other implementations, the first coupler arrangement 3150A includes additional couplers that define the rear ports of the blade 3100A (e.g., see blade 3100C of FIGS. 67-71).

In the example shown, each coupler 3151 includes four through-openings 3159, thereby providing a total of forty-eight through-openings 3159 on the blade 3100A. Accordingly, the first example blade 3100A is configured to connect forty-eight pairs of media segments 3200. In other implementations, however, the blade 3100 may include greater or fewer couplers 3151 and each coupler 3151 may include greater or fewer through-openings. For example, each coupler 3151 may include one, two, eight, ten, or twelve through-openings 3159. In accordance with other aspects, each coupler 3151 may define an unequal number of front and rear ports.

In some implementations, the couplers 3151 include fiber optic adapters configured to receive one or more pairs of connectorized fiber cables (e.g., two LC-connector terminated cables, two SC-connector terminated cables, two ST-connector terminated cables, two MPO-connector terminated cables, etc.). In the example shown in FIG. 60, the couplers 3151 are quadruplex fiber optic adapters 3151 that optically couple together four pairs of LC connectors. In other implementations, however, the couplers 3151 can include monoplex fiber optic adapters, duplex fiber optic adapters, or other types of adapters. In still other implementations, the couplers 3151 may include one or more electrical sockets.

In certain implementations, dust caps 3152 can be provided in the ports of one or more of the through-openings 3159 of the adapters 3151. In the example shown, each dust cap 3152 is configured to plug into two adjacent ports of an adapter 3151 (e.g., see FIG. 60). In another implementation, however, each dust caps 3152 may be configured to plug into a single port of an adapter 3151. In other implementations, each dust cap 3152 may be configured to plug into three or more ports of an adapter 3151.

Figure 57:
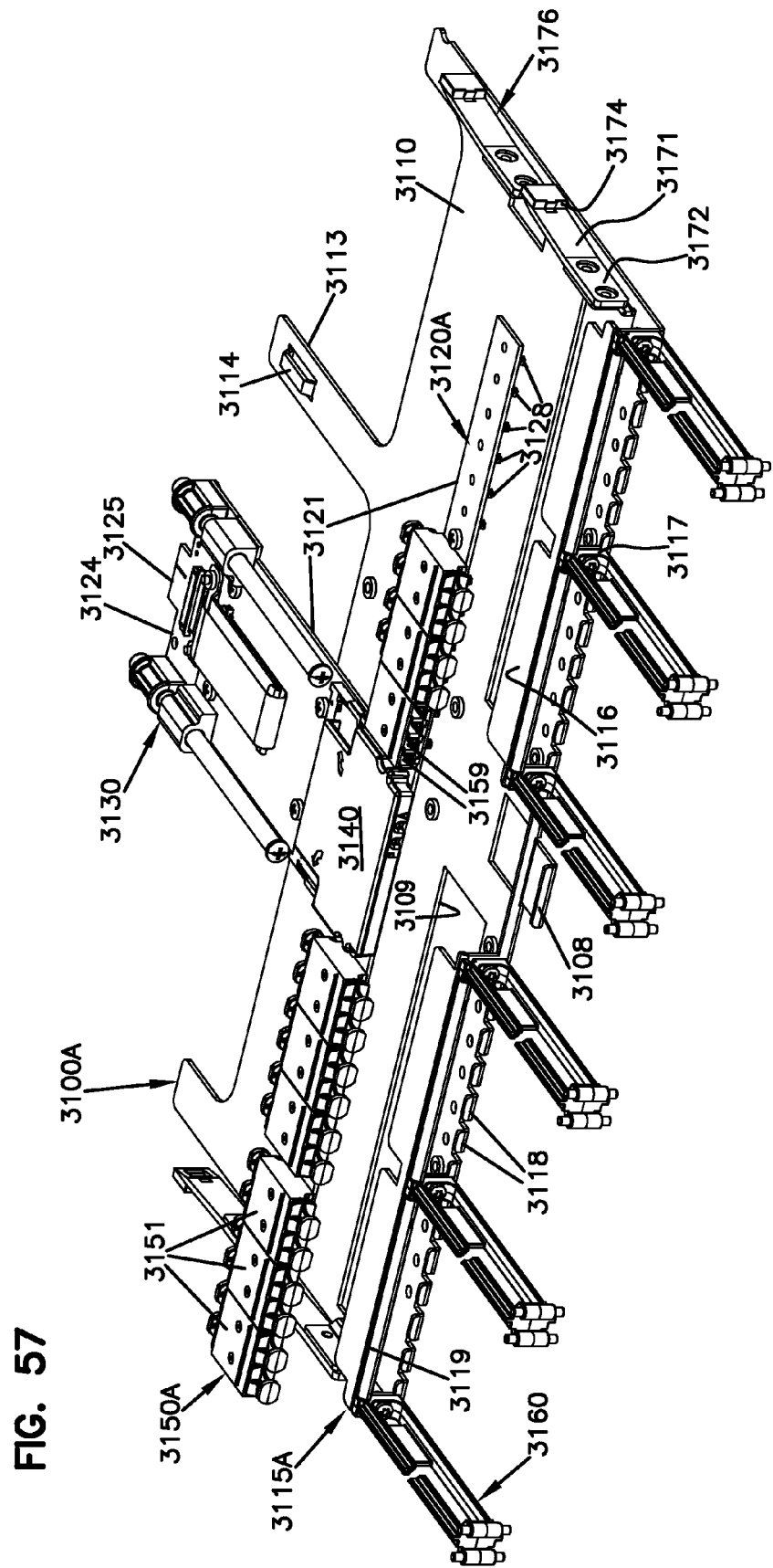
FIGS. 57-62 illustrate one example blade including a coupler arrangement that connects incoming media segments terminated at LC-type connectors to outgoing media segments terminated at LC-type connectors.
Figure 60:
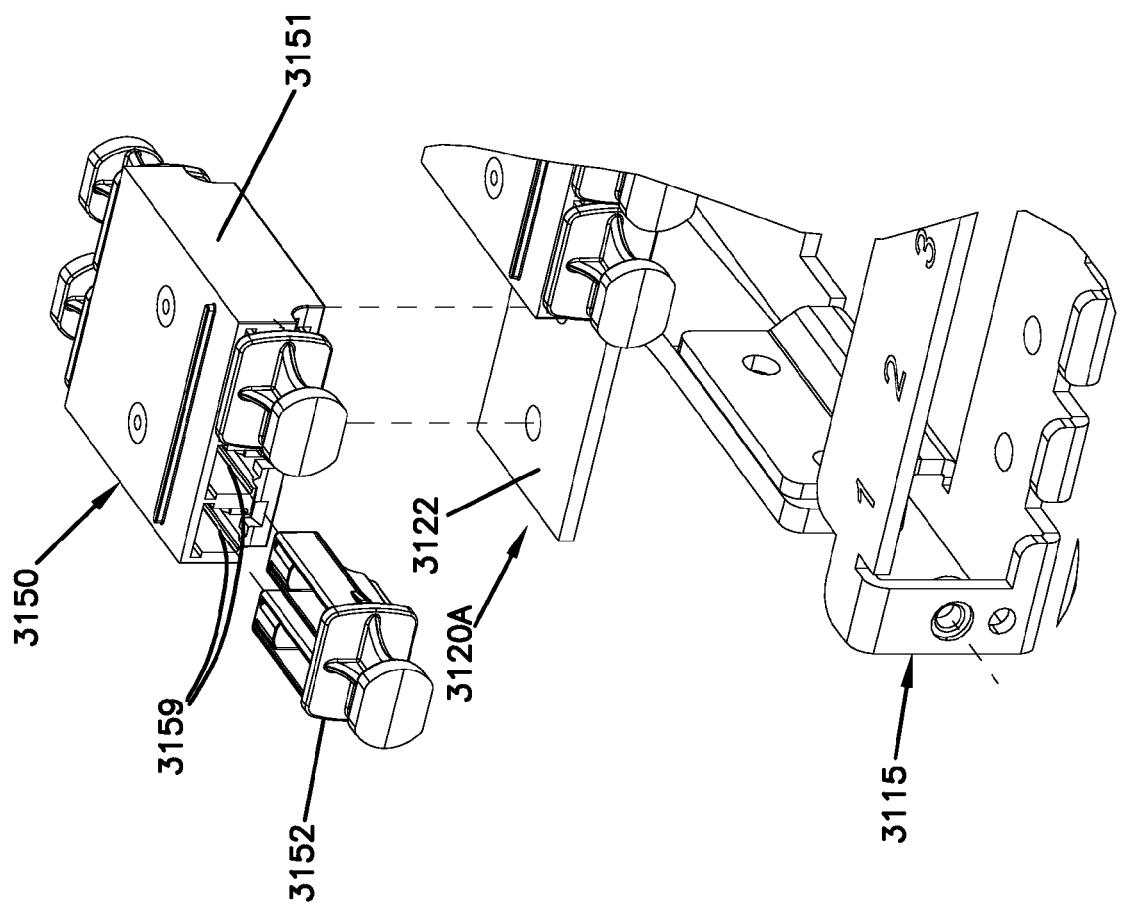

As shown in FIGS. 57 and 60, the couplers 3151 are mounted to a circuit board arrangement 3120A. In the example shown, the circuit board arrangement 3120A is generally T-shaped. A first portion of the circuit board arrangement 3120A extends across the front of the base 3110 and a second portion of the circuit board arrangement 3120A extends to a rear of the base 3110. The first plurality of couplers 3151 are mounted on top of the first portion of the circuit board arrangement 3120A.

For example, in FIG. 57, a row of spaced groups of the couplers 3151 are mounted to the first portion of the circuit board arrangement 3120A. In some implementations, the couplers 3151 within each group are positioned directly next to each other (see FIG. 57). In other implementations, the couplers 3151 within each group are spaced from each other. In the example shown, each group of couplers 3151 is positioned to align with one of the openings of the frame 3115A. Accordingly, the front ports of each coupler 3151 are accessible through the front openings of the frame 3115A at the front of the blade 3100A.

Figure 58:
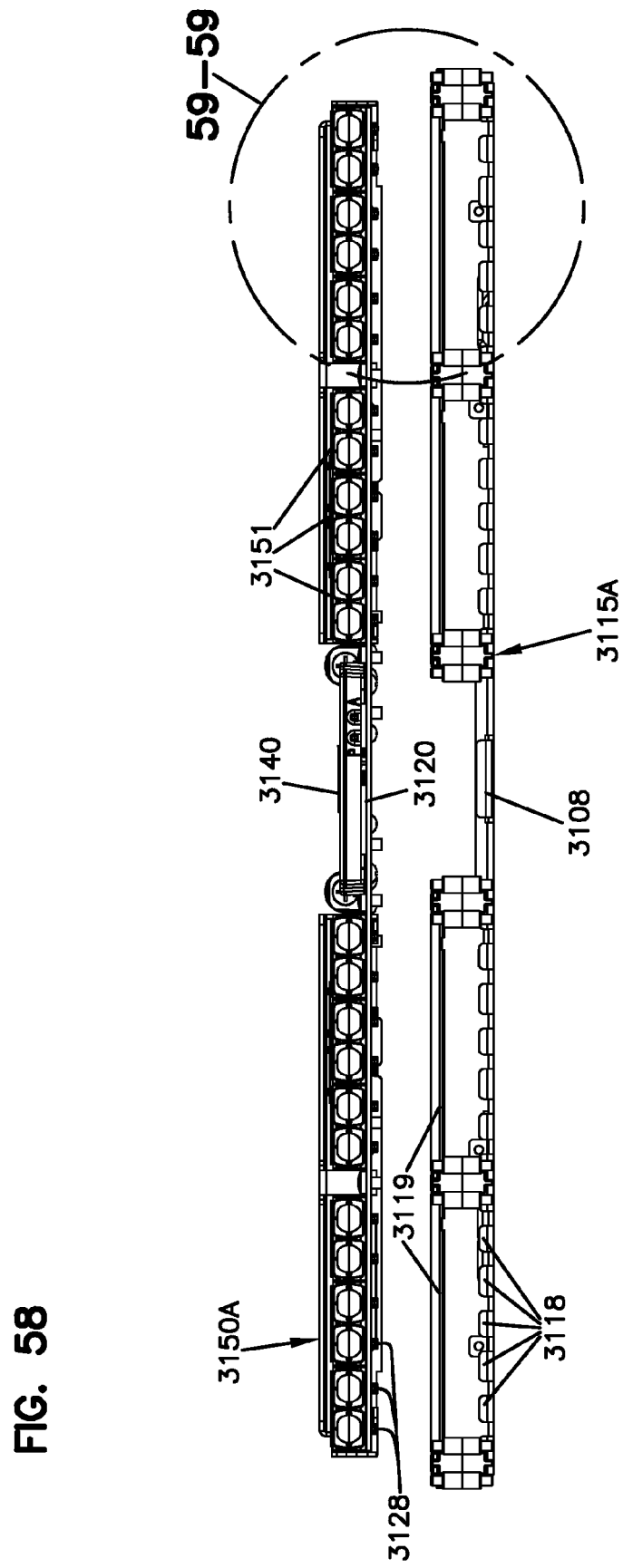
Figure 59:
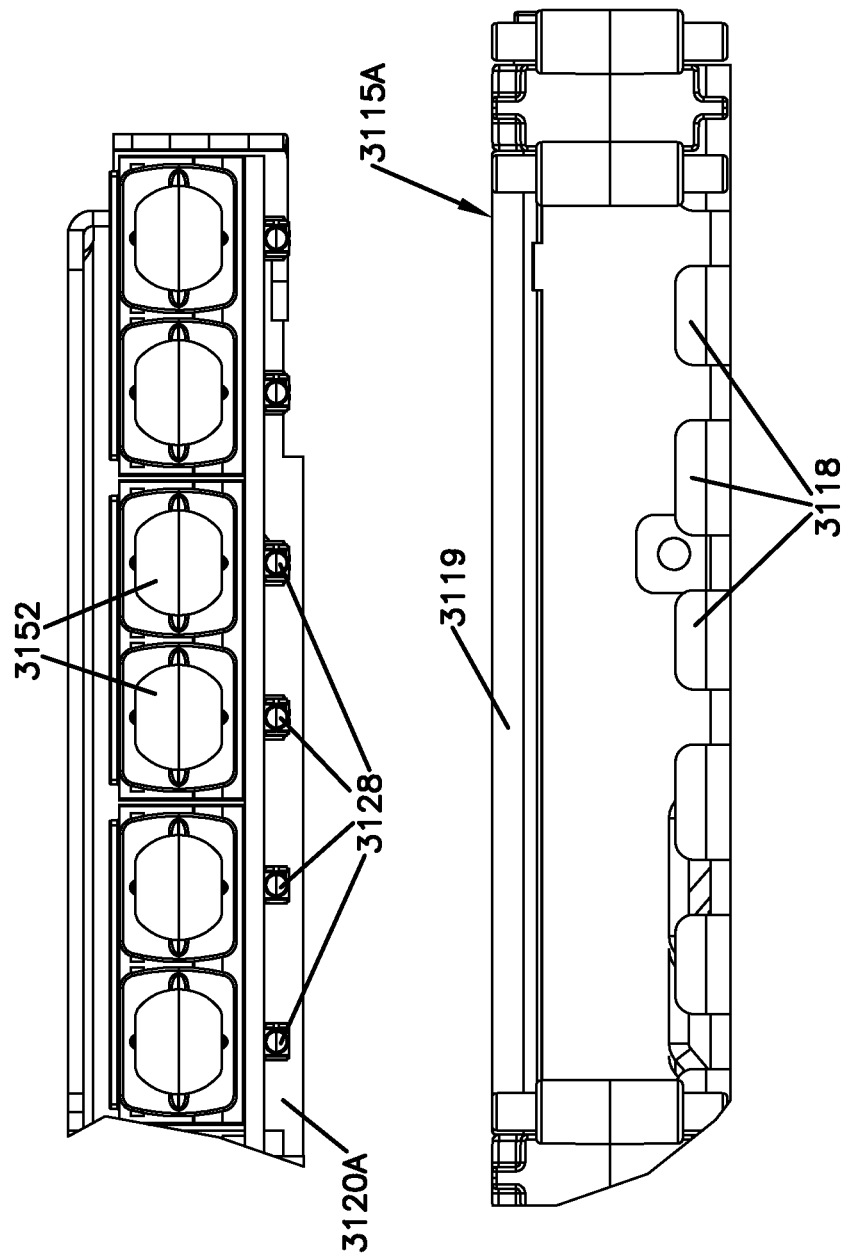

In certain implementations, the first example blade 3100A includes one or more visual indicators 3128 to indicate status information of the blade 3100A (e.g., see FIGS. 57-59). For example, the visual indicators 3128 may be used to indicate a coupler port, a set of coupler ports, a coupler 3151, or the first blade 3100A, itself. In one implementation, the first example blade 3100A includes a visual indicator 3128 positioned adjacent each front port (e.g., FIG. 59). In another implementation, the first example blade 3100A includes a visual indicator 3128 positioned adjacent each pair of front ports. In still other implementations, the first example blade 3100A includes a single visual indicator 3128 per blade.

In one example implementation, the visual indicators 3128 include light emitting diodes (LEDs). In accordance with some aspects, the blade processor 3140 can indicate a particular coupler port (e.g., to show a technician which port should receive a plug) by applying power to light the corresponding LED 3128. In accordance with other aspects, the processor 3140 can apply power to an LED 3128 to indicate a status of the corresponding port, set of ports, or blade. For example, the processor 3140 may apply power to the LED 3128 when a plug has been received at a respective port.

In accordance with certain aspects, the processor 3140 can send instructions to the LED 3128 to display a particular color. For example, the processor 3140 may cause an LED 3128 to display a first color (e.g., green) when a plug is inserted and physical layer information is successfully read, a second color (e.g., amber) when a plug is inserted and physical layer is not successfully read, and a third color (e.g., red) when a plug is partially (or otherwise improperly) inserted into the port. In other implementations, however, the LEDs 3128 can display greater or fewer colors or can indicate other types of statuses or errors. In other implementations, however, other types of visual indicators may be used (e.g., an LCD screen, a touch screen a monitor, etc.).

Figure 61:
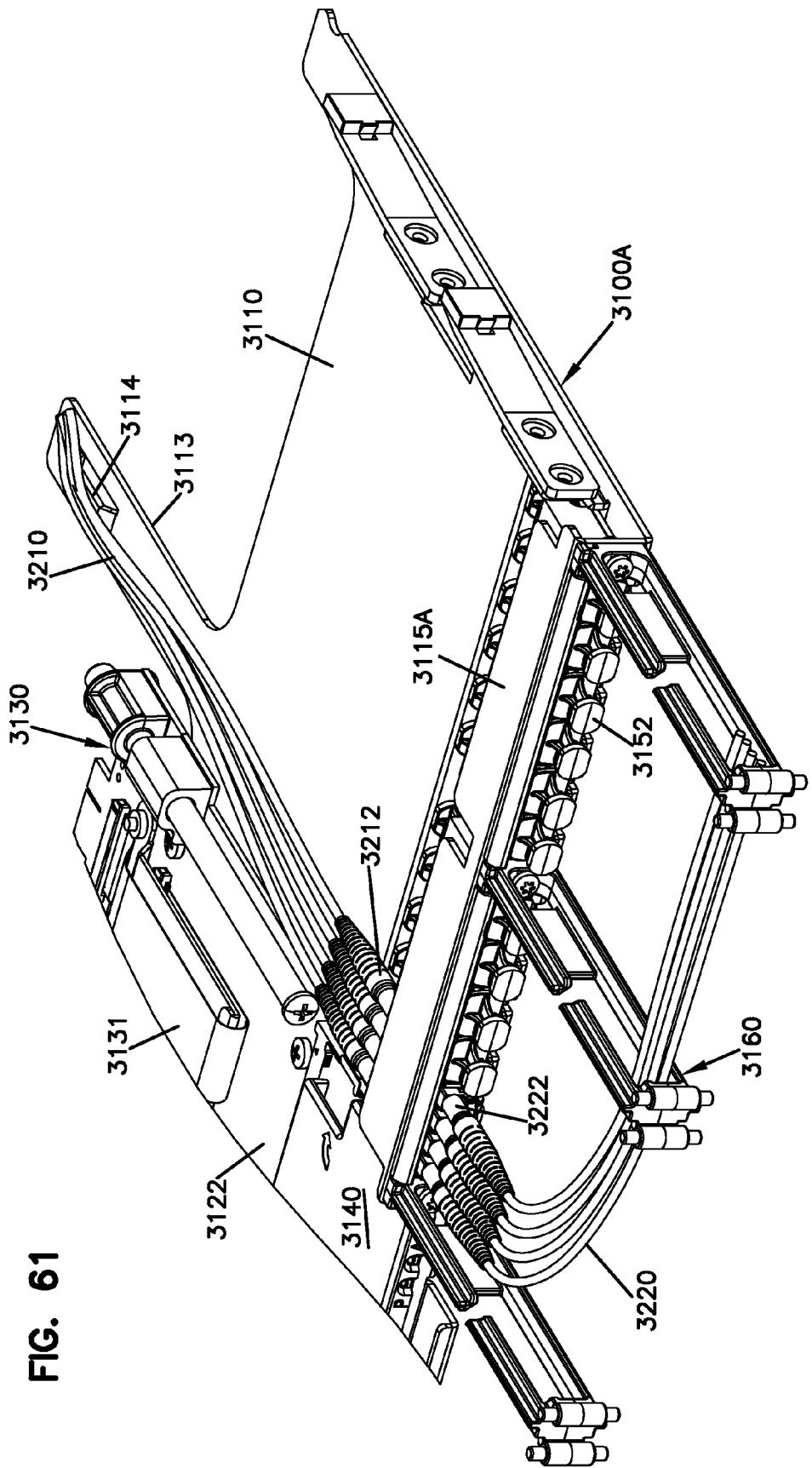
Figure 62:
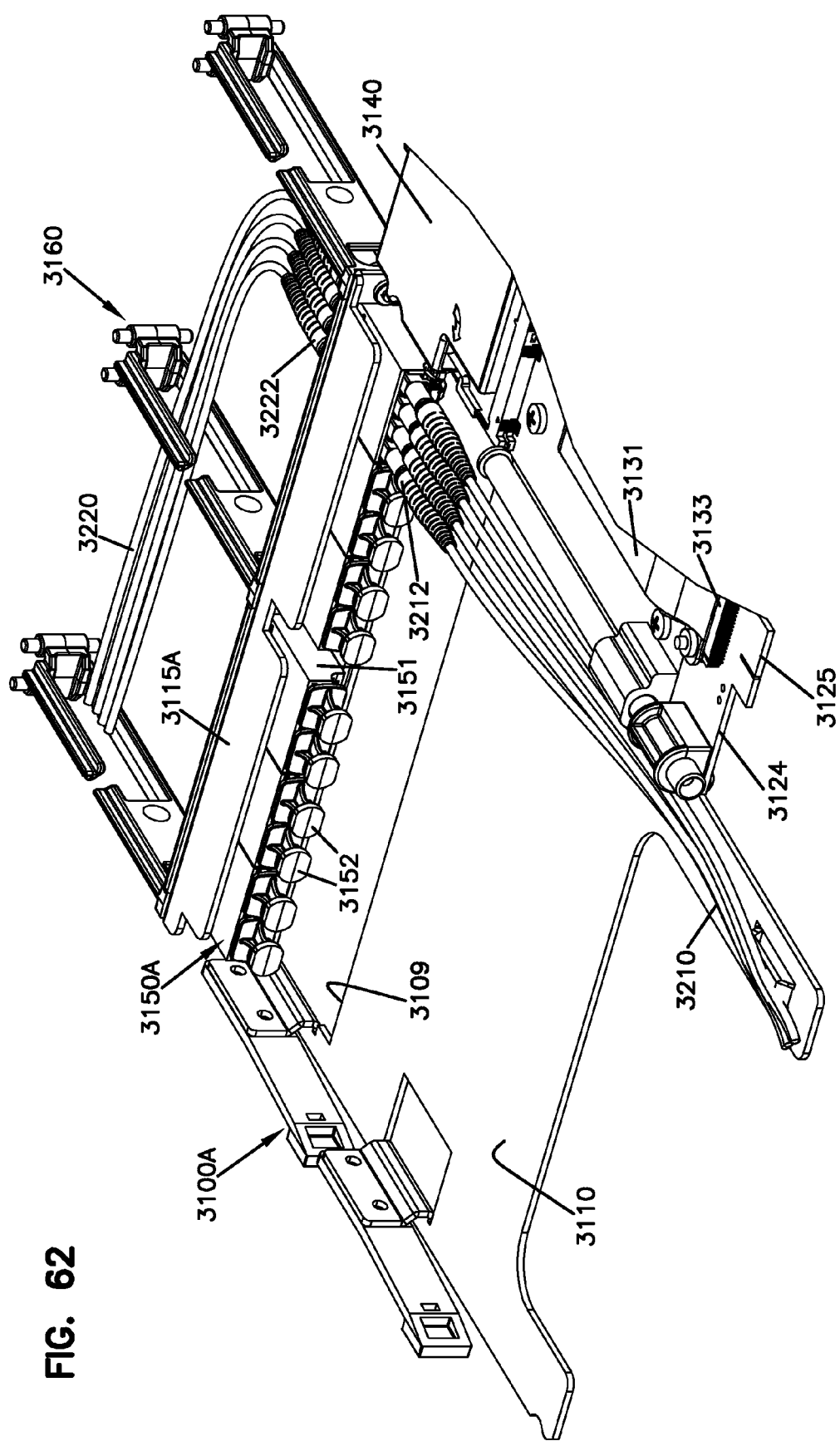

FIGS. 61-62 show one example routing path for incoming and outgoing media segments 3210, 3220 on the first example blade 3100A. Outgoing media segments 3220 are routed to the couplers 3151 at the front of the blade 3100A. Connectorized ends 3222 of the outgoing media segments 3220 are plugged into the front ports of the couplers 3151. For example, the connectorized ends 3222 may be inserted through the openings of the frame 3115A and into the front port of the through-openings 3159 defined by the couplers 3151. The media segments 3220 may be managed by one or more of the retention fingers 3160 coupled to the blade 3100A.

At least a first group of one or more incoming media segments 3210 are routed to one of the intermediate flanges 3113. The incoming media segments 3210 of the first group are secured to the blade 3100A at the intermediate flange 3113. For example, the first media segments of the first group may be secured to the tab 3114 at the flange 3113 using a cable tie 3039 (e.g., see FIGS. 77-79). For example, the cable tie 3039 may be wrapped around the media segments 3200 and looped through the tab 3114. Connectorized ends 3212 of the media segments 3210 are routed over the base 3110 towards the front of the blade 3100A and plugged into the rear ports of the couplers 3151.

FIGS. 63-66 show various views of a second example blade 3100B. The second example blade 3100B includes a generally planar base 3110, a handle 3108, outer extensions 3112, and inner extensions 3113. At least one of the outer extensions 3112 defines a notch 3105 in an external side. One or more tabs 3114 are provided at each inner flange 3113 to aid in securing a group of optical fibers to the blade 3100B. Retention fingers 3160 may extend forwardly of the blade 3100B to aid in managing outgoing media segments 3220.

The second example blade 3100B includes a second example coupler arrangement 3150B configured to connect incoming and outgoing fibers terminated with MPO-connectors. The second coupler arrangement 3150B includes a row of couplers 3153 (FIG. 66) at the front of the blade 3100B. In the example shown, the couplers 3153 are fiber optic adapters configured to receive MPO-type fiber optic connectors. For example, in one implementation, each adapter 3153 is configured to optically couple together a pair of MPO-connectors. In other implementations, each adapter 3153 may coupler together multiple pairs of MPO-connectors. In the example shown, dust plugs 3154 are mounted in front and rear ports of the adapters 3153.

In certain implementations, the second example blade 3100B includes a circuit board arrangement 3120B that includes multiple circuit boards. For example, in FIGS. 65 and 66, the circuit board arrangement 3100B includes a first circuit board 3122, a second circuit board 3124, and a third circuit board 3126. A processor 3140 connects to the first circuit board 3122. The MPO adapters 3153 are sandwiched between the first circuit board 3122 and the third circuit board 3126. Accordingly, each of the adapters 3153 may include a first media reading interface that communicates with the processor 3140 through the first circuit board 3122 and a second media reading interface 3157 that communicates with the processor 3140 through the third circuit board 3126 (see FIG. 66).

The third circuit board 3126 is communicatively (e.g., electrically) connected to the first circuit board 3122. For example, in some implementations, the third circuit board 3126 is connected to the first circuit board 3122 using pins 3129, which can be guided in a housing 3128 positioned on the first circuit board 3122 (e.g., see FIG. 66). Accordingly, the first circuit board 3122 connects the processor 3140 to the third circuit board 3126. In some implementations, the circuit board arrangement 3120B includes multiple third circuit boards 3126. For example, in the implementation shown in FIG. 65, the circuit board arrangement 3120B includes one third circuit board 3126 positioned over the couplers 3153 on a first side of the processor 3140 and another third circuit board 3126 positioned over the couplers 3153 on a second side of the processor 3140.

Figure 65:
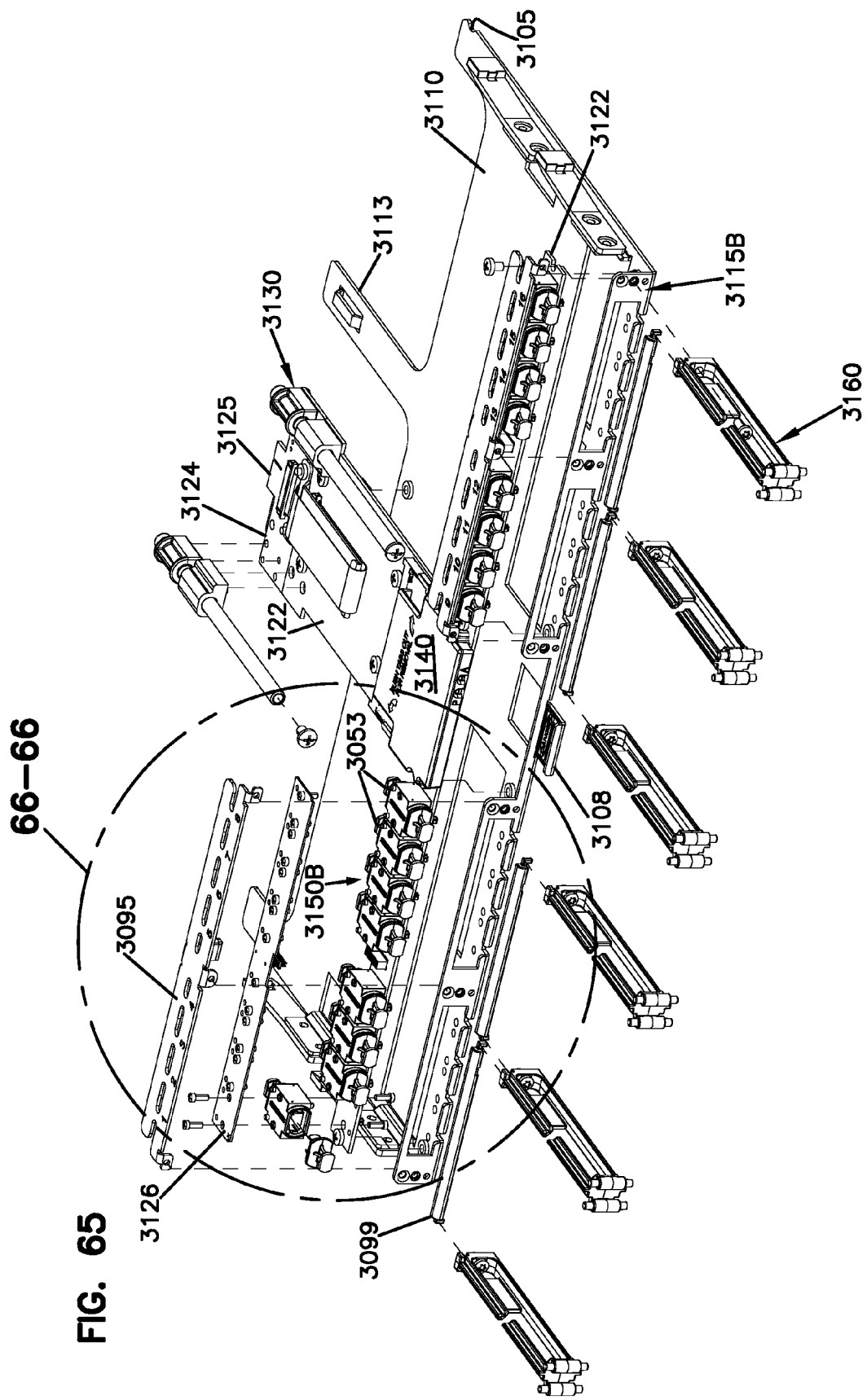
Figure 66:
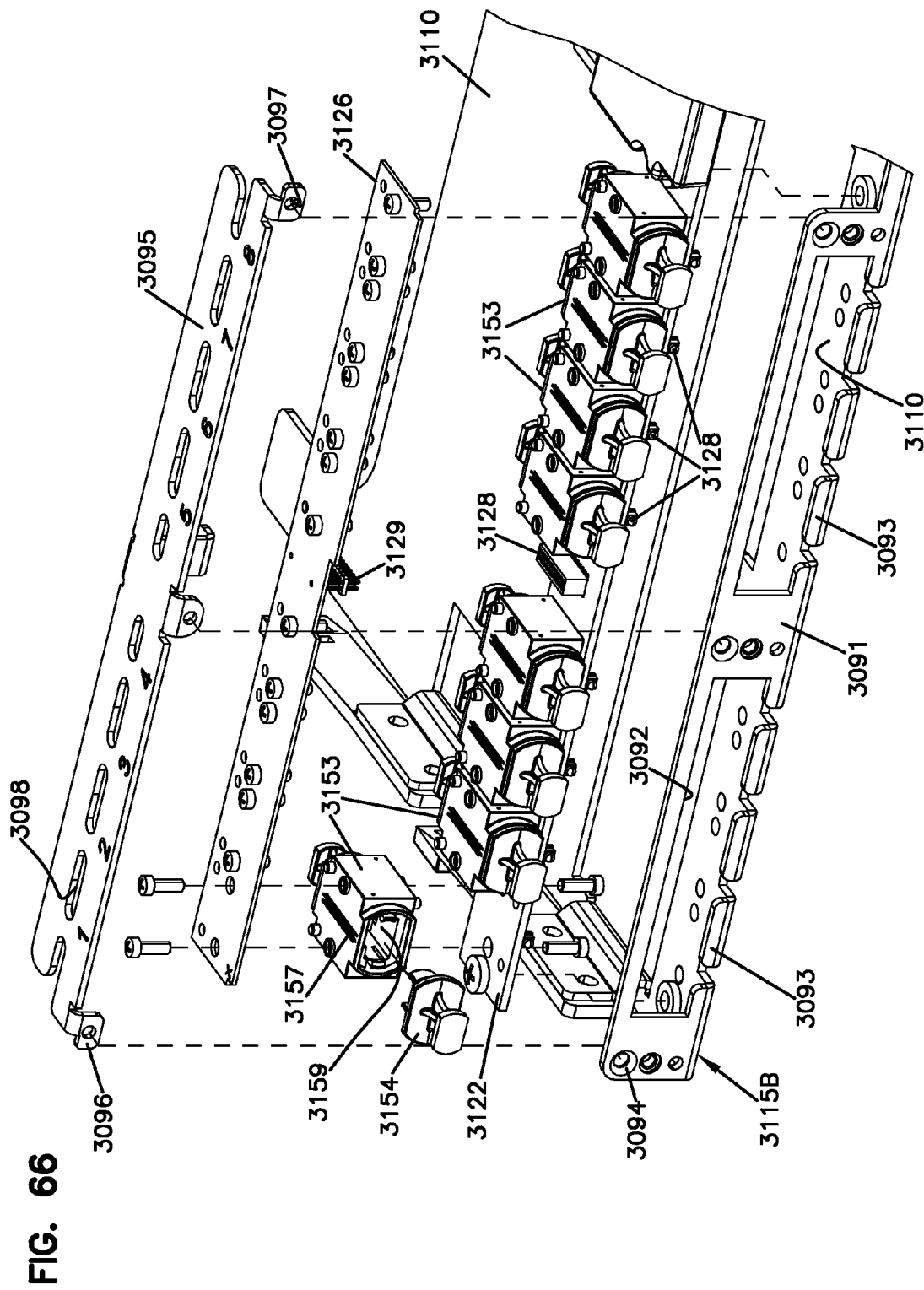
Figure 67:
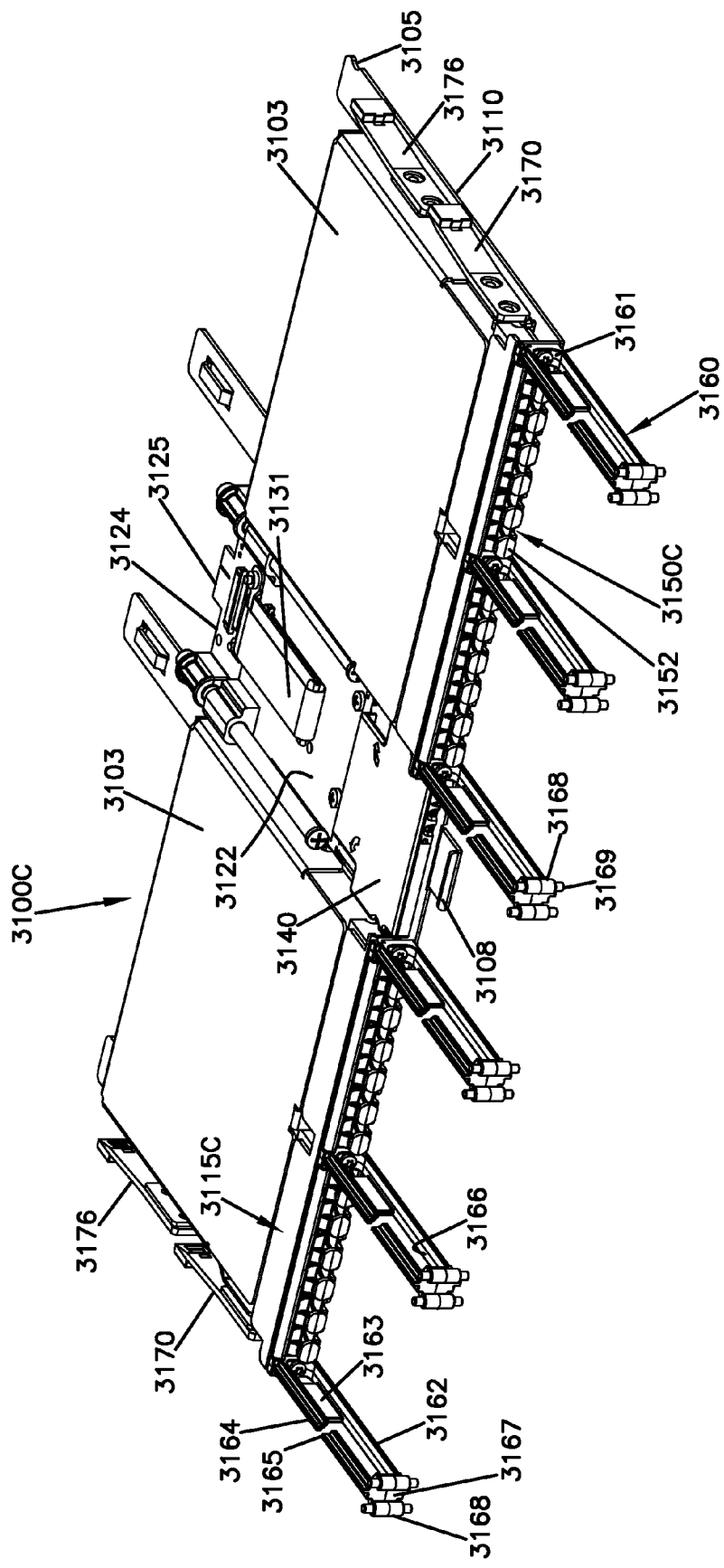
FIGS. 67-71 illustrate one example blade including a coupler arrangement that connects incoming media segments terminated at MPO-type connectors to outgoing media segments terminated at LC-type connectors.

The second example blade 3100B includes a second example mounting frame 3115B coupling the second coupler arrangement 3150B to the base 3110 (see FIGS. 65-66). The mounting frame 3115B is configured to hold the couplers 3153 at the front of the blade 3100B while allowing access to the front and rear ports of the couplers 3153. The mounting frame 3115B includes a fascia 3091 extending upwardly from the base 3110 (FIG. 66). The fascia 3091 defines one or more openings 3092 through which the front ports of the couplers 3153 may be accessed. In the example shown, the mounting frame 3115B defines four openings. In other implementations, however, the mounting frame 3115B may form greater or fewer openings.

Tabs 3093 extend from the base 3110 of the blade 3100B and into the openings 3092 to aid in retaining the couplers 3153. In some implementations, the frame 3115B includes a tab 3093 for each coupler 3153. In other implementations, the tabs 3093 extend between adjacent couplers 3153 (see FIG. 63). In the example shown, four couplers 3153 are mounted at each opening 3092. In other implementations, however, greater or fewer couplers 3153 can be mounted at each opening 3092. In some implementations, the couplers 3153 of each opening are positioned directly next to each other. In other implementations, adjacent couplers 3153 are spaced from each other.

A top member 3095, which extends generally perpendicular to the base 3110, can be removeably connected to the fascia 3091 (see FIG. 66). For example, the top member 3095 can include brackets 3096 that define openings 3097 and the fascia 3091 may define openings 3094. Fasteners can be inserted through the openings 3094, 3097 to connect the top member 3095 to the fascia 3091. In certain implementations, the top member 3095 may include a series of openings 3098. In the example shown, the openings 3098 accommodate fasteners holding the third circuit board 3126 to the couplers 3153.

A finishing member 3099 (FIG. 65) can be mounted to the frame 3115B. The finishing member 3099 defines a curved surface that extends over a length of the openings 3092 defined in the fascia 3091. In some implementations, the finishing member 3099 is configured to be held to the frame 3115B using the retention fingers 3160 (discussed above with reference to FIG. 60). For example, the finishing members 3099 may include hooked or bent ends that are held between the retention fingers 3160 and the frame fascia 3091 (see FIG. 65).

In certain implementations, each coupler 3153 defines one or more through-openings 3159 (FIG. 66) extending between front and rear ports of the coupler 3153. In the example shown, each coupler 3153 includes a single through-opening 3159, thereby providing a total of sixteen through-openings 3159 on the second example blade 3100B. Accordingly, the second blade 3100B is configured to connect sixteen pairs of multi-fiber cables 3200. In other implementations, however, the second example blade 3100B may include greater or fewer couplers 3153 and each coupler 3153 may include greater or fewer through-openings 3159. In accordance with other aspects, the couplers 3153 may define an unequal number of front and rear ports.

Figure 68:
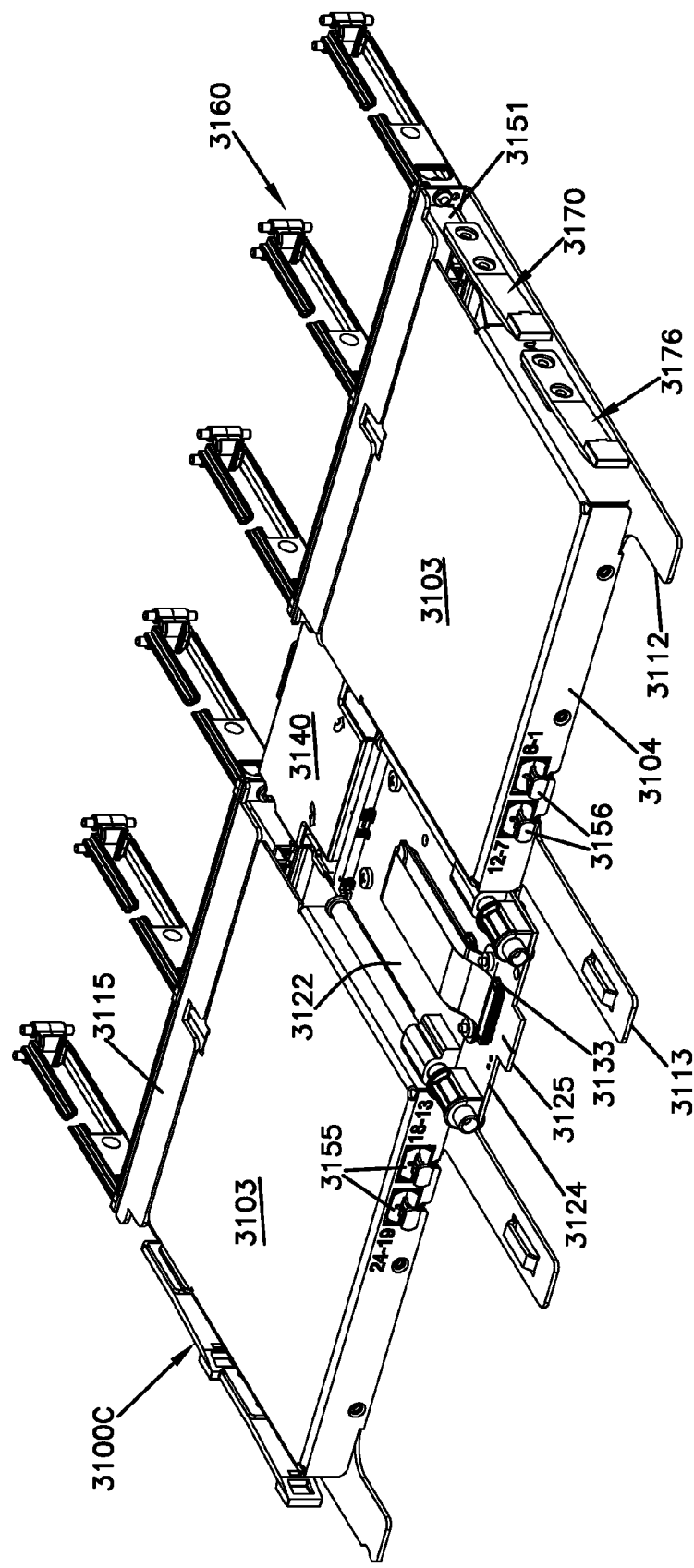
Figure 69:
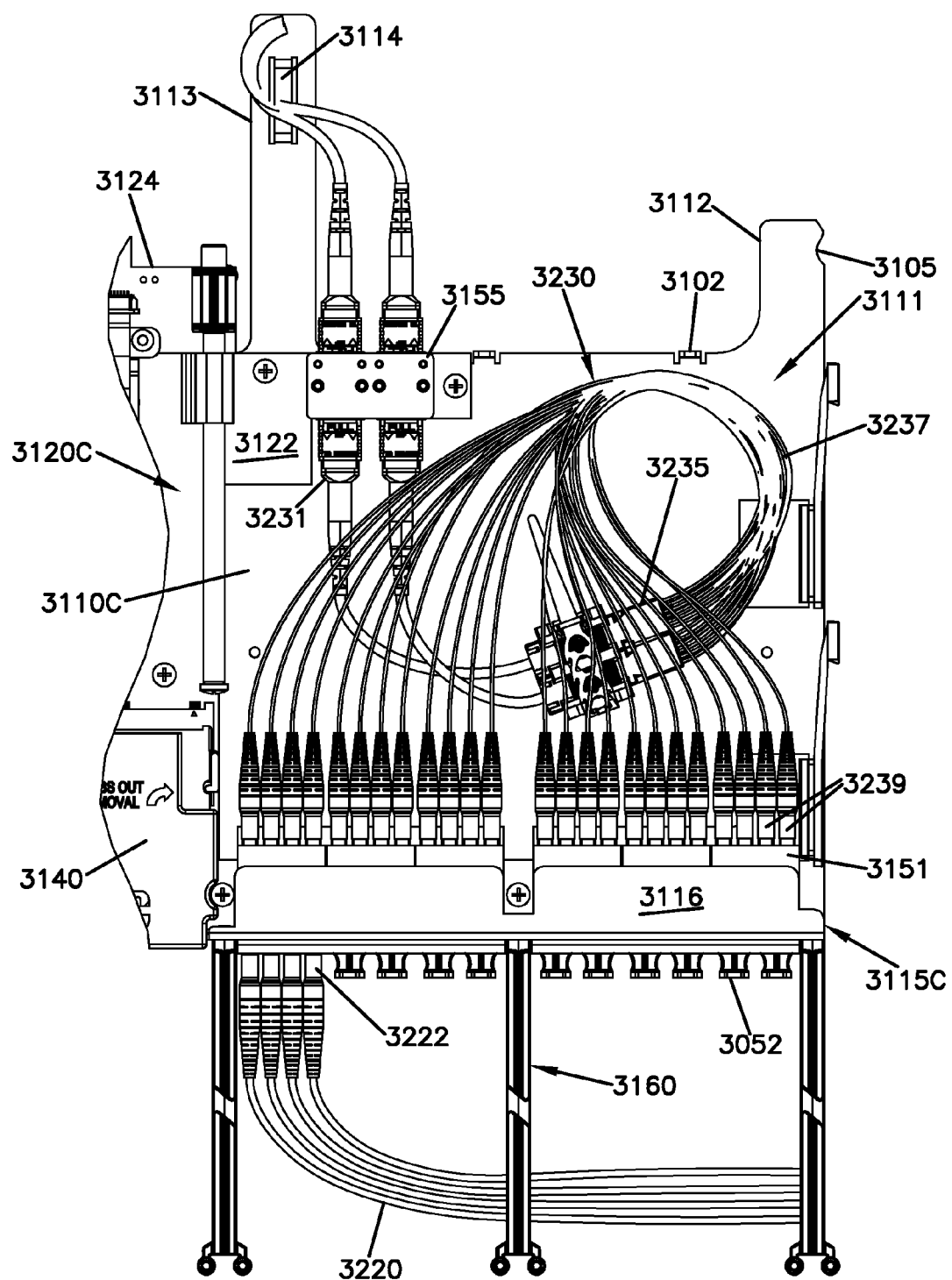
Figure 70:
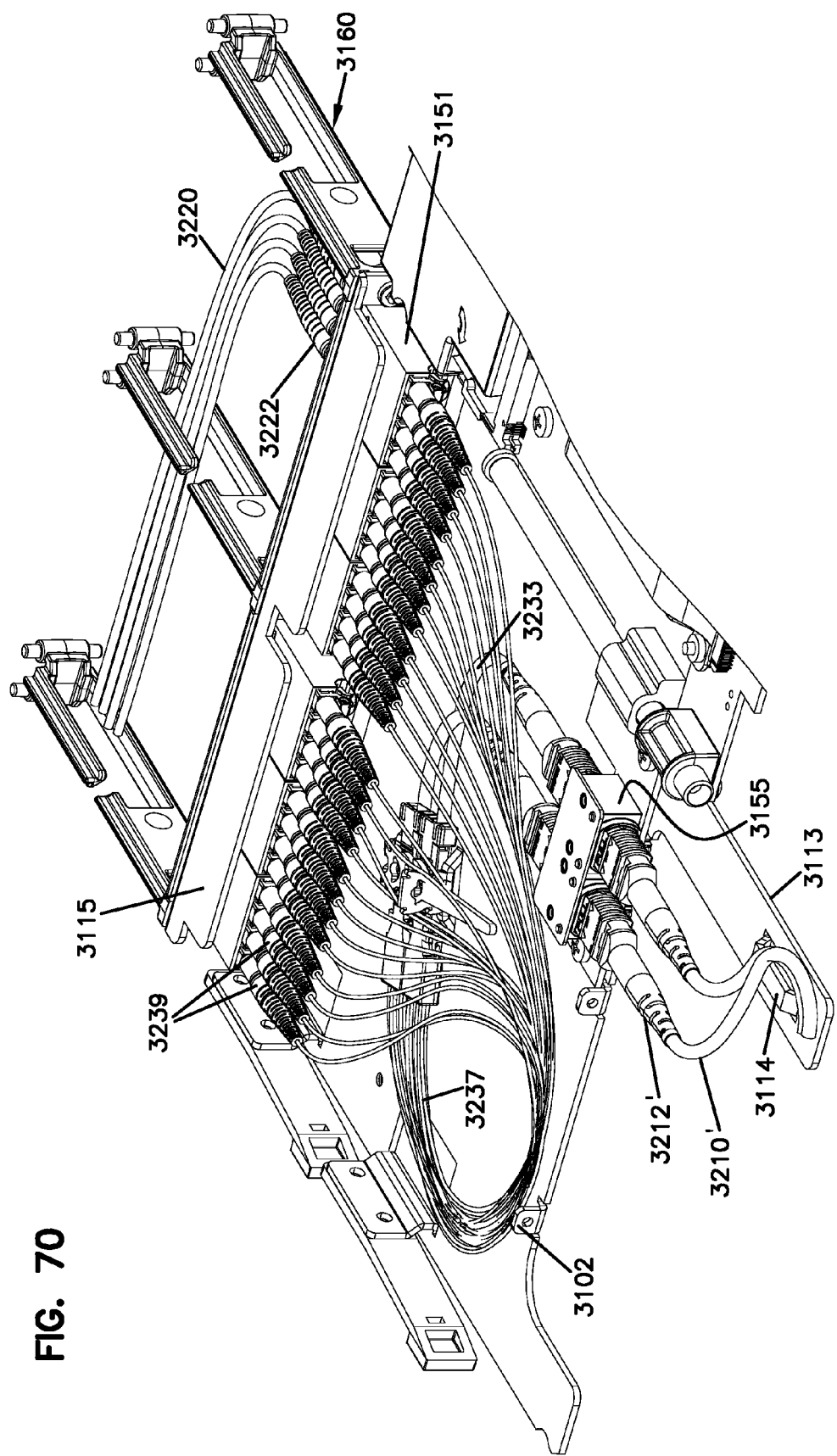

FIGS. 67-71 show different views of a third example blade 3100C. The third example blade 3100C includes a generally planar base 3110C (FIGS. 70-71) that is substantially similar to the base 3110 of the first example blade 3100A. However, the base 3110C of the third blade 3100C includes brackets 3102 (FIG. 70). The base 3110C of the third blade 3100C also includes a handle 3108, side flanges 3112, and inner flanges 3113. At least one of the side flanges 3112 defines a notch 3105 in an external side. One or more tabs 3114 are provided at each inner flange 3113 to aid in securing a group of optical fibers to the blade 3100C.

A cover arrangement 3103 (FIG. 67) may be mounted to the base 3110C at brackets 3102. The cover arrangement 3103 includes one or more covers that extend over the top of the blade 3100 between the frame 3115C and a rear of the base 3110C. In one implementation, a single cover 3103 extends over the entire blade 3100C. In other implementations, however, multiple covers 3103 can be installed on the blade 3100C. Each cover cooperates with the base 3110 to define a blade interior 3111. In some implementations, each cover 3103 includes side and/or rear walls that extend down to the base 3110 (see FIG. 68). In other implementations, however, each cover 3103 is mounted to a separate rear wall and/or to separate side walls of the blade 3100C. In still other implementations, each cover 3103 may be mounted to the frame 3115C. In the example shown, the outer and inner flanges 3112, 3113 extend outwardly from the cover arrangement 3103. In other implementations, however, the cover arrangement 3103 may extend over the outer and inner flanges 3112, 3113.

The third example blade 3100C also includes a third example coupler arrangement 3150C that is configured to connect incoming media segments 3210 and outgoing media segments 3220. In the example shown, the incoming media segments 3210 are optical fibers terminated with MPO-type connectors and the outgoing media segments 3200 are optical fibers terminated with LC-type connectors. The coupler arrangement 3150C includes a first set of couplers 3151 defining the front ports of the blade 3100C and a second set of couplers 3155 defining the rear ports of the blade 3100C. In the example shown, the blade 3100C includes a left coupler region at which a plurality of the fiber optic adapters 3151 is located, an intermediate region at which a blade processor 3140 is located, and a right coupler region at which another plurality of the fiber optic adapters 3151 is located. A cover is installed over each coupler region. In accordance with some aspects, the intermediate region of the blade 3100 is uncovered. Accordingly, the cover arrangement 3103 does not inhibit access to the blade processor 3140.

The third blade 3100C also includes a mounting frame 3115C that aids in holding the first set of couplers 3151 to the base 3110C. In the example shown, the mounting frame 3115C is substantially the same as the mounting frame 3115A of the first blade 3100A. Retention fingers 3160 may be coupled to the frame 3115C to aid in managing outgoing media segments 3220. In some implementations, the top 3116 of the mounting frame 3115A is about flush with the cover arrangement 3103. In other implementations, the cover arrangement 3103 encompasses part of the frame 3115A. In other implementations, the top 3116 of the frame 3115A extends over a portion of the cover arrangement 3103. In still other implementations, however, the third blade 3100C may include a frame 3115C with a different configuration than frame 3115A.

Figure 71:
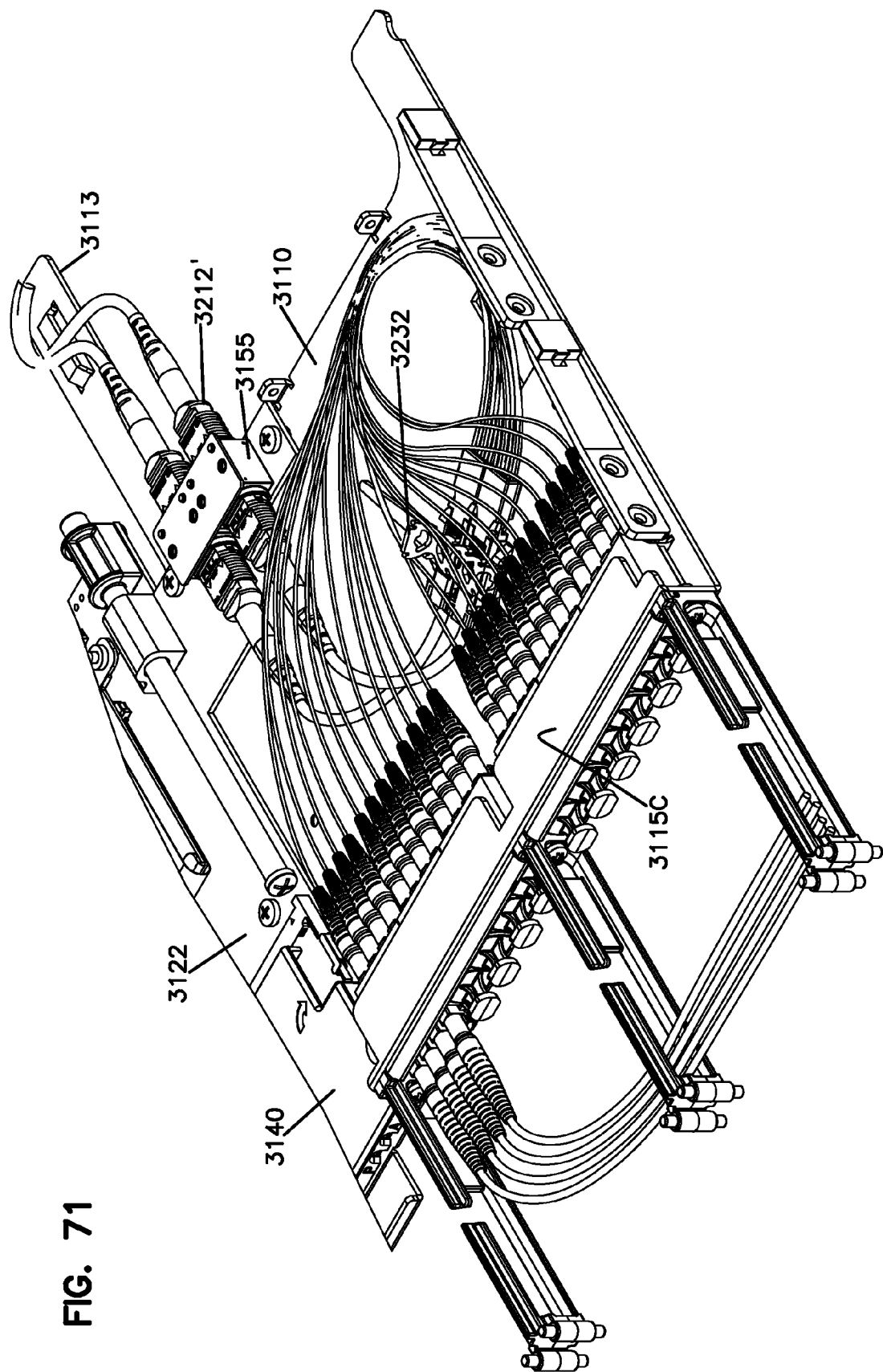

In the example shown in FIGS. 69-71, the front couplers 3151 define through-openings that are configured to optically couple optical fibers terminated with LC connectors to optical fibers terminated with LC connectors and the rear couplers 3155 are configured to optically couple optical cables terminated with MPO connectors to optical cables terminated with MPO connectors. In other implementations, however, each front and rear couplers 3151, 3155 can be configured to couple together other types of media segments. In certain implementations, dust plugs 3152 (FIG. 67) are mounted in front and rear sides of the front couplers 3151 and dust plugs 3156 (FIG. 68) are mounted to the rear couplers 3155.

The third blade 3100C also includes a third circuit board arrangement 3120C having a first portion extending across the front of the base 3110C and a second portion of the circuit board arrangement extending to a rear of the base 3110C. In certain implementations, the third circuit board arrangement 3120C also includes a third portion that extends at last partially along a rear side of the blade base 3110C (see FIGS. 69-71). The first plurality of couplers 3151 are mounted on top of the first portion of the circuit board arrangement 3120C and the second couplers 3155 are mounted on top of the third portion of the circuit board arrangement 3120C.

One or more connecting media segments 3230 connect the front couplers 3151 to the rear couplers 3155. In accordance with some aspects, the connecting media segments 3230 extend through the blade interior 3113 defined between the base 3110 and the cover arrangement 3103. The cover arrangement 3103 inhibits access to and/or provides protection for the connecting media segments 3230. The cover arrangement 3103 also may inhibit access to and/or provides protection for the rear ports of the first set of couplers 3151 and/or the front ports of the second set of couplers 3155.

In the example shown, the connecting media segment 3230 includes a hydra cable that includes a multi-fiber cable 3233 terminated at a multi-fiber connector (e.g., an MPO connector) 3231 (FIGS. 69-71). Certain types of hydra cable 3230 also includes one or more fanouts 3235 at which the fibers of the multi-fiber cable 3233 are separated into individual optical fibers 3237. Each of the individual fibers 3237 is terminated at a fiber optic connector (e.g., an LC connector, an SC connector, an FC connector, an ST connector, an LX.5 connector, etc.) 3239. Other types of hydra cables 3230 may include a cable breakout as part of an MPO boot instead of a separate fanout.

In some implementations, the hydra cable 3230 can be secured to the base 3110 of the blade 3100C. For example, the fanout arrangement 3235 of the hydra cable 3230 can be secured to a raised tab 3104 (FIG. 91) positioned on the base 3110. In the example shown, a tie (e.g., a cable tie, a zip tie, etc.) 3232 is looped through the raised tab 3104 and wrapped around the fanout arrangement 3235 (see FIGS. 69-71). In other implementations, the tie 3232 may wrap around any portion of the hydra cable 3230. In still other implementations, the fanout arrangement 3235 may include a clip that allows the fanout arrangement 3235 to be directly attached to the raised tab 3104. In still other implementations, other types of connecting media segments 3230 may optically couple the front ports of the blade 3100C to the rear ports of the blade 3100C.

Figure 72:
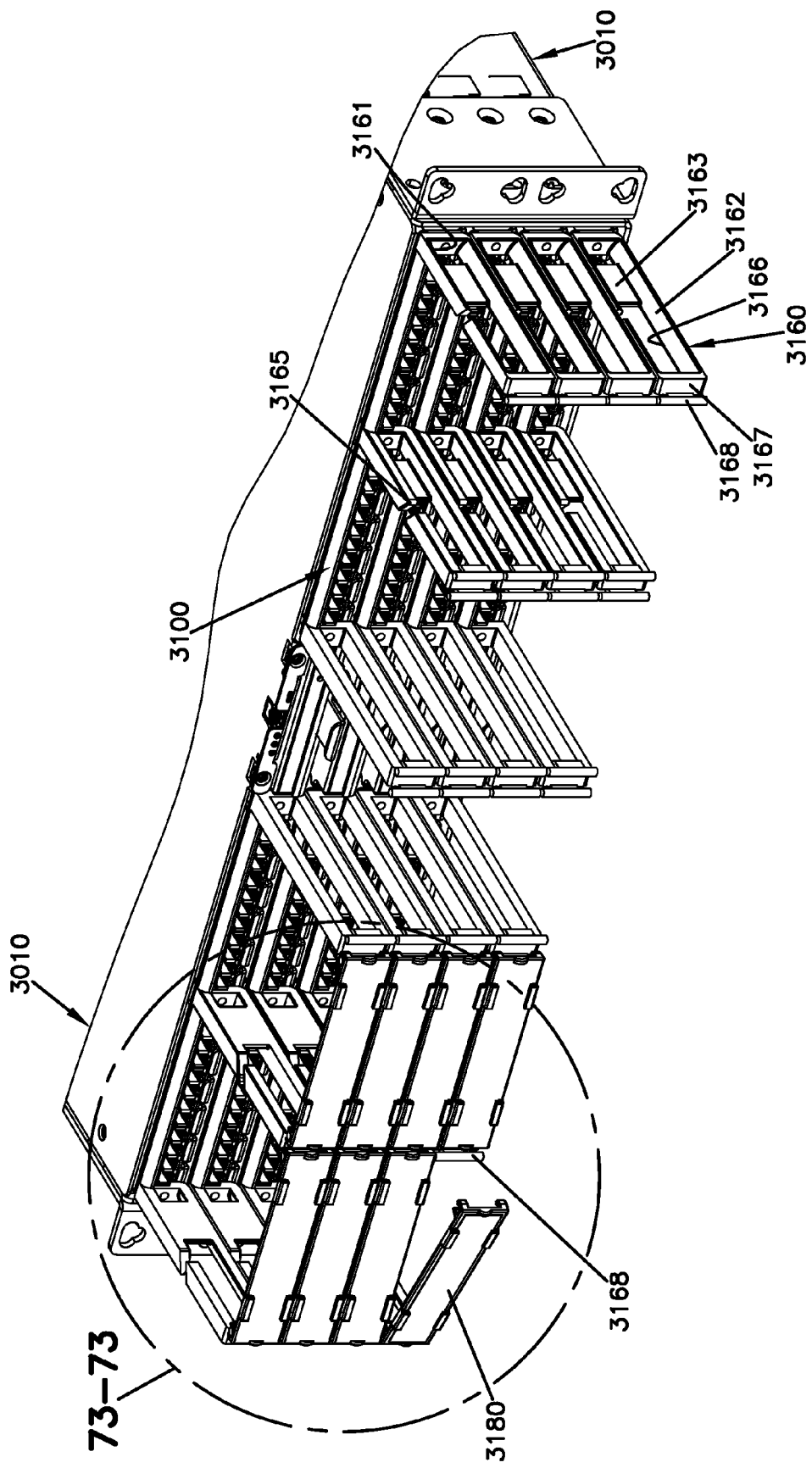
FIGS. 72-74 illustrate one example labeling assembly suitable for use with any of the blades disclosed herein.
Figure 73:
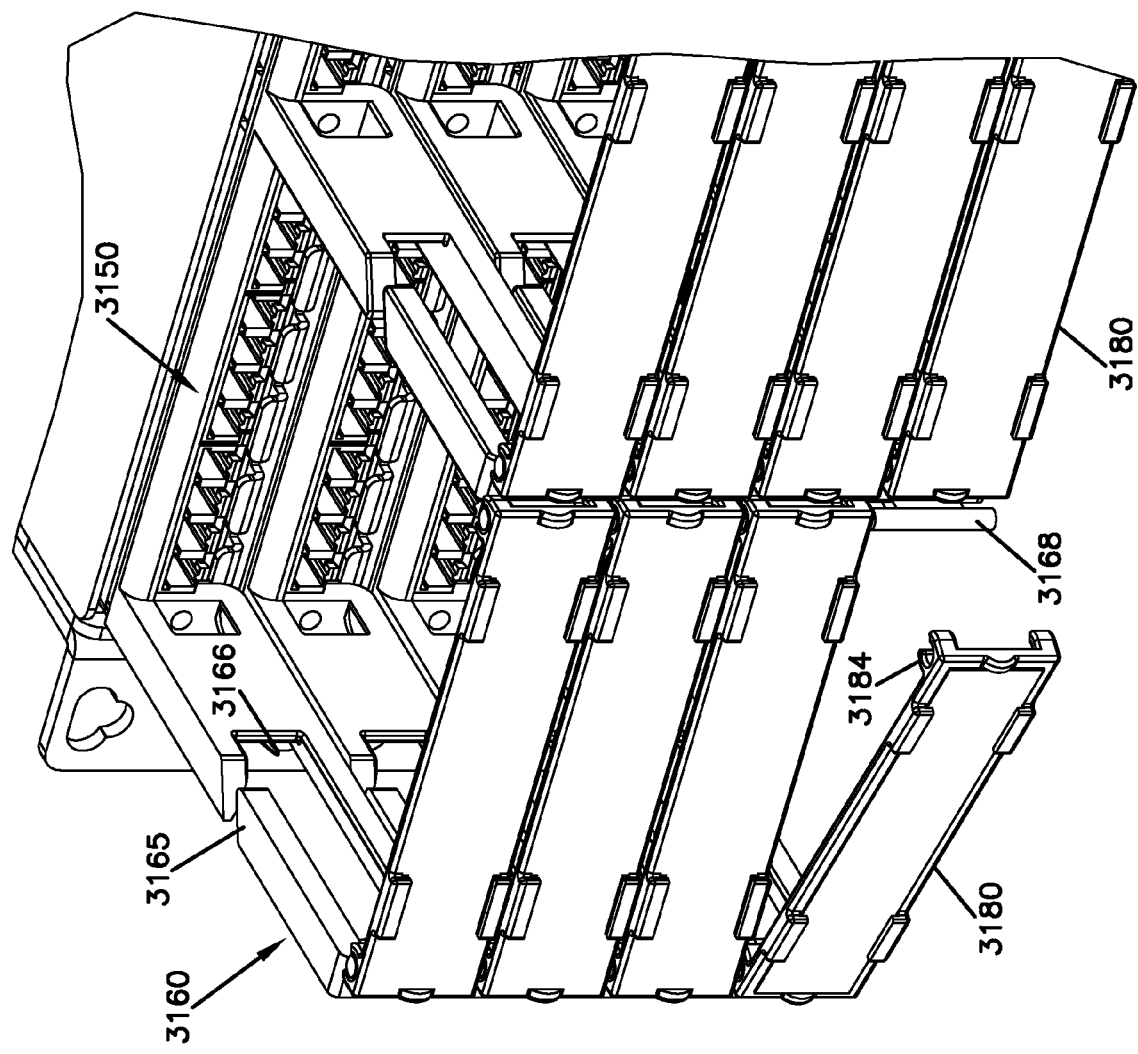
Figure 74:
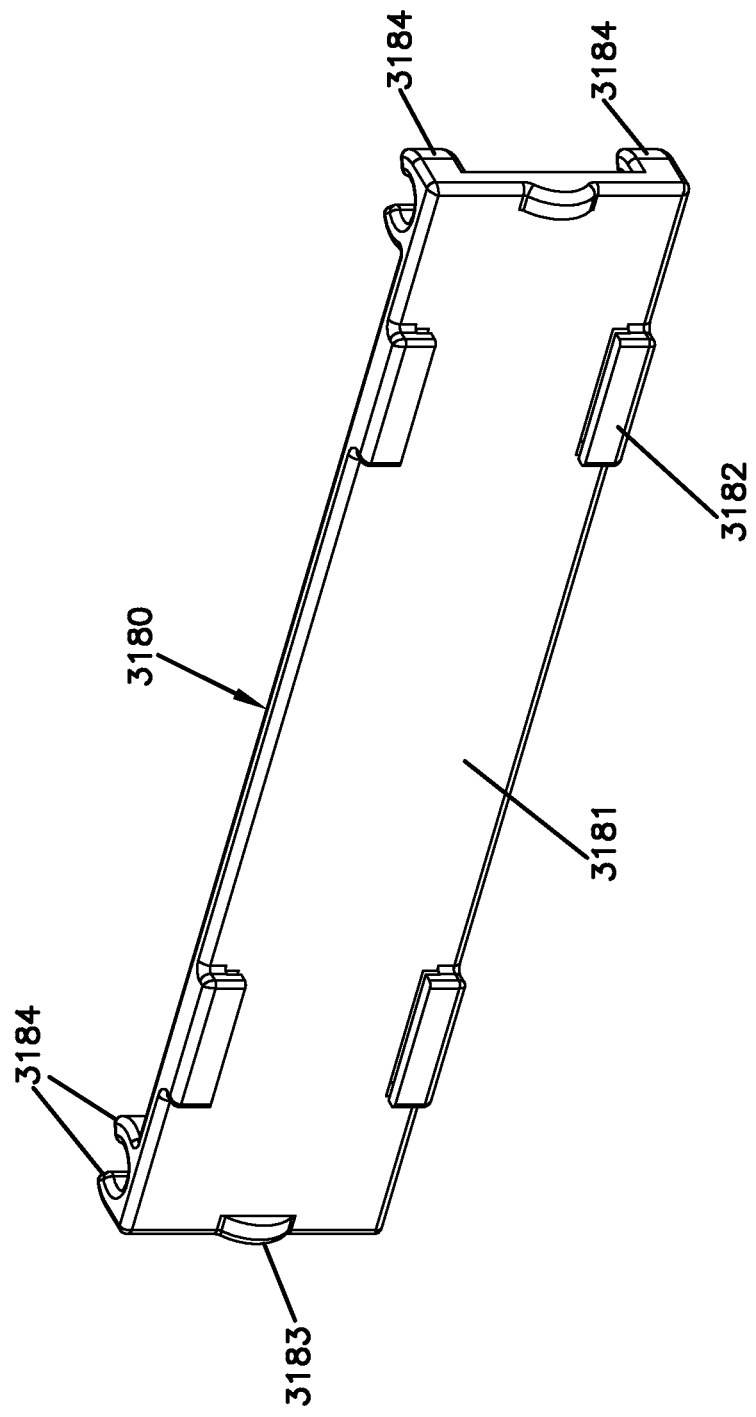

As shown in FIGS. 72-74, one or more labeling panels 3180 may be installed on the blades 3100 (e.g., blade 3100A, blade 3100B, and blade 3100C) to provide labeling of the front coupler ports. Each labeling panel 3180 extends across one or more front ports of the blade 3100. Labels (e.g., displaying numbers, letters, graphics, names, etc.) for the front ports may be provided on the labeling panel 3180. For example, a printed label may be removably mounted to the labeling panel 3180.

Each of the labeling panels 3180 may be configured to connect to one or more of the retention fingers 3160 extending forwardly of the blade 3100. In the example shown, each labeling panel 3180 extends between distal ends 3167 of two adjacent retention fingers 3160. In certain implementations, the retention fingers 3160 are sufficiently long that a gap defined between the front ports and each labeling panel 3180 allows each optical fiber plugged into one of the front ports a sufficient bend radius between the front port and the through-opening 3166 of the retention finger 3160 (e.g., see FIGS. 70 and 71).

One example labeling panel 3180 may be found in FIG. 74. The labeling panel 3180 includes a generally planar labeling surface 3181 on which a label may be provided. For example, in one implementation, a label may be affixed to the labeling surface 3181. In other implementations, the labeling panel 3180 also includes tabs 3182 at the top and/or bottom of the panel 3180 and nubs 3183 at opposing sides of the panel 3180 to aid in retaining one or more labels. In the example shown, the labeling panel 3180 includes one nub 3183 at each side of the labeling surface 3183, two tabs 3182 at the top of the labeling surface 3181 intermediate the two nubs 3183, and two tabs 3182 at the bottom of the labeling surface 3181 intermediate the two nubs 3183.

The labeling panel 3180 includes one or more attachment members 3184 configured to secure the labeling panel 3180 to the ends 3167 of the retention fingers 3160. In some implementations, the attachment members 3184 include grip fingers configured to snap to the distal ends 3167 of the retention fingers 3160. In the example shown, each labeling panel 3180 includes top and bottom grip fingers 3184 at each side of the panel 3180. In some implementations, the end 3167 of each retention finger 3160 includes at least one vertically extending mounting pin 3168. In some such implementations, the grip fingers 3184 of the labeling panel 3180 snap-fits or otherwise attaches to the mounting pins 3168.

In certain implementations, the end 3167 of each finger 3160 includes two spaced mounting pins 3168 (e.g., see FIG. 56). Accordingly, each retention fingers 3160 is configured to receive and support two adjacent labeling panels 3180 (e.g., see FIG. 72). In some implementations, each mounting pin 3168 defines one or more reduced diameter sections 3169. For example, in the implementation shown in FIG. 56, the ends of each pin 3168 define reduced diameter sections 3169. In some implementations, the grip fingers 3184 are sized to snap-fit to the reduced diameter sections 3169 of the mounting pins 3168. In other implementations, the grip fingers 3184 are configured to snap-fit to mounting pins 3168 at any point along the length.

In one implementation, the labeling panel 3180 has a height that allows both the top and bottom grip fingers 3184 at each side of the panel 3180 to attach to the same retention finger 3160. In other implementations, the labeling panel 3180 is sufficiently tall to provide labeling for the front ports on two or more blades 3100. For example, the labeling panel 3180 may be sufficiently tall to extend across the front ports of multiple (e.g., two, three, four, eight, etc.) blades 3100. In such implementations, the top grip fingers 3184 may attach to the retention fingers 3160 extending from a first blade 3100 and the bottom grip fingers 3184 may attach to the retention fingers 3160 extending from a second blade 3100.

In certain implementations, the grip fingers 3184 are configured to rotate about the mounting pins 3168. Rotating the labeling panels 3180 about one of the mounting pins 3168 may facilitate accessing the front ports of the blade 3100 that are located behind the labeling panel 3180. In some implementations, the labeling panels 3180 can be rotated by detaching one side of the labeling panel 3180 from one of the mounting pins 3168. For example, in FIG. 73, the attachment members 3184 on one side of the bottom, left labeling panel 3180 have been disengaged from an example mounting pin 3168 to allow the labeling panel 3180 to rotate outwardly about another mounting pin 3168 at the opposite side of the labeling panel 3180. In certain implementations, the labeling panels 3180 also may be fully detached from the retention fingers 3160.

Figure 75:
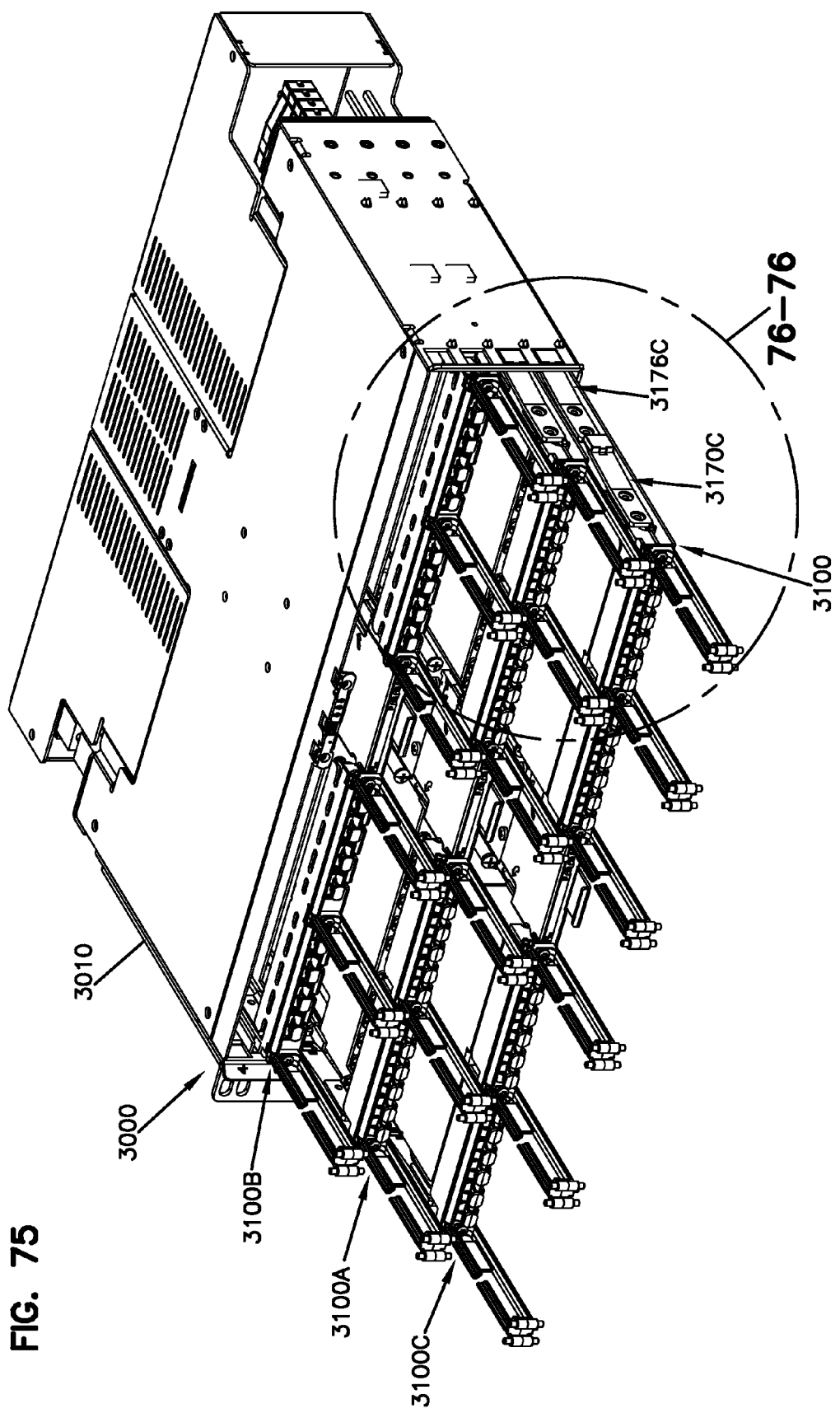
FIGS. 75 and 76 illustrate one example bladed panel system in which a plurality of blades is mounted within an example chassis with a top blade shown in a closed position relative to the chassis, a middle blade shown in a first extended position relative to the chassis, and a bottom blade shown in a second extended position relative to the chassis.
Figure 76:
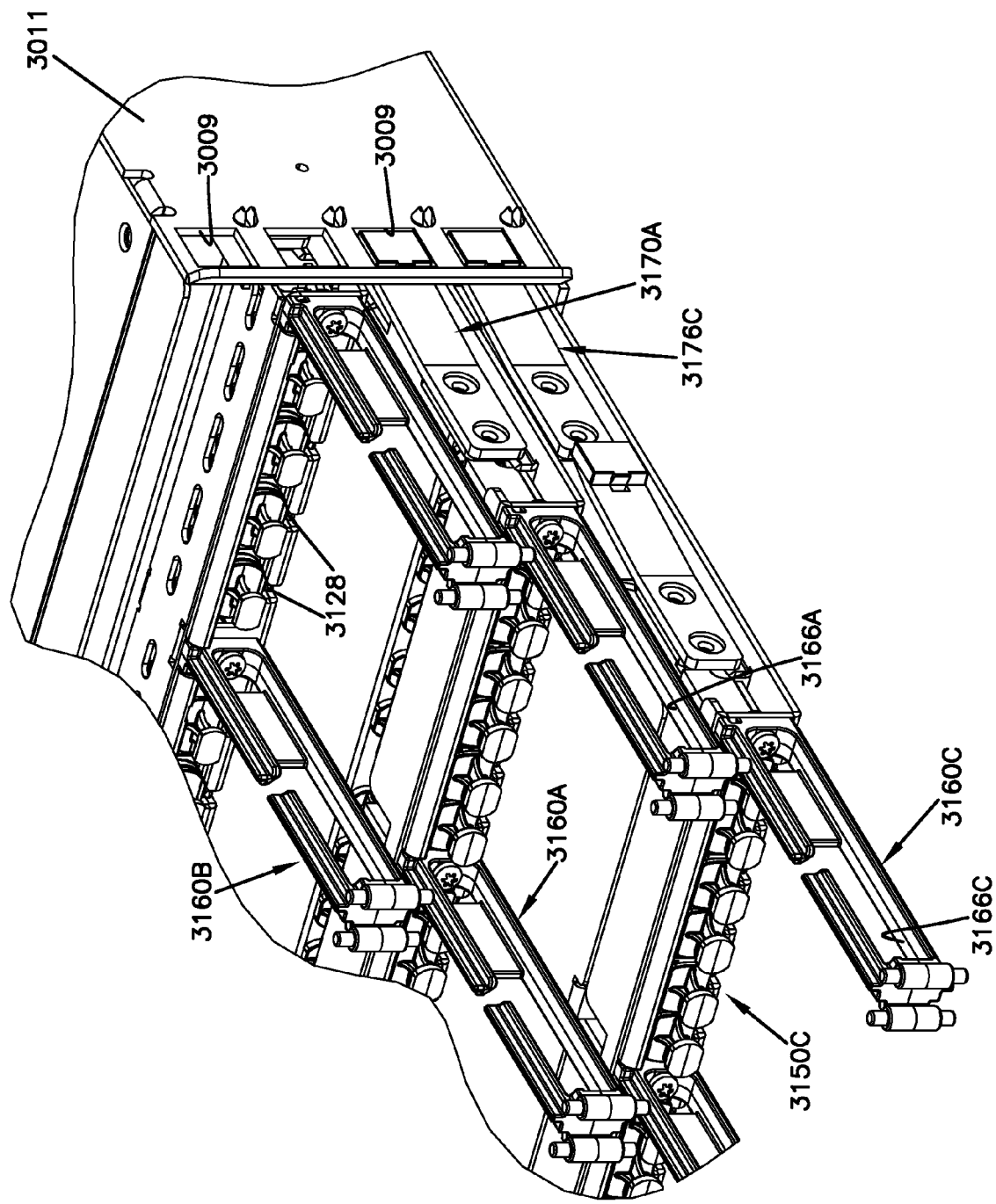

FIGS. 75 and 76 illustrate one example bladed panel system 3000 in which a plurality of blades 3100 is mounted within an example chassis 3010. In the example shown, the plurality of blades 3100 includes each type of blade 3100A, 3100B, 3100C disclosed above. In particular, the upper blade is configured the same as the second example blade 3100B disclosed above with reference to FIGS. 63-66; the middle blade is configured the same as the first example blade 3100A disclosed above with reference to FIGS. 57-62; and the lower blade is configured the same as the third example blade 3100C disclosed above with reference to FIGS. 67-71. Accordingly, the upper blade is configured to receive incoming and outgoing media segments 3210, 3220 terminated with MPO connectors. The middle blade 3100A is configured to receive incoming and outgoing media segments 3210, 3220 terminated with LC connectors. The lower blade 3100C is configured to receive incoming media segments 3210 terminated with MPO connectors and outgoing media segments 3220 terminated with LC connectors.

In accordance with some aspects, the bladed panel system 3000 is configured to enable the blades 3100 to move relative to the chassis 3010 into one or more positions. Moving one of the blades 3100 to a different position relative to the other blades 3100 in the chassis 3010 may aid a user in accessing the coupler ports of the blade 3100 and/or any media segments inserted therein. For example, moving one of the blades 3100 forward of the other blades 3100 may provide space for a user to grasp a connector inserted into one of the coupler ports of the blade 3100. In accordance with certain aspects, moving one of the blades 3100 to a different position also may provide access to the blade processor 3140.

In some implementations, each blade 3100 may move between a closed position and a first extended position. In the closed position, the blade 3100 is positioned within the chassis so that the front ports of the blade 3100 are located at the open front of the chassis 3010 and the retention fingers extend forwardly of the chassis 3010. In the first extended position, at least the front ports of the blade 3100 are located forwardly of the open front of the chassis 3010. In certain implementations, the rear ports of the front couplers 3151 also are located forwardly of the open front of the chassis 3010 when the blade 3100 is in the first extended position.

In some implementations, the blades 3100 also may move to a second extended position. In the second extended position, the front ports of the blade 3100 are located farther forward of the front chassis opening compared to their location in the first extended position. In some implementations, the blade processor 3140 is accessible when the blade 3100 is in the second extended position. In certain implementations, the blade processor 3140 is accessible when the blade 3100 is in the first extended position. In certain implementations, each of the blades 3100 may be latched or otherwise releasably secured into at least one of the positions as will be discussed in more detail with respect to FIGS. 91-127.

By way of example, in FIGS. 75 and 76, the upper blade 3100B is in a closed position; the middle blade 3100A is in a first extended position, and the lower blade 3100C is in a second extended position. The front ports of the upper blade 3100B generally align with the open front of the chassis housing 3010. The rear ports of the front couplers 3153 and the processor 3140 of the upper blade 3100B are not accessible. The front ports of the middle blade 3100A are spaced forward of the open front of the chassis 3010. The rear ports of the front couplers 3151 and/or the processor 3140 may be accessible from the front of the chassis 3010. The front ports of the lower blade 3100C are spaced farther forward of the open front of the chassis 3010 than the front ports of the middle blade 3100A. A cover arrangement 3103 blocks access from the front of the chassis 3010 to the rear ports of the front couplers 3151 of the lower blade 3100C.

The bladed panel system 3000 is configured to enable the blades 3100 to move (e.g., slide) relative to the chassis 3010 (e.g., see FIGS. 47 and 48). In certain implementations, the blades 3100 are configured to travel along the direction of the connector insertion axis $A_I$ (FIG. 91). For example, the blades 3100 may travel forwardly and rearwardly relative to the chassis 3010. In some implementations, each blade 3100 is configured to travel over a distance ranging from about one inch to about five inches between the closed position and the first extended position. Indeed, in some implementations, each blade 3100 travels over a distance ranging from about two inches to about four inches between the closed position and the first extended position. In one example implementation, each blade 3100 travels about three inches between the closed position and the first extended position.

In some implementations, each blade 3100 travels over a distance ranging from about four inches to about eight inches between the closed position and the second extended position. Indeed, in some implementations, each blade 3100 travels over a distance ranging from about five inches to about seven inches between the closed position and the second extended position. In one example implementation, each blade 3100 travels about six inches between the closed position and the second extended position. In some implementations, each blade 3100 travels about three inches between the first and second extended positions. In other implementations, however, each blade 3100 may travel a greater or lesser amount between the first and second extended positions (e.g., one inch, two inches, three inches, four inches, etc.).

Referring to FIGS. 77-90, management structures at the front and rear of the chassis 3010, blades 3100, and frames (e.g., racks, cabinets, etc.) secure the incoming media segments 3210 and outgoing media segments 3220 to the chassis 3010 while accommodating movement of the blades 3100 relative to the chassis 3010. For example, the incoming cables 3210 may be routed to the rear of the chassis 3010 so as to provide a slack length 3215 of the incoming media segments 3210 (see FIG. 78). In some implementations, the incoming media segments 3210 may include a curved slack length segment 3215 between the management structures (e.g., clamps 3030, fanouts 3035, etc.) at the rear of the chassis 3010 and the management structures (e.g., cable ties 3039) at the rear of the blade 3100.

The slack length 3215 enables the connectorized ends 3212 of the media segments 3210 to remain plugged into the blade couplers (e.g., rear couplers 3155) when the blade 3100 is moved to an extended position. For example, in some implementations, the curved slack length may straighten as the blades 3100 are moved forward of the chassis 3010. In certain implementations, the management structures (e.g., cable ties 3039) on the blade 3100 secure the media segments 3210 to the blade 3100 while allowing for movement of the media segments 3210 relative to the blade 3100 to accommodate movement of the blades 3100 relative to the chassis 3010. For example, the slack length 3215 can slide through the cable ties 3039 as the blades 3100 are moved forward and rearward of the chassis 3010.

In some implementations, the cable tie region is positioned so that the incoming media segments 3210 extend rearwardly from the chassis management structures to the cable ties 3039 when the blade 3100 is in the closed position. In certain implementations, the cable tie region on each inner extension 3113 is aligned with the chassis management structures when the blade 3100 is in the closed position. In some implementations, the cable tie region is positioned so that the incoming media segments 3210 extend generally sideways or forwardly from the chassis management structures to the cable tie region 3039 when the blade 3100 is in the first extended position. In certain implementations, the cable tie region on each inner extension 3113 is aligned with the backplane 2030 when the blade 3100 is in the first extended position (FIG. 79).

The outgoing media segments 3220 plugged into the front ports of the blades 3100 may be secured to an equipment rack or other structure to which the chassis 3010 mounted. Accordingly, movement of the blades 3100 relative to the chassis 3010 moves the media segments 3220 relative to the rack. The openings 3166 defined in the cable retention fingers 3160 are sufficiently long to aid in accommodate movement of the outgoing media segments 3220 within the openings 3166 when the blades 3100 are moved between closed and extended positions.

In accordance with some aspects, additional management structures also may be provided on the rack to accommodate movement of the blades. For example, FIGS. 80-90 illustrate an example bladed panel system in which at least one chassis 3010 and at least one bracket 4300 are mounted to a frame 4400. The brackets 4300 are mounted at the chassis 3010 to aid in routing the outgoing media segments 3220 from the front of the blades 3100 to elsewhere on the frame 4400.

The chassis 3010 is configured to receive one or more blades 3100 defining a plurality of front ports at which outgoing media segments 3220 may be positioned. In the example shown, each blade 3100 also includes multiple retention fingers 3160 FIG. 56) extending forwardly of the blade 3100 to manage the outgoing media segments 3220. Each of the blades 3100 is configured to move relative to the chassis 3010 between a closed position and at least one extended position. In certain implementations, each blade 3100 is configured to move between a closed position, a first extended position, and a second extended position.

In some implementations, the brackets 4300 are mounted to the frame 4400 through the mounting brackets of the chassis 3010. In other implementations, the brackets 4300 may be mounted directly to the frame 4400 adjacent the chassis 3010. In the example shown, one bracket 4300 is mounted at each side of the chassis 3010. In other implementations, however, greater or fewer brackets 4300 may be provided. For example, in some implementations, multiple brackets 4300 may be provided at each side of a chassis 3010. In other implementations, a single bracket 4300 may span multiple adjacent chasses 3010.

Figure 80:
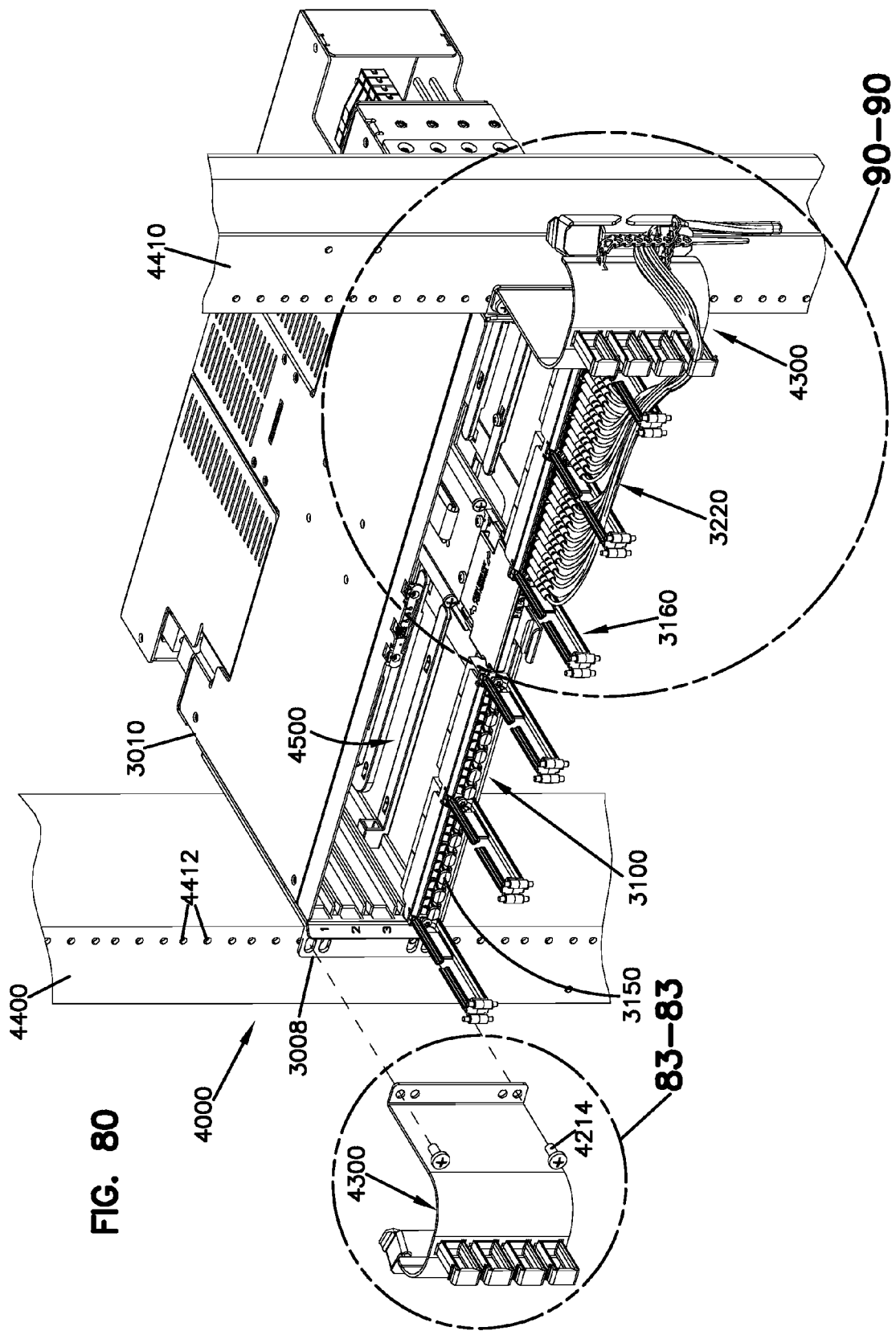
FIGS. 80-90 illustrate an example bladed panel system in which at least one chassis and at least one bracket are mounted to a frame to facilitate management of the outgoing media segments as blades are moved relative to the chassis.

Each bracket 4300 is configured to manage (e.g., secure and/or organize) slack length of outgoing media segments 3220 routed to the front ports of the blades 3100. The slack length of the outgoing media segments 3220 accommodates movement of the blades 3100 between the various positions. For example, compare the cable routing of FIGS. 80-82. In FIG. 80, one example blade 3100 is positioned within the chassis 3010 in the closed position. Outgoing media segments 3220, which are plugged into the front ports of the blade 3100, are routed to a side of the chassis 3010. Slack length of the outgoing media segments 3220 is routed around an example bracket 4300 positioned at the side of the chassis 3010. The outgoing media segments 3220 may be secured to the side of the chassis 3010 or to the frame 4400 after being routed around the bracket 4300.

Figure 81:
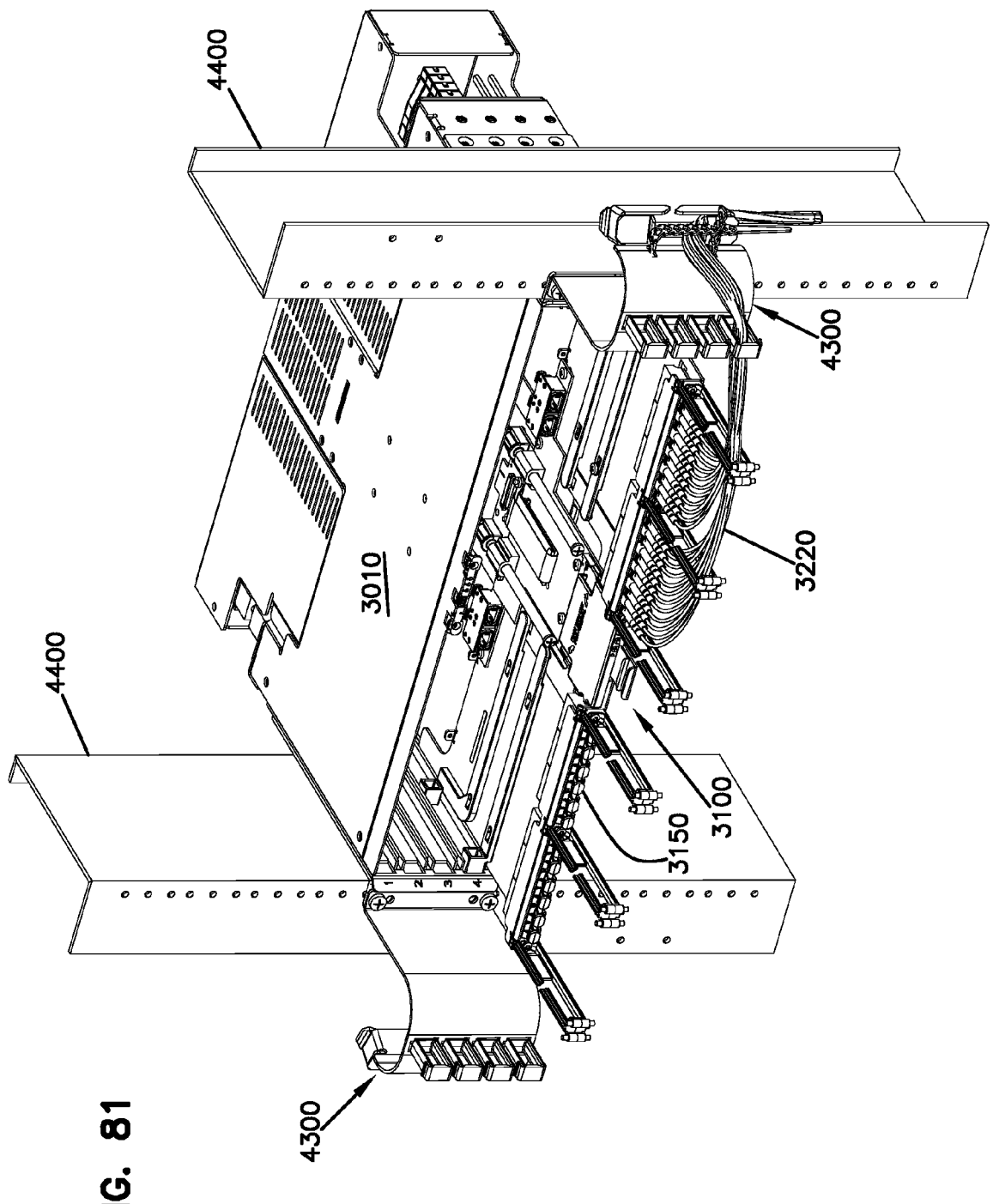

In FIG. 81, the blade 3100 has been moved to the first extended position relative to the chassis 3010. The front ports of the blade 3100 are positioned forwardly of the open front of the chassis 3010. The bracket 4300 enables movement of the outgoing media segments 3220 plugged into the blade front ports without pulling on the outgoing media segments 3220 (e.g., at the point where the outgoing media segments 3220 secure to the chassis 3010 or frame 4400). For example, the outgoing media segments 3220 may unwrap/lift away from at least a portion of the bracket 4300. In certain implementations, the bracket 4300 continues to manage (e.g., secure and/or organize) the slack length of the outgoing media segments 3220 while the blade 3100 is in the extended position.

Figure 82:
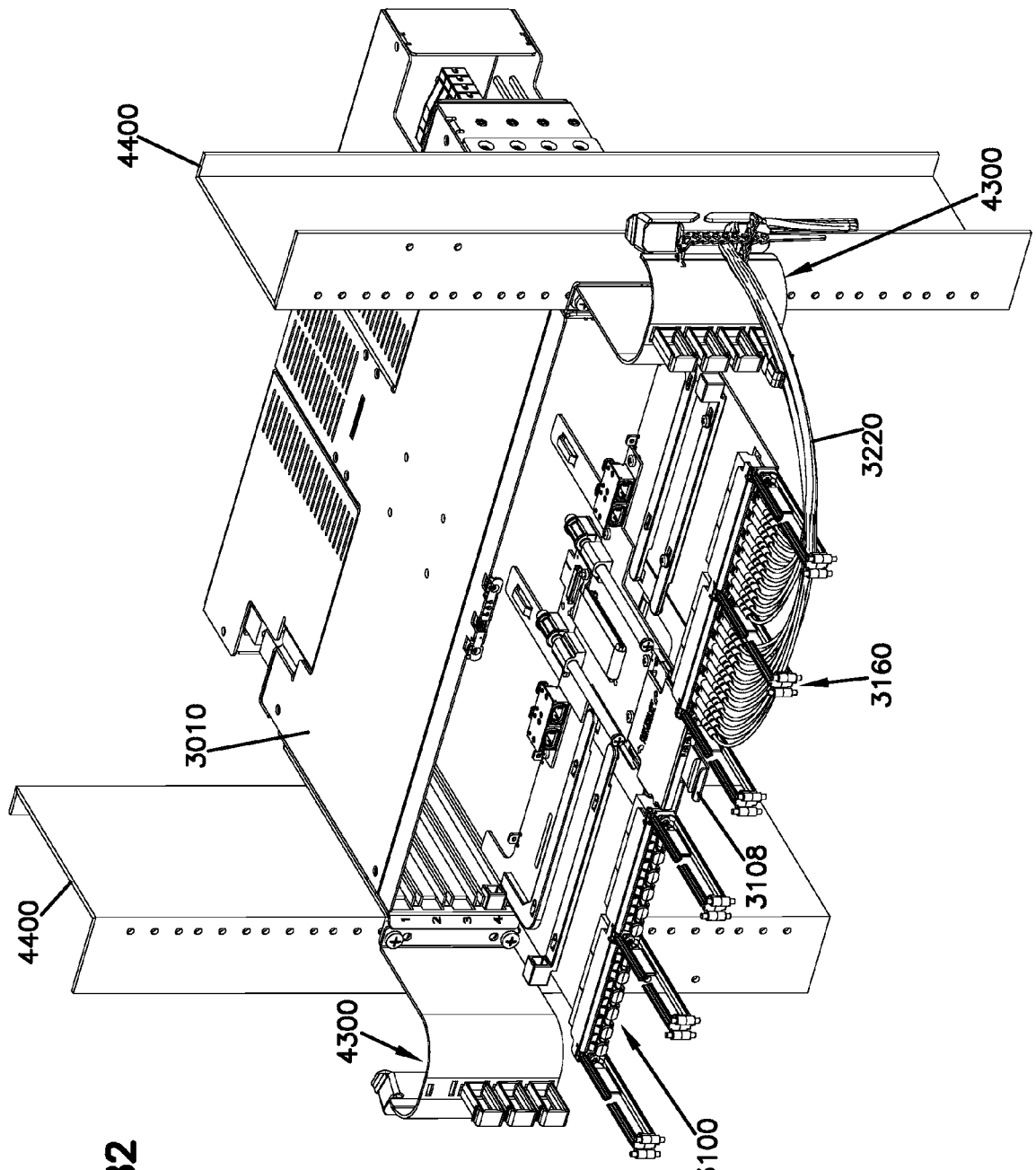

In FIG. 82, the blade 3100 has been further moved to the second extended position relative to the chassis 3010. The front ports of the blade 3100 are positioned farther forwardly of the chassis 3010 than in the first extended position. The bracket 4300 enables the further movement of the outgoing media segments 3220 plugged into the front ports without pulling on the outgoing media segments 3220 (e.g., at the point where the outgoing media segments 3220 secure to the chassis 3010 or frame 4400). For example, the outgoing media segments 3220 may continue to unwrap/lift away from at least a portion of the bracket 4300. In certain implementations, the outgoing media segments 3220 may be at least partially disconnected from the bracket 4300 when the blade 3100 is moved to the second extended position.

FIGS. 83-89 show one example bracket 4300 configured to manage the slack length of outgoing media segments 3220 plugged into the front ports of the blades 3100. The example bracket 4300 is suitable for use in managing the slack length of any media segments positioned at the front of any blade disclosed herein. The bracket 4300 includes a mounting base 4310 at which the bracket 4300 may be secured to the frame 4400 and/or to the chassis 3010. For example, the mounting base 4310 may define one or more holes 4312 through which a fastener 4314 may extend to secure the base 4310 to the frame 4400 and/or chassis 3010.

A spacer flange 4320 extends forwardly of the mounting base 4310. In some implementations, the spacer flange 4320 extends over a distance comparable to the distance between the closed blade position and the first extended position. In some implementations, the spacer flange 4320 extends forwardly less than about 4 inches. Indeed, in some implementations, the spacer flange 4320 extends forwardly less than about 3 inches. In other implementations, the spacer flange 4320 extends forwardly about 2 inches.

At least one bend radius limiter arrangement 4330 extends from the spacer flange 4320 opposite the mounting base 4310. In some implementations, the bend radius limiter arrangement 4330 defines a single arced surface. For example, the bend radius limiter arrangement 4330 may define a half-spool. In other implementations, the bend radius limiter arrangement 4330 includes two or more bend radius limiters. For example, the bend radius limiter arrangement 4330 shown in FIG. 83 includes a first bend radius limiter 4333 and a second bend radius limiter 4337 joined by a spacer 4335.

The convex surface of the bend radius limiter arrangement 4330 defines a surface over which the slack length of one or more outgoing media segments 3220 may be routed. The concave surface of the bend radius limiter arrangement 4330 defines a channel 4340 along which one or more of the outgoing media segments 3220 can be routed along the frame 4400 as will be described in more detail herein.

Figure 83:
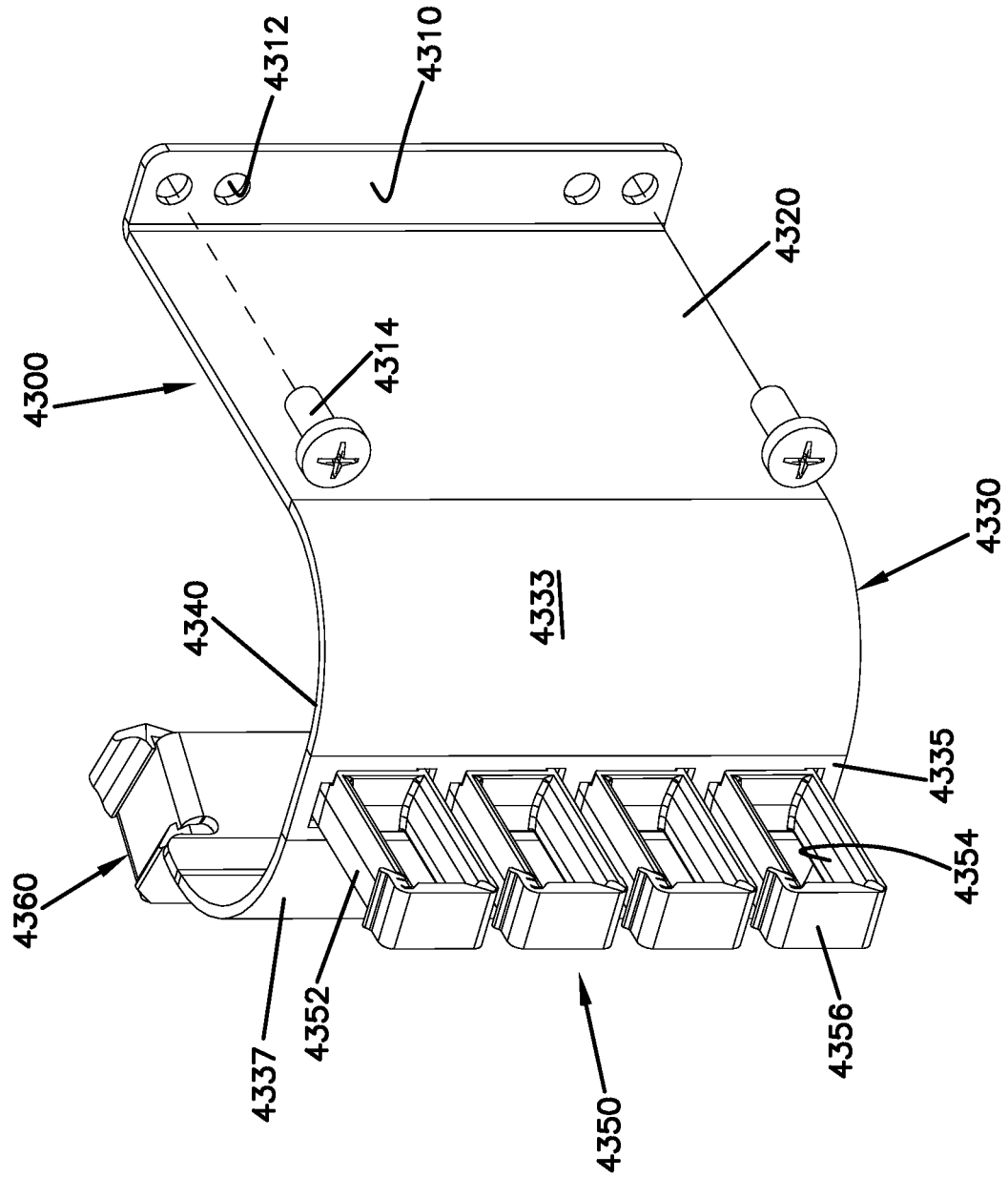
Figure 84:
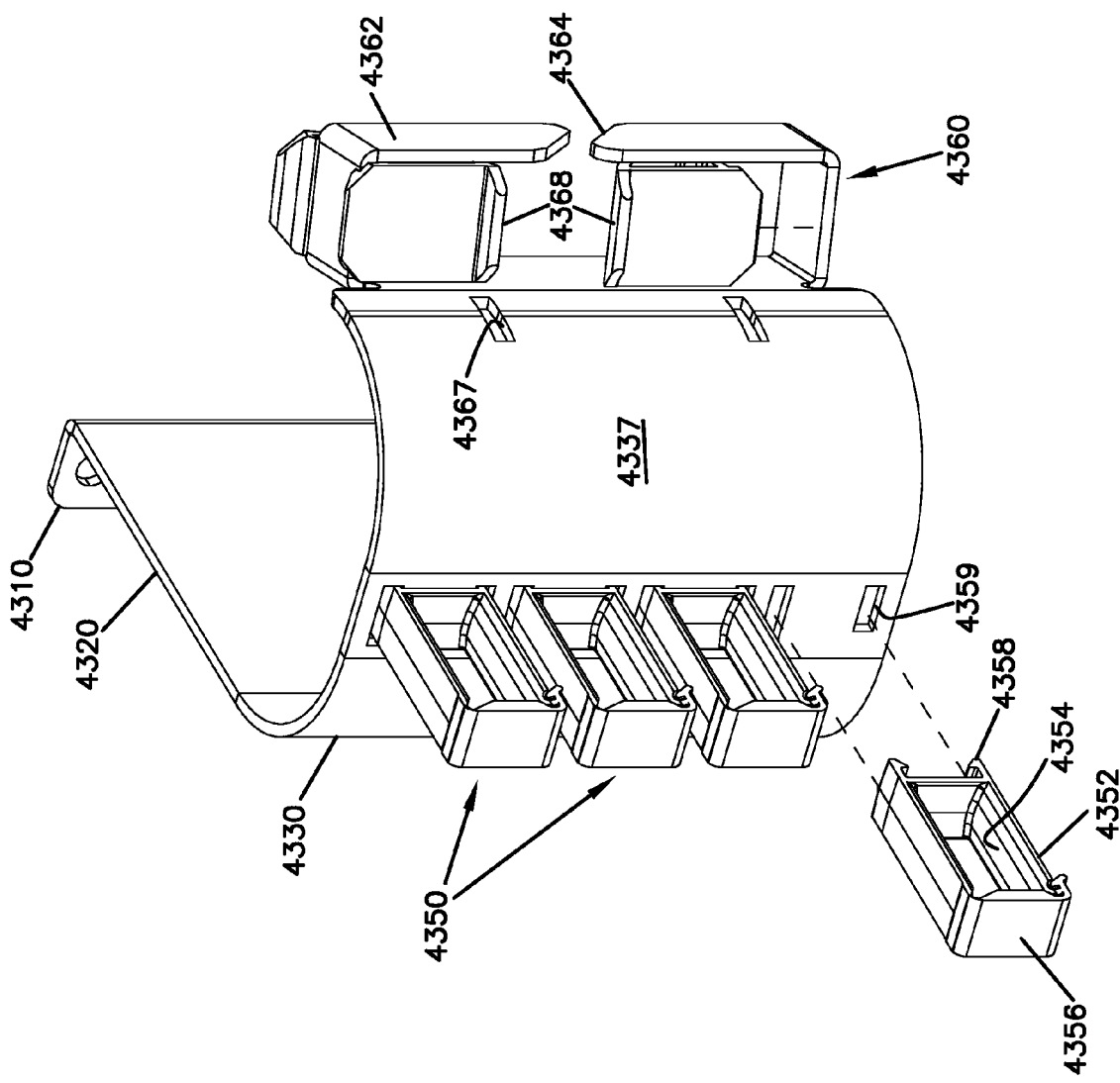
Figure 85:
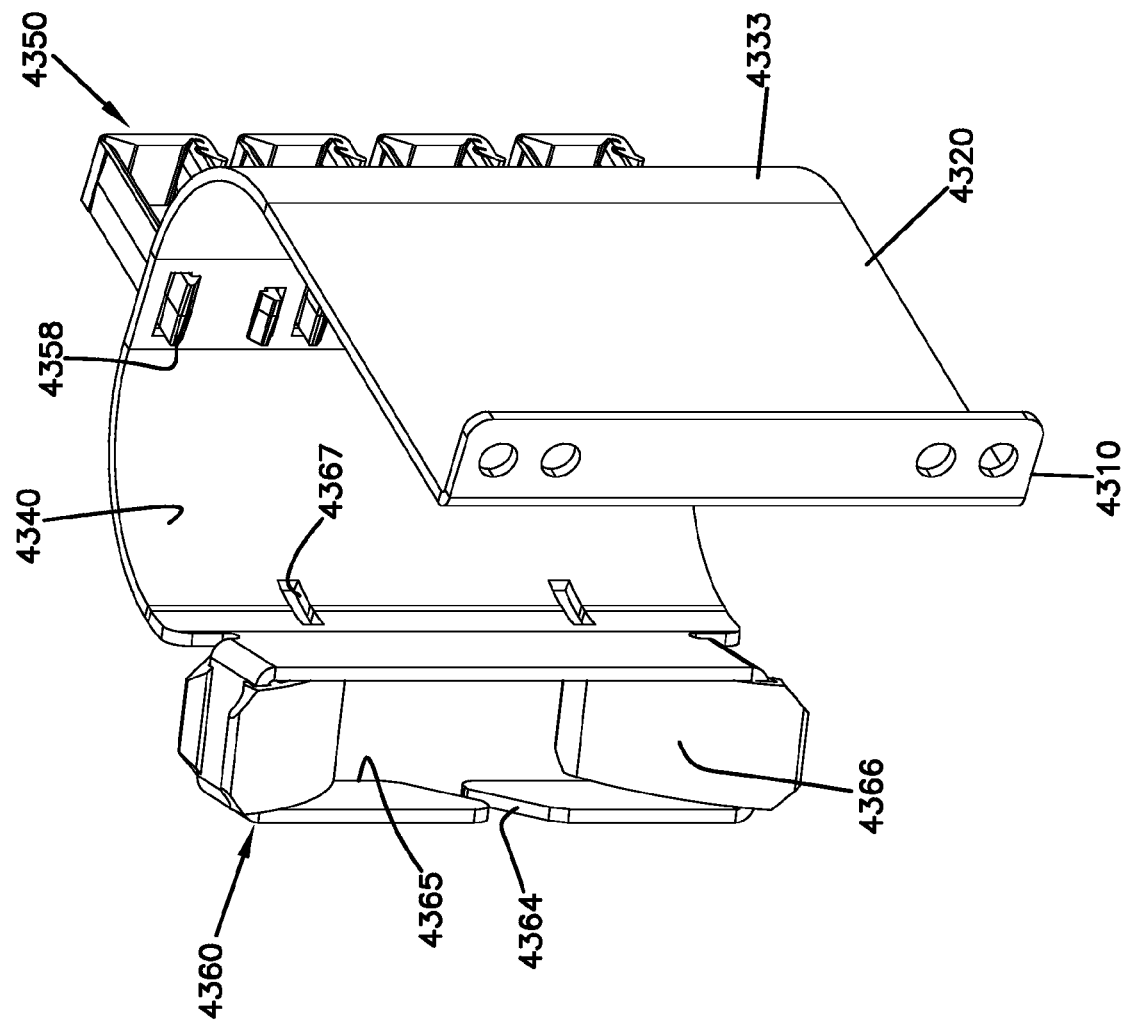
Figure 86:
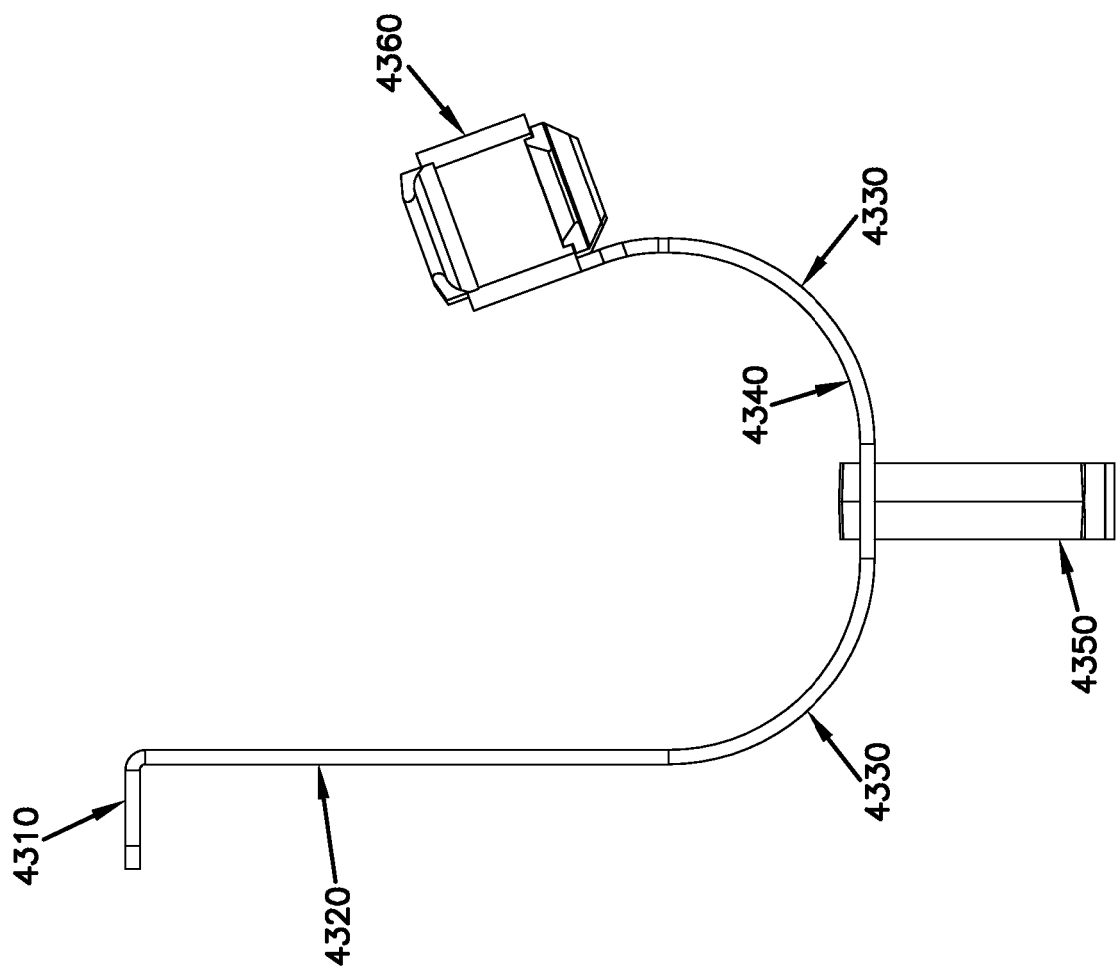
Figure 87:
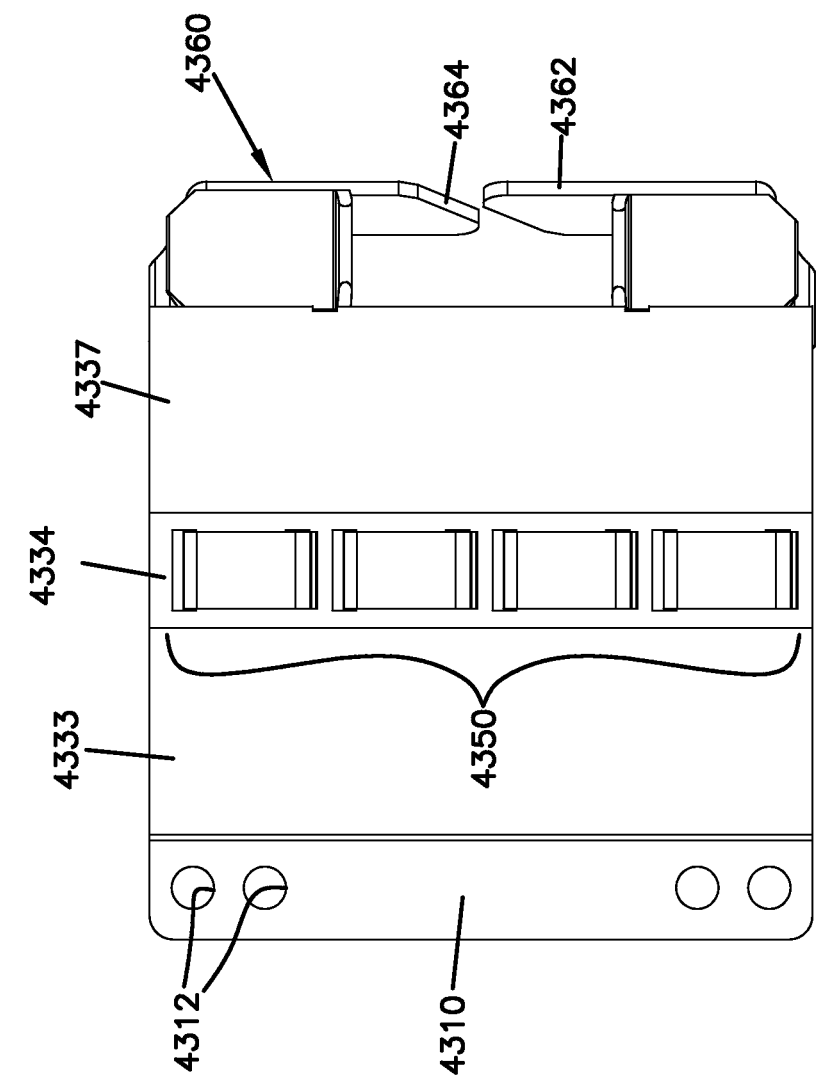
Figure 88:
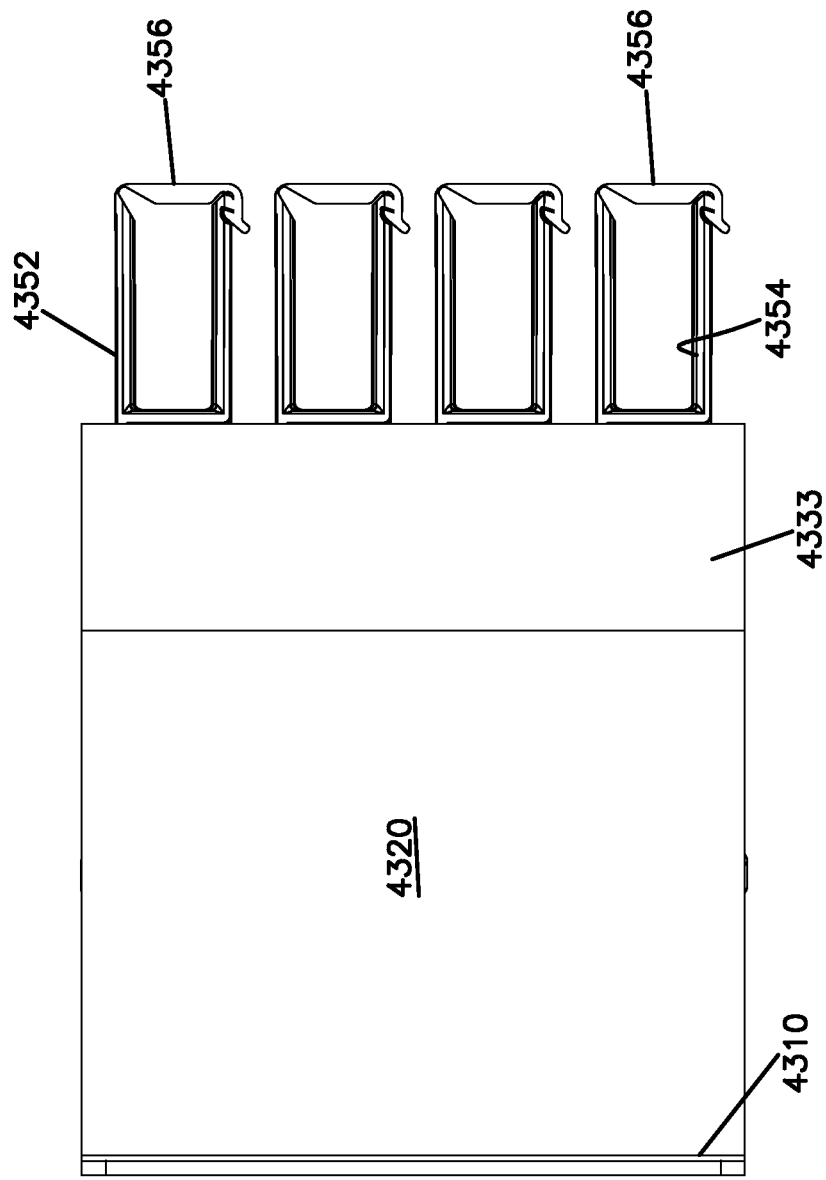
Figure 89:
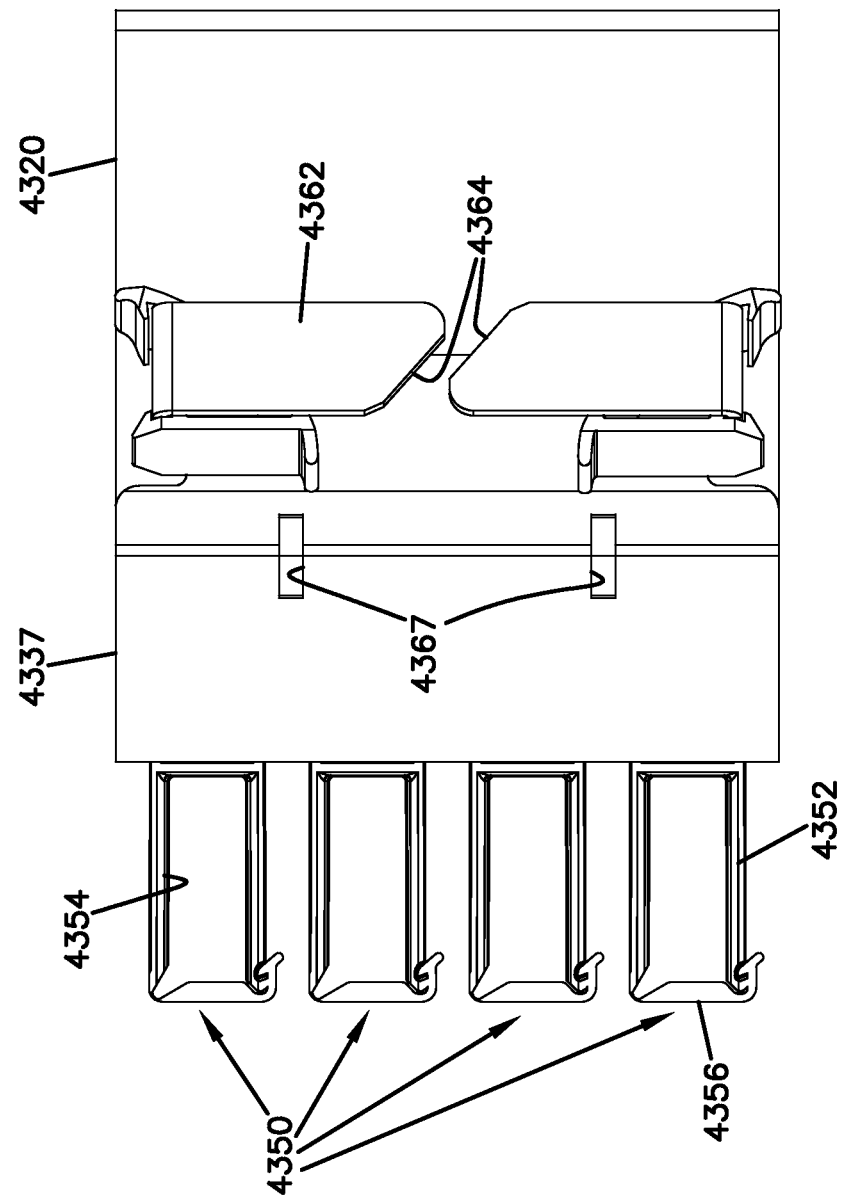

One or more cable retention fingers 4350 are mounted to the bracket 4300 to aid in managing the outgoing media segments 3220 routed around the bracket 4300. In certain implementations, the cable retention fingers 4350 are mounted to the bracket 4300 at the bend radius limiter arrangement 4330. For example, as shown in FIG. 83, the cable retention fingers 4350 may be mounted to the spacer 4335 separating two of the bend radius limiters 4333, 4337. In some implementations, multiple cable retention fingers 4350 are positioned in a column between the bend radius limiters 4333, 4337.

Each cable retention finger 4350 is includes a body 4352 defining an opening 4354 that is configured to receive one or more outgoing media segments 3220. For example, in some implementations, each retention finger 4350 includes a closing member 4356 that is configured to provide access to the opening 4354 to enable routing of the outgoing media segments 3220 through the cable retention fingers 4350 without inserting the ends of the outgoing media segments 3220 through the openings 4354. In one implementation, the closing member 4356 defines a living hinge that enables the closing member 4356 to move relative to the finger body 4352. In other implementations, each finger 4350 defines an uncovered slot through which the outgoing media segments 3220 may be inserted into and removed from the finger 4350. In certain implementations, the closing member 4356 may be opened to accommodate movement of the media segments 3220 when the blade 3100 is moved to the second extended position (see FIG. 82).

Figure 90:
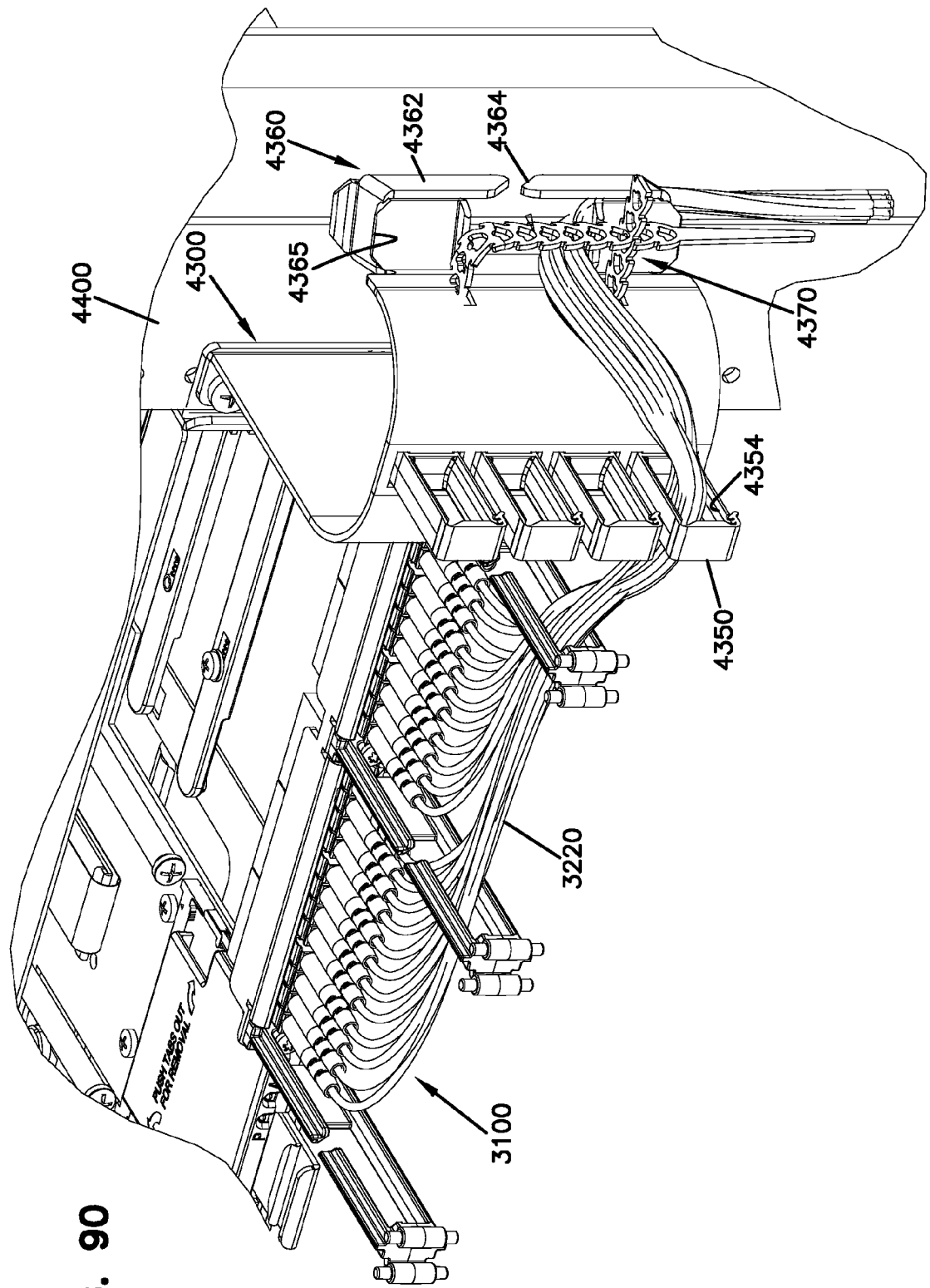

As best seen in FIG. 90, the bracket 4300 also may include a guide member 4360 at an opposite side of the bend radius limiter arrangement 4330 from the spacer flange 4320. The guide member 4360 guides the outgoing media segments 3220 routed around the bend radius limiter arrangement 4330 to the channel 4340. In some implementations, the guide 4360 includes a body 4362 that defines an opening 4365 through which one or more of the outgoing media segments 3220 may be routed. In certain implementations, the body 4362 of the guide 4360 defines a slot 4364 or other opening through which the outgoing media segments 3220 may be inserted into the opening 4365 without feeding the ends of the outgoing media segments 3220 through the guide member 4360.

One or more securement members 4370 may be provided to aid in routing the outgoing media segments 3220 to the guide member 4360 and/or in securing the outgoing media segments 3220 to the bracket 4300. In the example shown in FIG. 90, the securement members 4370 include zip ties. In other implementations, however, other types of securement members (e.g., cable ties, twist ties, straps, hooks, etc.) may be provided.

Referring to FIGS. 91-127, in accordance with some aspects, each blade (e.g., any of blades 1100, 2100, 3100) may be secured into one or more positions relative to the chassis. In accordance with some aspects, each blade 3100 may be latched or otherwise secured in the closed position. For example, as shown in FIGS. 91-94, each blade 3100 may cooperate with a detent 3017 on the chassis housing 3013 to releasably lock the blade 3100 in the closed position. Sufficient force to overcome the resistance of the detent 3017 is applied to the blade 3100 to move the blade 3100 to one of the extended positions (e.g., see FIG. 94). Sufficient force to overcome the detent 3017 also is applied to lock the blade 3100 in the closed position (e.g., see FIG. 92).

In some implementations, one or more detents 3017 may be provided at a rear of the chassis housing 3013. For example, a column of detents 3017 may be provided on (e.g., snapped into holes defined in) at least one of the chassis side walls 3011 at the rear of the chassis 3010 (see FIG. 93). The notch 3105 defined in at least one of the side flanges 3112 of each blade 3100 cooperates with one of the detents 3017 to inhibit forward movement of the blade 3100. In the example shown, only one of the side flanges 3112 defines a notch 3105 (e.g., see FIGS. 54, 63, and 67). In other implementations, however, the detents 3017 may be provided on both sides of the chassis housing 3013 and the notches 3105 may be provided on both side flanges 3112.

Figure 92:
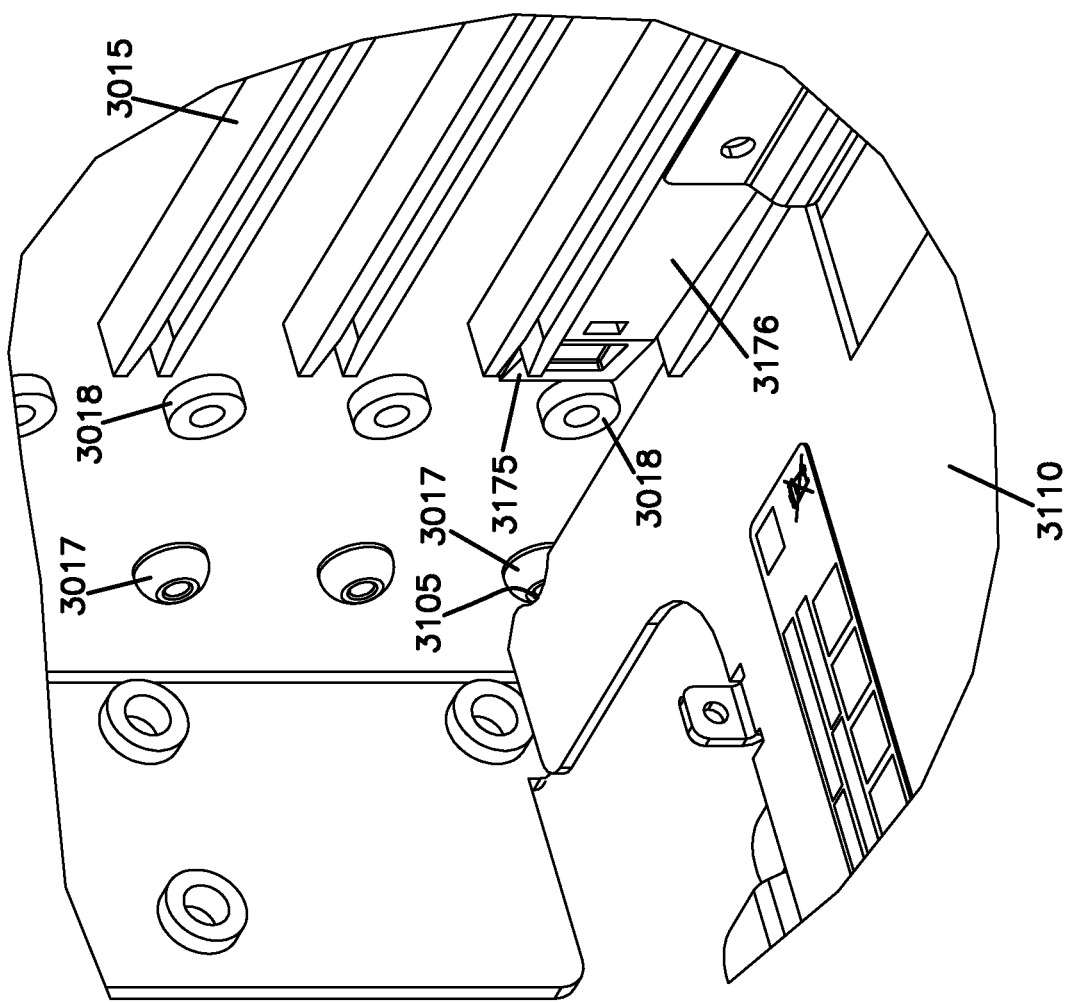
FIGS. 92-94 are enlarged views of the interior of the chassis shown in FIG. 91 to illustrate an example latching arrangement by which a blade may be latched into the closed position relative to the chassis.
Figure 93:
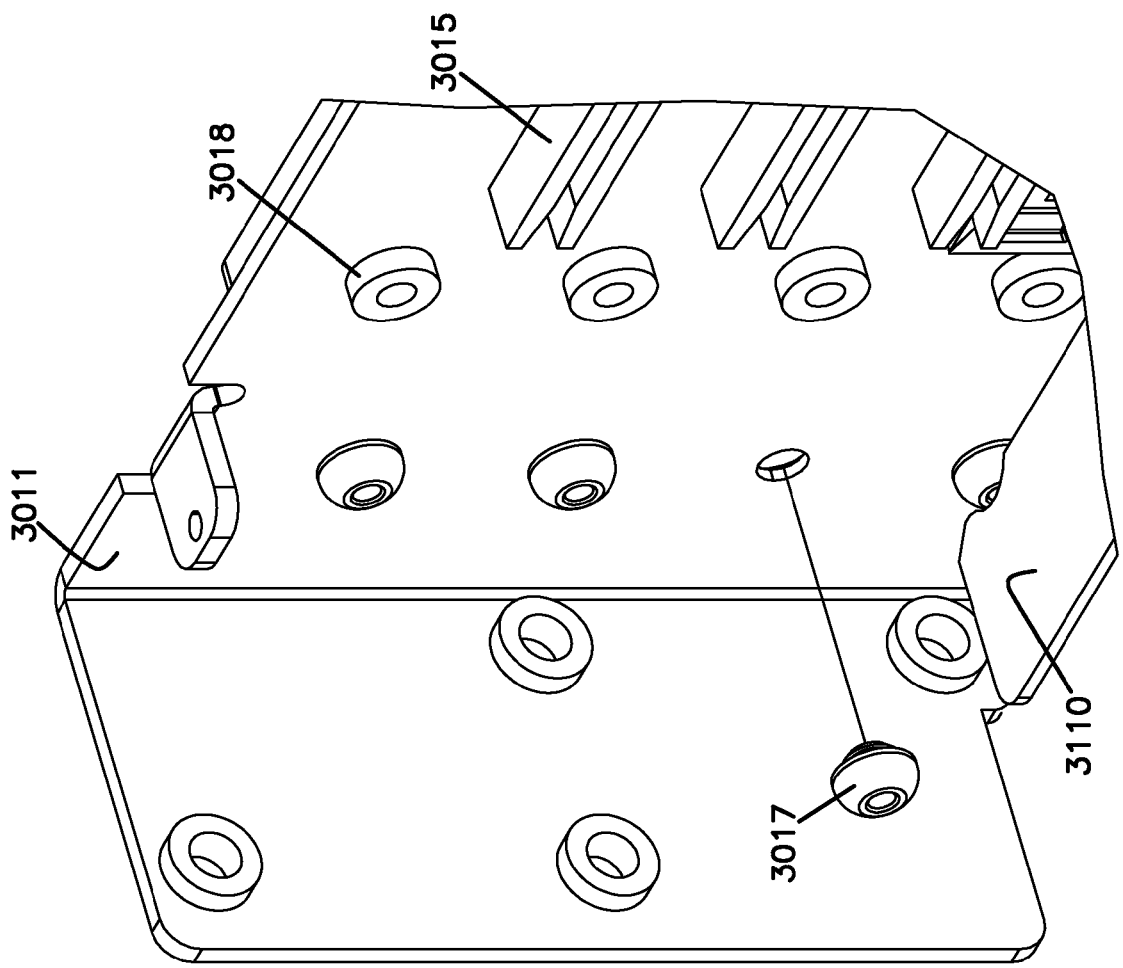
Figure 94:
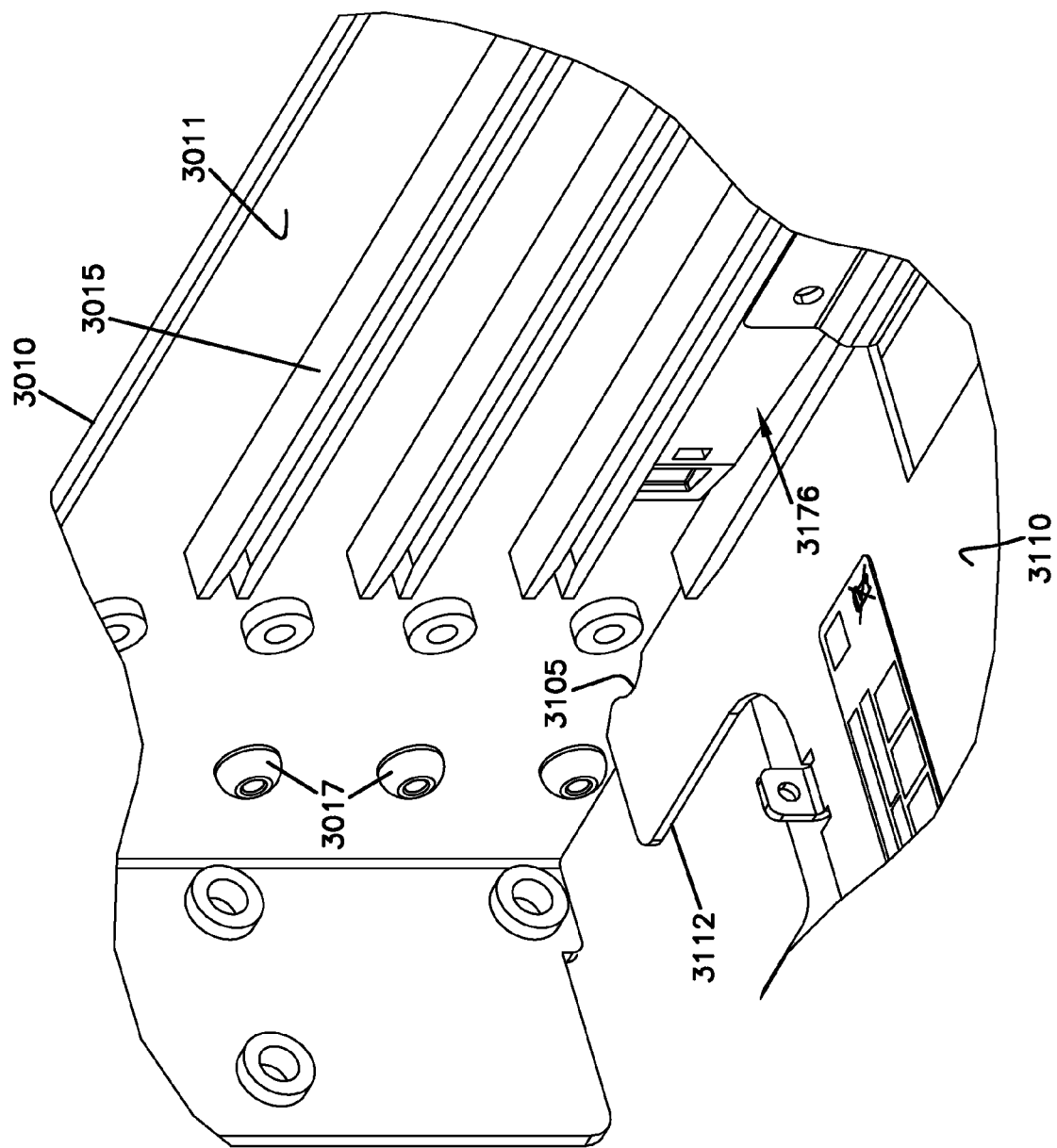

In some implementations, the chassis housing 3013 may be configured to inhibit a blade 3100 from being moved too far rearward relative to the chassis 3010. For example, one or more stops 3018 may be provided on the side walls 3011 of the chassis housing 3013 (FIG. 92). In the example shown, the stops 3018 are positioned forwardly of the detents 3017. In the example shown in FIG. 92, the rearward shoulder 3175 of the second latching tab 3176 of a blade 3100 abuts against one of the stops 3018 to inhibit further rearward motion of the blade 3100.

Figure 95:
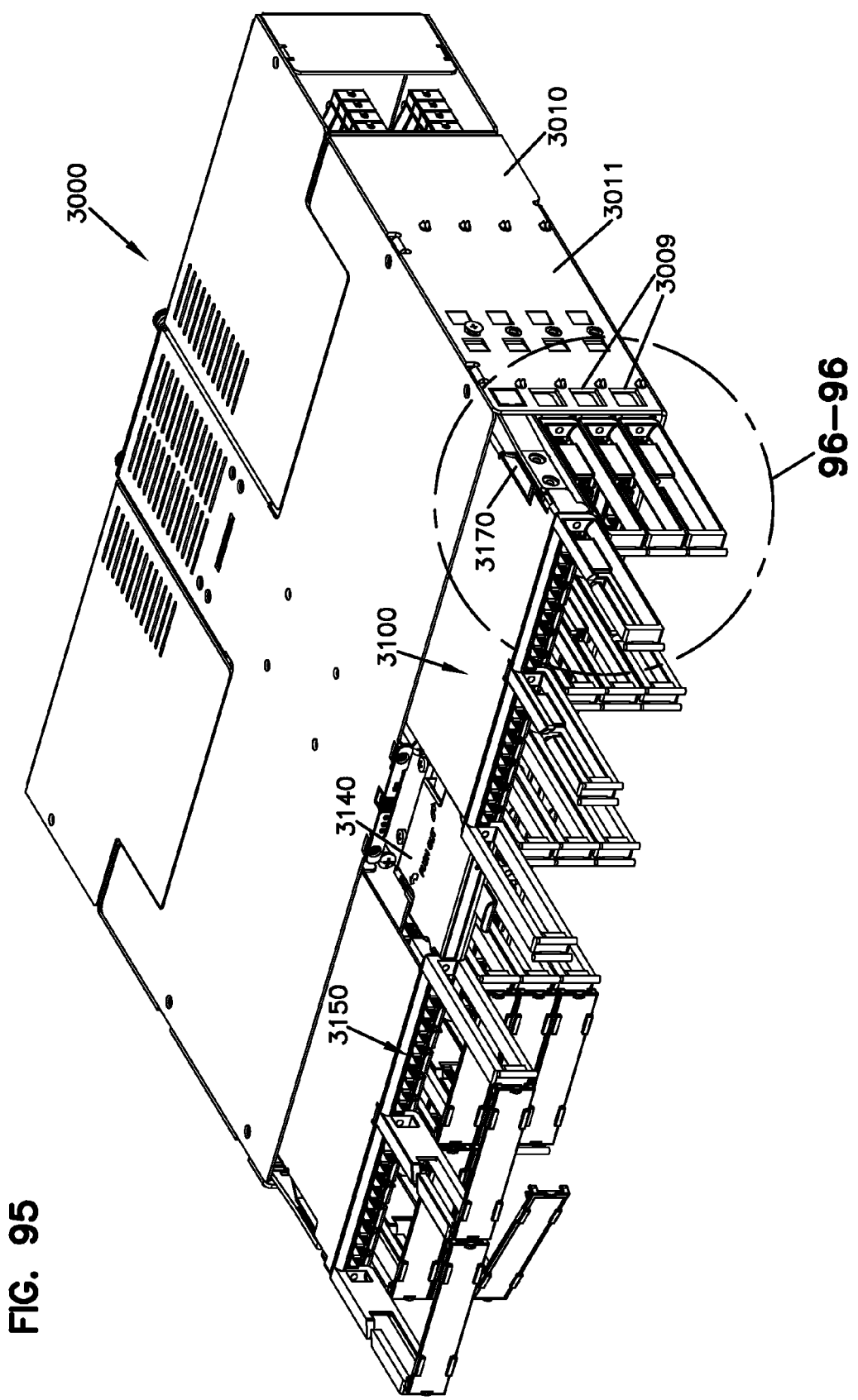
FIGS. 95-98 illustrate an example latching arrangement by which a blade may be latched in at least the first extended position relative to the chassis.
Figure 96:
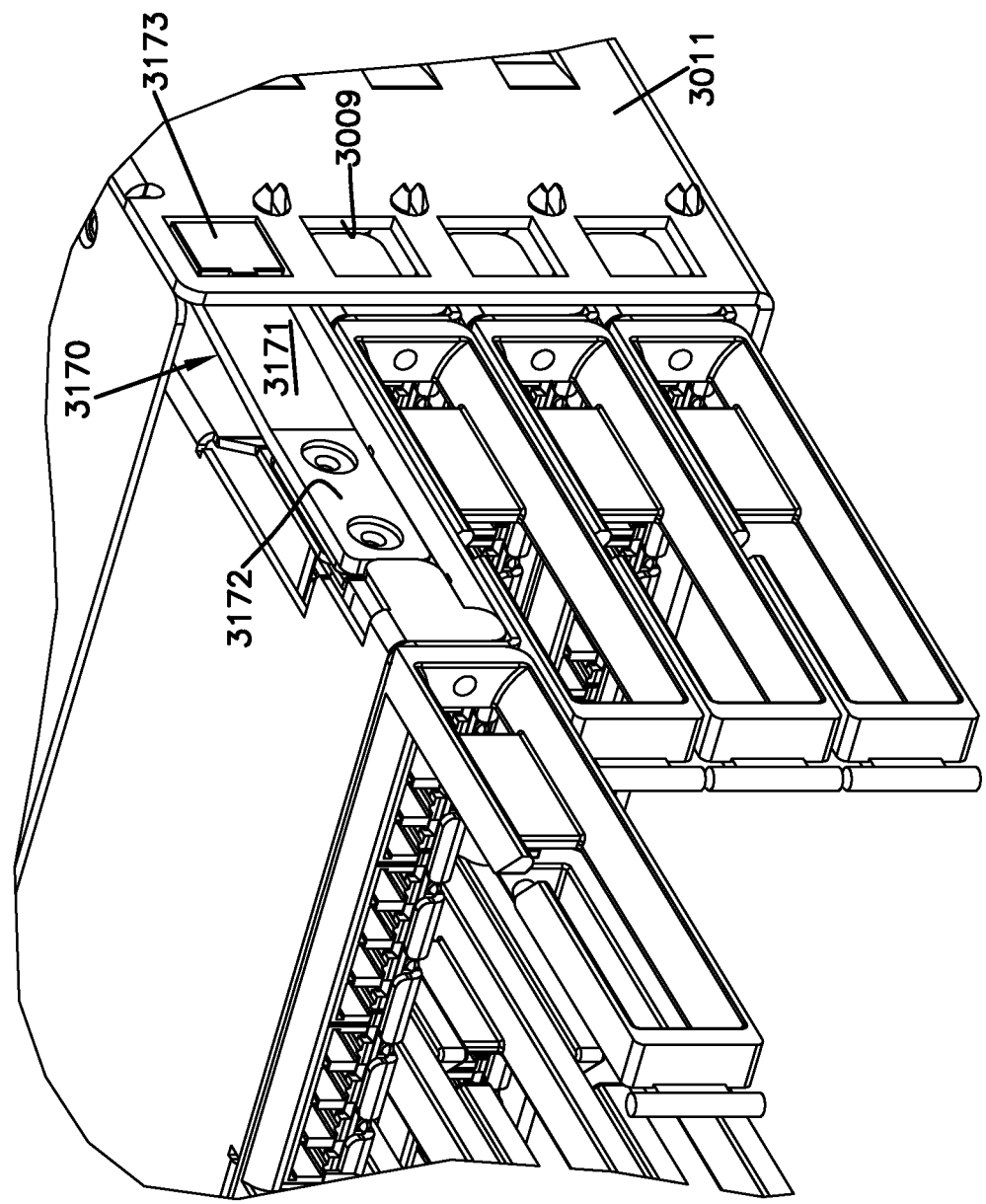
Figure 97:
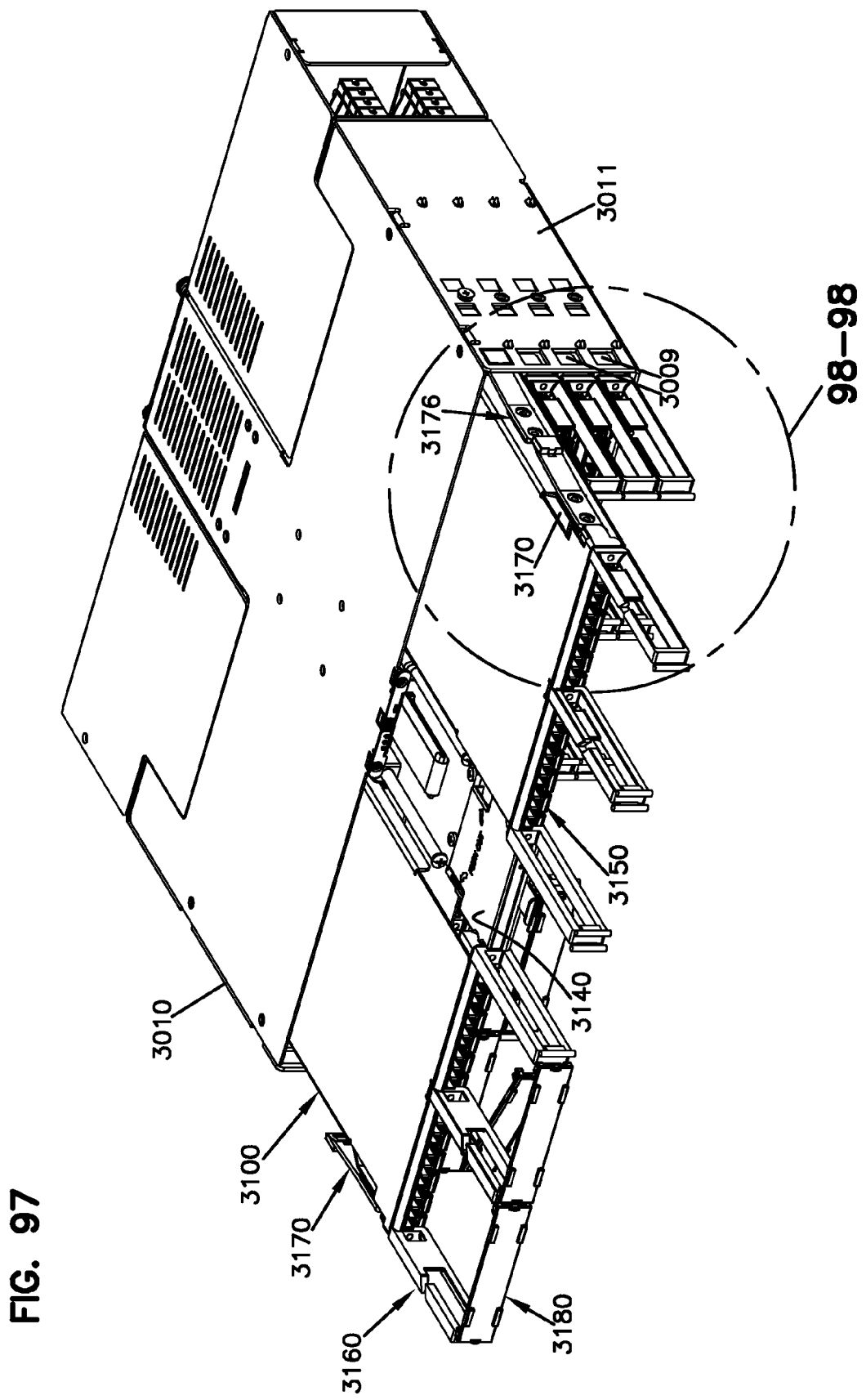
Figure 98:
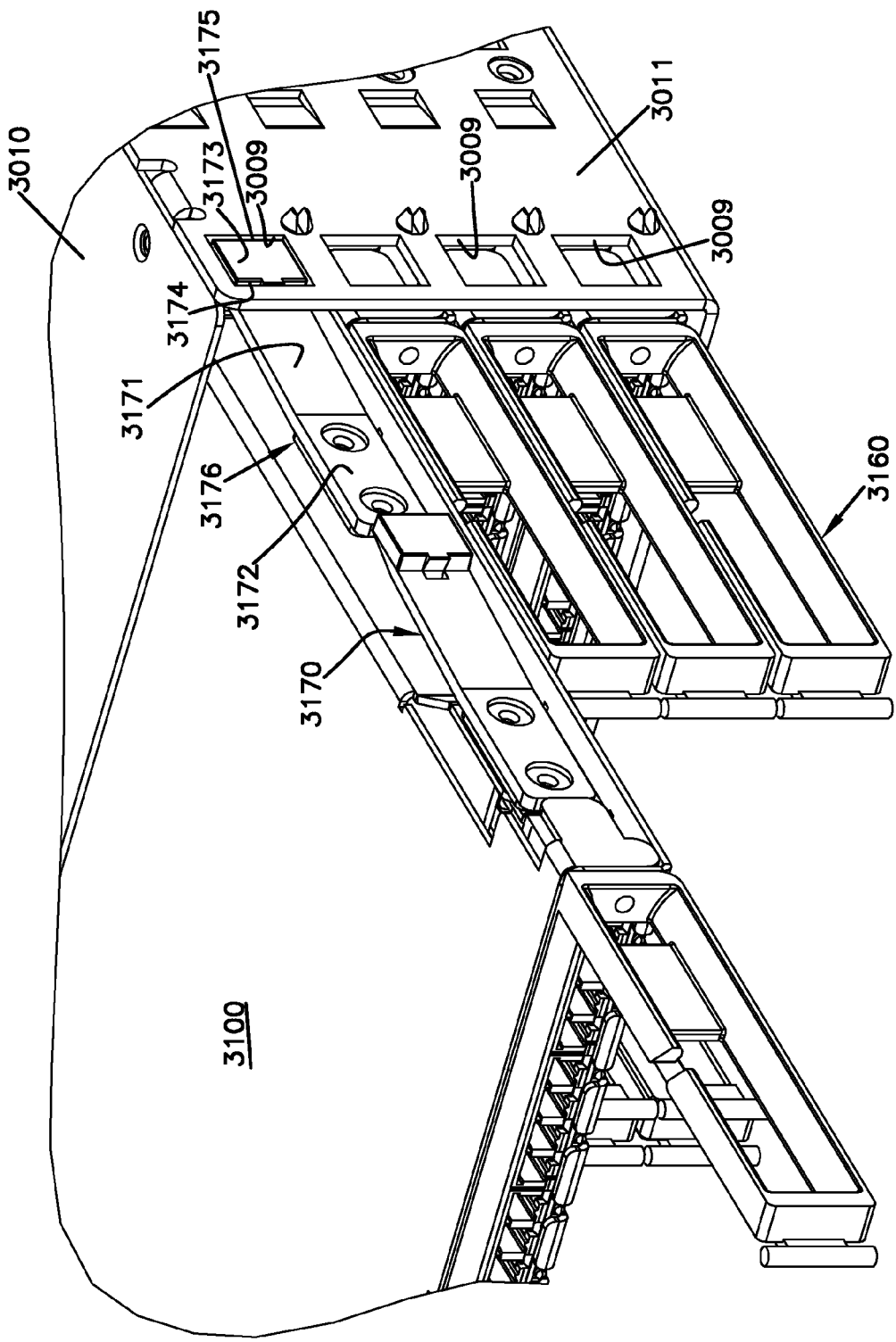
Figure 99:
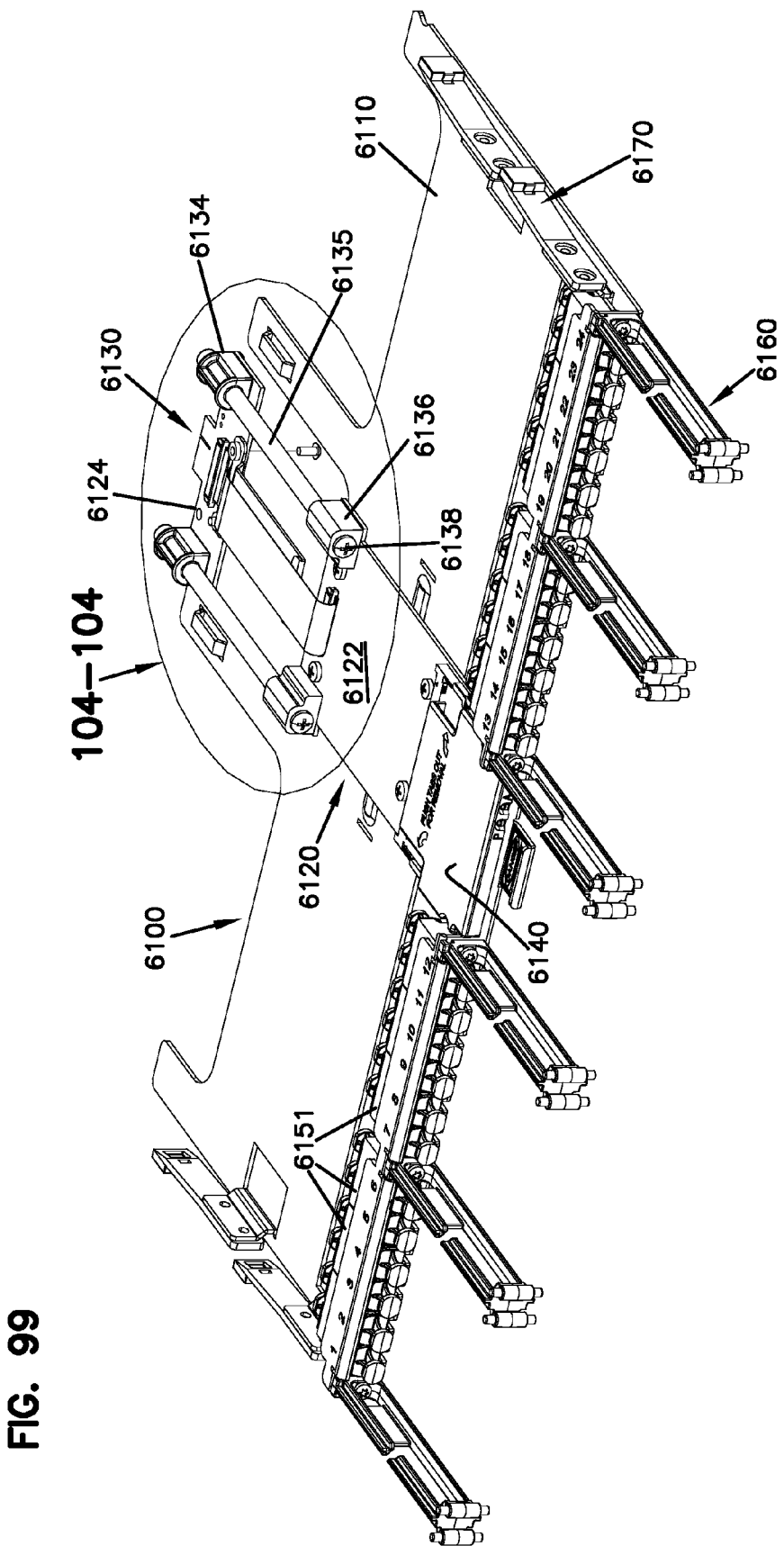
FIG. 99 is a perspective view of an example smart blade including a circuit board arrangement, a connection system, a blade processor, and a smart coupler arrangement in accordance with aspects of the disclosure.

In accordance with some aspects, each blade 3100 includes a latching arrangement that is configured to secure the blade 3100 in one or more positions. FIGS. 95-97 illustrate one example latching arrangement by which a blade 3100 may be latched or otherwise secured in the first extended position. Each blade 3100 with the example latching arrangement includes one or more latching tabs 3170 (FIGS. 55, 64, and 68) configured to engage with the chassis housing 3010 to lock the blade 3100 in one of a plurality of positions.

In such implementations, at least one side of the chassis housing 3010 defines one or more latching recesses 3009 or openings (FIGS. 91 and 95) that receive the latching tabs 3170. In certain implementations, both sides of the blade 3100 may include one or more latching tabs 3170 configured to cooperate with one or more latching openings 3009 defined in both sides of the chassis housing 3010. In some implementations, the chassis 3010 defines one latching opening 3009 for each blade 3100 at the front of the chassis 3010. In other implementations, the chassis 3010 defines a latching opening 3009 at the front of each side wall 3011 for each blade 3100 to be received (e.g., see FIG. 101). In still other implementations, each side 3011 of the chassis 3010 may define multiple openings 3009 for each blade 3100 (e.g., see FIG. 120).

Figure 63:
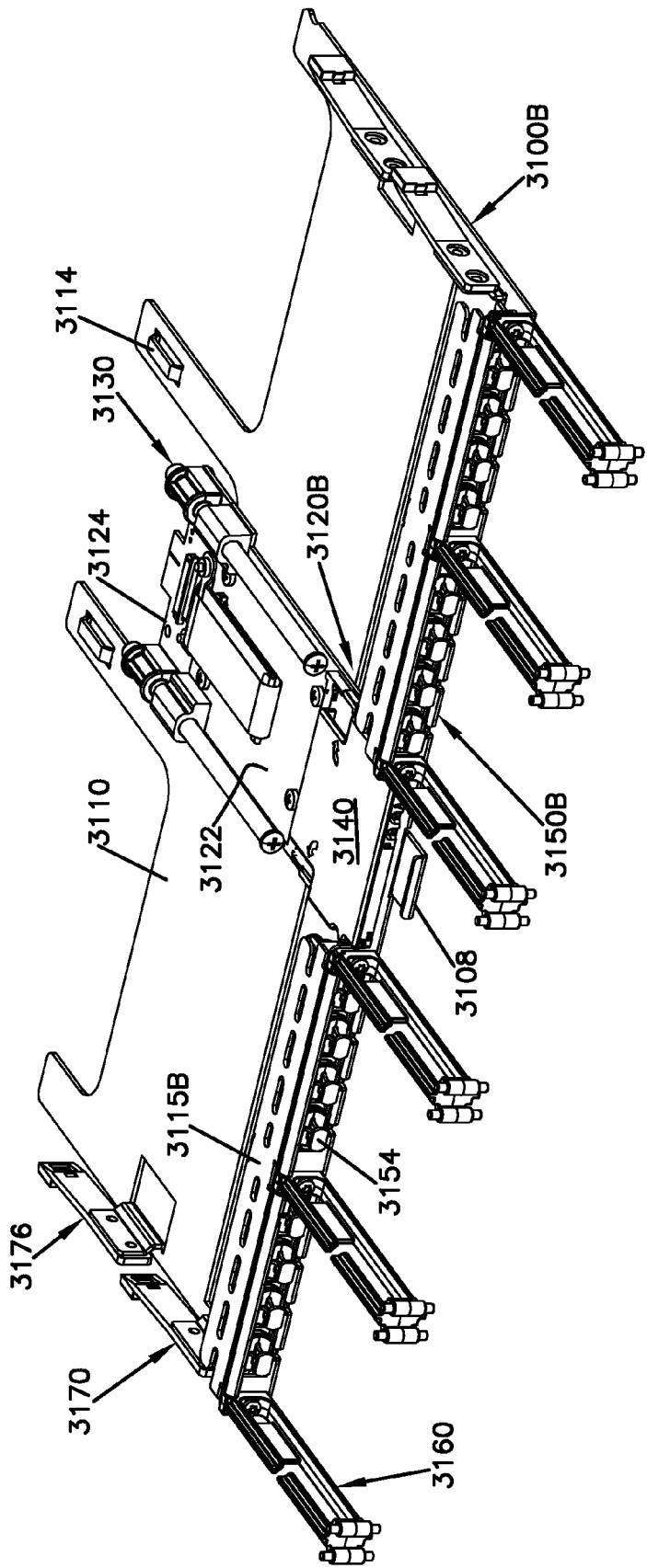
FIGS. 63-66 illustrate another example blade including a coupler arrangement that connects incoming media segments terminated at MPO-type connectors to outgoing media segments terminated at MPO-type connectors.

Example blade latching tabs 3170 are shown in FIGS. 55, 63, and 68. Each latching tab 3170 includes a resilient body 3171 having a mounting end 3172 and a free end. The mounting end 3172 of the tab body 3171 is secured to the blade base 3110 (e.g., via fasteners, welding, etc.). The free end of the body 3171 defines a latching surface 3173 having first and second shoulders 3174, 3175, respectively (see FIGS. 54 and 55). When the blade 3100 is inserted into the chassis 3010, the first shoulder 3174 faces the front of the chassis housing 3013 and the second shoulder 3175 faces the rear of the chassis housing 3013 (see FIG. 98).

When a blade 3100 is located in the chassis 3010 in the closed position, the distal end of the first latching tab 3170 abuts against the side walls 3011 of the chassis housing 3013. When the blade 3100 is moved forwardly (e.g., by pulling handle 3108), the latching surface 3173 of the tab 3170 moves along the side wall 3011 until the latching surface 3173 aligns with the latching recess 3009 of the chassis housing 3013. When aligned, the latching surface 3173 pops into the latching recess 3009 (see FIG. 96). Front and rear shoulders 3174 and 3175 of the latching tab 3170 abut against edges of the side wall 3011 to inhibit forward and rearward movement of the blade 3100 (see FIG. 96). Pushing the latching surface 3173 sufficiently inwards for the shoulders 3174, 3175 to clear the side wall edges releases the blade 3100, thereby enabling forward and rearward movement of the blade 3100 relative to the chassis 3010.

In accordance with some aspects, each blade 3100 also may be latched or otherwise secured in a second extended position. For example, in some implementations, each blade 3100 may include at least a second latching tab 3176 positioned further rearward on the blade 3100 than the first latching tab 3170 (see FIGS. 55, 63, and 68). In the example shown, the second latching tab 3176 is structured the same as the first latching tab 3170. In other implementations, however, the second latching tab 3176 may have a different structure. In some implementations, the second latching tab 3176 is configured to engage with the openings 3009 of the chassis housing 3013 to lock the blade 3100 in the second extended position (see FIG. 97). In other implementations, the second latching tab 3176 interacts with a different set of latching recesses or openings than the first latching tab 3170.

In the example shown in FIGS. 75 and 76, the latching tabs 3170, 3176 of the upper blade 3100B are contained within the chassis housing 3013 and, accordingly, are not visible. No portion of the tabs 3170, 3176 is visible through the chassis opening 3009. The first latching tab 3170B of the middle blade 3100A is latched into one of the latching openings 3009 of the chassis 3013. The second latching tab 3176 of the middle blade 3100A is contained within the housing 3013. The first latching tab 3170C of the lower blade 3100C is external of the chassis housing 3013. The second latching tab 3176C of the lower blade 3100C is latched into another opening 3009 of the chassis housing 3013.

In accordance with some aspects, the blade 3100 can be completely removed from the chassis housing 3013. For example, to remove the blade 3100 from the chassis housing 3010, a blade 3100 may first be moved to the first extended position at which the first latching tab 3170 snaps into the latching opening 3009 of the chassis housing 3013. By depressing the first latching tab 3170 free of the opening 3009, the blade 3100 may be moved further forward of the chassis 3010 to the second extended position. By depressing the second latching tab 3176 of the blade 3100 through the chassis opening 3009, the blade 3100 may be pulled still further forward of the chassis 3010 until the blade 3100 is free of the chassis housing 3013.

In accordance with some aspects, one or more blades positioned in the chassis 3010 may be "smart" blades. As the term is used herein, a "smart" blade is a blade having PLI functionality. Smart blades may include a circuit board arrangement, a blade processor, and one or more "smart" couplers.

The smart couplers include one or more media reading interfaces configured to read physical layer information stored on or in physical media segments. The blade processor may manage the media reading interfaces via the circuit board arrangement.

A smart blade may be installed at a "smart" chassis, which includes a backplane (e.g., chassis backplane 3040 of FIG. 91). The circuit board arrangement of each smart blade connects the blade processors to the backplane. A chassis processor (e.g., chassis processor 3060 of FIG. 48) connects to the blade processors via the backplane. The chassis processor may be connected to a data network. For example, FIG. 91 illustrates one example smart chassis 3010 having a backplane 3040 including multiple blade ports 3042. Each blade port 3042 is configured to connect to the circuit board arrangement of any smart blade positioned in the chassis 3010.

In accordance with other aspects, one or more of the blades may be "passive" blades. As the term is used herein, a "passive" blade is a blade that does not have PLI functionality. For example, in some implementations, a passive blade may have one or more "passive" couplers that do not include media reading interfaces as will be described in more detail herein. In certain implementations, the passive blade does not have a circuit board arrangement or a blade processor.

In accordance with some aspects, a passive blade may be installed at a smart chassis. For example, the passive blade may have the same or similar dimensions of the smart blade to enable the passive blade to fit within the smart chassis. In other implementations, the passive blade may be installed at a "passive" chassis. As the term is used herein, a "passive" chassis is a chassis that does not include a backplane or a chassis processor. In certain implementations, a smart blade may be installed at the passive chassis.

FIGS. 99-115 illustrate various example implementations of smart blades 6100. In general, the smart blade 6100 includes a base 6110 that is the same as the base 3110 of blade 3100 of FIGS. 54-98. The smart blade 6100 also includes a circuit board arrangement 6120, a blade processor 6140, retention fingers 6160, and latching tabs 6170 that are substantially the same as the circuit board arrangement 3120, blade processor 3140, retention fingers 3160, and latching tabs 3170 of blade 3100. The blade processor 6140 connects to the chassis backplane (e.g., chassis backplane 3040 of FIG. 91) via the circuit board arrangement 6120 as will be described in more detail herein.

In the example shown, the example blade 6100 includes a plurality of smart couplers 6151 at the front of the blade 6100. Each smart coupler 6151 includes one or more media reading interfaces 6158. The media reading interfaces of the smart couplers 6151 are coupled to the circuit board arrangement 6120 of the blade 6100. The blade processor 6140 also is coupled to the circuit board arrangement 6120 (see FIG. 99). A connection end 6125 (FIG. 104) of the circuit board arrangement 6120 is plugged into one of the blade ports 3042 of the backplane 3040 (e.g., see connection end 3125 of blade 3100 plugged into port 3042 in FIG. 91). In various implementations, the connection end 6125 of the circuit board 6120 and the backplane 3040 forms a card edge connection, a plug/socket connection, a cable connection, a wireless connection, or another type of connection.

In some implementations, the media reading interface determines that a media segment 6250 has been received at a port of the smart coupler 6151. For example, a media reading interface at a front port of the blade 6100 may determine when an outgoing media segment 3220 has been received at the front port. In other implementations, each media reading interface of a smart coupler 6151 forms an electrical connection between a storage device 6254 of a media segment 6250 and the circuit board arrangement 6120 of the blade 6100 (see FIGS. 100 and 101). For example, the storage device 6254 may store physical layer information about the media segment 6250.

The media reading interfaces are electrically connected (or otherwise communicatively coupled) to the blade processor 6140. The blade processors 6140 connect to the data network via the chassis backplane 3040 and the chassis processor 3060. In some implementations, each blade processor 6140 operates the media reading interfaces of each blade 6100. In some such implementations, the chassis processor 3060 is a master processor that connects to and manages the blade processors 6140 of the blades 6100 in the chassis 3010. For example, the chassis processor 3060 can instruct each of the blade processors 6140 to determine which communications couplers 6150 have media segments 3200 inserted therein, to obtain physical layer information from the media segments 3200, or to forward the physical layer information to the chassis processor 3060 for storage and/or transmission to the data network.

Figure 100:
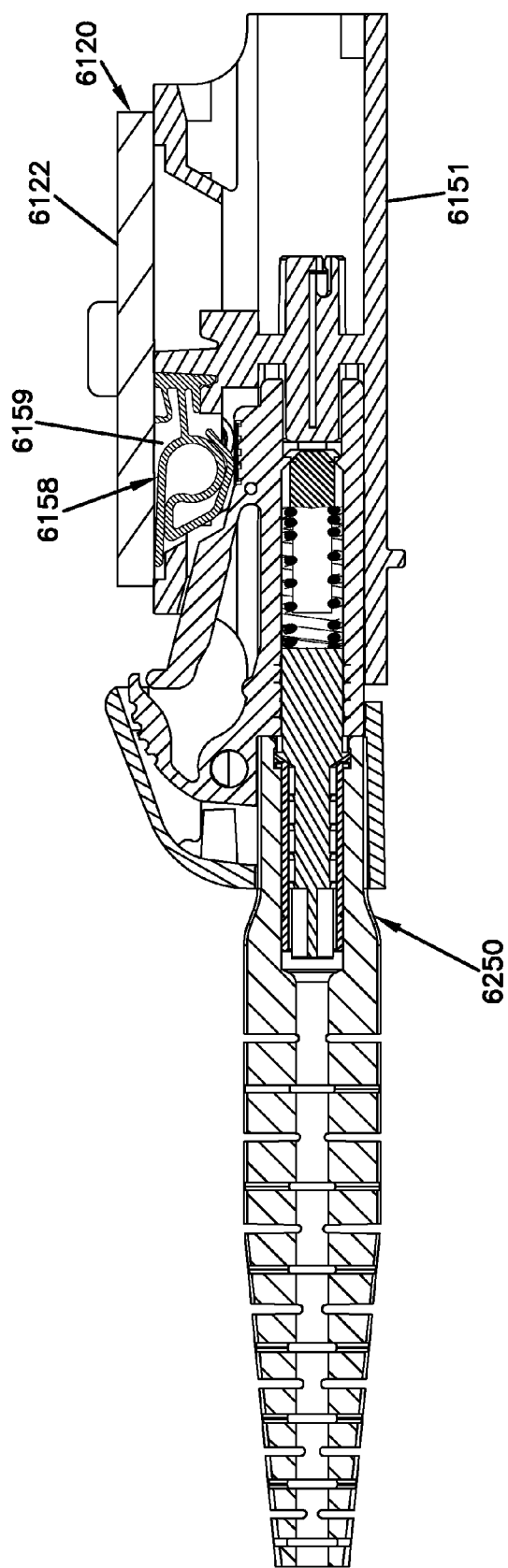
FIG. 100 is a cross-sectional view of an example smart coupler including a media reading interface that is contacting a storage device of an LC-type fiber optic connector received at a respective port of the smart coupler in accordance with aspects of the disclosure.
Figure 101:
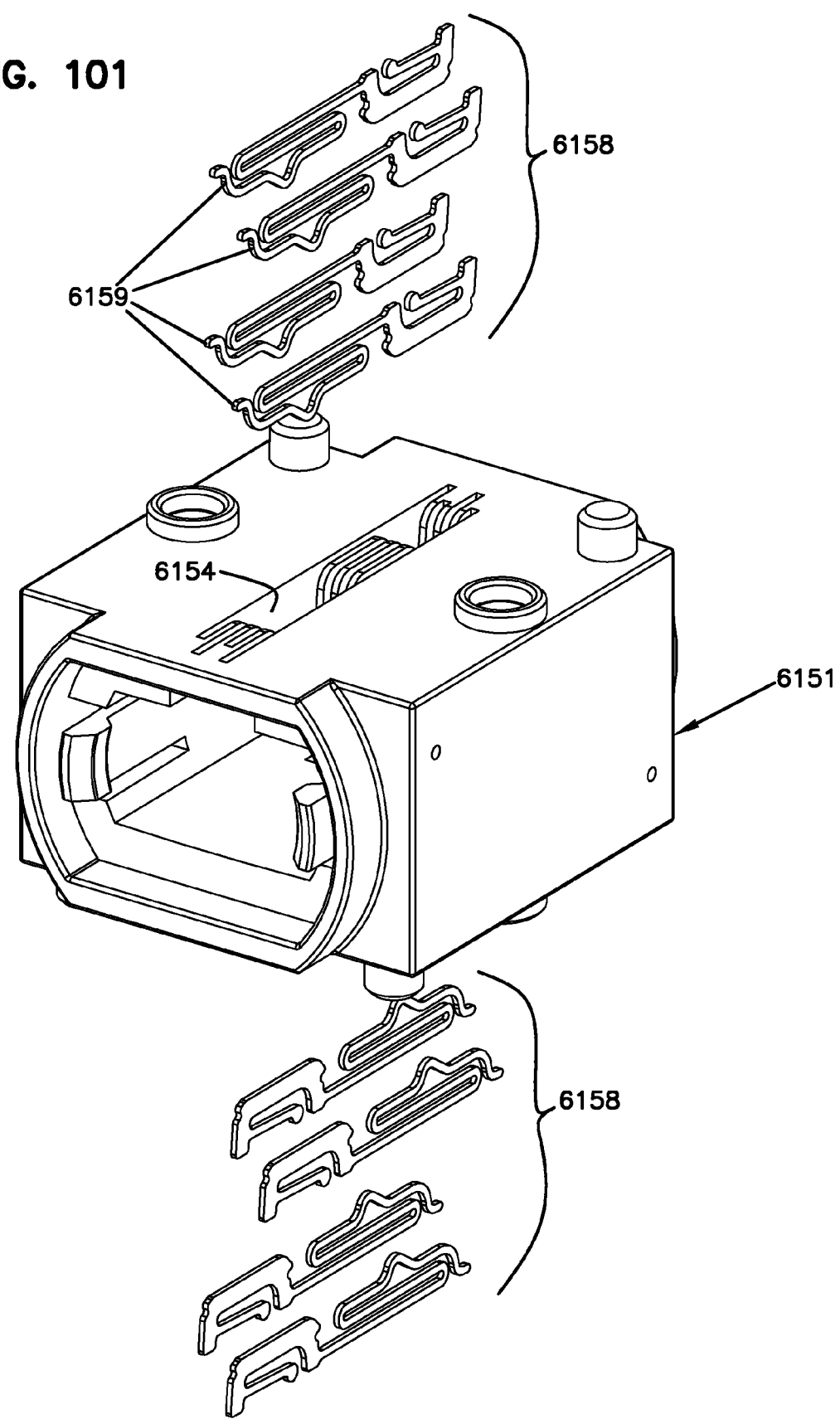
FIG. 101 is a perspective view of an example smart coupler including media reading interfaces that are configured to contact storage devices of MPO-type fiber optic connectors received at the port of the smart coupler in accordance with aspects of the disclosure.

FIGS. 100 and 101 show example implementations of smart couplers 6151 including example media reading interfaces 6158. The smart coupler 6151 of FIG. 100 is configured to receive two or more LC-type optical connectors and the smart coupler 6151 of FIG. 101 is configured to receive two MPO-type optical connectors. In general, each media reading interface 6158 is formed from one or more contact members 6159. As shown in FIG. 101, some types of coupler bodies 6151 defines slots 6154 configured to receive the one or more contact members 6159. As shown in FIG. 100, portions of the contact members 6159 extend into the through-passages of the couplers 6151 to engage the electrical contacts of the storage devices 6254 of the fiber optic connector 6250. Other portions of the contact members are configured to engage contacts on a printed circuit board 6120 (FIG. 100) associated with (e.g., positioned on top of) the coupler 6151. As discussed above, the blade processor 6140 also can be electrically coupled to the printed circuit board 6120 for locally managing the media reading interfaces 6158. Such a processor 6140 can communicate with the memory circuitry on the connector storage devices 6254 via the contact members and the printed circuit board arrangement 6120.

Figure 102:
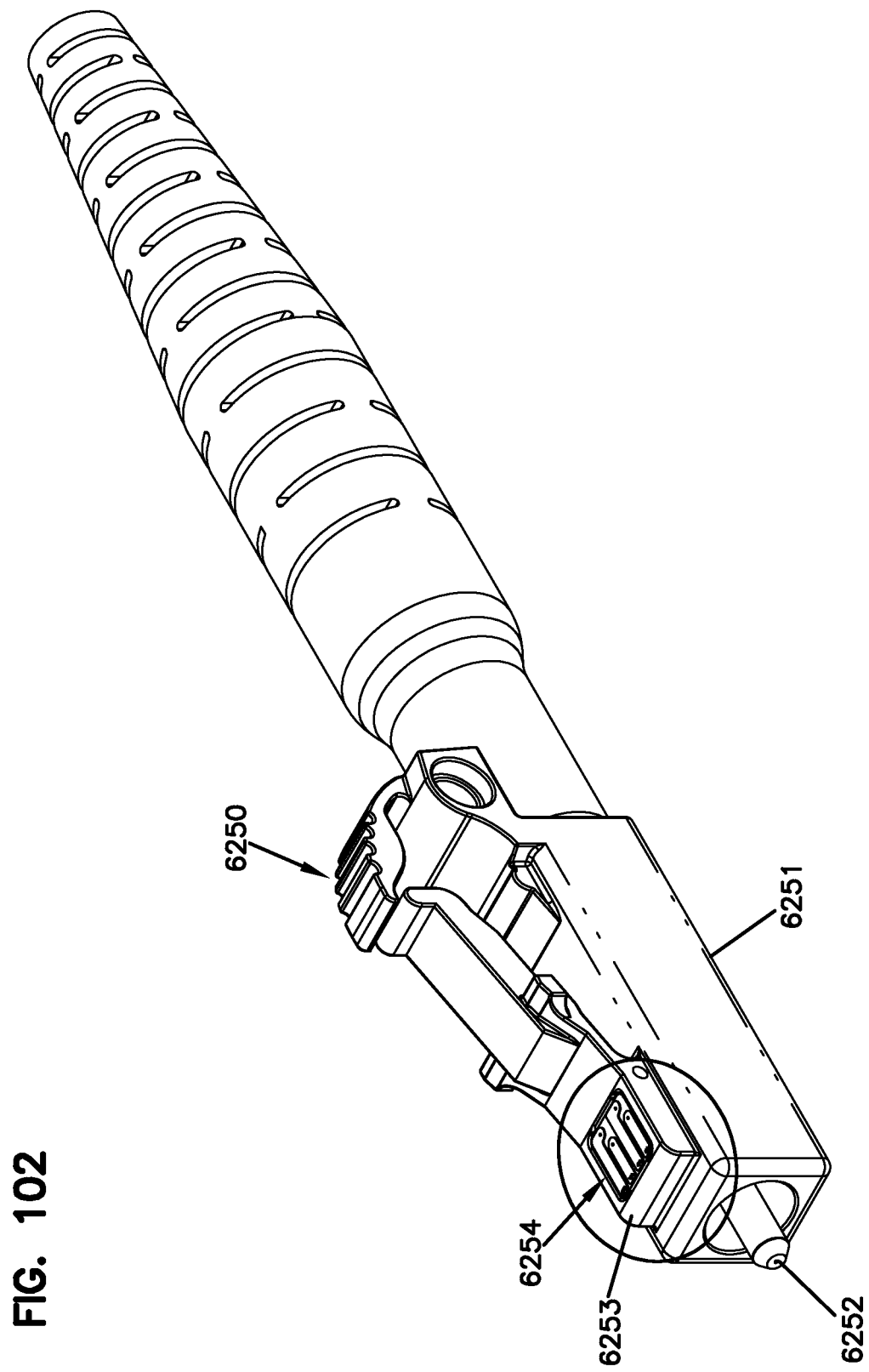
FIG. 102 is a perspective view of the example LC-type fiber optic connector of FIG. 129A.
Figure 103:
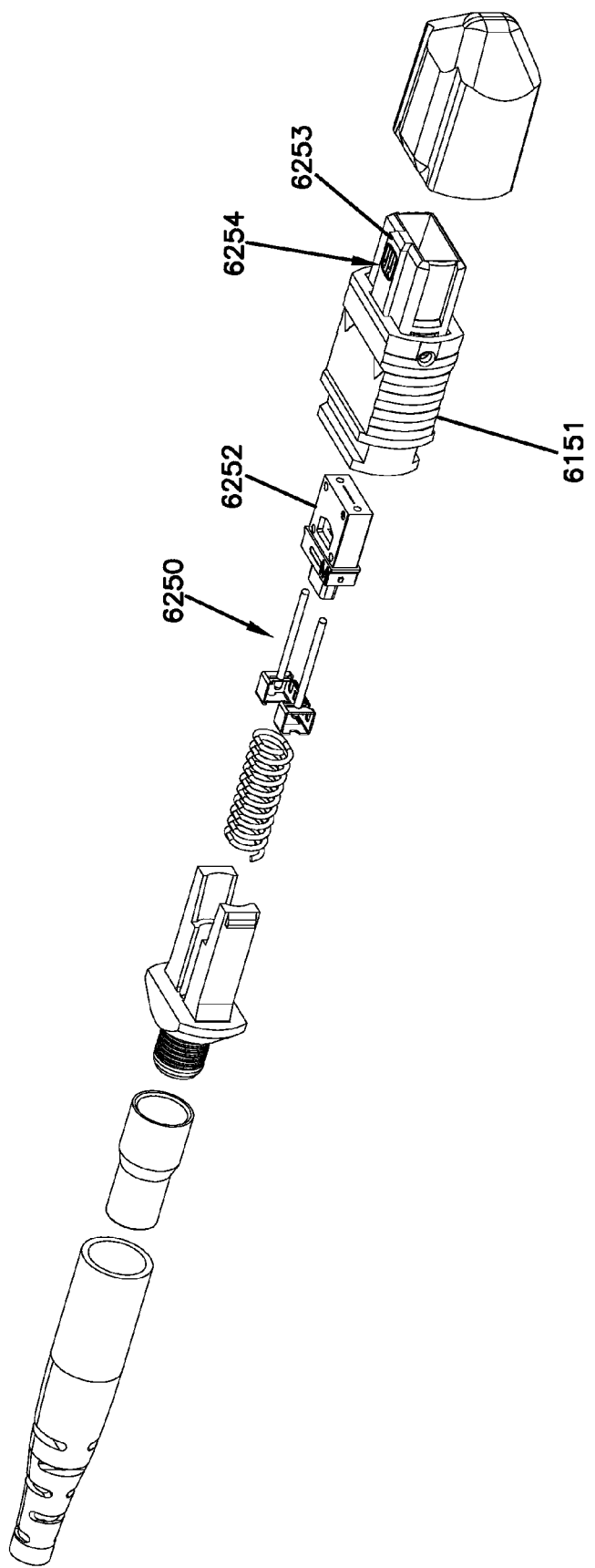
FIG. 103 is an exploded, perspective view of an example MPO-type fiber optic connector that is suitable for receipt at a port of the smart coupler shown in FIG. 129B.

FIGS. 102 and 103 show example implementations of physical media segments 6250 configured to terminate at least one optical fiber. FIG. 102 shows a physical media segment 6250 implemented as an LC-type fiber optic connector and FIG. 103 shows a physical media segment 6250 implemented as an MPO-type fiber optic connector. Each fiber optic connector 6250 includes a body 6251 enclosing an optical ferrule 6252 through which at least one optical fiber extends. The body 6251 also includes a key area 6253 at which the storage device 6254 may be positioned. For example, the key area 6253 may define a depression or cavity in which a storage device 6254 can be positioned. In accordance with some implementations, the storage device 6254 includes memory circuitry (e.g., an EEPROM chip) arranged on a printed circuit board. Electrical contacts also are arranged on the printed circuit board for interaction with the media reading interface 6158 of the smart coupler 6151.

Additional information pertaining to some example fiber optic connectors 6250, storage devices 6254, fiber optic adapters 6151, and contact members can be found in copending U.S. provisional Application Nos. 61/303,961; 61/413,828; 61/437,504; and U.S. application Ser. No. 13/025,841 incorporated by reference above.

FIGS. 104-115 illustrate various example bladed panel systems in which the smart couplers 6151 of the blades 6100 remain electrically connected to a chassis backplane 3040 while the blades 6100 move relative to the chassis 3010 between at least two positions. For example, the couplers 6151 may remain electrically connected to the backplane 3040 as the blade 6100 moves between the closed and first extended positions. In some implementations, the example blade 6100 includes a circuit board arrangement 6120 having at least a first board 6122 and a second board 6124. The smart couplers 6151 defining the front ports of the blade 6100 connect to the first board 6122. The connection end 6125 of the circuit board arrangement 6125 is defined by the second board 6124.

The blade 6100 also includes a first connection system 6130 that electrically connects the first board 6122 and the second board 6124. The first connection system 6130 also enables movement between the first board 6122 and the second board 6124 without disrupting the electrical connection between the two boards 6122, 6124. The first connection system 6130 enables the circuit board arrangement 6120 to remain connected to the backplane 3040 of the chassis 3010 during movement of the blade 6100. Accordingly, the chassis processor 3060 may manage the media reading interfaces 6158 of the smart couplers 6151 when the blade 6100 has been moved to the first extended position (e.g., to facilitate insertion and/or removal of media segments at the front ports.

In general, each connection assembly 6130 includes a first portion secured to the first circuit board 6122 and a second portion secured to the second circuit board 6124. The first portion of the connection assembly 6130 is moveably secured to the second portion. For example, the first portion of certain types of connection assemblies 6130 is slideably secured to the second portion. Certain types of connection assemblies 6130 also include a flexible electrical connector that maintains an electrical connection between the first board 6122 and the second board 6124.

Figure 106:
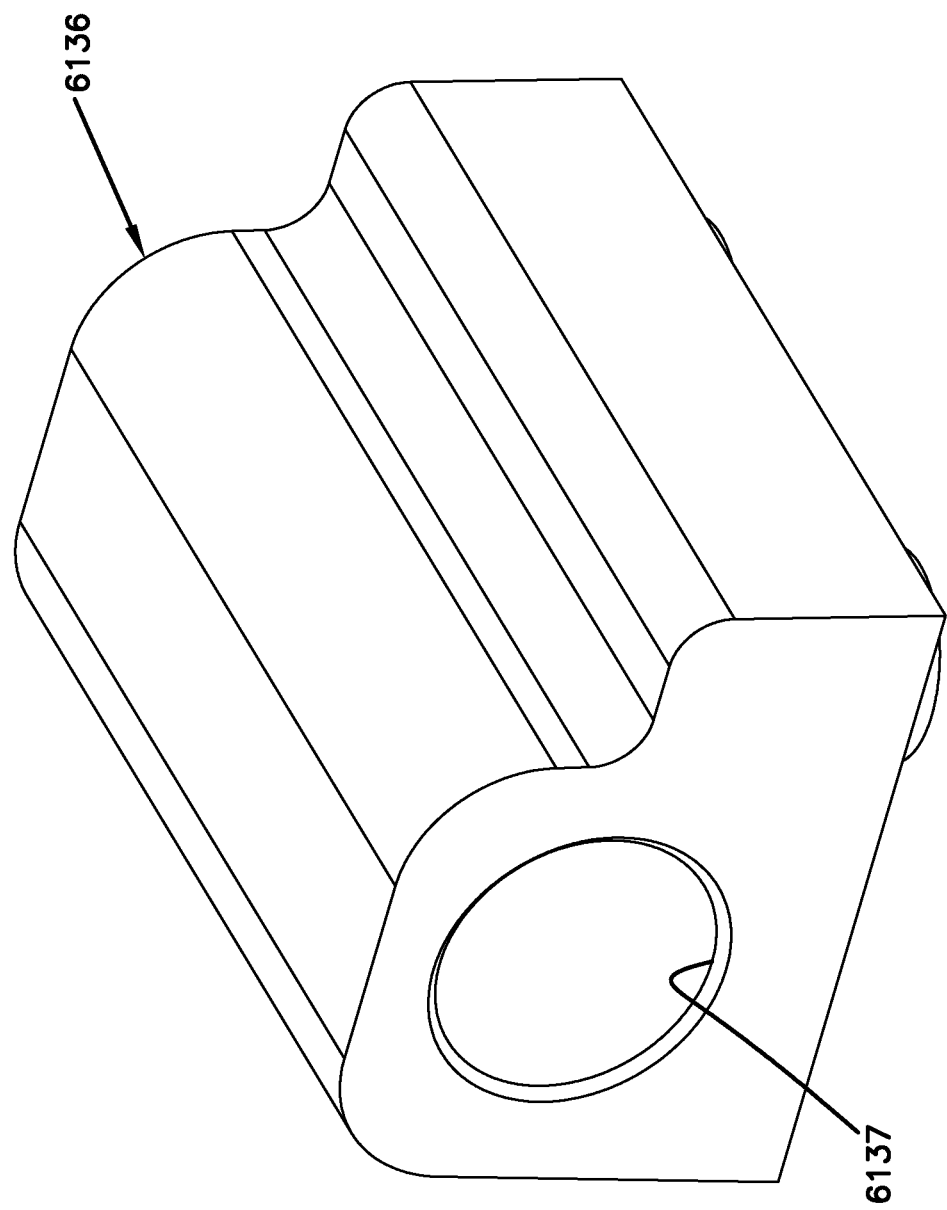
Figure 107:
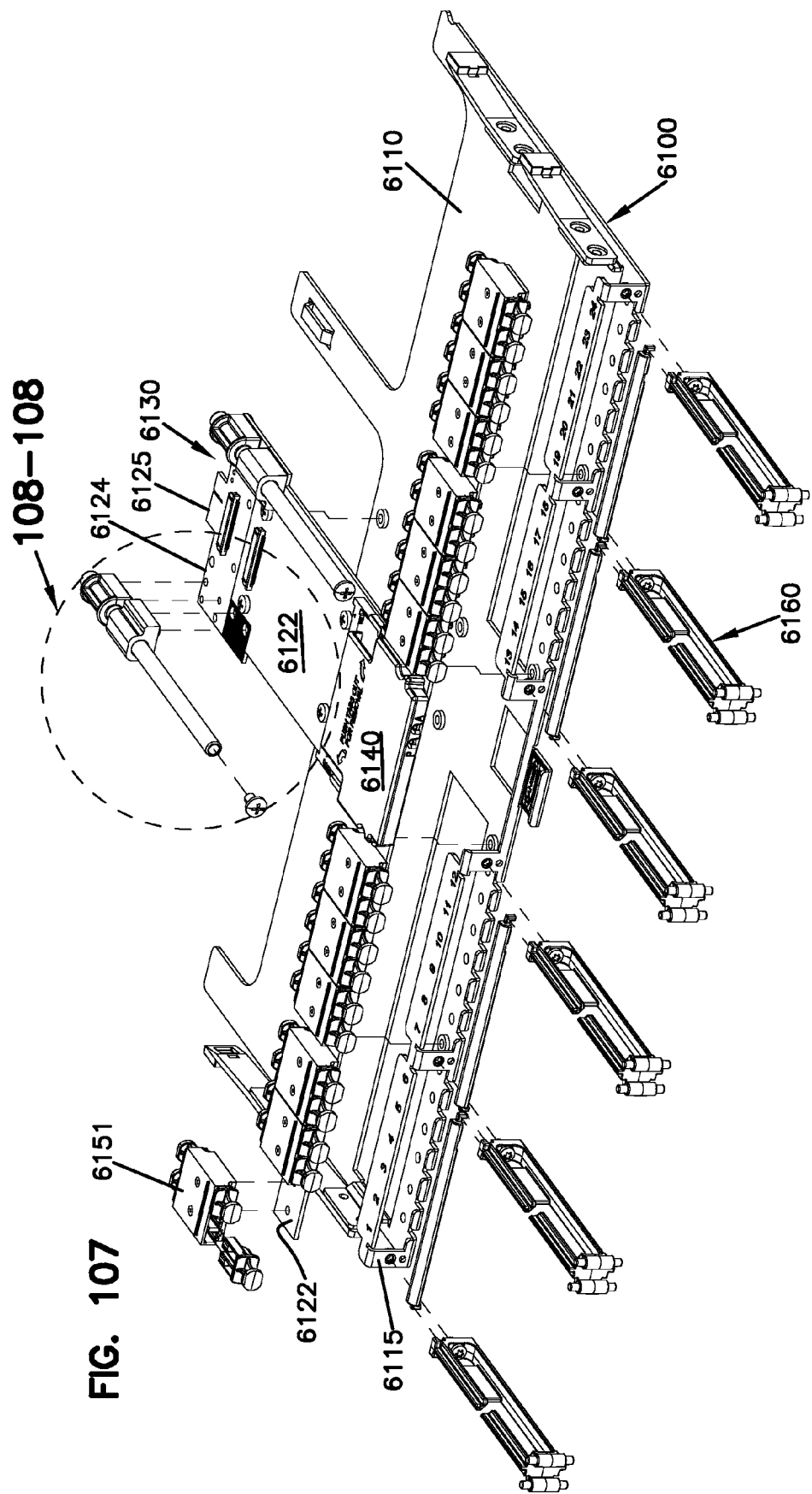
Figure 108:
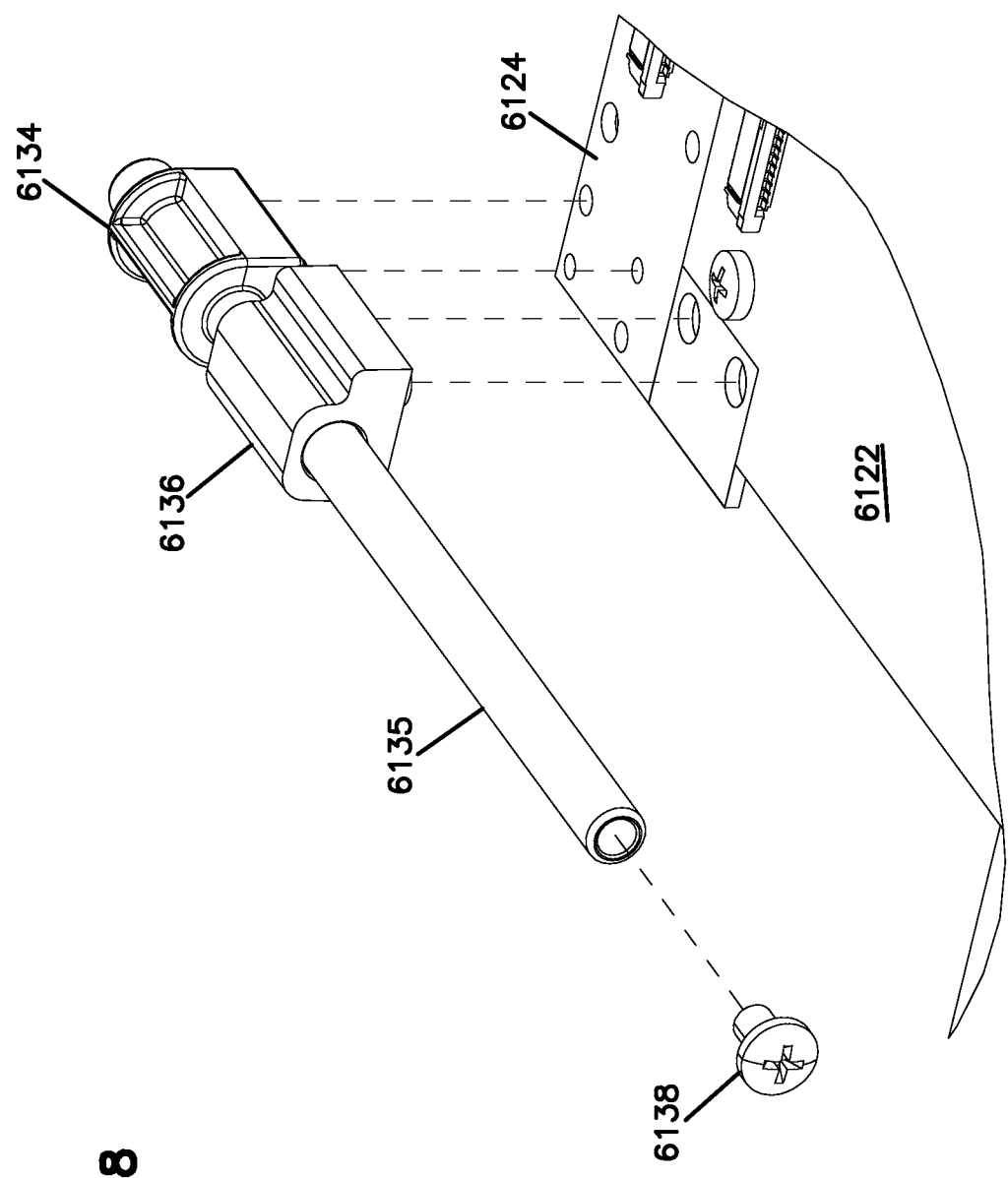
Figure 109:
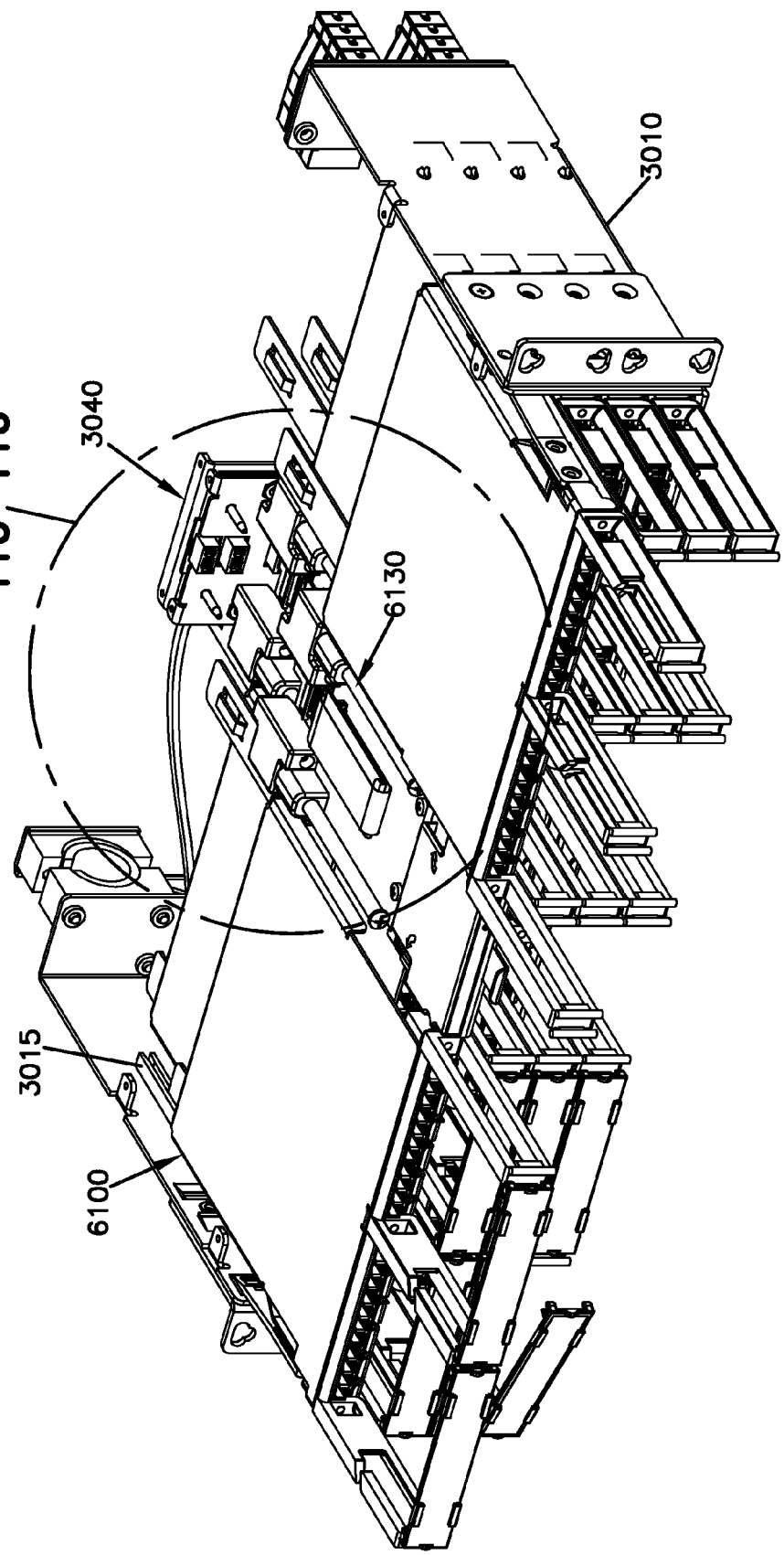
FIGS. 109-115 show another example connection system that enables a smart blade to remain connected to a chassis backplane when the smart blade moves relative to the chassis in accordance with aspects of the disclosure.

FIGS. 104-108 illustrate one example connection assembly 6130 suitable for use with a blade 6100. The connection assembly 6130 includes at least a first mounting member 6134 (FIG. 105) that holds or otherwise connects to the second circuit board 6124. For example, the first mounting member 6134 may be fastened, glued, soldered, welded, snap-fit, or otherwise installed on the second circuit board 6124. For example, FIG. 108 shows an example first mounting member 6134 being fastened (e.g., via screws) to a top of the second board 6124. A rail 6135 (FIG. 105) extends outwardly from the first mounting members 6134. In some implementations, the rail 6135 is axially fixed relative to the first mounting member 6134. In one implementation, the rail 6135 is unitary with the first mounting member 6134.

The connection assembly 6130 also includes at least a second mounting member 6136 (FIG. 106) that is connected to the first circuit board 6122. In the example shown in FIG. 135, the second mounting member 6136 is fastened to the first circuit board 6122 (e.g., via screws). In other implementations, however, the second mounting member 6136 may be glued, soldered, welded, snap-fit, or otherwise installed on the first circuit board 6136. For example, FIG. 108 shows an example second mounting member 6136 being fastened to a top of the first board 6122. In some implementations, the rails 6135 slide through an opening 6137 defined in the second mounting members 6136 to move the first mounting member 6134 toward and away from the second mounting member 6136. Moving the first mounting member 6134 toward and away from the second mounting member 6136 moves the second circuit board 6124 toward and away from the first circuit board 6122.

In some implementations, the connection assembly 6130 includes only a single first mounting member 6134, a single rail 6135, and a single second mounting member 6136. In other implementations, however, the connection assembly 6130 can include two or more sets of mounting members 6134, 6136, and rails 6135. For example, the connection assembly 6130 shown in FIGS. 104-108 includes two spaced first mounting members 6134, each holding one rail 6135. The connection assembly 6130 of FIGS. 104-108 also includes two spaced second mounting members 6136 configured to slideably receive the rails 6135.

Figure 105:
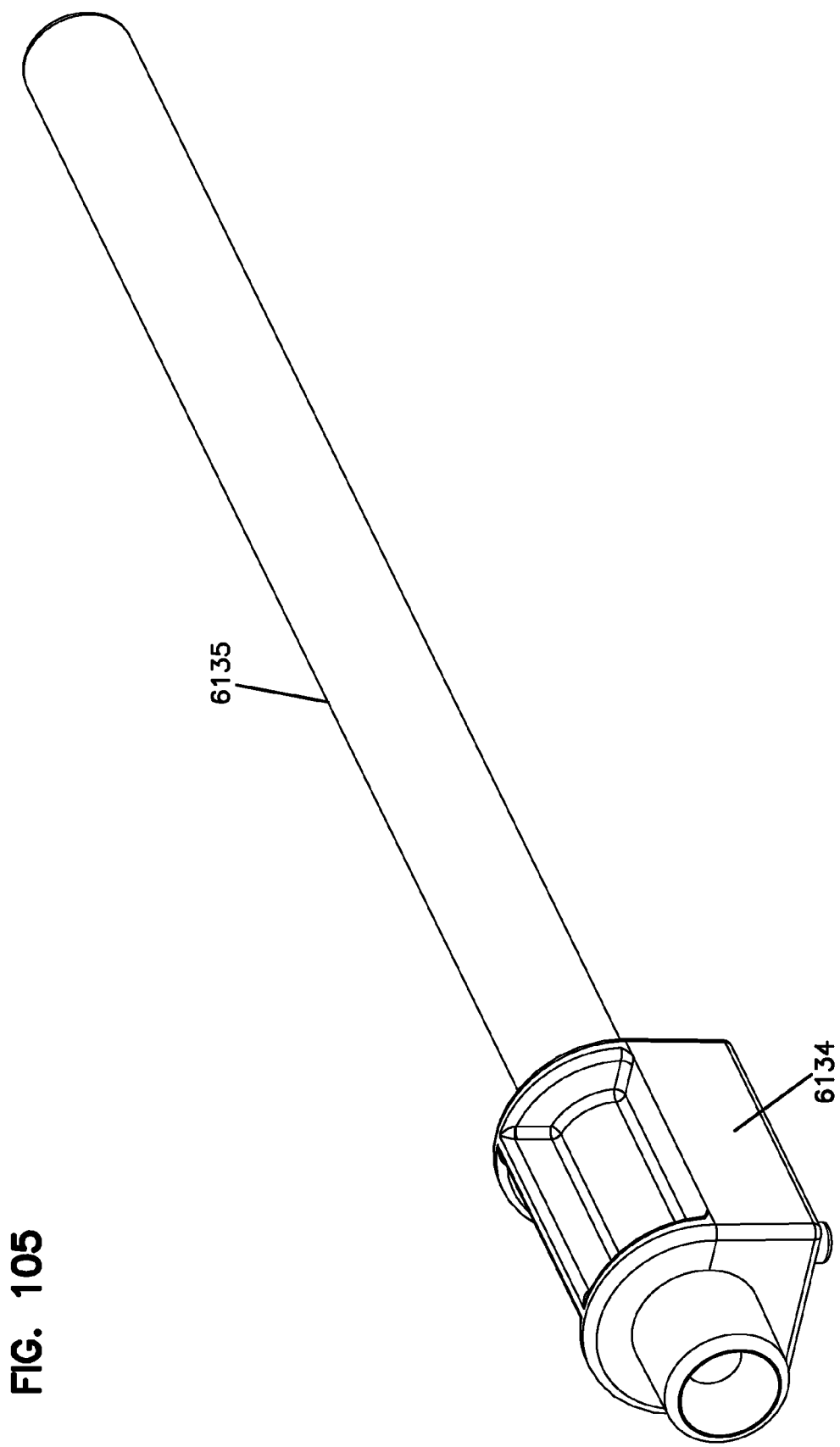

One example first mounting member 6134 is shown in FIG. 105. The first mounting member 6134 is configured to secure to the second circuit board 6124. Certain types of first mounting members 6134 include rectangular bases that are configured to be installed on the second circuit board 6124. Certain types of first mounting members 6134 also include curved tops. In the example shown, the curved top of the first mounting member 6134 defines axial ribs. In other implementations, however, the first mounting member 6134 may include a body defining a different shape (e.g., a rectangle, a triangle, etc.).

One example rail 6135 is shown in FIG. 105. In the example shown, each rail 6135 has a circular transverse cross-section. In other implementations, however, the rails 6135 may have different cross-sectional shapes (e.g., square, rectangle, oval, trapezoid, etc.) that complement the cross-sectional shapes of channels 6137 of the second mounting members 6136 (FIG. 106). Each of the rails 6135 is configured to receive a fastener 6138 (FIG. 104) that secures the rail 6135 to the second mounting member 6136 to inhibit the rail 6135 from sliding completely through the second mounting member 6136.

One example second mounting member 6136 is shown in FIG. 106. The second mounting member 6136 is configured to secure to the first circuit board 6122 (e.g., see FIGS. 107-108). The second mounting member 6136 defines a channel 6137 through which a rail 6135 may extend. Certain types of second mounting members 6136 define a stepped profile on one side. In other implementations, however, the second mounting members 6136 may define any suitable shape.

Figure 104:
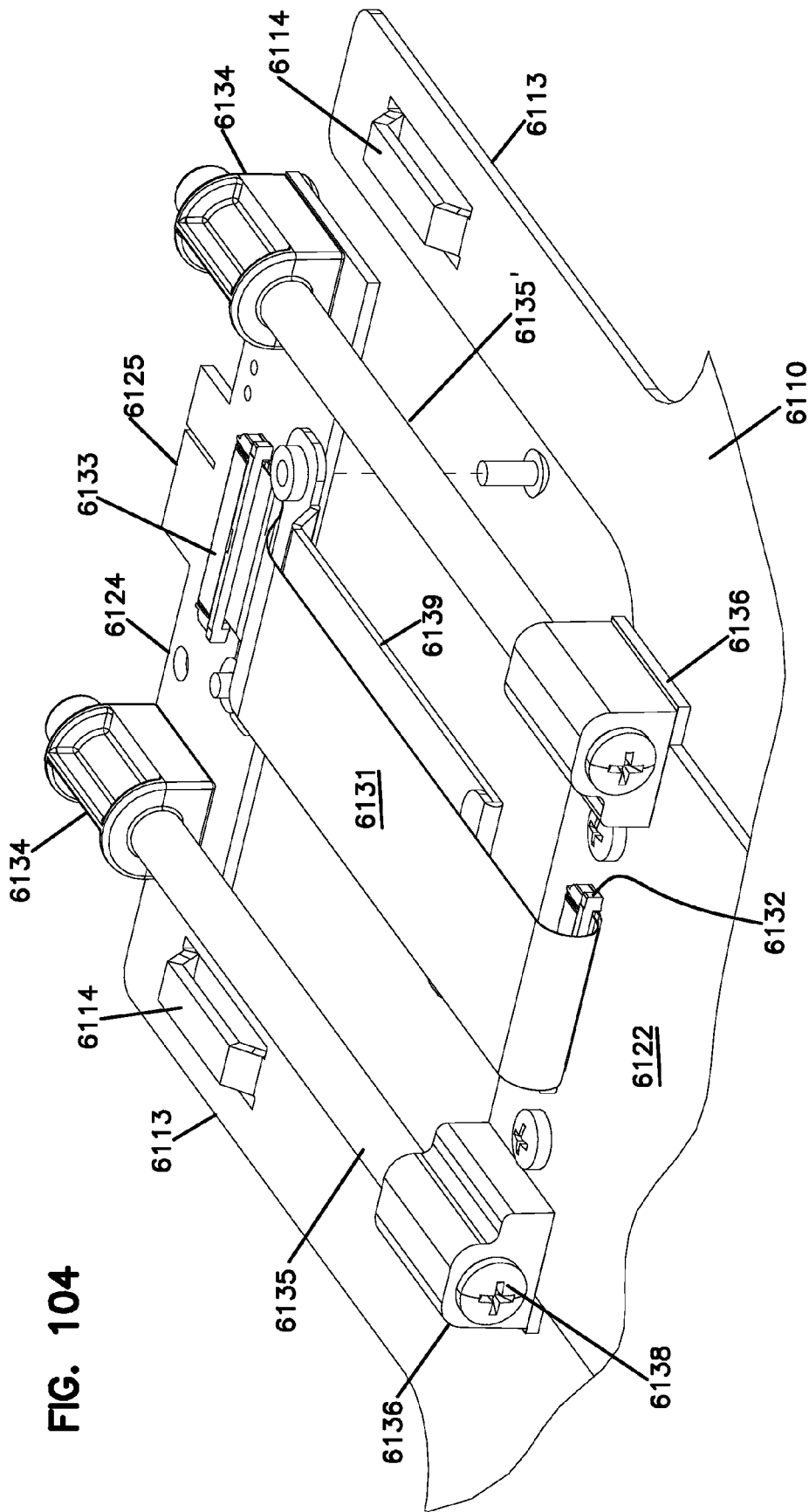
FIGS. 104-108 show an example connection system that enables a smart blade to remain connected to a chassis backplane when the smart blade moves relative to the chassis in accordance with aspects of the disclosure.

The connection assembly 6130 also includes a cable 6131 that connects to the first circuit board 6122 at a first plug 6132 and that connects to the second circuit board 6124 at a second plug 6133 (see FIG. 104). The cable 6131 is generally flexible and is sufficiently long to enable the second printed circuit board 6124 to move relative to the first printed circuit board 6122 without disconnecting from the first printed circuit board 6122. For example, when the second printed circuit board 6124 is in the retracted position (e.g., as shown in FIG. 107), the cable 6131 forms a half loop at a location between the first and second plugs 6132, 6133. When the second printed circuit board 6124 is in the extended position (e.g., as shown in FIG. 104), the cable 6131 straightens out to extend over the distance between the printed circuit boards 6122, 6124.

In certain implementations, the connection assembly 6130 also includes a flange 6139 around which the cable 6131 may fold to manage the bending of the cable 6131 during extension and retraction of the circuit board arrangement 6120. For example, the flange 6139 may include an elongated, planar body extending generally parallel with the first circuit board 6122. In the example shown, the free end of the elongated flange 6139. is bent, folded, or curved to inhibit damage to the cable 6131. In such implementations, the cable 6131 may form the half-loop around the distal end of the flange 6139 when the circuit board arrangement 6120 is in the retracted position (see FIG. 91).

For example, when the blade 6100 is being inserted into the chassis 3010 and the second circuit board 6124 has not yet been connected to the backplane 3040, the first mounting members 6134 abut the second mounting members 6136 and a majority of each rail 6135 protrudes forwardly of the second mounting members 6136 (see FIG. 91). The first and second plugs 6132, 6133 of the cable 6131 are positioned adjacent each other with the first plug 6132 being positioned below the elongated flange 6139. The cable 6131 wraps around the distal end of the flange 6139 and extends substantially along the length of both major sides of the elongated flange 6139.

Moving the blade 6100 out of the chassis 3010 to the first extended position moves the second mounting members 6136 forwardly relative to the backplane 3040. The backplane 3040 retains the connector end 6125 of the second printed circuit board 6124 with sufficient force to retain the connection to the second printed circuit board 6124. Accordingly, the second mounting members 6136 slide forwardly along the rails 6135. In some implementations, the second mounting members 6136 slide along the rails 6135 until the second mounting members 6136 abut the ends of the rails 6135. In the example shown in FIG. 104, the second mounting members 6136 abut screw heads on the ends of the rails 6135.

Accordingly, when a user chooses to pull one of the blades 6100 forwardly relative to the chassis housing 3010 (e.g., to access a communications coupler 6150), the first cable plug 6132 of the corresponding cable 6131 moves with the blade 6100. The second cable plug 6133, however, remains at a fixed position relative to the backplane 3040. For example, if a user wants to add, remove, or replace an outgoing media segment 3200 on a blade 6100, then the user can slide the blade 6100 to the first extended position to access the desired segment or coupler port without disconnecting the storage devices of the remaining physical media segments 6200 mounted to the blade 6100 from the data management network.

In some implementations, moving the blades 6100 further out of the chassis 3010 (e.g., to the second extended position) disconnects the blades 6100 from the backplane 3040 and, hence, from the data network. As discussed above, moving the blade 6100 to the second extended position may facilitate access the rear ports of the front couplers 6151 through an open top of the blade 6100. In other implementations, the moving the blade 6100 to the second extended position enables a user to access (e.g., add, remove, or replace) the blade processor 6140. In other implementations, however, the user can access the processor 6140 when the blade 6100 is in the first extended position.

In FIGS. 109-115, the example blade 6100 includes a second example connection system 6130' that connects the processor 6140 to the backplane 3040 of the chassis 3010. The second connection assembly 6130' includes at least a first mounting member 6134' that holds or otherwise connects to the second circuit board 6124. The first mounting member 6134' mounts the second circuit board 6124 on rails 6135' that are connected to the first circuit board 6122 via second mounting members 6136'. In some implementations, the rails 6135' slide through the second mounting members 6136' to move the second printed circuit board 6124 relative to the first printed circuit board 6122. In other implementations, the first mounting members 6134' move over the rails 6135' to move the second printed circuit board 6124 relative to the first printed circuit board 6122.

Figure 113:
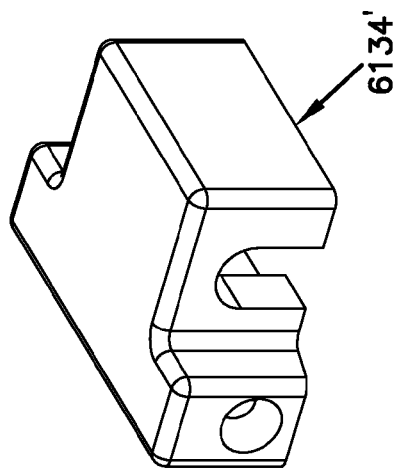

One example first mounting member 6134' is shown in FIG. 113. The first mounting member 6134' is configured to mount on rails 6135'. In the example shown, the first mounting member 6134' includes a generally T-shaped body that defines an open-ended slot through which a rail 6135' can extend. In other implementations, however, the first mounting member 6134' may include a body defining a different shape (e.g., a rectangle, a triangle, etc.). In other implementations, the first mounting member 6134' may define through-opening instead of a slot. In some implementations, one first mounting member 6134' is installed at a first side of the second printed circuit board 6124 and another first mounting member 6134' is installed at a second side of the second printed circuit board 6124. In certain implementations, the second printed circuit board 6124 is held between two first mounting members 6134'. In other implementations, the first mounting members 6134' are mounted on top of the second printed circuit board 6124 (e.g., see FIG. 112).

Figure 114:
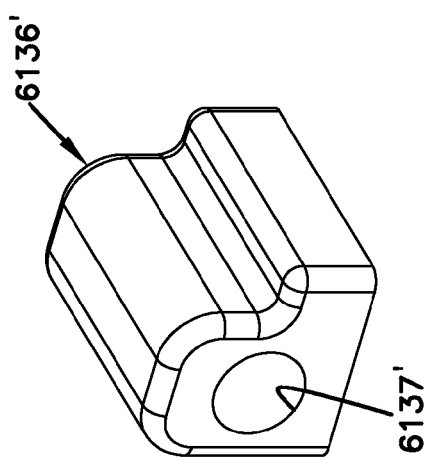
Figure 115:
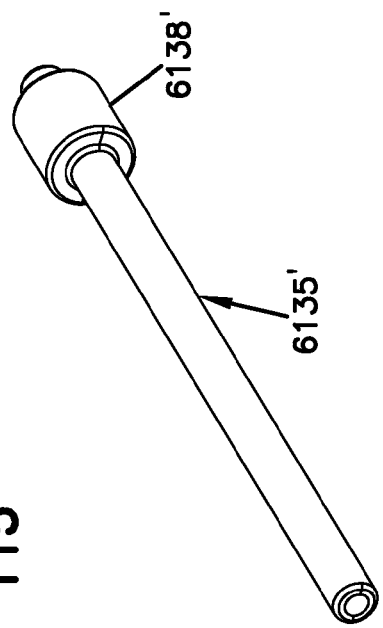

The rails 6135' are connected to the first printed circuit board 6122 by second mounting members 6136'. One example second mounting member 6136 is shown in FIG. 114. The second mounting member 6136' defines a channel 6137' through which one of the rails 6135' may extend. One example rail 6135' is shown in FIG. 115. In the example shown, each rail 6135' has a circular transverse cross-section. In other implementations, however, the rails 6135' may have different cross-sectional shapes (e.g., square, rectangle, oval, trapezoid, etc.) that complement the cross-sectional shapes of channels 6137' of the second mounting members 6136'. Each of the rails 6135' includes a stop 6138' at one end to inhibit the rail 6135' from sliding completely through the first mounting member 6134'.

Figure 110:
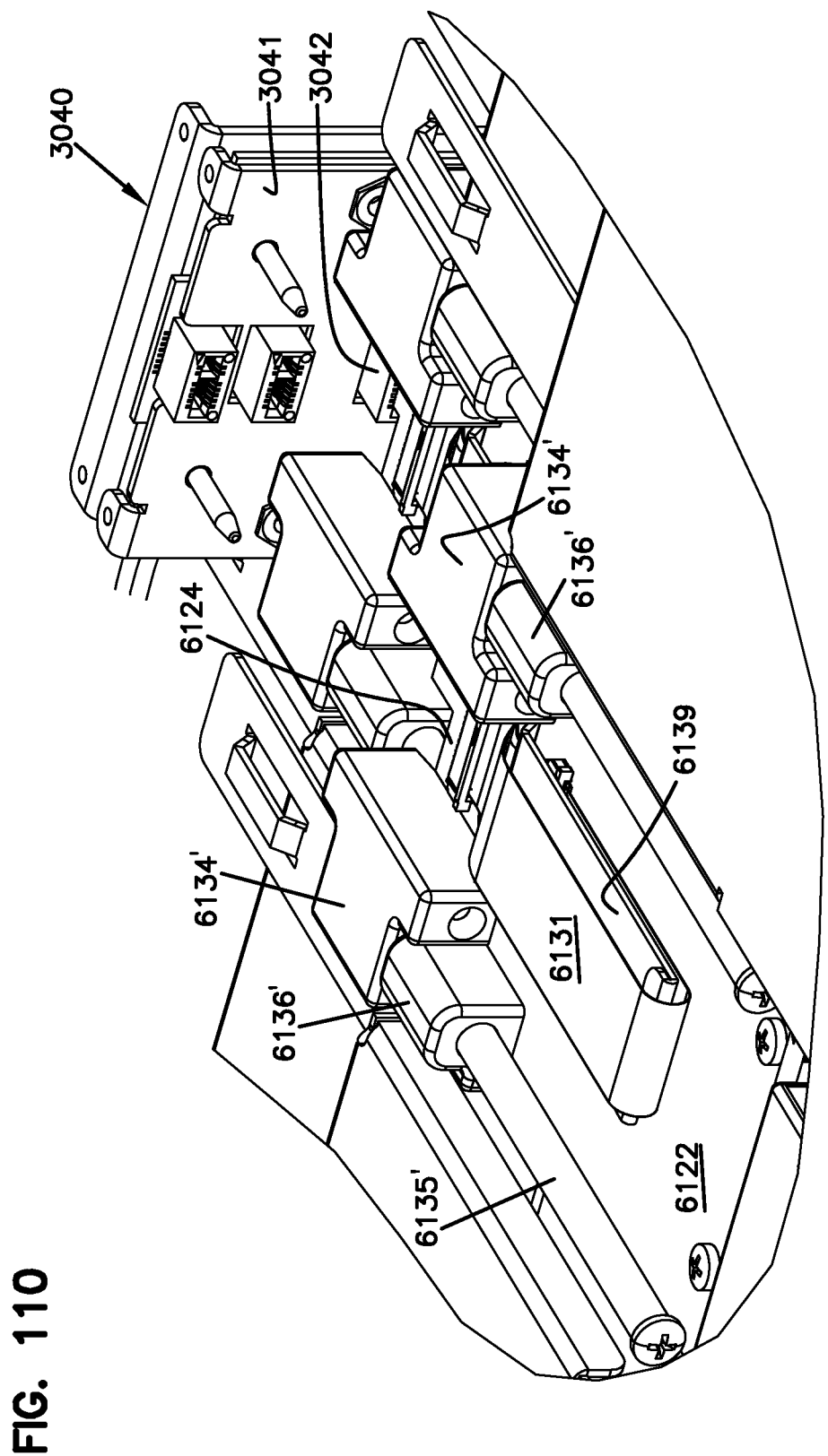
Figure 111:
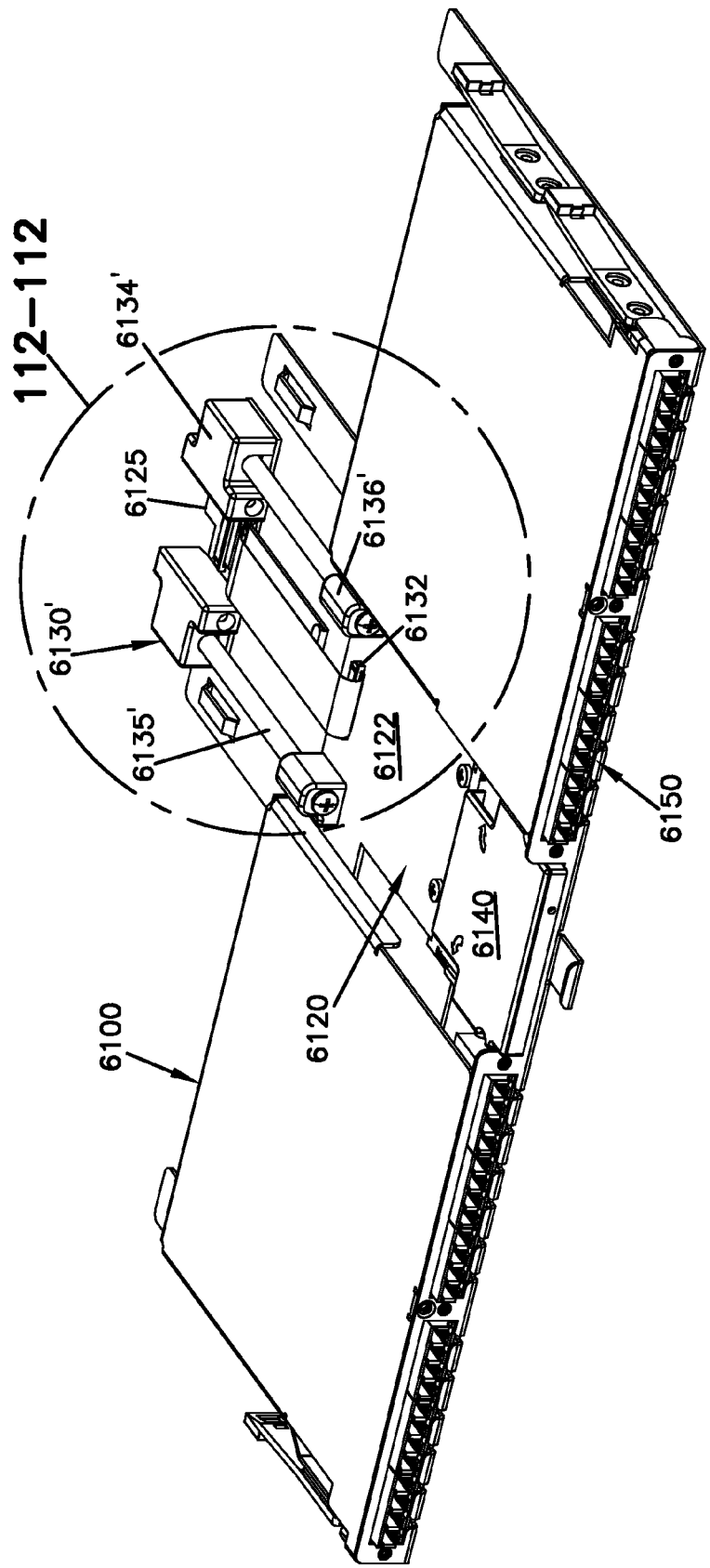
Figure 112:
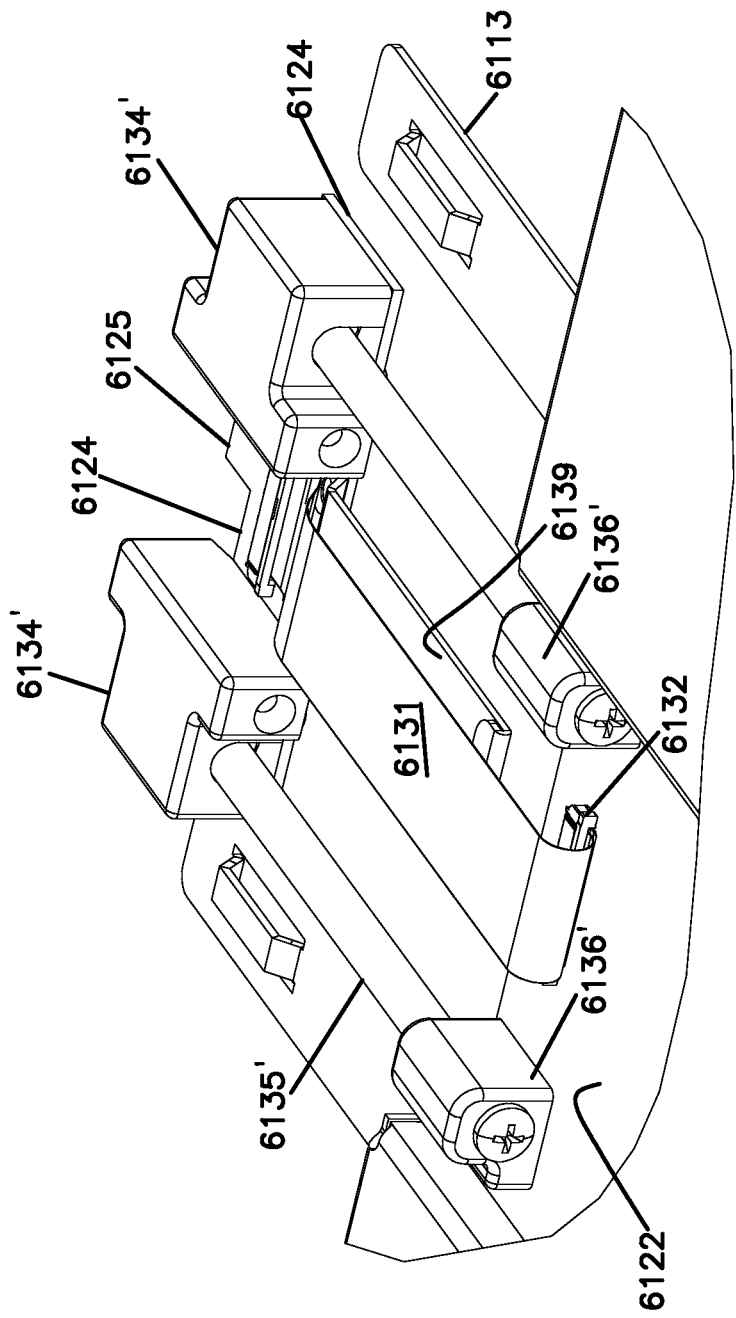

The connection assembly 6130' also includes the cable 6131 that connects to the first circuit board 6122 at the first plug 6132 (FIG. 111) and that connects to the second circuit board 6124 at the second plug 6133 (FIGS. 104 and 111). The cable 6131 is generally flexible and is sufficiently long to enable the second printed circuit board 6124 to move relative to the first printed circuit board 6122 without disconnecting from the first printed circuit board 6122. For example, when the second printed circuit board 6124 is in the retracted position (e.g., as shown in FIG. 110), the cable 6131 can form a half loop at a location between the first and second connectors 6132, 6133. When the second printed circuit board 6124 is in the extended position (e.g., as shown in FIG. 111), the cable 6131 substantially straightens out to extend over the distance between the printed circuit boards 6122, 6124.

In certain implementations, the second connection assembly 6130' also includes the flange 6139 around which the cable 6131 may fold to manage the bending of the cable 6131 during extension and retraction of the circuit board arrangement 6120. For example, the flange 6139 may include an elongated, planar body extending generally parallel with the first circuit board 6122. In the example shown, the free end of the elongated flange 6139. is bent, folded, or curved to inhibit damage to the cable 6131. In such implementations, the cable 6131 may form the half-loop around the distal end of the flange 6139 when the circuit board arrangement 6120 is in the retracted position (see FIG. 109).

For example, in the example shown in FIG. 110, the blade 6100 is being inserted into the chassis 3010 and the second circuit board 6124 has not yet been connected to the backplane 3040. The first mounting members 6134 abut the second mounting members 6136' and a majority of each rail 6135' protrudes forwardly of the second mounting members 6136'. The first and second plugs 6132, 6133 are positioned adjacent each other with the first plug 6132 positioned below the elongated flange 6139. The cable 6131 wraps around the distal end of the flange 6139 and extends substantially along the length of both major sides of the elongated flange 6139.

Moving the blade 6100 out of the chassis 3010 to the first extended position moves the second mounting members 6136' forwardly relative to the backplane 3040. The backplane 3040 retains the connector end 6125 of the second printed circuit board 6124 with sufficient force to retain the connection to the second printed circuit board 6124. Accordingly, the second mounting members 6136' slide forwardly along the rails 6135'. In some implementations, the second mounting members 6136' slide along the rails 6135' until the second mounting members 6136' abut the ends of the rails 6135'. In the example shown in FIG. 112, the second mounting members 6136' abut screw heads on the ends of the rails 6135'.

Accordingly, when a user chooses to pull one of the blades 6100 forwardly relative to the chassis housing 3010 (e.g., to access a communications couplers 6151), the first cable plug 6132 of the corresponding cable 6131 moves with the blade 6100. The second cable plug 6133, however, remains at a fixed position relative to the backplane 3040. For example, if a user wants to add, remove, or replace an outgoing media segment 3200 on a blade 6100, then the user can slide the blade 6100 to the first extended position to access the desired segment or coupler port without disconnecting the storage devices of the remaining physical media segments 3200 mounted to the blade 6100 from the data management network.

In some implementations, moving the blades 6100 further out of the chassis 3010 (e.g., to the second extended position) disconnects the blades 6100 from the backplane 3040 and, hence, from the data network. As discussed above, moving the blade 6100 to the second extended position may facilitate access the rear ports of the front couplers 6151 through an open top of the blade 6100. In other implementations, the moving the blade 6100 to the second extended position enables a user to access (e.g., add, remove, or replace) the blade processor 6140. In other implementations, however, the user can access the processor 6140 when the blade 6100 is in the first extended position.

FIGS. 116-123 illustrate one example bladed panel system 7000 including a "passive" chassis 7010 and a plurality of "passive" blades 7100. In other implementations, however, one or more smart blades 6100 may be mounted to the passive chassis 7010. The chassis 7010 includes side walls 7011 interconnected by top and bottom walls 7012 to define an open front and an open rear. A rear cover 7050 may be mounted to the chassis 7010. In certain implementations, the rear cover 7050 is substantially the same as rear cover 3050 disclosed above. In contrast to chassis 3010 above, however, the example chassis 7010 does not include a backplane. In some implementations, a panel 7040 may be mounted in place of a backplane. In other implementations, the rear of the chassis 7010 may be left open.

One or more guides 7015 are positioned along the side walls 7011. The blades 7100 are moveably positioned in the chassis 7010 using the guides 7015. For example, the blades 7100 may be slid along the guides 7015. In certain implementations, the guides 7015 extend between the front and rear of the chassis 7010. In the example shown, the chassis 7010 includes eight guides 7015. In other implementations, however, the chassis 7010 may include greater or fewer guides (e.g., one guide, two guides, three guides, four guides, ten guides, twelve guides, etc.).

Figure 119:
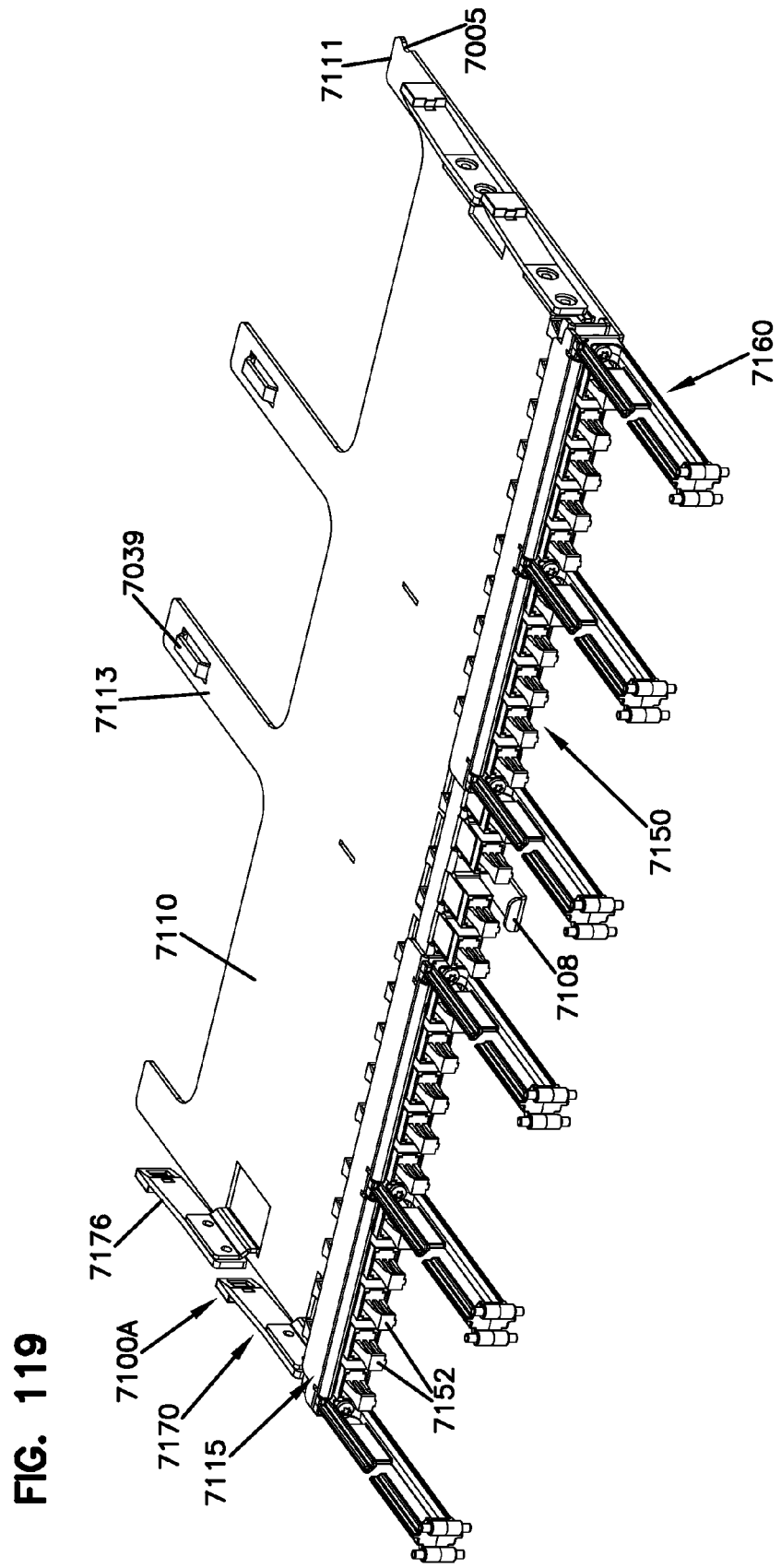

FIG. 119 shows one example implementation of a first passive blade 7100A including a coupler arrangement 7150A having one or more passive couplers 7151. As the term is used herein, a "passive" blade 7100 is a blade that does not include PLI/PLM functionality. In some implementations, a passive blade 7100 does not include a circuit board arrangement. In other implementations, a passive blade 7100 may include couplers 7151 that do not have media reading interfaces. In certain implementations, the passive couplers 7151 are configured to receive media segments 3200 regardless of whether the media segment 3200 includes a storage device storing physical layer information. In the example shown, dust caps 7152 are positioned at the front ports of the blade 7100A.

In the example shown, the first passive blade 7100A includes a generally planar base 7110 having outer and inner extensions 7111, 7113. At least one of the outer extensions 7111 defines a notch 7005 that enables the blade 7100A to be locked in a closed position within the chassis 7010 as described above. The inner extensions 7113 define cable tie locations 7039 at which media segments may be secured to the base 7110. One or more latching tabs 7170, 7176 may be positioned on the base 7110 to enable the blade 7100A to be locked into one or more positions relative to the chassis 7010. In other implementations, other types of latching systems may be used with blade 7100A.

A handle 7108 extends forwardly of the base 7110 to facilitate movement of the blade 7100A relative to the chassis 7010. A frame 7115 is positioned at the front of the first passive blade 7100A. The frame 7115 is configured to secure one or more passive couplers 7151 to the base 7110. In some implementations, the couplers 7151 are configured to receive both incoming media segments 3210 and outgoing media segments 3220. In other implementations, the couplers 7151 receive only outgoing media segments 3220 and couplers positioned at the rear of the base 7110 receive the incoming media segments 3210. Retention fingers 7160 extend forwardly of the frame 7115. In certain implementations, the retention fingers 7160 are substantially the same as retention fingers 3160 described above.

Figure 120:
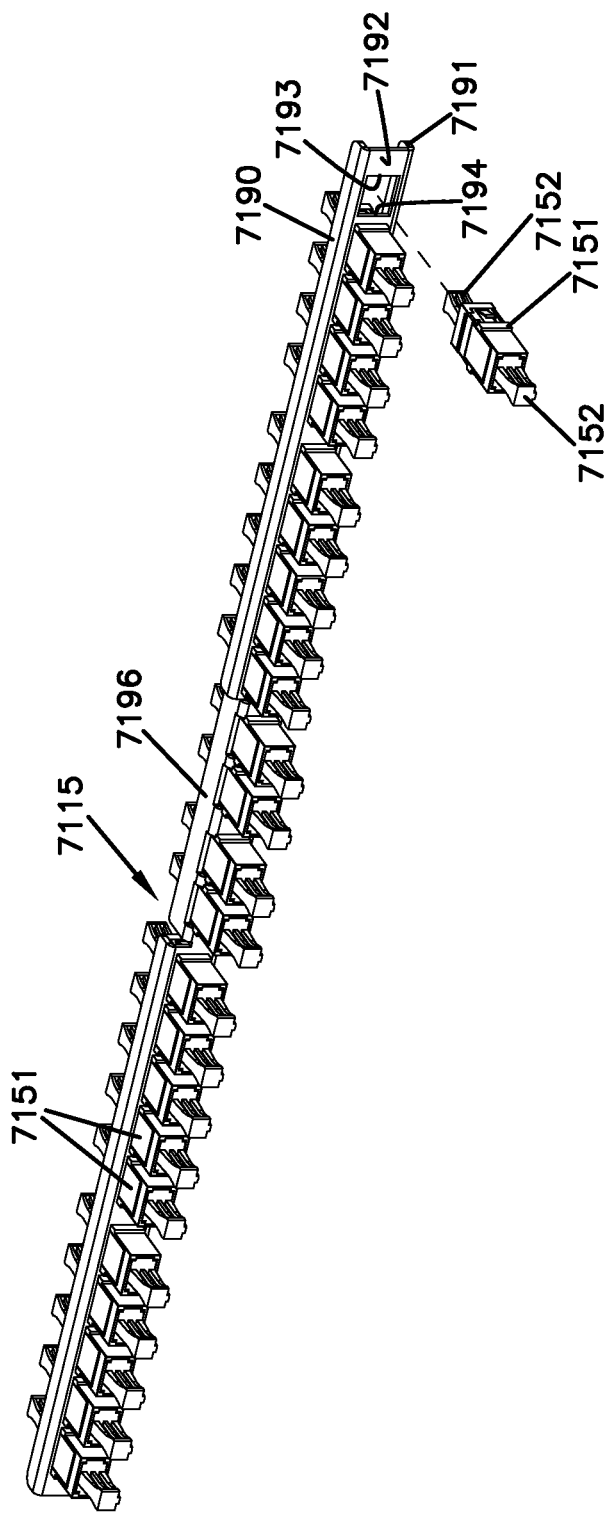
Figure 121:
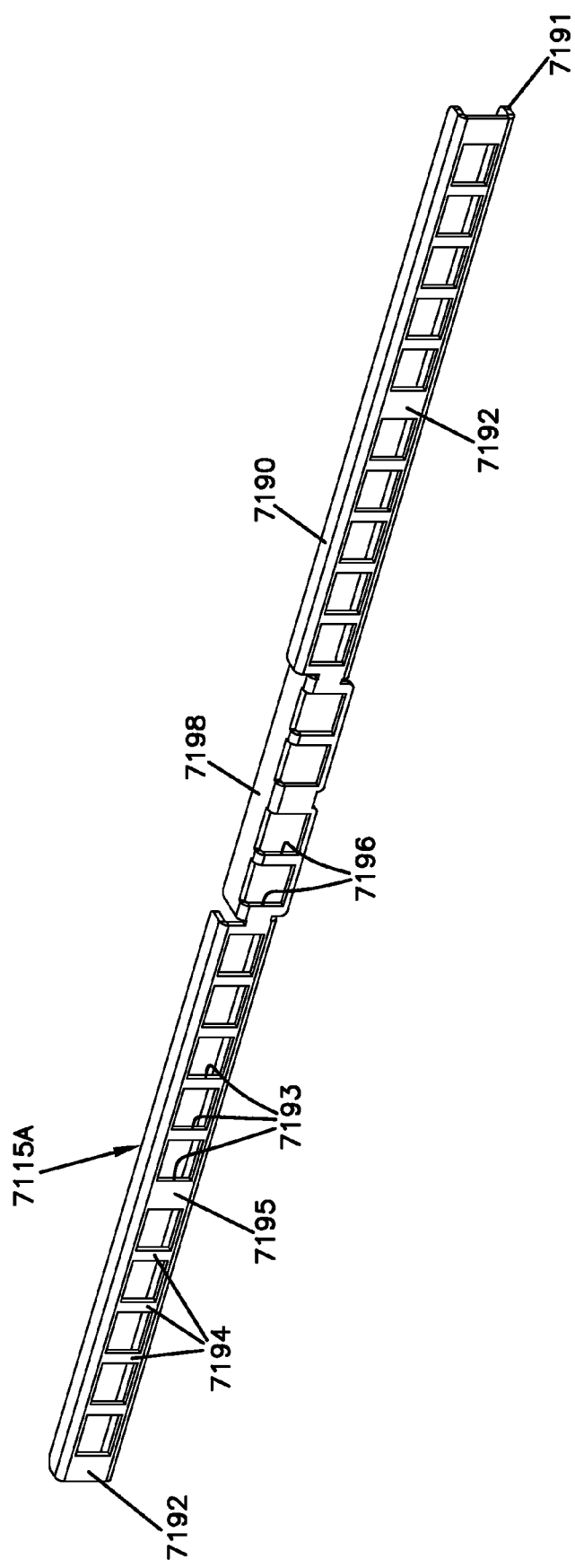
Figure 122:
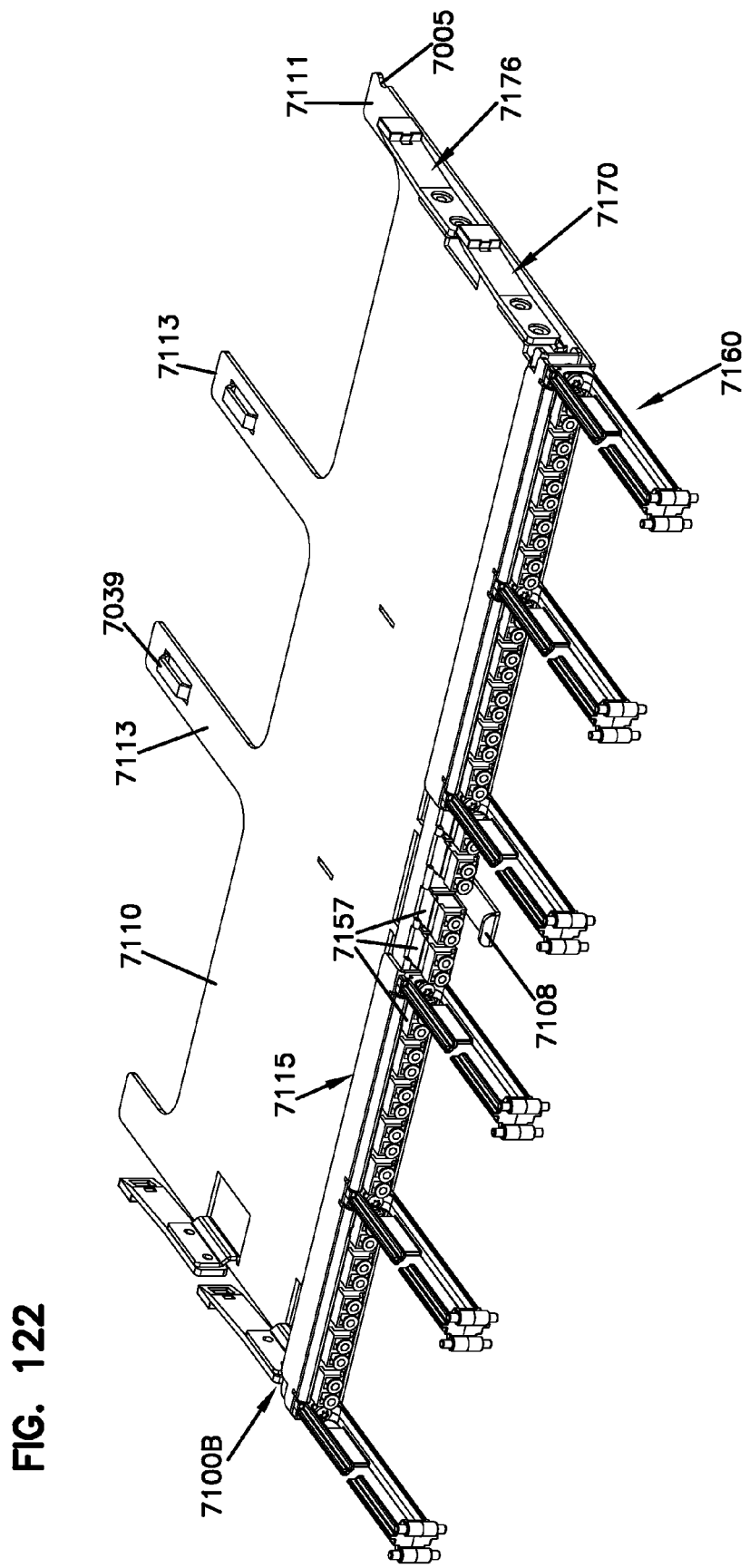

FIGS. 120 and 121 show one example implementation of the frame 7115. The example frame 7115 includes parallel top and bottom members 7090, 7091, respectively, connected by a front panel 7192. The front panel 7192 defines one or more openings 7193 configured to receive the coupler arrangement 7150 of the blade 7100A. In some implementations, an intermediate section 7198 of the frame 7115 has a reduced height compared to outer sections of the frame 7115. In some implementations, the reduced height section 7198 also defines openings 7196 configured to receive couplers 7151. In other implementations, the reduced height section 7198 defines a blank flange extending between the outer sections of the frame 7115.

In some implementations, each opening 7193 is sized to receive a single coupler 7151 and the openings 7193 are separated by dividing flanges 7194. For example, in one implementation, each opening 7193 may be sized to receive a simplex coupler 7151. In another implementation, each opening 7193 is sized to receive a duplex coupler 7151. In yet another implementation, each opening 7193 is sized to receive a quadruplex coupler 7151. In still other implementations, each opening 7193 may be sized to receive various other sized couplers. In some implementations, the openings 7193 are separated into two or more groups by dividing sections 7195 (FIG. 121). The dividing sections 7195 are thicker than dividing flanges 7194.

In some implementations, the frame 7115 is configured to receive one or more couplers 7151 configured to receive media segments terminated with SC-type connectors (see FIG. 119). In other implementations, the frame 7115 is configured to receive one or more couplers 7151 configured to receive media segments terminated with LC-type connectors (see couplers 7157 of the second example passive blade 7100B of FIG. 122). In still other implementations, the frame 7115 may be configured to receive media segments terminated with various other types of connectors (e.g., ST-type connectors, FC-type connectors, MPO-type connectors).

Figure 123:
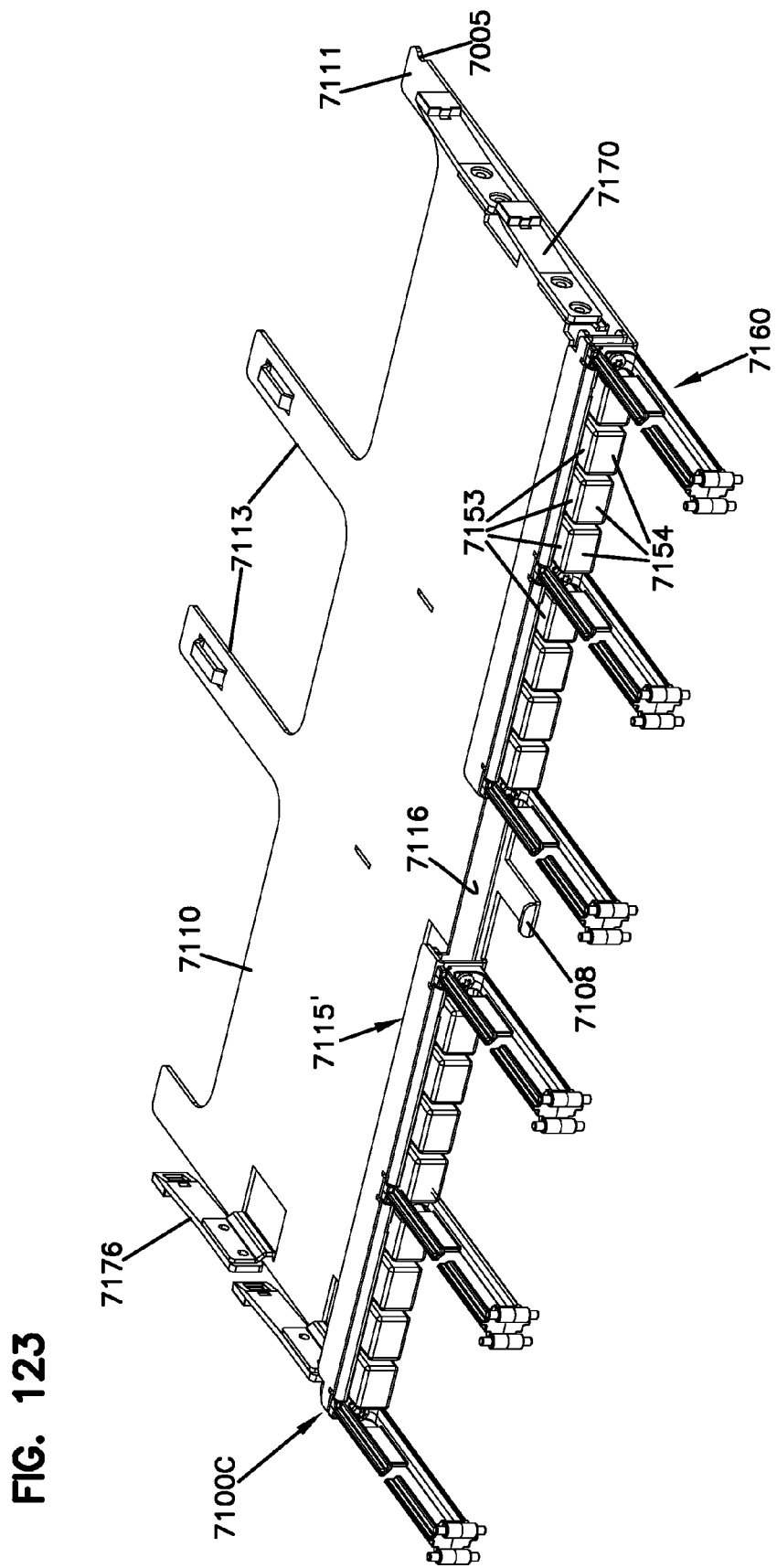

For example, FIG. 123 shows a third example passive blade 7100C including a base 7110, latching tabs 7170, 7176, and retention fingers 7160. A frame 7115' is positioned at the front of the base 7110 to secure a plurality of couplers 7153 to the blade 7100C. In the example shown, the couplers 7153 are configured to receive MPO-type connectors. In other implementations, however, the frame 7115' may be configured to receive other types of couplers. The frame 7115' includes a reduced height section 7116 that is not configured to hold any couplers. Rather, the reduced height section 7116 of the frame 7115' includes a generally planar face that extends between groups of front couplers 7153. In the example shown, dust caps 7154 are received at the front ports of the couplers 7153.

Figure 116:
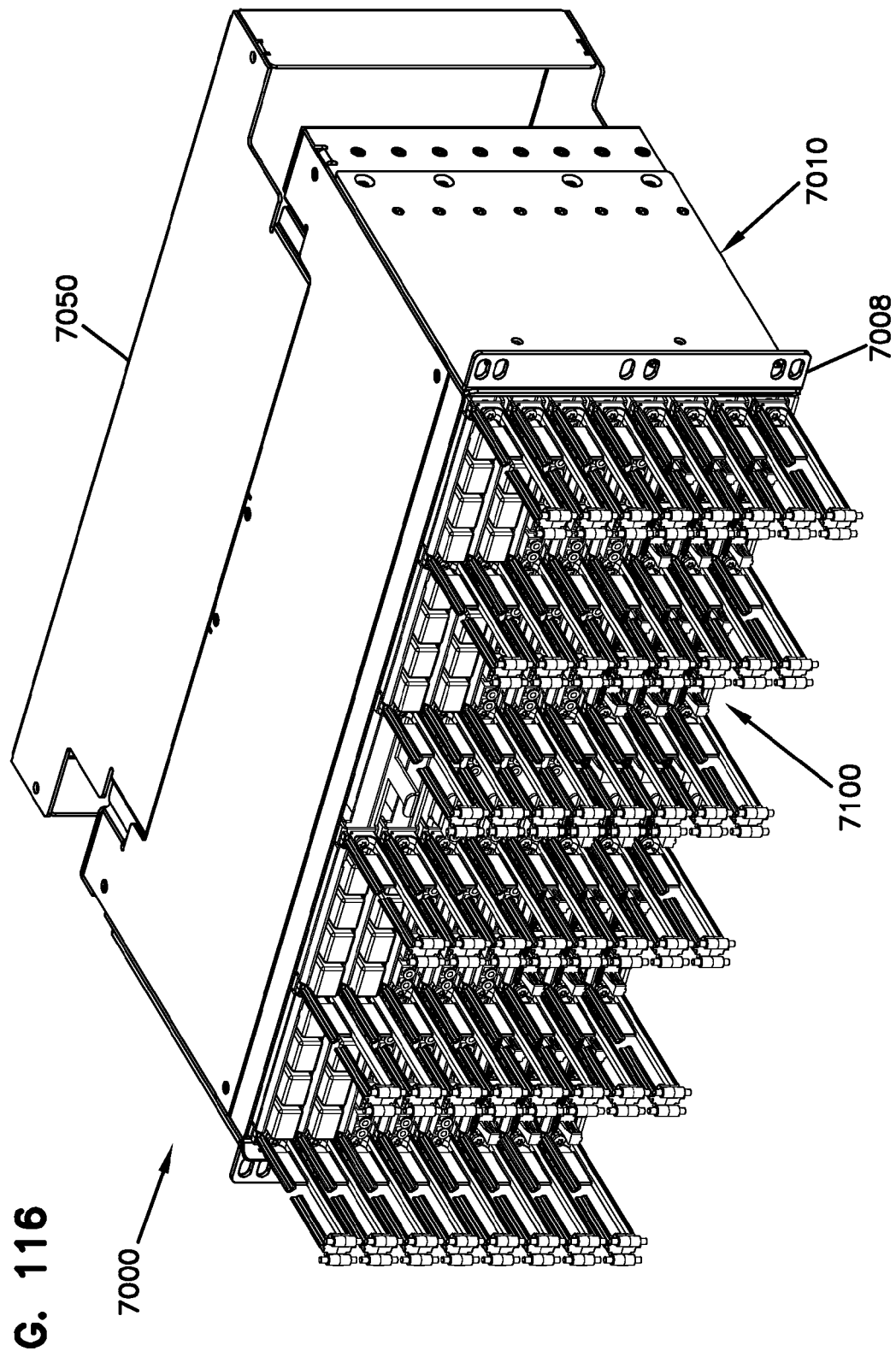
FIGS. 116-123 illustrate one example bladed panel system including a "passive" chassis and a plurality of "passive" blades in accordance with aspects of the disclosure.
Figure 117:
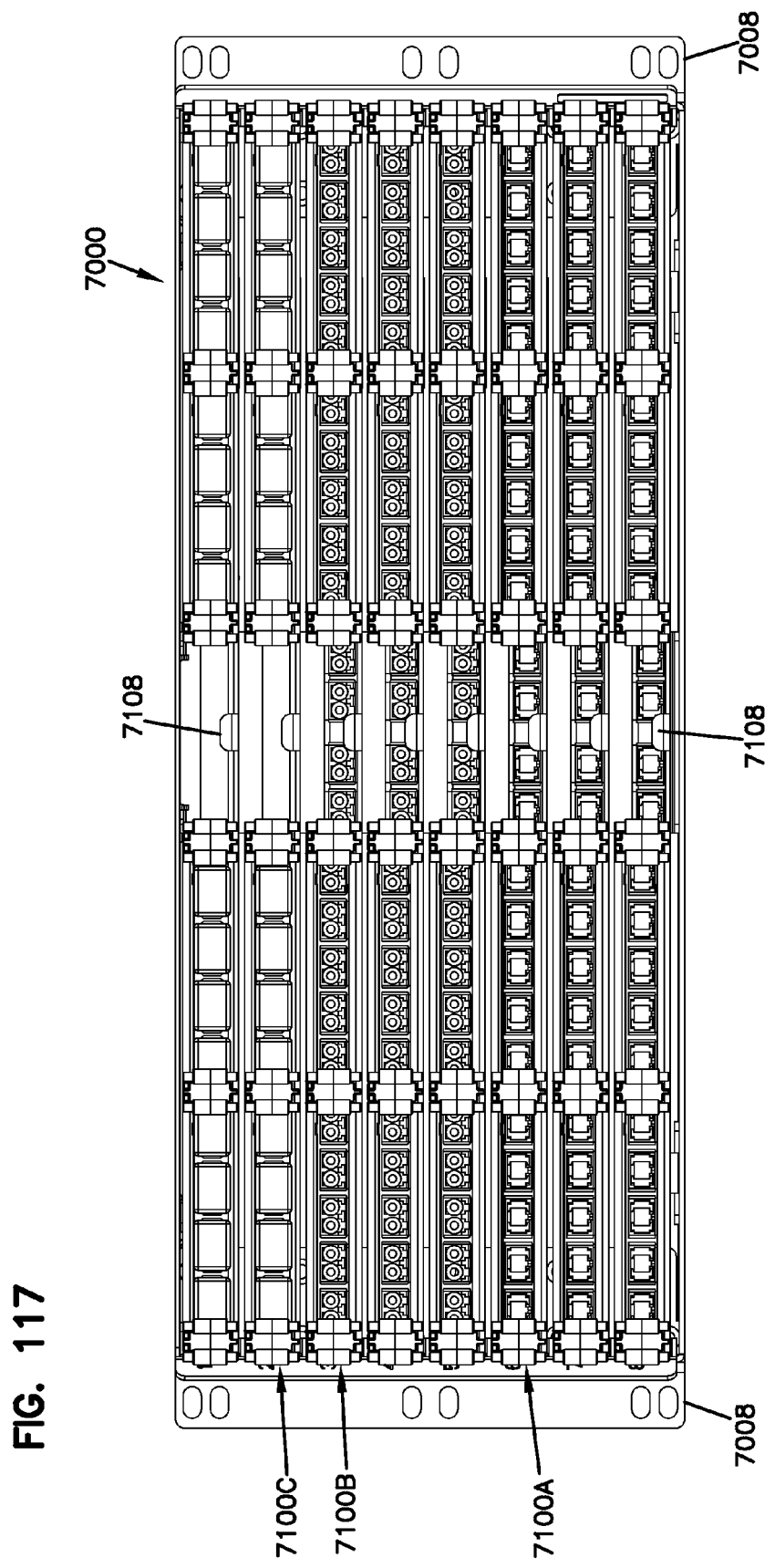
Figure 118:
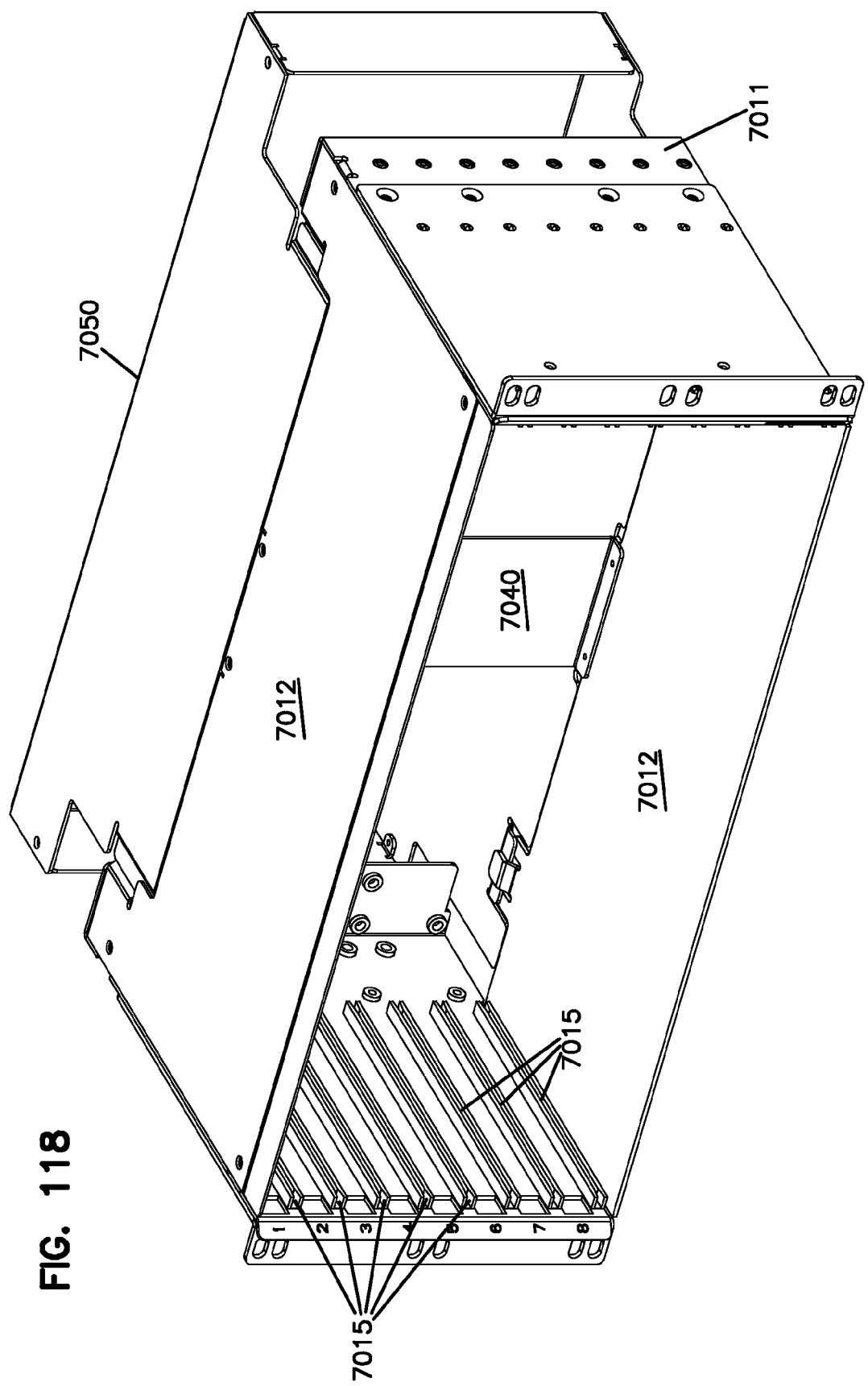

As shown in FIGS. 116 and 117, a single chassis 7010 may receive one or more types of blades 7100. For example, the chassis 7010 shown in FIG. 117 has received a third example passive blade 7100C at each of the top two guides 7015, a second example passive blade 7100B at each of the three intermediate guides 7015, and a first example passive blade 7100A at each of the three bottom guides 7015. In other implementations, the guides 7100 may be arranged in the chassis 7010 in a different configuration.

In still other implementations, any of the passive blades 7100A, 7100B, 7100C may be positioned in a chassis that includes a backplane (e.g., chassis 3010 disclosed above). For example, in some implementations, the rear of each of the passive chasses 7100A, 7100B, 7100C terminates before the backplane 3040 when the chassis 7100A, 7100B, 7100C is mounted to a smart chassis 3010 in a closed position. In certain implementations, the reduced height section 7198, 7116 of the frames 7115, 7115' of the passive chasses 7100A, 7100B, 7100C accommodate a status board (e.g., status board 3070 of FIG. 45) when received at a top of a smart chassis 3010. Further, the reduced height sections 7198, 7116 of the frames 7115, 7115' facilitate gripping the handle 7108 when outgoing media segments 3220 are routed to the front of the blades 7100A, 7100B, 7100C (see FIG. 117).

To enhance clarity of the application, the following disclosure provides an example walk-through of routing the incoming and outgoing media segments 3200 for an example blade. One or more chasses (e.g., chasses 1010, 2010, 3010, 5010, and 7010) are provided, for example, on an equipment rack (see rack 4400 of FIGS. 80-82). One or more blades (e.g., blades 1100, 2100, 3100, 6100, and 7100) are installed in each chassis. In this walk-through, a smart blades, such as blade 3100, is being mounted to a smart chassis, such as chassis 3010 having backplane 3040. A status board 3070 also may be installed at the chassis 3010 and connected to the backplane 3040.

The blade 3100 is slid rearwardly along guides 3015 from the front of the chassis 3010. A circuit board arrangement 3120 of the blade 3100 is connected to a backplane 3040 of the chassis 3010 by sliding the blade 3100 rearwardly into the chassis 3010 along the guides 3015. For example, a second circuit board 3124 on each blade 3100 may be connected to the backplane 3040 (e.g., via a card-edge connection, via a connector, etc.).

The blade processor 3140 on the smart blade 3100 also is connected to the backplane 3040 via the circuit board arrangement 3120.

Incoming cables 3210 may be connected to the rear ports of each blade 3100 after the blade 3100 has been inserted into the chassis 3010. For example, a technician may plug connectorized ends 3212 of the incoming cables 3210 into the rear ports of the blade 3100. The technician also may secure the incoming cables 3210 to the blade 3100, the chassis 3010, and/or the frame. For example, the technician may routes the incoming cables 3210 to a cable clamp 3030, fanout arrangement 3035, or other securement structure at the chassis 3010 before securing the incoming cables 3210 to the blades 3100. The technician also may secure (e.g., using a cable tie 3039) the incoming cables 3210 to the tabs on the intermediate flanges at the rear of the blades to provide slack length of the incoming cables 3210 between the chassis 3010 and the blade 3100.

The technician routes the connectorized ends 3212 of the incoming cables 3210 to the rear ports of the blade 3100. In some implementations, the technician plugs the connectorized ends 3212 of the incoming cables 3210 into ports 3195 (FIG. 78) defined by couplers at the rear of the blade 3100. In such implementations, the technician accesses the rear ports 3195 from the rear of the chassis 3010. In particular, the technician can unplug a dust plug 3158 (FIG. 79) from one of the rear ports 3195 of the rear couplers and insert one of the connectorized ends 3212 into the rear port 3195 from the rear of the chassis 3010.

In other implementations, the technician feeds connectorized ends 3212 of the incoming cables 3210 from the rear of the chassis 3010, over the base of the respective blade, toward the front couplers. The technician may subsequently access the rear ports of the front couplers through an open top of the blade from the front of the chassis 3010. For example, the technician may access the front couplers when the blade 3100 is in a first or second extended position. In particular, the technician can unplug a dust plug from one of the rear ports of the front couplers and insert each of the connectorized ends 3212 of the incoming media segments 3210 into one of the rear ports from the front of the chassis 3010.

Outgoing cables 3220 may be installed at the front ports of the blades 3100. If the blade is a smart blade, then the outgoing cables 3220 may be installed at the front ports without disconnecting the blade 3100 from the backplane 3040. For example, the technician may plug the connectors 3222 of the outgoing cables 3220 into the front ports of the front couplers when the blade 3100 is in the closed or first extended position. In other implementations, however, the connectors 3222 of the outgoing fibers 3220 may be plugged into the front coupler ports while the blade 3100 is in any desired position. The technician also routes the fibers 3220 through the retention fingers 3160 at the front of the blade 3100.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:
1. A chassis for a bladed panel system, the chassis comprising:
    a chassis housing defining an interior accessible through an open front;
    a plurality of guides positioned along interior sides of the chassis housing, the guides extending between a front and a rear of the chassis housing, the guides being configured to facilitate sliding of blades through the open front of the chassis housing;

a backplane positioned at an open rear of the chassis, the backplane including a plurality of blade ports facing the interior of the chassis housing and a processor port facing an exterior of the chassis housing;

a chassis processor electrically coupled to the processor port of the chassis backplane, the chassis processor being coupled to a data network; and a rear cover configured to releasably couple to the chassis housing to at least partially enclose the open rear of the chassis housing, the rear cover cooperating with the rear of the chassis housing to define at least one routing opening through which media segments are routed to the blades from the rear of the chassis housing, the at least one routing opening being located rearward of the backplane.

2. The chassis of claim 1, further comprising a plurality of rear management structures positioned at the rear of the chassis housing.

3. The chassis of claim 2, wherein the rear management structures include a plurality of cable clamps.

4. The chassis of claim 2, wherein the rear management structures include a plurality of fanout arrangements.

5. The chassis of claim 2, wherein the rear management structures include cable spools.

6. The chassis of claim 5, wherein the cable spools are positioned in a management tray that is attached to a rear of the chassis.

7. The chassis of claim 6, wherein the management tray has an open top.

8. The chassis of claim 1, wherein mounting flanges are coupled to sides of the chassis housing, the mounting flanges having portions that extend generally parallel with the open front of the chassis housing.

9. The chassis of claim 8, wherein the mounting flanges extend over a majority of a length of the sides of the chassis housing.

10. The chassis of claim 1, wherein a rear of the chassis includes a rearward extension that forms an enclosure in which the chassis processor is mounted.

11. The chassis of claim 10, wherein guides are provided in the enclosure of the rearward extension to enable sliding movement of the chassis processor relative to the enclosure.

12. The chassis of claim 1, wherein a plurality of latching openings are defined through sidewalls of the chassis housing.

13. The chassis of claim 12, wherein the latching openings are located towards the front of the chassis housing.

14. The chassis of claim 1, wherein the rear cover includes sidewalls extending between a top and a bottom of the rear cover.

15. The chassis of claim 14, wherein the rear cover also includes a rear wall extending between the sidewalls.

16. The chassis of claim 15, wherein the sidewalls extend from a rear of the rear cover towards a front of the rear cover.

17. The chassis of claim 16, wherein at least one of the sidewalls terminates before reaching the chassis housing to define the routing opening.

18. The chassis of claim 15, wherein an exterior of the rear wall defines a plurality of cable ties locations.

19. The chassis of claim 15, further comprising a bracket coupled to the chassis at the open front, the bracket including a curved transition surface located forwardly of the open front of the chassis.

* * * * *